US011600526B2

(12) United States Patent
Lee et al.

(10) Patent No.: US 11,600,526 B2
(45) Date of Patent: Mar. 7, 2023

(54) CHIP PACKAGE BASED ON THROUGH-SILICON-VIA CONNECTOR AND SILICON INTERCONNECTION BRIDGE

(71) Applicant: iCometrue Company Ltd., Zhubei (TW)

(72) Inventors: Jin-Yuan Lee, Hsinchu (TW); Mou-Shiung Lin, Hsinchu (TW)

(73) Assignee: iCometrue Company Ltd., Hsin-Chu County (TW)

( * ) Notice: Subject to any disclaimer, the term of this patent is extended or adjusted under 35 U.S.C. 154(b) by 24 days.

(21) Appl. No.: 17/155,069

(22) Filed: Jan. 21, 2021

(65) Prior Publication Data

US 2021/0225708 A1 Jul. 22, 2021

Related U.S. Application Data

(60) Provisional application No. 63/135,369, filed on Jan. 8, 2021, provisional application No. 63/023,235, filed (Continued)

(51) Int. Cl.

*H01L 21/768* (2006.01)
*H01L 21/78* (2006.01)
*H01L 21/48* (2006.01)

(52) U.S. Cl.

CPC ...... *H01L 21/76898* (2013.01); *H01L 21/486* (2013.01); *H01L 21/768* (2013.01); *H01L 21/78* (2013.01)

(58) Field of Classification Search

CPC ... H01L 21/76898; H01L 21/78; H01L 23/50; H01L 2224/11; H01L 21/486; (Continued)

(56) References Cited

U.S. PATENT DOCUMENTS 4,870,302 A 9/1989 Freeman
5,272,368 A 12/1993 Turner et al.
(Continued)

FOREIGN PATENT DOCUMENTS

CN 104282650 7/2006
CN 103681367 3/2014
(Continued)

*Primary Examiner* — Thanh T Nguyen

(57) ABSTRACT

A method for a through-silicon-via (TSV) connector includes: providing a semiconductor wafer with a silicon substrate, wherein the semiconductor wafer has a frontside and a backside opposite to the frontside thereof; forming multiple holes in the silicon substrate of the semiconductor wafer; forming a first insulating layer at a sidewall and bottom of each of the holes; forming a metal layer over the semiconductor wafer and in each of the holes; polishing the metal layer outside each of the holes to expose a frontside surface of the metal layer in each of the holes; forming multiple metal bumps or pads each on the frontside surface of the metal layer in at least one of the holes; grinding a backside of the silicon substrate of the semiconductor wafer to expose a backside surface of the metal layer in each of the holes, wherein the backside surface of the metal layer in each of the holes and a backside surface of the silicon substrate of the semiconductor wafer are coplanar; and cutting the semiconductor wafer to form multiple through-silicon-via (TSV) connectors.

28 Claims, 59 Drawing Sheets

Related U.S. Application Data on May 11, 2020, provisional application No. 63/012,072, filed on Apr. 17, 2020, provisional application No. 62/983,634, filed on Feb. 29, 2020, provisional application No. 62/964,627, filed on Jan. 22, 2020.

(58) Field of Classification Search
CPC .............. H01L 23/147; H01L 23/5385; H01L 23/49816; H01L 23/49827; H01L 23/5384; H01L 24/00; H01L 23/481; H01L 23/5389; H01L 2224/18
See application file for complete search history.

(56) References Cited

U.S. PATENT DOCUMENTS 5,587,603 A 12/1996 Kowshik
5,592,102 A 1/1997 Lane et al.
5,689,195 A 11/1997 Cliff et al.
5,796,662 A 8/1998 Kalter et al.
6,020,633 A 2/2000 Erikson
6,167,558 A 12/2000 Trimberger
6,356,478 B1 3/2002 McCollum
6,388,466 B1 5/2002 Wittig et al.
6,404,226 B1 6/2002 Schadt
6,687,167 B2 2/2004 Guaitini et al.
6,798,240 B1 9/2004 Pedersen
6,812,086 B2 11/2004 Murthy et al.
6,828,823 B1 12/2004 Tsui
6,943,580 B2 9/2005 Lewis et al.
6,998,872 B1 2/2006 Chirania et al.
7,030,652 B1 4/2006 Lewis et al.
7,061,271 B1 6/2006 Young et al.
7,190,190 B1 3/2007 Camarota et al.
7,193,433 B1 3/2007 Young
7,219,237 B1 5/2007 Trimberger
7,366,306 B1 4/2008 Trimberger
7,385,417 B1 6/2008 Agrawal et al.
7,420,390 B1 9/2008 Hutton et al.
7,550,994 B1 6/2009 Camarota
7,598,555 B1 10/2009 Papworth Parkin
7,653,891 B1 1/2010 Anderson et al.
7,747,025 B1 6/2010 Trimberger
7,853,799 B1 12/2010 Trimberger
7,933,140 B2 4/2011 Wang et al.
7,944,231 B2 5/2011 Javerliac
7,948,266 B2 5/2011 Schmit et al.
7,973,556 B1 7/2011 Noguera Serra et al.
8,064,224 B2 11/2011 Mahajan et al.
8,081,079 B1 12/2011 Camarota
8,159,268 B1 4/2012 Madurawe
8,243,527 B2 8/2012 Hung et al.
8,354,297 B2 1/2013 Pagaila et al.
8,378,407 B2 2/2013 Audzeyeu et al.
8,531,032 B2 9/2013 Yu et al.
8,546,955 B1 10/2013 Wu
8,592,886 B2 11/2013 Hsu et al.
8,709,865 B2 4/2014 Hu et al.
8,742,579 B2 6/2014 Pagaila et al.
8,786,060 B2 7/2014 Yen et al.
8,796,137 B2 8/2014 Pagaila et al.
8,866,292 B2 10/2014 Beer et al.
8,872,349 B2 10/2014 Chiu et al.
8,878,360 B2 11/2014 Meyer et al.
8,883,561 B2 11/2014 Park et al.
8,885,334 B1 11/2014 Baxter
8,895,440 B2 11/2014 Choi et al.
8,912,822 B2 12/2014 Yasuda
8,916,421 B2 12/2014 Gong et al.
8,941,230 B2 1/2015 Kyozuka et al.
8,952,489 B2 2/2015 Elian et al.
8,952,521 B2 2/2015 Wojnowski et al.
8,987,918 B2 3/2015 Razdan et al.
8,993,377 B2 3/2015 Koo et al.
9,003,221 B1 4/2015 Abugharbieh et al.
9,082,806 B2 7/2015 Lin et al.
9,106,229 B1 8/2015 Hutton
9,135,185 B2 9/2015 Loh et al.
9,147,638 B2 9/2015 Liu et al.
9,224,647 B2 12/2015 Koo et al.
9,225,512 B1 12/2015 Trimberger
9,252,127 B1 2/2016 Shen et al.
9,263,370 B2 2/2016 Shenoy et al.
9,281,292 B2 3/2016 Hu et al.
9,324,672 B2 4/2016 Pagaila et al.
9,331,060 B2 5/2016 Otremba et al.
9,343,442 B2 5/2016 Chen et al.
9,349,703 B2 5/2016 Chiu et al.
9,349,713 B2 5/2016 Kim et al.
9,362,187 B2 6/2016 Ossimitz
9,385,006 B2 7/2016 Lin
9,385,009 B2 7/2016 Lin et al.
9,385,105 B2 7/2016 Meyer et al.
9,396,998 B2 7/2016 Kurita et al.
9,397,050 B2 7/2016 Shin et al.
9,406,619 B2 8/2016 Pagaila et al.
9,406,658 B2 8/2016 Lee et al.
9,437,260 B2 9/2016 Prenat et al.
9,449,930 B2 9/2016 Kim et al.
9,455,218 B2 9/2016 Ooi et al.
9,508,626 B2 11/2016 Pagaila et al.
9,524,955 B2 12/2016 Huang et al.
9,543,276 B2 1/2017 Jee et al.
9,583,431 B1 2/2017 Rahman
9,593,009 B2 3/2017 Fuergut et al.
9,607,967 B1 3/2017 Shih
9,627,365 B1 4/2017 Yu et al.
9,640,259 B2 5/2017 Li et al.
9,679,863 B2 6/2017 Lin et al.
9,704,843 B2 7/2017 Kilger et al.
9,722,584 B1 8/2017 Chang et al.
9,735,113 B2 8/2017 Chi et al.
9,763,329 B1 9/2017 Mason
9,773,757 B2 9/2017 Yu et al.
9,806,058 B2 10/2017 Wei et al.
9,812,337 B2 11/2017 Chen et al.
9,818,720 B2 11/2017 Wei et al.
9,831,148 B2 11/2017 Yu et al.
9,859,896 B1 1/2018 Gaide et al.
9,881,850 B2 1/2018 Yu et al.
9,887,206 B2 2/2018 Su et al.
9,893,732 B1 2/2018 Lewis
9,899,248 B2 2/2018 Yu et al.
9,899,355 B2 2/2018 Yuan et al.
9,935,113 B2 4/2018 Wu et al.
9,966,325 B2 5/2018 Beyne
9,997,464 B2 6/2018 Hsieh et al.
10,015,916 B1 7/2018 Karp
10,026,681 B2 7/2018 Ko et al.
10,033,383 B1 7/2018 Richter et al.
10,037,963 B2 7/2018 Chen et al.
10,038,647 B1 7/2018 Lesea
10,043,768 B2 8/2018 Meyer et al.
10,056,351 B2 8/2018 Yu et al.
10,056,907 B1 8/2018 Asnaashari
10,062,648 B2 8/2018 Hsieh et al.
10,062,651 B2 8/2018 Liang et al.
10,079,243 B2 9/2018 Ramkumar
10,109,559 B2 10/2018 Lin et al.
10,109,588 B2 10/2018 Jeong et al.
10,109,617 B2 11/2018 Sugiyama et al.
10,153,222 B2 12/2018 Yu et al.
10,153,239 B2 12/2018 Wang et al.
10,157,828 B2 12/2018 Hsu et al.
10,157,849 B2 12/2018 Huang et al.
10,162,139 B1 12/2018 Wang et al.
10,163,798 B1 12/2018 Alur et al.
10,163,802 B2 12/2018 Lin et al.
10,177,188 B2 1/2019 Kang et al.
10,204,684 B2 2/2019 Widjaja
10,211,070 B2 2/2019 Lee et al.
10,211,182 B2 2/2019 Meyer et al.
10,256,219 B2 4/2019 Chew
10,290,611 B2 5/2019 Yu et al.
10,325,882 B2 6/2019 Kang et al.

(56) References Cited

U.S. PATENT DOCUMENTS

| | | | |
|---|---|---|---|
| 10,333,623 | B1 | 6/2019 | Liao et al. |
| 10,340,249 | B1 * | 7/2019 | Yu .......................... H01L 24/81 |
| 10,373,885 | B2 | 8/2019 | Yu et al. |
| 10,419,001 | B2 | 9/2019 | Jo et al. |
| 10,431,536 | B2 | 10/2019 | Kim et al. |
| 10,447,274 | B2 | 10/2019 | Lee et al. |
| 10,476,505 | B2 | 11/2019 | Ngai |
| 10,490,521 | B2 | 11/2019 | Hu et al. |
| 10,490,540 | B2 | 11/2019 | Yu et al. |
| 10,504,835 | B1 | 12/2019 | Wang et al. |
| 10,510,634 | B2 | 12/2019 | Lin et al. |
| 10,510,650 | B2 | 12/2019 | Yu et al. |
| 10,522,449 | B2 | 12/2019 | Chen et al. |
| 10,541,227 | B2 | 1/2020 | Yeh et al. |
| 10,541,228 | B2 | 1/2020 | Chen et al. |
| 10,622,321 | B2 | 4/2020 | Yu et al. |
| 10,741,537 | B2 | 8/2020 | Lu et al. |
| 10,784,248 | B2 | 9/2020 | Yu et al. |
| 10,797,031 | B2 | 10/2020 | Liao et al. |
| 10,892,011 | B2 | 1/2021 | Lin et al. |
| 2001/0045844 | A1 | 11/2001 | New et al. |
| 2003/0122578 | A1 | 7/2003 | Masui et al. |
| 2004/0041584 | A1 | 3/2004 | Sunaga et al. |
| 2004/0145850 | A1 | 7/2004 | Fukumoto et al. |
| 2004/0222817 | A1 | 11/2004 | Madurawe |
| 2005/0185457 | A1 | 8/2005 | Kim et al. |
| 2005/0218929 | A1 | 10/2005 | Wang et al. |
| 2006/0138509 | A1 | 6/2006 | Lee et al. |
| 2007/0164279 | A1 | 7/2007 | Lin et al. |
| 2007/0166912 | A1 | 7/2007 | Fenigstein et al. |
| 2007/0279987 | A1 | 12/2007 | Fang et al. |
| 2009/0114971 | A1 | 5/2009 | Cai et al. |
| 2009/0243650 | A1 | 10/2009 | Madurawe |
| 2009/0243652 | A1 | 10/2009 | Dorairaj et al. |
| 2009/0267238 | A1 | 10/2009 | Joseph |
| 2010/0039136 | A1 | 2/2010 | Chua-Eoan et al. |
| 2010/0157669 | A1 | 6/2010 | Audzeyeu |
| 2010/0283085 | A1 | 11/2010 | Bemanian |
| 2011/0026232 | A1 | 2/2011 | Lin et al. |
| 2011/0221470 | A1 | 9/2011 | Javerliac et al. |
| 2012/0193785 | A1 | 8/2012 | Lin et al. |
| 2012/0217549 | A1 | 8/2012 | Widjaja |
| 2013/0082399 | A1 | 4/2013 | Kim et al. |
| 2013/0257477 | A1 | 10/2013 | Yasuda et al. |
| 2013/0285253 | A1 | 10/2013 | Aoki et al. |
| 2014/0017882 | A1 | 1/2014 | Lei |
| 2014/0070403 | A1 | 3/2014 | Pan et al. |
| 2014/0112066 | A1 | 4/2014 | Chow et al. |
| 2014/0131858 | A1 | 5/2014 | Pan et al. |
| 2014/0183731 | A1 | 7/2014 | Lin et al. |
| 2014/0185264 | A1 | 7/2014 | Chen et al. |
| 2014/0203412 | A1 | 7/2014 | Wang et al. |
| 2014/0210097 | A1 | 7/2014 | Chen |
| 2014/0254232 | A1 | 9/2014 | Wu |
| 2014/0302659 | A1 | 10/2014 | Phatak |
| 2015/0008957 | A1 | 1/2015 | Olgiati et al. |
| 2015/0014844 | A1 | 1/2015 | Wu et al. |
| 2015/0085560 | A1 | 3/2015 | Candelier et al. |
| 2015/0116965 | A1 | 4/2015 | Kim et al. |
| 2015/0227662 | A1 | 8/2015 | Lepercq |
| 2015/0327367 | A1 | 11/2015 | Shen |
| 2016/0118390 | A1 | 4/2016 | Liaw |
| 2016/0133571 | A1 | 5/2016 | Lee et al. |
| 2016/0173101 | A1 | 6/2016 | Gao et al. |
| 2016/0190113 | A1 | 6/2016 | Sharan et al. |
| 2016/0217835 | A1 | 7/2016 | Blott et al. |
| 2016/0351626 | A1 | 12/2016 | McCollum |
| 2016/0372449 | A1 | 12/2016 | Rusu et al. |
| 2017/0071552 | A1 | 3/2017 | Harpe et al. |
| 2017/0301650 | A1 | 10/2017 | Yu |
| 2018/0053730 | A1 | 2/2018 | Shao |
| 2018/0061742 | A1 | 3/2018 | Ananiev |
| 2018/0076179 | A1 | 3/2018 | Hsu et al. |
| 2018/0102776 | A1 | 4/2018 | Chandrasekar et al. |
| 2018/0150667 | A1 | 5/2018 | Yu et al. |
| 2018/0151477 | A1 | 5/2018 | Yu et al. |
| 2018/0151501 | A1 | 5/2018 | Yu et al. |
| 2018/0158746 | A1 | 6/2018 | Lin |
| 2018/0165396 | A1 | 6/2018 | Lin et al. |
| 2018/0174865 | A1 | 6/2018 | Yu et al. |
| 2018/0204810 | A1 | 7/2018 | Yu et al. |
| 2018/0204828 | A1 | 7/2018 | Yu et al. |
| 2018/0210799 | A1 | 7/2018 | Gao |
| 2018/0226349 | A1 | 8/2018 | Yu et al. |
| 2018/0247905 | A1 | 8/2018 | Yu et al. |
| 2018/0269188 | A1 | 9/2018 | Yu et al. |
| 2018/0275193 | A1 | 9/2018 | Rouge et al. |
| 2018/0284186 | A1 | 10/2018 | Chadha |
| 2018/0286776 | A1 | 10/2018 | Yu et al. |
| 2018/0301351 | A1 | 10/2018 | Yu et al. |
| 2018/0301376 | A1 | 10/2018 | Shih et al. |
| 2018/0350629 | A1 | 12/2018 | Liu et al. |
| 2018/0350763 | A1 | 12/2018 | Yu et al. |
| 2018/0358312 | A1 | 12/2018 | Yu et al. |
| 2018/0374824 | A1 | 12/2018 | Yu et al. |
| 2019/0013276 | A1 | 1/2019 | Lee et al. |
| 2019/0019756 | A1 | 1/2019 | Yu et al. |
| 2019/0020343 | A1 | 1/2019 | Lin et al. |
| 2019/0051641 | A1 | 2/2019 | Lin et al. |
| 2019/0057932 | A1 | 2/2019 | Wu et al. |
| 2019/0097304 | A1 | 3/2019 | Hsiao et al. |
| 2019/0129817 | A1 | 5/2019 | Zhuo |
| 2019/0221547 | A1 | 7/2019 | Drab et al. |
| 2019/0238134 | A1 | 8/2019 | Lin et al. |
| 2019/0238135 | A1 | 8/2019 | Lin et al. |
| 2019/0245543 | A1 | 8/2019 | Lin et al. |
| 2019/0253056 | A1 | 8/2019 | Lin et al. |
| 2019/0304803 | A1 | 10/2019 | Hu et al. |
| 2019/0333871 | A1 | 10/2019 | Chen et al. |
| 2019/0347790 | A1 | 11/2019 | Lin et al. |
| 2019/0363715 | A1 | 11/2019 | Lin et al. |
| 2019/0372574 | A1 | 12/2019 | Lin et al. |
| 2020/0058617 | A1 | 2/2020 | Wu et al. |
| 2020/0082885 | A1 | 3/2020 | Lin et al. |
| 2020/0111734 | A1 | 4/2020 | Lin et al. |
| 2020/0144159 | A1 * | 5/2020 | Chang ................ H01L 25/0652 |
| 2020/0144224 | A1 | 5/2020 | Lin et al. |
| 2020/0161242 | A1 | 5/2020 | Lin et al. |
| 2020/0373215 | A1 | 11/2020 | Wu et al. |
| 2020/0411488 | A1 * | 12/2020 | Yu .......................... H01L 24/19 |
| 2021/0005592 | A1 | 1/2021 | Lin et al. |
| 2021/0043557 | A1 | 2/2021 | Lin et al. |
| 2021/0050300 | A1 | 2/2021 | Lin et al. |
| 2021/0090983 | A1 | 3/2021 | Lin et al. |
| 2021/0159180 | A1 | 5/2021 | Zhai et al. |
| 2021/0217702 | A1 | 7/2021 | Dabral et al. |
| 2021/0232744 | A1 | 7/2021 | Lin et al. |
| 2022/0013504 | A1 | 1/2022 | Dabral et al. |

FOREIGN PATENT DOCUMENTS

| | | |
|---|---|---|
| CN | 104078453 | 10/2014 |
| CN | 105745752 | 7/2016 |
| CN | 104064556 | 4/2019 |
| TW | 200623398 | 7/2006 |
| WO | WO00/36748 | 6/2000 |
| WO | WO2005010976 | 2/2005 |
| WO | WO2016160063 | 10/2016 |

* cited by examiner

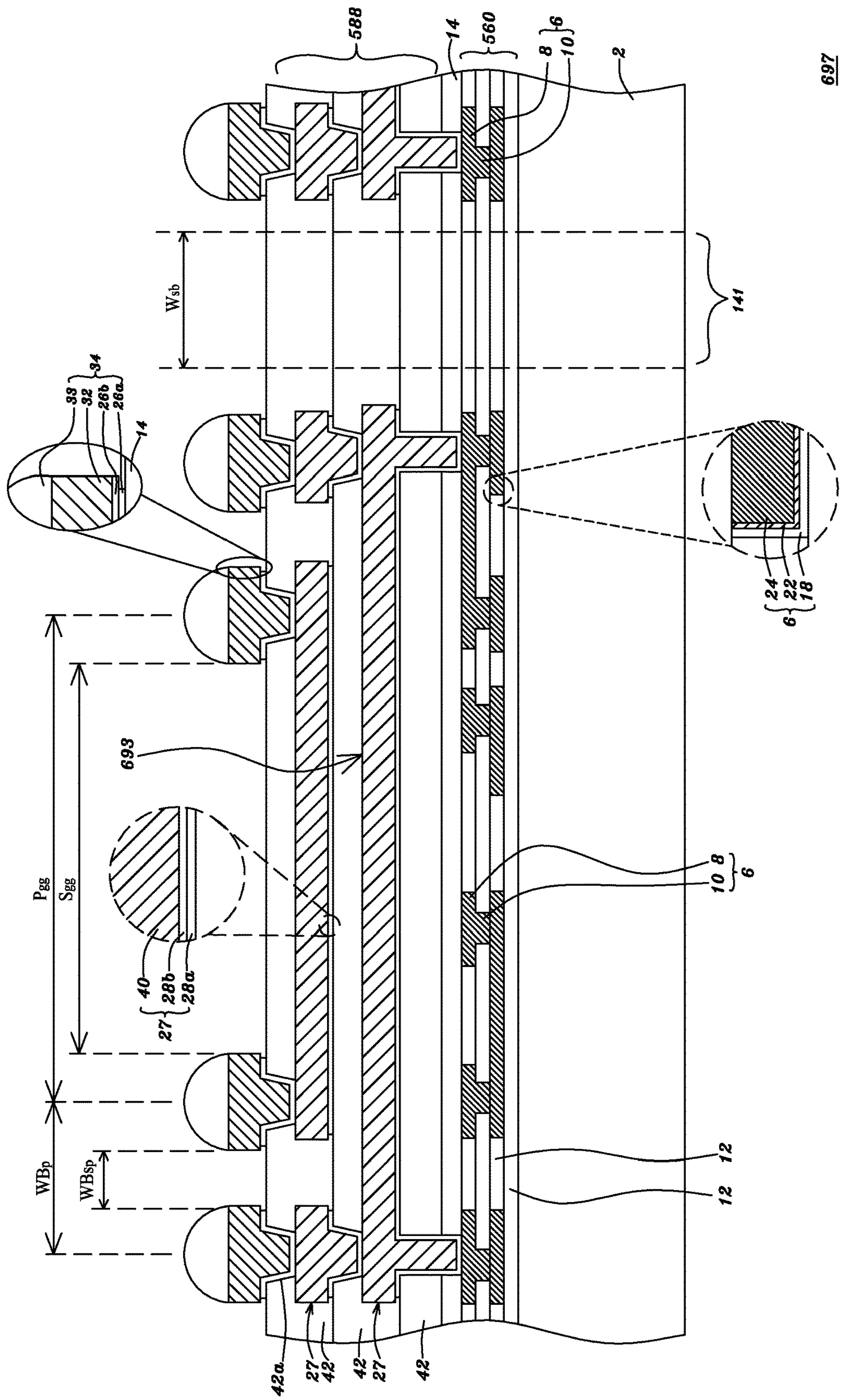
Fig. 5C
Replacement Sheet 697
34a
34b
WBsp
Pgg
Sgg
WBp
WBsbb
141
142
WBspse
WBpse
Wsb
693
690

CHIP PACKAGE BASED ON THROUGH-SILICON-VIA CONNECTOR AND SILICON INTERCONNECTION BRIDGE

PRIORITY CLAIM

This application claims priority benefits from U.S. provisional application No. 62/964,627, filed on Jan. 22, 2020 and entitled "3D chiplet system-in-a-package using vertical-through-via connector", U.S. provisional application No. 62/983,634, filed on Feb. 29, 2020 and entitled "A Non-volatile Programmable Logic Device Based On Multichip Package", U.S. provisional application No. 63/012,072, filed on Apr. 17, 2020 and entitled "VERTICAL INTERCONNECT ELEVATOR BASED ON THROUGH SILICON VIAS", U.S. provisional application No. 63/023,235, filed on May 11, 2020 and entitled "3D Chip Package based on Through-Silicon-Via Interconnection Elevator" and U.S. provisional application No. 63/135,369, filed on Jan. 8, 2021 and entitled "MICRO HEAT PIPE FOR USE IN SEMICONDUCTOR IC CHIP PACKAGE". The present application incorporates the foregoing disclosures herein by reference.

BACKGROUND OF THE DISCLOSURE

Field of the Disclosure

The present invention relates to 3D IC multi-chip packaging technology, more specifically relates to 3D multi-chip stacking chip-scale packages.

Brief Description of the Related Art

The Field Programmable Gate Array (FPGA) semiconductor integrated circuit (IC) has been used for development of new or innovated applications, or for small volume applications or business demands. When an application or business demand expands to a certain volume and extends to a certain time period, the semiconductor IC supplier may usually implement the application in an Application Specific IC (ASIC) chip, or a Customer-Owned Tooling (COT) IC chip. The switch from the FPGA design to the ASIC or COT design is because the current FPGA IC chip, for a given application and compared with an ASIC or COT chip, (1) has a larger semiconductor chip size, lower fabrication yield, and higher fabrication cost, (2) consumes more power, and (3) gives lower performance. When the semiconductor technology nodes or generations migrate, following the Moore's Law, to advanced nodes or generations (for example below 20 nm), the Non-Recurring Engineering (NRE) cost for designing an ASIC or COT IC chip increases greatly (more than US $5M or even exceeding US $10M, US $20M, US $50M or US $100M), FIG. 36. The cost of a photo mask set for an ASIC or COT IC chip at the 16 nm technology node or generation may be over US $1M, US $2M, US $3M, or US $5M. The high NRE cost in implementing the innovation and/or application using the advanced IC technology nodes or generations slows down or even stops the innovation and/or application using advanced and powerful semiconductor technology nodes or generations. A new approach or technology is needed to inspire the continuing innovation and to lower down the barrier for implementing the innovation in the semiconductor IC chips using the advanced and powerful semiconductor technology nodes or generations.

SUMMARY OF THE DISCLOSURE

One aspect of the disclosure provides a Vertical Interconnect Elevator (VIE) chip or component that is a Through- Silicon-Via Interconnect Elevator or Connector (TSVIE, also named as TSV Connector). The VIE chip or component is for use in a chip package, wherein the chip package may be (i) a single-chip package (comprising only one semiconductor IC chip), (ii) single-COC package (chip-on-chip component or package) or (iii) a multichip package (comprising a plurality of semiconductor IC chips or a plurality of COCs), wherein COC is chip-on-chip unit or package. The formation and structures of the COCs package will be described and specified below. The chip package may comprise one or a plurality of semiconductor IC chips (or COCs) and one or a plurality of VIE chips or components, wherein one or the plurality of semiconductor IC chips (or COCs) and one or the plurality of VIE chips or components are disposed on a same horizontal plane. The chip package comprising the VIE chips or components provides vertical interconnection for connecting the circuits at the bottom side (frontside) of the chip package to the top side (backside) of the chip package, wherein the through vias in the VIE chips or components are used for signal, clock, power and/or ground interconnection. The one or the plurality of semiconductor IC chips may not comprise any TSV (Through Silicon Via). Alternatively, the one or the plurality of semiconductor IC chips may comprise TSVs, used for signal, clock, power supply (Vcc) and/or ground reference (Vss) interconnection. The VIE chip or component may comprise only passive elements and no active devices (for example, transistors). The standard common wafer for the VIE chips or components is diced or sawed to form the separated VIE chips or components. The VIE chip or component may be manufactured by the packaging manufacturing companies or facilities without front-end of line (for fabrication of circuits including transistors) manufacturing capability. The chip package comprises copper pads, pillars or bumps, or solder bumps at the frontside (i.e., the side of the semiconductor IC chip or chips with transistors is facing) of the chip package, and copper or nickel pads, copper pillars or bumps, or solder bumps at the backside side (i.e., the side of the semiconductor IC chip or chips without transistors is facing) of the chip package. The copper pads, pillars or bumps, or solder bumps at the frontside of the chip package may be coupled or connected to the copper or nickel pads, copper pillars or bumps, or solder bumps at the backside side of the chip package through the TSVs of the VIE chips or components, wherein the TSVs of the VIE chips or components are used for signal, clock, power and/or ground interconnection. The transistors or circuits of the semiconductor IC chip or chips may be coupled or connected to the external circuits outside of the frontside and/or the backside of the chip package. The transistors or circuits of the semiconductor IC chip or chips may be coupled or connected to the external circuits outside of the backside of the chip package, through the TSVs of the VIE chips or components and the copper or nickel pads, copper pillars or bumps, or solder bumps at the backside side of the chip package, wherein the TSVs of the VIE chips or components are used for signal, clock, power supply (Vcc) and/or ground reference (Vss) interconnection. The locations (x and y coordinates) or layout in a horizontal plane of copper pads, pillars or bumps, or solder bumps at the frontside of the chip package may be the same as and vertically aligned with that of the copper or nickel pads, copper pillars or bumps, or solder bumps at the backside side of the chip package. In this case, the chip package is a chiplet or package in a standard format. The standard format of the chiplets or packages provides capability for stacking them vertically in a stacked 3D chip package. A second chip package may be stacked on the top of a first chip package using Package-On-Package (POP) assembly methods to form the 3D stacked chip package, wherein the first and second chip packages may be the chip packages as described and specified above and below.

Another aspect of the disclosure provides a standard common wafer for the VIE chips or components, as described and specified above and to be described and specified below. The VIE chip or component is for use in the chip package comprising (i) a single-chip package (comprising only one semiconductor IC chip), (ii) single-COC package or (iii) a multichip package (comprising a plurality of semiconductor IC chips or a plurality of COCs), as described above and to be described and specified below. The standard common wafers for the VIE chips or components may have a fixed pattern of design and layout for locations (x and y coordinates) of the TSVs, and may be diced or separated into VIE chips or components each with any desired size, dimension and shape and comprising any desired number of TSVs. A first type VIE chip or component obtained from a first standard common wafer has a first size, dimension and shape and comprises a first number of the micro metal pads or bumps, and, a second type VIE chip or component obtained from a second standard common wafer has a second size, dimension and shape and comprises a second number of the micro metal pads or bumps, wherein the first size, dimension and shape, and the first number of the micro metal pads or bumps are different from the second size, dimension and shape, and the second number of the micro metal pads or bumps, respectively, wherein the first and second standard common wafers have exact same design and layout. The diced or separated VIE chips or components each may comprise contact points at its top (frontside) surface, for example, copper pads, pillars or bumps, or solder bumps (refer to micro metal pad or bump in below) on the top surface of TSVs; while the bottom surface of TSVs is not exposed, that is the bottom side of each of the diced or separated VIE chips or components is the backside of the silicon substrate; the bottom surface of the TSVs is then exposed in the sequential process steps performed later for forming the chip package. In process of forming the chip package, a metal interconnection scheme may be formed on the exposed surface of TSVs. If an oxide layer is further formed at the bottom surface of the silicon substrate, a coper-pad-to-copper-pad oxide-to-oxide direct bond may be formed using the exposed bottom surface of TSVs. Alternatively, the bottom surface of TSVs is exposed in the standard common wafers for the VIE chips or components before dicing or separating.

Alternatively, the diced or separated VIE chips or components each may comprise contact points of the exposed TSV surfaces at its frontside (top) surface; while the backside (bottom) surface of TSVs is not exposed, that is the bottom side of each of the diced or separated VIE chips or components is the backside of the silicon substrate; the bottom surface of the TSVs is then exposed in the sequential process steps performed later for forming the chip package. In process of forming the chip package, a top metal interconnection scheme may be formed on the exposed top surface of TSVs and a bottom metal interconnection scheme may be formed on the exposed bottom surface of TSVs. If oxide layers are further formed, respectively, at the top surface and the bottom surface of the silicon substrate, copper pads of semiconductor IC chips may be bonded to the exposed surfaces of TSVs, respectively, at the top surface and at the bottom surface of each of the diced or separated VIE chips or components, using a copper-pad-to-copper-pad direct bonding method. Alternatively, the bottom surfaces of TSVs are exposed in the standard common wafer for the VIE chips or components before dicing or separating; wherein the diced or separated VIE chips or components each may have the exposed TSV surfaces at both of its top and bottom surfaces. If oxide layers are further formed, respectively, at the top surface and at the bottom surface of the silicon substrate, copper pads of semiconductor IC chips may be bonded to the exposed surfaces of TSVs, respectively, at the top surface and the bottom surface of each of the diced or separated VIE chips or components, using a copper-pad-to-copper-pad direct bonding method.

Alternatively, the diced or separated VIE chips or components each may have contact points at its top and surfaces with copper pads, pillars or bumps, or solder bumps at both of its top and bottom surfaces.

In some applications, the aspect ratio of length to width for a diced or separated VIE chip or component may be between 2 and 10, between 4 and 10 or between 2 and 40. Assume that the width of a scribe line is $W_{sbt}$, the space or separation between the scribe line and the TSV at the edge or boundary of the VIE chip or component is $W_{sbt}$, and the space or separation between two neighboring TSVs is $W_{sptsv}$. $W_{sptsv}$ is smaller than 50, 40 or 30 micrometers. In a case, if $W_{sptsv}$ is greater than $W_{sb}$+2 $W_{sbt}$, the standard common wafer is designed and layout with TSVs populated regularly in the whole wafer with a fixed pitch and separation (space $W_{sptsv}$) between two neighboring TSVs in x-direction and y-direction, respectively. The standard common VIE wafer may be cut or diced, through the space between two neighboring TSVs, to form separated or diced VIE chips or components each in a square or rectangular shape and with any dimension, and the separated or diced VIE chip or component may comprise any number of TSVs. In this case, in each separated or diced VIE chip or component, $W_{sbt}$ is smaller than $W_{sptsv}$. For example, a standard common VIE wafer with a given TSV layout may be cut or diced into separated or diced VIE chips or components each with an array of M1 by N1 (M1×N1) TSVs, M1 and N1 are positive integers, and wherein N1<M1, 1<=N1<=15, and 50<=M1<=500; or N1<M1, 1<=N1<=10, and 30<=M1<=200. For example, a separated or diced VIE chip or component may comprise an array of 100 by 5, 200 by 5, or 300 by 10 TSVs. In another case, if $W_{sptsv}$ is equal to or smaller than $W_{sb}$+2 $W_{sbt}$, the standard common wafer is designed and layout with two alternatives: (1) with islands or regions of TSV arrays populated regularly in the whole wafer with reserved scribe lines. Each of the reserved scribe line has a fixed space or separation $W_{spild}$ between two neighboring islands or regions of TSV arrays (that is between two neighboring TSVs across the reserved scribe line) in x-direction and y-direction, respectively, that is, there are two different separation spaces, $W_{spild}$ and $W_{sptsv}$, between two neighboring TSVs in a separated or diced VIE chip or component in x-direction and y-direction, respectively, wherein $W_{spild}$ is greater than $W_{sptsv}$. As an example, $W_{spild}$ is greater than 50, 40 or 30 micrometers, and $W_{sptsv}$ is smaller than 50, 40 or 30 micrometers. The reserved scribe line between two neighboring islands or regions of TSV arrays may be used as a scribe line for dicing and cutting the standard common wafer. The standard common VIE wafer may be cut or diced, through the reserved scribe lines, to form separated or diced VIE chips or components in square or rectangular shape and with various dimensions and comprising different numbers of TSVs. In this case, the separated or diced chip or component comprises M×N islands or regions of TSV arrays (wherein M and N are positive integers, wherein N<=M, 1<=N<=10, and 1<=M<=20) with the fixed space or separation $W_{spild}$ between two neighboring islands or regions of TSV arrays, wherein, for example, $W_{spild}$ is greater than 50, 40 or 30 micrometers, and $W_{sptsv}$ is smaller than 50, 40 or 30 micrometers. As example, the standard common VIE wafer with a given design and layout of islands or regions of TSV arrays may be cut or diced into a plurality of VIE chips or components, wherein each separated or diced VIE chip or component comprises one or a plurality of islands or regions of TSV arrays, for example, 3 by 1, 6 by 1, 4 by 2, 8 by 2, or 10 by 3 islands or regions of TSV arrays. If the separated or diced VIE chip or component comprises a plurality of (more than one) islands or regions of TSV arrays, there is the reserved scribe line between two neighboring islands or regions of TSV arrays therein. The diced or separated VIE chip or component may comprise repetitive islands or regions of TSV arrays with each island or region of TSV arrays comprising M2 by N2 TSVs, M2 and N2 are positive integers, and wherein N2<M2, 1<=N2<=15, 25<=M2<=250; or, N2<M2, 1<=N2<=10, and 15<=M2<=100. For example, a separated or diced VIE chip or component comprises repetitive islands or regions of TSV arrays with each island or region of TSV arrays comprising an array of 50 by 5, 150 by 5, 150 by 10, or 250 by 10 TSVs; (2) with TSVs populated regularly in the whole wafer with a fixed pitch and separation (space $W_{sptsv}$) between two neighboring TSVs in x-direction and y-direction, respectively. The standard common VIE wafer may be cut or diced through the TSVs to form separated or diced VIE chips or components in a square or rectangular shape and with any dimension, and the separated or diced VIE chip or component may comprise any number of TSVs. In this case, for each separated or diced VIE chip or component, $W_{sbt}$ may be equal to or greater than zero and is smaller than $W_{sptsv}$ and $W_{sptsv}$ is smaller than 50, 40 or 30 micrometers.

The standard common wafers for the VIE chips or components, as described and specified above, may be stored in the inventory, and sawed or diced to form separated VIE chips or components with different sizes for different vertical interconnection requirements upon business orders or requests. Therefore, the cycle time of manufacturing the VIE chips or components is reduced. Since the standard common wafers are standard commodity products and can be fabricated with volume production, the manufacturing cost the VIE chips or components is reduced. The VIE chip or component is configured for use in: (i) Chip-on-chip (COC) unit or package for connecting or coupling a first semiconductor IC chip therein and at the top to a metal interconnect vertically under a second semiconductor IC chip therein and at the bottom; (ii) a Fan-Out Interconnection Technology (FOIT) package, wherein the VIE chip or component is molded in a polymer molding compound and at a same horizontal level of a semiconductor IC chip which is also in the polymer molding compound. The VIE chip or component is used to connecting or coupling a metal interconnect over the semiconductor IC chip to a metal interconnect vertically under the semiconductor IC chip; (iii) a Chip-On-InterPoser (COIP) package, wherein the VIE chip or component and a semiconductor IC chip are flip-chip bonded to the interposer. The VIE chip or component is used to connecting or coupling the interposer to a metal interconnect over the semiconductor IC chip.

Another aspect of the disclosure provides a standard common wafer for the VIE chips or components. The VIE chip or component is for use in the chip package comprising (i) a single-chip package (comprising only one semiconductor IC chip), (ii) single-COC package or (iii) a multichip package (comprising a plurality of semiconductor IC chips or a plurality of COCs), as described above and to be described and specified below. The standard common wafers for the VIE chips or components may have a fixed pattern of design and layout for locations (x and y coordinates) of the micro metal pads or bumps on the TSVs, and may be diced or separated into VIE chips or components each with any desired size, dimension or shape and comprising any desired different number of the micro metal pads or bumps on the TSVs. A first type VIE chip or component obtained from a first standard common wafer has a first size, dimension and shape and comprises a first number of the micro metal pads or bumps, and, a second type VIE chip or component obtained from a second standard common wafer has a second size, dimension and shape and comprises a second number of the micro metal pads or bumps, wherein the first size, dimension and shape, and the first number of the micro metal pads or bumps are different from the second size, dimension and shape, and the second number of the micro metal pads or bumps, respectively, wherein the first and second standard common wafers have exact same design and layout. In some applications, the aspect ratio of length to width for a deiced or separated VIE chip or component may be between 2 and 10, between 4 and 10 or between 2 and 40. Assume that the width of a scribe line is $W_{sb}$, the space or separation between the scribe line and the micro metal pad or bump (for example, copper pad, pillar or bump, or solder bump) on the TSV at the edge or boundary of the VIE chip is $WB_{sbt}$, and the space or separation between two neighboring micro metal pads or bumps on the TSVs is $WB_{sptsv}$. $WB_{sptsv}$ is smaller than 50, 40 or 30 micrometers. In a case, if $WB_{sptsv}$ is greater than $W_{sb}+2WB_{sbt}$, the standard common wafer is designed and layout with micro metal pads or bumps on the TSVs populated regularly in the whole wafer with a fixed pitch and separation (space $WB_{sptsv}$) between two neighboring micro metal pads or bumps on the TSVs in x-direction and y-direction, respectively. The standard common VIE wafer may be cut or diced, through the space between two neighboring micro metal pads or bumps on the TSVs, to form a separated or diced VIE chip or component in a square or rectangular shape and with any size or dimension, and the separated or diced VIE chip may comprise any number of micro metal pads or bumps on the TSVs. In this case, in each separated or diced VIE chip or component, the distance between the edge of the diced VIE chip or component to the nearest micro metal pad or bump on the TSV (WBsbt) is smaller than $WB_{sptsv}$. For example, a standard common VIE wafer with a layout of given micro metal pads or bumps on the TSVs may be cut or diced into separated or diced VIE chips or components each with an array of M1 by N1 (M1×N1) micro metal pads or bumps on the TSVs, M1 and N1 are positive integers, and wherein N1<M1, 1<=N1<=15, and 25<=M1<=250; or N1<M1, 1<=N1<=10, and 15<=M1<=100. For example, a separated or diced VIE chip or component may comprise an array of 50 by 5, 150 by 5, 150 by 10, or 250 by 10 micro metal pads or bumps on the TSVs. In another case, if $WB_{sptsv}$ is equal to or smaller than $W_{sb}+2WB_{sbt}$, the standard common wafer is designed and layout with two alternatives: (1) with islands or regions of arrays of micro metal pads or bumps on the TSVs populated regularly in the whole wafer with reserved scribe lines. Each of the reserved scribe line has a fixed space or separation $WB_{spild}$ (equal to $W_{sb}+2WB_{sbt}$,) between two neighboring islands or regions of arrays of micro metal pads or bumps on the TSVs (that is between two neighboring micro metal pads or bumps on the TSVs across the reserved scribe line) in x-direction and y-direction, respectively, that is, there are two different separation spaces, $WB_{spild}$ and $WB_{sptsv}$, between two neighboring micro metal pads or bumps on the TSVs in a separated or diced VIE chip or component, in x-direction and y-direction, respectively, wherein $WB_{spild}$ is greater than $WB_{sptsv}$. As an example, $WB_{sod}$ is greater than 50, 40 or 30 micrometers, and $WB_{sptsv}$ is smaller than 50, 40 or 30 micrometers. The reserved scribe line between two neighboring islands or regions of arrays of micro metal pads or bumps on the TSVs may be used as a scribe line for dicing and cutting. The standard common VIE wafer may be cut or diced, through the reserved scribe lines, to form separated or diced VIE chips or components in square or rectangular shape and with various dimensions. In this case, the separated or diced chip or component comprises M×N islands or regions of arrays of micro metal pads or bumps on the TSVs (wherein M and N are positive integers, wherein $N<M$, $1<=N<=10$, and $2<=M<=20$) with the fixed space or separation $WB_{spild}$ between two neighboring islands or regions of arrays of micro metal pads or bumps on the TSVs, wherein, for example, $WB_{spild}$ is greater than 50, 40 or 30 micrometers, and $WB_{sptsv}$ is smaller than 50, 40 or 30 micrometer. As an example, the standard common VIE wafer with a given design and layout of islands or regions of arrays of micro metal pads or bumps on the TSVs may be cut or diced into a plurality of VIE chips or components, wherein each separated or diced VIE chip or component comprises one or a plurality of islands or regions of arrays of micro metal pads or bumps on the TSVs, for example, 3 by 1 islands or regions of arrays of micro metal pads or bumps on the TSVs, 6 by 1 islands or regions of arrays of micro metal pads or bumps on the TSVs, 4 by 2 islands or regions of arrays of micro metal pads or bumps on the TSVs, 8 by 2 islands or regions of arrays of micro metal pads or bumps on the TSVs, or 10 by 3 islands or regions of arrays of micro metal pads or bumps on the TSVs. If the separated or diced VIE chip or component comprises a plurality of (more than one) islands or regions of arrays of micro metal pads or bumps on the TSVs, there is the reserved scribe line between two neighboring islands or regions of arrays of micro metal pads or bumps on the TSVs therein. The diced or separated VIE chip or component may comprise repetitive islands or regions of arrays of micro metal pads or bumps on the TSVs with each island or region of arrays of micro metal pads or bumps on the TSVs comprising an array of M2 by N2 micro metal pads or bumps on TSVs, wherein M2 and N2 are positive integers, $N2<M2$, $1<=N2<=15$, and $25<=M2<=250$; or, $N2<M2$, $1<=N2<=10$, and $15<=M2<=100$; for example, an array of 30 by 2 micro metal pads or bumps on the TSVs, an array of 60 by 2 micro metal pads or bumps on the TSVs, an array of 50 by 5 micro metal pads or bumps on the TSVs, or an array of 100 by 5 micro metal pads or bumps on the TSVs; (2) with micro metal pads or bumps on the TSVs populated regularly in the whole wafer with a fixed pitch and separation (space $WB_{sptsv}$) between two neighboring micro metal pads or bumps on the TSVs in x-direction and y-direction, respectively. The standard common VIE wafer may be cut or diced through the micro metal pads or bumps on the TSVs to form separated or diced VIE chips or components in a square or rectangular shape and with any dimension, and the separated or diced VIE chip or component may comprise any number of micro metal pads or bumps on the TSVs. In this case, for each separated or diced VIE chip or component, $WB_{sbt}$ may be equal to or greater than zero, and is smaller than $WB_{sptsv}$, and $WB_{sptsv}$ is smaller than 50, 40 or 30 micrometers.

The standard common wafers for the VIE chips or components, as described and specified above, may be stored in the inventory, and sawed or diced to form separated VIE chips or components with different sizes for different vertical interconnection requirements upon business orders or requests. Therefore, the cycle time of manufacturing the VIE chips or components is reduced. Since the standard common wafers are standard commodity products and can be fabricated with volume production, the manufacturing cost the VIE chips or components is reduced. The VIE chip or component is configured for use in: (i) Chip-on-chip (COC) unit or package for connecting or coupling a first semiconductor IC chip therein and at the top to a metal interconnect vertically under a second semiconductor IC chip therein and at the bottom; (ii) a Fan-Out Interconnection Technology (FOIT) package, wherein the VIE chip or component is molded in a polymer molding compound and at a same horizontal level of a semiconductor IC chip which is also in the polymer molding compound. The VIE chip or component is used to connecting or coupling a metal interconnect over the semiconductor IC chip to a metal interconnect vertically under the semiconductor IC chip; (iii) a Chip-On-InterPoser (COIP) package, wherein the VIE chip or component and a semiconductor IC chip are flip-chip bonded to the interposer. The VIE chip or component is used to connecting or coupling the interposer to a metal interconnect over the semiconductor IC chip.

Another aspect of the disclosure provides a standard common wafer for Fineline Interconnection Bridge (FIB) chips or components. The FIB chip or component for the chip package, wherein the FIB chip or component comprises a silicon substrate with high density interconnects, metal vias and fine pitch metal pads, on or over the silicon substrate. The FIB chip or component is for use in the chip package comprising (i) a single-chip package (comprising only one semiconductor IC chip), (ii) single-COC package or (iii) a multichip package (comprising a plurality of semiconductor IC chips or a plurality of COCs), as described above and to be described and specified below. The FIB chip or component comprises: (1) a silicon substrate; (2) a First Interconnection Scheme on or of the Interconnection Bridge (FISIB) on or over the silicon substrate formed by the damascene copper electroplating process; (3) a Second Interconnection Scheme of the Interconnection Bridge (SISIB) on or over the FISIB structure, formed by the embossing copper electroplating process; (4) micro copper pads, pillars or bumps, or solder bumps (micro metal pads or bumps) on or over the SISIB and/or FISIB. The FIB chip or component in the chip package is used for interconnection between the semiconductor IC chips (or COCs), between the semiconductor IC chips (or COCs) and the VIE chips, between a semiconductor IC chip and a VIE chip or component, wherein the semiconductor IC chips (or COCs) and the VIE chips or components are flip-chip-assembled, bonded or packaged on or over the FIB chip or component by solder reflow bonding, thermal compression bonding or copper-pad-to-copper-pad oxide-to-oxide direct bonding.

The First Interconnection Scheme on or of the Interconnection Bridge (FISIB) on or over the silicon substrate comprises metal lines or traces, and metal vias (between two neighboring metal layers) which are formed by the single damascene copper processes or the double damascene copper processes. The FISIB may comprise 2 to 10 layers, or 3 to 6 layers of interconnection metal layers. The metal lines or traces of the interconnection metal layers of FISIB have the adhesion layer (Ti or TiN, for example) and the copper seed layer at both the bottom and the sidewalls of the metal lines or traces.

The metal lines or traces in the FISIB are coupled or connected to another chip or component in the chip package. The thickness of the metal lines or traces of the FISIB, either formed by the single-damascene process or by the double-damascene process, is, for example, between 3 nm and 500 nm, between 10 nm and 1,000 nm, or between 10 nm and 2,000 nm, or, thinner than or equal to 50 nm, 100 nm, 200 nm, 300 nm, 500 nm, 1,000 nm, 1,500 nm or 2,000 nm. The minimum width of the metal lines or traces of the FISIB is, for example, equal to or smaller than 50 nm, 100 nm, 150 nm, 200 nm, 300 nm, 500 nm, 1,000 nm, 1,500 nm or 2,000 nm. The minimum space between two neighboring metal lines or traces of the FISIB is, for example, equal to or smaller than 50 nm, 100 nm, 150 nm, 200 nm, 300 nm, 500 nm, 1,000 nm, 1,500 nm or 2,000 nm. The minimum pitch of the metal lines or traces of the FISIB is, for example, equal to or smaller than 100 nm, 200 nm, 300 nm, 400 nm, 600 nm, 1,000 nm, 3,000 nm or 4,000 nm. The thickness of the inter-metal dielectric layer has a thickness, for example, between 3 nm and 500 nm, between 10 nm and 1,000 nm, or between 10 nm and 2,000 nm, or, thinner than or equal to 50 nm, 100 nm, 200 nm, 300 nm, 500 nm, 1,000 nm or 2,000 nm. The metal lines or traces of the FISIB may be used as the programmable interconnection.

The Second Interconnection Scheme on or of the Interconnection Bridge (SISIB) on or over the FISIB structure is formed. The SISIB comprises multiple interconnection metal layers, with an inter-metal dielectric layer between two neighboring interconnection metal layers. The metal lines or traces, and the metal vias are formed by the embossing electroplating copper processes. The SISIB may comprise 1 to 5 layers, or 1 to 3 layers of interconnection metal layers. The metal lines or traces of the interconnection metal layers of SISIB have the adhesion layer (Ti or TiN, for example) and the copper seed layer at the bottoms of the metal lines or traces, but not at a sidewall of the metal lines or traces. Alternatively, the SISIB may be omitted, and the FIB chip or component only has FISIB interconnection scheme on the silicon substrate. Alternatively, the FISIPB on or of the FIB chip or component may be omitted, and the FIB chip or component only has SISIB interconnection scheme on the silicon substrate.

The thickness of the metal lines or traces of SISIB is between, for example, 0.3 μm and 20 μm, 0.5 μm and 10 μm, 1 μm and 5 μm, 1 μm and 10 μm, or 2 μm and 10 μm; or thicker than or equal to 0.3 μm, 0.5 μm, 0.7 μm, 1 μm, 1.5 μm, 2 μm or 3 μm. The width of the metal lines or traces of SISIB is between, for example, 0.3 μm and 20 μm, 0.5 μm and 10 μm, 1 μm and 5 μm, 1 μm and 10 μm, or 2 μm and 10 μm; or wider than or equal to 0.3 μm, 0.5 μm, 0.7 μm, 1 μm, 1.5 μm, 2 μm or 3 μm. The thickness of the inter-metal dielectric layer has a thickness between, for example, 0.3 μm and 20 μm, 0.5 μm and 10 μm, 1 μm and 5 μm, or 1 μm and 10 μm; or thicker than or equal to 0.3 μm, 0.5 μm, 0.7 μm, 1 μm, 1.5 μm, 2 μm or 3 μm. The metal lines or traces of SISIB may be used as the programmable interconnection.

Micro copper pads, pillars or bumps, or solder bumps are formed on or over the SISIB or FISIB: (i) on the top surface of the top-most interconnection metal layer of SISIB, exposed in openings in the topmost insulating dielectric layer of the SISIB, or (ii) on the top surface of the top-most interconnection metal layer of FISIB, exposed in openings in the topmost insulating dielectric layer of the FISIB in the case that the SISIB is omitted. An embossing electroplating copper process, as described and specified in above paragraphs, is performed to form the micro copper pads, pillars or bumps, or solder bumps on or over the SISIB or FISIB.

The FIB chip or component comprises a plurality of metal interconnects (provided by the FISIB and/or SISIB) on the silicon substrate and two groups of micro metal pads or bumps separated by a space $S_{gg}$, wherein a left group of the two groups is for assembling or bonding a first chip or component thereon, and a right group of the two groups is for assembling or bonding a second chip or component thereon. Each micro pad or bump in the left group is connected to a corresponding micron pad or bump of the right group through a metal interconnect (of the FISIB and/or SISIB).

The standard common wafers for the FIB chips or components may have a fixed pattern of design and layout for the plurality of metal interconnects and/or for locations (x and y coordinates) of the micro metal pads or bumps at two ends of each of the plurality of metal interconnects on the FIB chips or components. The standard common wafers may be diced or separated into FIB chips or components each has any desired size, dimension or shape and comprising any number of the metal interconnects and the micro metal pads or bumps at two ends of each metal interconnects. A first type FIB chip or component obtained from a first standard common wafer has a first size, dimension and shape and comprises a first number of the micro metal pads or bumps, and, a second type FIB chip or component obtained from a second standard common wafer has a second size, dimension and shape and comprises a second number of the micro metal pads or bumps, wherein the first size, dimension and shape, and the first number of the micro metal pads or bumps are different from the second size, dimension and shape, and the second number of the micro metal pads or bumps, respectively, wherein the first and second standard common wafers have exact same design and layout. Each FIB chip or component comprises an array of micro pads or bumps comprising the left group and the right group with a space $S_{gg}$ between them. The space ($S_{gg}$) between the two groups of the FIB is the sum of (i) a space ($S_{cc}$) between first and second chips or components to be flip chip packaged on or over the left and right groups, respectively, of the micro metal pads or bumps of the FIB, (ii) a space ($S_{lbre}$) from the most right column of an array of the left group of micro metal pads or bumps to the right edge of the first chip or component and (iii) a space ($S_{rble}$) from the most left column of an array of the right group of micro metal pads or bumps to the left edge of the second chip or component; that is $S_{gg}=S_{cc}+S_{lbre}+S_{rble}$, wherein the space $S_{cc}$ may range from 20 micrometers to 300 micrometers, or from 20 micrometers to 100 micrometers, each of the spaces $S_{lbre}$ and $S_{rble}$ may range from 20 micrometers to 100 micrometers, or from 20 micrometers to 50 micrometers, and the space $S_{gg}$ may range from 60 micrometers to 500 micrometers, or from 60 micrometers to 200 micrometers. In some applications, the aspect ratio of length to width for a deiced or separated FIB chip or component may be between 1 and 10, between 4 and 10 or between 2 and 40. Assume that the width of a scribe line is $W_{sb}$, the space or separation between the scribe line and the micro metal pad or bump at the edge or boundary of the FIB chip or component is $WB_{sbb}$, and the space or separation between two neighboring micro metal pads or bumps is $WB_{sp}$. $WB_{sp}$ is smaller than 50, 40 or 30 micrometers. In a case, if $WB_{sp}$ is greater than $W_{sb}+2WB_{sbb}$, the standard common wafer is designed and layout with micro metal pads or bumps populated regularly in the whole wafer with a fixed pitch and separation (space $WB_{sp}$) between two neighboring micro metal pads or bumps in x-direction and y-direction, respectively. The standard common FIB wafer may be cut or diced, through the space between two neighboring micro metal pads or bumps, to form a separated or diced FIB chip or component in a square or rectangular shape and with any dimension, and the separated or diced FIB chip may comprise any number of micro metal pads or bumps. In this case, in each separated or diced FIB chip or component, the distance between the edge of the diced FIB chip or component to the nearest micro metal pad or bump ($WB_{sbb}$) is smaller than $WB_{sp}$. For example, a standard common FIB wafer with a given layout of micro metal pads or bumps may be cut or diced into separated or diced FIB chips or components each with an array of M1 by N1 (M1×N1) micro metal pads or bumps, wherein M1 and N1 are positive integers, 2<=N1<=100, and 25<=M1<=250; or 2<=N1<=50, and 15<=M1<=100. The micro metal pads or bumps are separated in two groups (the left group and the right group), and each group comprises an array of M1 by N1/2 micro metal pads or bumps. For example, a separated or diced FIB chip or component may comprise an array of 50 by 20, 150 by 20, 150 by 10, or 250 by 20 micro metal pads or bumps. In another case, if $WB_{sp}$ is equal to or smaller than $W_{sb}$+2$WB_{sbb}$, the standard common wafer is designed and layout with two alternatives: (1) with sections or regions of arrays of micro metal pads or bumps populated regularly in the whole wafer with reserved scribe lines in the x direction (a direction perpendicular to a direction of the most left column of the first group of micro metal pads or bumps and a direction of the right most column of the right group of micro metal pads and bumps. Note that the reserved scribe lines are running in the x direction.) A space or separation $WB_{spse}$ (equal to $W_{sb}$+2$WB_{sbb}$,) is between two neighboring sections or regions of arrays of micro metal pads or bumps and across one of the reserved scribe lines in the x direction. There are two different separation spaces in the y direction, $WB_{spse}$ and $WB_{sp}$, between two neighboring micro metal pads or bumps in a separated or diced VIE chip or component, wherein $WB_{spse}$ is greater than $WB_{sp}$. As an example, $WB_{spse}$ is greater than 50, 40 or 30 micrometers, and WBsp is smaller than 50, 40 or 30 micrometers. The reserved scribe line between two neighboring sections or regions of arrays of micro metal pads or bumps may be used as a scribe line for dicing, sawing and cutting. The standard common FIB wafer may be cut, sawed or diced, through the reserved scribe lines, to form separated or diced FIB chips or components in square or rectangular shape and with various dimensions. In this case, the separated or diced chip or component comprises M sections or regions of arrays of micro metal pads or bumps (wherein M are positive integers, 1<=M<=20) with the space or separation $WB_{spse}$ between two neighboring stripes or regions of arrays of micro metal pads or bumps. As an example, the standard common FIB wafer with a given design and layout of sections or regions of arrays of micro metal pads or bumps may be cut, sawed or diced into a plurality of FIB chips or components, wherein each separated or diced FIB chip or component comprises one or a plurality of sections or regions of arrays of micro metal pads or bumps, for example, 2 sections or regions of arrays of micro metal pads or bumps, 3 sections or regions of arrays of micro metal pads or bumps, or 5 sections or regions of arrays of micro metal pads or bumps. If the separated or diced FIB chip or component comprises a plurality of (more than one) sections or regions of arrays of micro metal pads or bumps, there is at least one reserved scribe line between two neighboring sections or regions of arrays of micro metal pads or bumps therein. The diced or separated FIB chip or component may comprise repetitive sections or regions of arrays of micro metal pads or bumps with each section or region of arrays of micro metal pads or bumps comprising an array of M2 by N2 micro metal pads or bumps, wherein M2 and N2 are positive integers, 2<=N2<=100, and 10<=M2<=50; or 2<=N2<=50 and 15<=M2<=30; for example, an array of 30 by 6 micro metal pads or bumps, an array of 30 by 20 micro metal pads or bumps, an array of 50 by 8 micro metal pads or bumps, or an array of 100 by 8 micro metal pads or bumps; (2) with micro metal pads or bumps populated regularly in the whole wafer with a fixed pitch and separation (space $WB_{sp}$) between two neighboring micro metal pads or bumps in the y-direction. The standard common FIB wafer may be cut, sawed or diced (1) through the micro metal pads or bumps along the x direction and (2) through the scribe line along the y direction, to form separated or diced FIB chips or components in a square or rectangular shape and with any dimension, and the separated or diced FIB chip or component may comprise any number of micro metal pads or bumps. In this case, for each separated or diced FIB chip or component, $WB_{sbb}$ in the y direction may be equal to or greater than zero, and is smaller than $WB_{sp}$ in the y direction, and $WB_{sp}$ in the y direction is smaller than 50, 40 or 30 micrometers.

The standard common wafers for the FIB chips or components, as described and specified above, may be stored in the inventory, and sawed or diced to form separated FIB chips or components with different sizes for different horizontal interconnection requirements upon business orders or requests. Therefore, the cycle time of manufacturing the FIB chips or components is reduced. Since the standard common wafers are standard commodity products and can be fabricated with volume production, the manufacturing cost the FIB chips or components is reduced. The FIB chip or component is configured for use in: (i) enhancing the interconnection density of the Printed Circuit Board (PCB) or the Ball-Grid-Array (BGA) substrate by embedding the FIB chip or component in the PCB or BGA substrate. The embedded FIB chip or component is used to connect or couple two semiconductor IC chips flip-chip bonded on or over it; (ii) replacing the interposer in the COIP package by a molded polymer interposer formed by molding the FIB chip or component and a first semiconductor IC chip in polymer molding compound. Second and third semiconductor IC chips are flipchip bonded to the molded polymer interposer. The FIB chip and component couples or connects the second semiconductor IC chip to the third semiconductor IC chip.

Another aspect of the disclosure provides a chip-on-chip component or package (COC) configured in a format like the one or the plurality of semiconductor IC chips in the chip package, for packaging in the chip package as described above, or to be described and specified below. The COC has micro metal pads, pillars or bumps exposed at a surface thereof, like the micro metal pads, pillars or bumps at the surface of the semiconductor IC chips. The micro metal pads, pillars or bumps exposed at the surface of the COC are configured for the chip package as described above, or to be described and specified below.

The COC comprises a first semiconductor IC chip with the frontside (with transistors) facing up, and a second semiconductor IC chip with the frontside (with transistors) facing down, wherein the second semiconductor IC chip is on or over and bonded to the first semiconductor IC chip, wherein the area of the second semiconductor IC chip is smaller than that of the first semiconductor IC chip, and the boundary (four edges) of the second semiconductor IC chip is within the boundary (four edges) of the first semiconductor IC chip. A VIE chip or component may be further on or over and bonded to the first semiconductor IC chip, and the boundary (four edges) of the A VIE chip or component is also within the boundary (four edges) of the first semiconductor IC chip. The second semiconductor IC chip comprises through silicon vias (TSVs) in its silicon substrate. Alternatively, the second semiconductor IC chip may not comprise any through silicon vias (TSVs) in its silicon substrate. The first and second semiconductor IC chips may comprise (i) the standard commodity FPGA chip, (ii) an auxiliary or supporting (AS) IC chip, wherein the AS IC chip comprises a cryptography or security IC chip, I/O or control IC chip, power management IC chip, intellectual property IC chip (IP IC chip) and/or Innovated ASIC or COT (abbreviated as IAC below) IC chip, (iii) processing and/or computing IC chip, for example CPU, GPU, DSP, TPU, APU or ASIC chip, and/or (iv) memory IC chip, for a first example, the non-volatile NAND and/or NOR flash chip, and/or High Bandwidth DRAM or SRAM Memory (HBM) chip. For a first example, a first type COC may comprise (a) the first semiconductor chip comprising the standard commodity FPGA chip, or the processing and/or computing IC chip, for example CPU, GPU, DSP, TPU, APU or ASIC chip, and (b) the second semiconductor IC chip comprising the AS IC chip comprising the cryptography or security IC chip, I/O or control IC chip, power management IC chip, intellectual property IC chip (IP IC chip) or Innovated ASIC or COT (abbreviated as IAC below) IC chip, or the memory IC chip, for example, the non-volatile NAND and/or NOR flash chip, or High Bandwidth DRAM or SRAM Memory (HBM) chip. In the first example, the AS IC chip (the second semiconductor IC chip) in the COC is working with, cooperating with, or assisting the operation of the standard commodity FPGA chip, or the processing and/or computing IC chip (the first semiconductor IC chip). In the first example, the COC may be a (i) FPGA/AS COC or logic/AS COC, or (ii) a FPGA/HBM COC or logic/HBM COC. For a second example, a first type chip-on-chip component or package may comprise (a) the first semiconductor chip comprising the AS IC chip comprising the cryptography or security IC chip, I/O or control IC chip, power management IC chip, intellectual property IC chip (IP IC chip) or Innovated ASIC or COT (abbreviated as IAC below) IC chip, or the memory IC chip, for example, the non-volatile NAND and/or NOR flash chip, and/or High Bandwidth DRAM or SRAM Memory (HBM) chip, and (b) the second semiconductor IC chip comprising the standard commodity FPGA chip, or the processing and/or computing IC chip, for example CPU, GPU, DSP, TPU, APU or ASIC chip. In the second example, the COC may be a (i) FPGA/AS COC or logic/AS COC, or (ii) a FPGA/HBM COC or logic/HBM COC. In the second example, the COC may be a (i) FPGA/AS COC or logic/AS COC, or (ii) a FPGA/HBM COC or logic/HBM COC. In the second example, the AS IC chip (the first semiconductor IC chip) in the COC is working with, cooperating with, or assisting the operation of the standard commodity FPGA chip, or the processing and/or computing IC chip (the second semiconductor IC chip). The COC unit or package may be used for a logic drive if the COC comprises one or a plurality of standard commodity Field Programmable Gate Array (FPGA) IC chips.

The key process steps of forming the COC are: (i) Providing (a) the diced and separated VIE chip or component with solder bumps at its front side and exposed surfaces of TSVs in its silicon substrate at the backside, and (b) the separated or diced second semiconductor IC chip also with solder bumps at its front side and exposed surfaces of TSVs in its silicon substrate at its back side. Then, flip-chip bonding the separated or diced second semiconductor IC chip and diced and separated VIE chip or component on a wafer comprising the first semiconductor IC chips by flip-chip solder reflow bonding, thermal compression bonding, wherein the first semiconductor IC chip comprises copper pads at its front surface. A Backside Interconnection Scheme of the logic Drive or Device (BISD) is formed on the exposed surfaces of TSVs in the VIE chip or component and the backside (the side without transistors) of the second semiconductor IC chip. Alternatively, the diced and separated VIE chip or component may have exposed surfaces of TSVs in its silicon substrate at the frontside and backside, and the separated or diced second semiconductor IC chip with copper pads at its frontside and exposed surfaces of TSVs in its silicon substrate at its back side. Then, flip-chip bonding the separated or diced second semiconductor IC chip and diced and separated VIE chip or component on a wafer comprising the first semiconductor IC chips by flip-chip oxide-to-oxide copper-pad-to-copper-pad direct bonding, wherein the frontside (with transistors) of the first semiconductor IC chip has copper pads and is facing up, and the frontside (with transistors) of the second semiconductor IC chip has copper pads is facing down. The pitch between two micro metal bonds (based on the pitch of the micro solder bumps at the frontside of the second semiconductor IC chips and the VIE chip or component) formed by the thermal compression bonding may be between 5 and 30 micrometers or between 10 and 25 micrometers. The pitch between two micro metal bonds (based on the pitch of the micro copper pads at the frontside of the second semiconductor IC chips and the pitch of the exposed TSV surfaces at the front side of the VIE chip or component) formed by the oxide-to-oxide copper-pad-to-copper-pad direct bonding may be between 1 and 10 micrometers or 4 and 7 micrometers; (ii) applying a material, polymer, resin, or compound (a) on or over the wafer comprising the first semiconductor IC chips, (b) between the second semiconductor IC chip and the VIE chip or component, (iii) on or over the backsides of the second semiconductor IC chip and the VIE chip or component; (iii) polishing, grinding or CMP the surface at the backside of the wafer until the top surfaces of TSVs in the silicon substrates of the second semiconductor IC chip and the VIE chip or component are exposed; (iv) forming the Backside Interconnection Scheme of the logic Drive or Device (BISD) on the exposed surfaces of TSVs in the VIE chip or component and the second semiconductor IC chip; (v) forming micro copper pads, pillars or bumps, or solder bumps at the top of the TSVs; (iv) the wafer is then separated or diced to form the separated COC.

Another aspect of the disclosure provides a Fan-Out Interconnection Technology (FOIT) with Frontside Interconnection Scheme of logic Drive or Device (abbreviated as FISD) and Backside metal Interconnection Scheme at the backside of the chip-packaged logic drive or device (abbreviated as BISD) for making or fabricating a chip package using the VIE chips or components. The chip package may be used for a logic drive if the chip package comprises one or a plurality of standard commodity Field Programmable Gate Array (FPGA) IC chips. The chip package is formed by the following process steps:

(1) Providing a chip carrier, holder, molder or substrate, semiconductor IC chips, COCs and/or VIE chips or components, wherein the semiconductor IC chips may comprise TSVs; alternatively, the semiconductor IC chips may not comprise TSVs. The semiconductor IC chip or COC will be abbreviated as SIC/COC. The semiconductor IC chip and the COC have the same format with copper pads, pillars or bumps at their frontside surface (for the semiconductor IC chip, the frontside is the side with transistors; for the COC, the frontside is the backside of the second semiconductor IC chip (with TSVs) in the COC). The separated or diced VIE chip or component has exposed TSV surfaces at the frontside, and copper pads, pillars or bumps at the backside. In the separated or diced VIE chip or component, the copper pads, pillars or bumps are on the backside surfaces of one or a plurality of the TSVs and an oxide layer, wherein the oxide layer is on the backside of the silicon substrate and the backside surfaces of one or a plurality of the TSVs, and wherein the copper pads, pillars or bumps are connecting or coupling to the one or the plurality of backside surfaces of one or a plurality of the TSVs through one or a plurality of openings in the oxide layer. In the separated or diced VIE chip or component, a plurality of TSVs vertically under a single copper pad, pillar or bump at the frontside of the separated or diced VIE chip or component are connected or coupled to each other through the single copper pad, pillar or bump. Then placing, fixing or attaching the backsides of SIC/COCs and VIE chips or components to and on the carrier, holder, molder or substrate. The carrier, holder, molder or substrate may be in a wafer format (with 8", 12" or 18" in diameter), or, in a panel format in the square or rectangle format (with a width or a length greater than or equal to 20 cm, 30 cm, 50 cm, 75 cm, 100 cm, 150 cm, 200 cm or 300 cm). The material of the chip carrier, holder, molder or substrate may be silicon, metal, ceramics, glass, steel, plastics, polymer, epoxy-based polymer, or epoxy-based compound. The SIC/COCs and the VIE chips or components are placed, fixed or attached to the carrier, holder, molder or substrate (with the frontsides of the SIC/COCs and the VIE chips or components with copper pads, pillars or bumps facing up). The VIE chips or components and the SIC/COCs are on a same horizontal plane (coplanar). Each of the VIE chips or components is located in a space between two neighboring SIC/COCs. The semiconductor IC chips comprise (i) the standard commodity FPGA chip, (ii) an auxiliary or supporting (AS) IC chip, wherein the auxiliary or supporting IC chip comprises a cryptography or security IC chip, I/O or control IC chip, power management IC chip, intellectual property IC chip (IP IC chip) or Innovated ASIC or COT (abbreviated as IAC below) IC chip, (iii) processing and/or computing IC chip, for example CPU, GPU, DSP, TPU, APU or ASIC chip, and/or (iv) memory IC chip, for example, the non-volatile NAND and/or NOR flash chip, and/or High Bandwidth DRAM or SRAM Memory (HBM) chip. The AS IC chip (the second semiconductor IC chip) in the FOIT chip package is working with, cooperating with, or assisting the operation of the standard commodity FPGA chip, or the processing and/or computing IC chip (the first semiconductor IC chip). The COCs are as described and specified above. The SIC/COCs packaged in the chip package comprise micro metal pads, pillars or bumps, (for example, copper pads, pillars or bumps, or solder bumps) on their surfaces (the frontsides); wherein the frontside of the one or the plurality of the semiconductor IC chips have transistors, and the frontside of the one or the plurality of the COC is the backside (without transistors) of the second semiconductor IC chips in the COC. The frontside of the SIC/COCs (the side or surface with micro metal pads, pillars or bumps) is facing up, and the backside of the SIC/COCs (the side or surface without micro metal pads, pillars or bumps) is placed, fixed, held or attached on or to the carrier, holder, molder or substrate. The frontside of the VIE chips or components (the side or surface with exposed TSV frontside surfaces) is facing up, and the backside of the VIE chips or components (the side or surface with micro copper pads, pillars or bumps) is placed, fixed, held or attached on or to the carrier, holder, molder or substrate.

(2) Applying a material, resin, polymer or compound to fill the gaps or spaces between the SIC/COCs, between the VIE chips or components, and between the SIC/COCs and the VIE chips or components, up to a level sufficiently at a horizontal level covering the top-most frontside surfaces of the SIC/COCs and the VIE chips or components by methods, for example, spin-on coating, screen-printing, dispensing or molding in the wafer or panel format. Applying a CMP, polishing or grinding process to planarize the surface of the applied material, resin or compound, and until a level where the micro metal pads, pillars or bumps of the SIC/COCs and the exposed TSV surfaces of VIE chips or components are fully exposed.

(3) Depositing by a wafer or panel processing a first insulating dielectric layer (for example, a polymer layer) on or over (i) the front side (the side with micro metal pads, pillars or bumps) of the SIC/COCs and the VIE chips or components, (ii) exposed micro copper pads or pillars, or solder bumps at the front side of the SIC/COCs and the VIE chips or components, and (iii) the material, resin or compound in the spaces or gaps between the SIC/COCs, between the VIE chips or components, and between the SIC/COCs and the VIE chips or components. Then forming openings in the first insulating dielectric layer to expose the micro metal pads, pillars or bumps at the frontside of the SIC/COCs and the VIE chips or components. The first insulating dielectric layer comprises a polymer material includes, for example, polyimide, BenzoCycloButene (BCB), parylene, polybenzoxazole (PBO), epoxy-based material or compound, photo epoxy SU-8, elastomer, silicon organic glass (SOG) or silicone.

(4) Forming a Frontside Interconnection Scheme in, on or of the logic Drive or Device (FISD) on or over (i) the first insulating dielectric layer deposited as described above, (ii) the exposed micro metal pads, pillars or bumps at the front side of the SIC/COCs and the exposed TSV surfaces of VIE chips or components, by a wafer or panel processing. The FISD comprises one or a plurality of interconnection metal layers, (for example, 1 to 5 or 1 to 8 interconnection metal layers) with inter-metal dielectric layers between two neighboring layers of the plurality of interconnection metal layers. The metal lines or traces of the interconnection metal layers of the FISD are over the SIC/COCs and the VIE chips or components and extend horizontally across the edges of the SIC/COCs and the VIE chips or components. The metal lines or traces of the interconnection metal layers of the FISD are formed using embossing copper electroplating processes. The interconnection metal lines or traces of FISD have an adhesion layer (Ti or TiN, for example) and the copper seed layer at the bottom of the metal lines or traces, but not at a sidewall of metal lines or traces of the interconnection metal layers of the FISD. The inter-metal dielectric layers may comprise polyimide, BenzoCycloButene (BCB), parylene, polybenzoxazole (PBO), epoxy-based material or compound, photo epoxy SU-8, elastomer, or silicone. The polymer may be, for example, photosensitive polyimide/PBO PIMEL™ supplied by Asahi Kasei Corporation, Japan; or epoxy-based molding compounds, resins or sealants provided by Nagase ChemteX Corporation, Japan.

The thickness of the metal lines or traces of the FISD is between, for example, 0.3 μm and 30 μm, 0.5 μm and 20 μm, 1 μm and 10 μm, or 0.5 μm to 5 μm, or thicker than or equal to 0.3 μm, 0.5 μm, 0.7 μm, 1 μm, 1.5 μm, 2 μm, 3 μm or 5

μm. The width of the metal lines or traces of the FISD is between, for example, 0.3 μm and 30 μm, 0.5 μm and 20 μm, 1 μm and 10 μm, or 0.5 μm to 5 μm, or wider than or equal to 0.3 μm, 0.5 μm, 0.7 μm, 1 μm, 1.5 μm, 2 μm, 3 μm or 5 μm. The thickness of the inter-metal dielectric layer of the FISD is between, for example, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm.

(5) Forming copper pads, pillars or bumps, or solder bumps (for example, copper pads, pillars or bumps, or solder bumps) on or over the top-most insulating dielectric layer of the FISD, and the exposed top surfaces of the top-most interconnection metal layer of the FISD in openings of the top-most insulating dielectric layer of the FISD, by performing an embossing electroplating copper process.

(6) Removing the carrier, holder, molder or substrate to expose micro copper pads, pillars or bumps of the VIE chips or components.

(7) Separating, cutting or dicing the wafer or panel, including separating, cutting, sawing or dicing through materials or structures between two neighboring chip packages. The material (for example, polymer) filling gaps or spaces between chips or components of two neighboring chip packages is separated, cut, sawed or diced to form individual unit of the chip package.

Alternatively, a Backside metal Interconnection Scheme at the backside of the chip-packaged logic drive or device (BISD) may be further formed, using the wafer or panel processes, on the backside of the chip package. The process steps are the same as above, except:

In Step (1), the separated or diced VIE chip or component provided has exposed TSV surfaces at backside surfaces, instead of copper pads, pillars or bumps at the backside.

In Step (5) Forming copper pads (not including solder bumps) on or over the top-most insulating dielectric layer of the FISD, and the exposed top surfaces of the top-most interconnection metal layer of the FISD in openings of the top-most insulating dielectric layer of the FISD, by performing an embossing electroplating copper process.

In Step (6), Removing the carrier, holder, molder or substrate to exposed the exposed TSV surfaces at backside surfaces of VIE chip or component.

And continuing process as follows:

(7) (now turning the whole structure upside down) Depositing a second insulating dielectric layer (for example a polymer layer) on the top side (the opposite side of the side with FISD) of the chip package; that is, on or over (i) the exposed backside of the semiconductor IC chips (or COCs), (ii) the exposed backside of the VIE chips or components and (iii) the spaces or gaps between the semiconductor IC chips (or COCs), between the VIE chips or components, and between the semiconductor IC chips (or COCs) and the VIE chips or components. Forming openings in the second insulating dielectric layer to expose the exposed surfaces of the TSVs of the VIE chips or components;

(8) Forming a Backside metal Interconnection Scheme at the backside of the chip-packaged logic drive or device (abbreviated as BISD in below) on or over the second insulating dielectric layer, and the exposed surfaces (of the TSVs in the VIE chips or components) in the openings in the second insulating dielectric layer. The BISD is on or over (i) the exposed surfaces (of the TSVs in the VIE chips or components) in the openings in the second insulating dielectric layer, (ii) the exposed backside of the semiconductor IC chips (or COCs), (iii) the exposed backside of the VIE chips or components and (iv) the spaces or gaps between the semiconductor IC chips (or COCs), between the VIE chips or components, and between the semiconductor IC chips (or COCs) and the VIE chips or components. The BISD may comprise metal lines, traces, or planes in one or a plurality of interconnection metal layers (for example, 1 to 6 or 1 to 4 interconnection metal layers), and is formed on or over the backsides of the semiconductor IC chips and the VIE chips or components, or, on or over the backsides of the COC and the VIE chips or components. The metal lines or traces of the interconnection metal layers of the BISD are over the SIC/COCs and the VIE chips or components and extend horizontally across the edges of the SIC/COCs or the VIE chips or components. The BISD may be formed using the same or similar process steps and materials as in forming the FISD as described above. The BISD provides additional interconnection metal layer or layers at the backside of the chip package.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

(9) Forming copper or nickel pads, or, copper pillars or bumps on or over exposed surfaces of the top-most metal interconnection layer (of the BISD) at the bottom of openings in the top-most insulting dielectric layer of the BISD. The copper or nickel pads, or, copper pillars or bumps in an area array at the top of the chip package including at locations vertically over the backside of the SIC/COCs of the chip package. The copper or nickel pads, or copper pillars or bumps are formed by performing an embossing electroplating copper process.

(10) (now turning the whole structure upside down) Forming solder bumps (for example, on or over the copper pads on or over the FISD, by performing solder ball implant process using a screen for dropping solder balls on the copper pads on or over the FISD. A solder reflow process is then performed to form the solder bumps.

(11) Separating, cutting, sawing or dicing the finished wafer or panel, including separating, cutting or dicing through materials or structures between two neighboring chip packages. The material (for example, polymer) filling gaps or spaces between chips or components of two neighboring chip packages is separated, cut or diced to form individual unit of the chip package.

In the separated, cut or diced individual unit of the chip package, the copper or nickel pads, or, copper pillars or bumps, in an area array at its backside (the opposite side of FISD side) are connected or coupled to a transistor (at the same side as FISD side) of the SIC/COCs therein through the TSVs of the VIE chips or components therein. The TSVs of the VIE chips or components are used for connecting or coupling circuits or components (for example, the FISD) at the frontside of the chip package to that (for example, the BISD) at the backside of the chip package. A copper pad, pillar or bump, or solder bump of the copper pads, pillars or bumps, or solder bumps in an area array at the frontside (the FISD side) of the separated or diced chip package may be vertically under a SIC/COCs of the SIC/COCs, and couple or connect (for signal, clock, power supply Vcc, or ground reference Vss) to a copper or nickel pad, copper pillar or bumps of the copper or nickel pads, copper pillars or bumps vertically over the SIC/COC through a metal interconnect of the FISD, the TSV of the VIE chip or component and a metal interconnect of the BISD, wherein the copper pad, pillar or bump, or solder bump at the frontside of the separated or diced chip package may couple to a transistor of the SIC/COC. Each separated or diced chip package may comprise one or a plurality of SIC/COCs and one or a plurality of VIE chips or components.

Another aspect of the disclosure provides the chip package with a plurality of the semiconductor IC chips (or COCs), one or a plurality of the VIE chips or components, and one or a plurality of the FIB chips or components for use in a 3D stacked chip package, wherein the chip package may be in a standard format, layout or having a standard size, wherein the chip package may be a single-chip package or multichip package. The standard chip package is formed using one of the methods of (i) the FOIT chip package with the FISD and BISD, as described and specified above, (ii) the COIP chip package using the interposer, or (iii) the chip package using the PCB or BGA (with FIBs embedded in it). The standard chip package may be in a shape of square or rectangle, with a certain widths, lengths and thicknesses; and/or with a standard layout of the locations of the copper pads, pillars or bumps, or solder bumps at its frontside, and a standard layout of the locations of the copper or nickel pads, copper pillars or bumps at its backside. An industry standard may be set for the shape and dimensions of the standard chip package. For example, the standard shape of the standard chip package may be a square, with a width smaller than or equal to 4 mm, 7 mm, 10 mm, 12 mm, 15 mm, 20 mm, 25 mm, 30 mm, 35 mm or 40 mm, and having a thickness thinner than or equal to 0.03 mm, 0.05 mm, 0.1 mm, 0.3 mm, 0.5 mm, 1 mm, 2 mm, 3 mm, 4 mm, or 5 mm. Alternatively, the standard shape of the standard chip package may be a rectangle, with a width smaller than or equal to 3 mm, 5 mm, 7 mm, 10 mm, 12 mm, 15 mm, 20 mm, 25 mm, 30 mm, 35 mm or 40 mm, and a length smaller than or equal to 5 mm, 7 mm, 10 mm, 12 mm, 15 mm, 20 mm, 25 mm, 30 mm, 35 mm, 40 mm, 45 mm or 50 mm; and having a thickness thinner than or equal to 0.03 mm, 0.05 mm, 0.1 mm, 0.3 mm, 0.5 mm, 1 mm, 2 mm, 3 mm, 4 mm, or 5 mm. The copper pads, pillars or bumps, or solder bumps at the frontside (the side the semiconductor IC chips with transistors is facing, or the side the COCs with micro metal pads, pillars or bumps is facing) may be in an area array with a standard layout, wherein the locations of the copper pads, pillars or bumps, or solder bumps are at standard x-y coordinates in a horizontal plane. The copper or nickel pads, copper pillars or bumps at the backside (the side the semiconductor IC chips without transistors is facing, or the side the COCs without micro metal pads, pillars or bumps is facing) of the standard chip package may be also in the area array with a standard layout, wherein the locations of the copper or nickel pads, copper pillars or bumps are at standard x-y coordinates in a horizontal plane, wherein the copper or nickel pads, copper pillars or bumps may be at locations vertically over the semiconductor IC chips (or COCs) and may be connecting or coupling to the frontside of the semiconductor IC chips (or COCs). Each of all or more than 10, 20, 30, 50, or 100 copper pads, pillars or bumps, or solder bumps at the frontside of a standard chip package has a copper or nickel pads, copper pillars or bumps at the backside of the standard chip package vertically over and aligned with it. The standard layout or locations of the copper pads, pillars or bumps, or solder bumps at the frontside of a standard chip package are the same as the standard layout or locations of the copper or nickel pads, copper pillars or bumps at the backside of the standard chip package; therefore the bottom of a standard chip package may be stacked on the top of another standard chip package.

Another aspect of the disclosure provides the standard chip packages for use in the 3D stacked chip package, wherein the standard chip packages are as described and specified above. A 3D stacked chip package may comprise a first chip package and a second chip package on or over the first chip package, wherein the standard layout or locations of contact points for the first chip package and the second chip package are the same, including contact points of: (i) the copper pads, pillars or bumps, or solder bumps at the bottom of the first standard chip package; (ii) the nickel or copper pads, or, copper pillars or bumps at the top of the first chip package, (iii) the copper pads, pillars or bumps, or solder bumps at the bottom of the second standard chip package; (iv) the nickel or copper pads, or, copper pillars or bumps at the top of the second chip package. Therefore, the bottom of the second chip package may be stacked on the top of the first package to form the 3D stacked chip package.

Another aspect of the disclosure provides a molded polymer interposer to replace the interposer in the Chip-On-InterPoser (COIP) chip package. The interposer in the Chip-On-InterPoser (COIP) chip package comprises a First Interconnection Scheme on or of the Interposer (FISIP) and/or a Second Interconnection Scheme of the Interposer (SISIP) on or over the FISIP structure. The specifications of the FISIP and SISIP are the same as that of the FISIB and SISIB, respectively, as described and specified above. That is, the interposer used for the COIP package comprises a silicon substrate with TSVs therein, the FISIP on the silicon substrate, the SISIP on the FISIP, micro copper pads, bumps or pillars on or over the SISIP or FISIP, and solder bumps at the backside of the interposer.

The molded polymer interposer is formed by a process similar to that of forming the Fan-Out Interconnection Technology (FOIT). The molded polymer interposer comprises one or a plurality of the semiconductor IC chips, one or a plurality of VIE chips or components, and one or a plurality of FIB chips or components embedded in a molded polymer layer, wherein the one or the plurality of semiconductor IC chips, the one or the plurality of VIE chips or components and the one or the plurality of FIB chips or components are at a same horizontal plane with the frontside (the side having transistors) of the one or the plurality of semiconductor IC chips and the frontside (the side having FISIB and/or SISIB) of the one or the plurality of FIB chips or components facing up. The molded polymer interposer may comprise the same structures, metal contact points, pads, pillars or bumps and features at its top and bottom surfaces as that of the interposer in the COIP, and is used, like the interposer in the COIP, for interconnecting the semiconductor IC chips flipchip bonded on or over the molded polymer interposer. In the molded polymer interposer, the functions of COIP interposer are split into (i) the FIB chip or component for interconnecting the semiconductor IC chips bonded on or over the interposer; (ii) the VIE chip or component for vertically interconnection through TSVs therein. The process steps for forming a wafer or panel for the molded polymer interposer are the same as that for forming the FOIT package described and specified above except that:

In Step (1), the semiconductor IC chip, and the COC have the same format with micro copper pads, pillars or bumps at their frontside surface (for the semiconductor IC chip, the frontside is the side with transistors; for the COC, the frontside is the backside of the second semiconductor IC chip (with TSVs) in the COC). The separated or diced VIE chip or component has copper pads, pillars or bumps at the frontside and exposed TSV surfaces at the backside. Alternatively, the TSV bottom surfaces is not exposed at the backside of the separated or diced VIE chip or component. The separated or diced FIB chip or component has copper pads, pillars or bumps at the frontside. For the VIE chip or component, the copper pads, pillars or bumps are on the frontside surfaces of one or a plurality of the TSVs and an oxide layer, wherein the oxide layer is on the frontside of the silicon substrate and the frontside surfaces of one or a plurality of the TSVs, wherein the copper pads, pillars or bumps are connecting or coupling to the TSVs through openings in the oxide layer. In some applications, the plurality of TSVs vertically under a single copper pad, pillar or bump may be connected or coupled to each other through the single copper pad, pillar or bump. Then placing, fixing or attaching the backsides of SIC/COCs, VIE chips or components, and FIB chips or components to and on the carrier, holder, molder or substrate. The SIC/COCs, VIE chips or components, and the FIB chips or components are placed, fixed or attached (the frontsides of the SIC/COCs, FIB chips or components and VIE chips or components with micro metal pads, pillars or bumps are facing down) to the carrier, holder, molder or substrate. The SIC/COCs, VIE chips or components, and FIB chips or components are on a same horizontal plane (coplanar). The backsides of the SIC/COCs, the VIE chips or components, and the FIB chips or components are facing up, and their frontsides are placed, fixed, held or attached on or to the carrier, holder, molder or substrate.

In Step (2), applying a material, resin, polymer or compound to fill the gaps or spaces between the SIC/COCs, between the VIE chips or components, between the SIC/COCs and the VIE chips or components, between the SIC/COCs and the FIB chips or components, and between the VIE chips or components and the FIB chips or components, up to a level sufficiently covering the top-most backside surfaces of the SIC/COCs, VIE chips or components and FIB chips or components by methods, for example, spin-on coating, screen-printing, dispensing or molding in the wafer or panel format. Applying a CMP, polishing or grinding process to planarize the surface of the applied material, resin or compound, and until a level where the backside surfaces of TSVs in the VIE chips or components are fully exposed.

And continuing process as follows:

(3) Depositing an insulating dielectric layer (for example a polymer layer) on the top side (the backsides of the SIC/COCs, VIE chip or components and FIB chip or components) of the chip package; that is, on or over (i) the exposed backside of the semiconductor IC chips (or COCs), (ii) the exposed backside TSV surface of the VIE chips or components and (iii) the spaces or gaps between the semiconductor IC chips (or COCs), the VIE chips or components, and the FIB chips or components. Forming openings in the insulating dielectric layer to expose the exposed surfaces of the TSVs of the VIE chips or components;

(4) Forming a Backside metal Interconnection Scheme at the backside of the chip-packaged logic drive or device (abbreviated as BISD in below) on or over the second insulating dielectric layer, and the exposed surfaces (of the TSVs in the VIE chips or components) in the openings in the second insulating dielectric layer. The BISD is over (i) the exposed backside of the semiconductor IC chips (or COCs), (ii) the exposed backside TSV surface of the VIE chips or components and (iii) the spaces or gaps between the semiconductor IC chips (or COCs), the VIE chips or components, and the FIB chips or components. The BISD may comprise metal lines, traces, or planes in one or a plurality of interconnection metal layers (for example, 1 to 6 or 1 to 4 interconnection metal layers), and is formed on or over the backsides of the semiconductor IC chips and the VIE chips or components, or, on or over the backsides of the COC and the VIE chips or components. The metal lines or traces of the interconnection metal layers of the BISD are over the SIC/COCs, the VIE chips or components and the FIB chips or components, and extend horizontally across the edges of the SIC/COCs, the VIE chips or components, the FIB chips or components. The BISD may be formed using the same or similar process steps and materials as in forming the FISD as described above. The BISD provides additional interconnection metal layer or layers at the top or the backside of the molded polymer interposer.

The thickness of the metal lines, traces or planes of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or thicker than or equal to 0.3 μm, 0.7 μm, 1 μm, 2 μm, 3 μm, 5 μm, 7 μm or 10 μm. The width of the metal lines or traces of the BISD is between, for example, 0.3 μm and 40 μm, 0.5 μm and 30 μm, 1 μm and 20 μm, 1 μm and 15 μm, 1 μm and 10 μm, or 0.5 μm to 5 μm, or wider than or equal to 0.3 μm, 0.7 μm, 1 μm, 2 μm, 3 μm, 5 μm, 7 μm or 10 μm. The thickness of the inter-metal dielectric layer of the BISD is between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. The planes in a metal layer of interconnection metal layers of the BISD may be used for the power, ground planes of a power supply, and/or used as heat dissipaters or spreaders for the heat dissipation or spreading; wherein the metal thickness may be thicker, for example, between 5 μm and 50 μm, 5 μm and 30 μm, 5 μm and 20 μm, or 5 μm and 15 μm; or thicker than or equal to 5 μm, 10 μm, 20 μm, or 30 μm. The power, ground plane, and/or heat dissipater or spreader may be layout as interlaced or interleaved shaped structures in a plane of an interconnection metal layer of the BISD; or may be layout in a fork shape.

(5) Forming copper pads, pillars or bumps on or over exposed surfaces of the top-most metal interconnection layer (of the BISD) at the bottom of openings in the top-most insulting dielectric layer of the BISD. The copper pads, pillars or bumps in an area array at the top of the chip package including at locations vertically over the backside of the SIC/COCs of the chip package. The copper pads, pillars, or bumps are formed by performing an embossing electroplating copper process.

(6) Removing the carrier, holder, molder or substrate to expose the micro metal pads, pillars or bumps at the frontsides of the SIC/COCs, FIB chips or components and VIE chips or components.

A chip package may be formed using the above wafer or panel comprising the molded polymer interposers by continuing the above process:

(7) (now turning the whole structure upside down) Flip-chip bonding at least first and second semiconductor IC chips (having solder bumps) on the micro metal pads, pillars or bumps at the frontsides of the SIC/COCs, FIB chips or components and VIE chips or components, exposed at the top surface of molded polymer interposer. The flipchip bonding is performed by solder reflow bonding or solder thermal compression bonding, wherein the first semiconductor IC chip (with solder bumps) is bonded on or over a FIB chip or component, a first VIE chip or component and a third semiconductor IC chip in the molded polymer interposer, and the second semiconductor IC chip (with solder bumps) is bonded on or over the FIB chip or component, a second VIE chip or component and a fourth semiconductor IC chip in the molded polymer interposer.

(8) Underfill the spaces or gaps between (i) the first and second semiconductor IC chips and (ii) the molded polymer interposer, and spaces between solder bumps of the first and second semiconductor IC chips.

(9) Molding the first and second semiconductor IC chips with molding polymer compound.

(10) (now turning the whole structure upside down) Forming solder bumps on or over the copper pads, pillars, or bumps on or over the BISD, by performing solder ball implant process using a screen for dropping solder balls on the copper pads, pillars, or bumps on or over the BISD. A solder reflow process is then performed to form the solder bumps.

(11) Separating, cutting or dicing the finished wafer or panel to form individual unit of chip package. The first and second semiconductor IC chips in the chip package are coupling or connecting to each other through the FISIB and/or SISIB of the FIB chip or component in the molded polymer interposer; the first semiconductor IC chip couples or connecting to the micro metal pads, pillars or bumps at the bottom surface (opposite side of the first and second semiconductor IC chips) of the chip package through the TSVs of the first VIE chip or component, and the second semiconductor IC chip couples or connecting to the micro metal pads, pillars or bumps at the bottom surface (opposite side of the first and second semiconductor IC chips) of the chip package through the TSVs of the second VIE chip or component.

Another aspect of the disclosure provides the standardized commodity logic drive, wherein a person, user, customer, or software developer, or algorithm/architecture/application developer may purchase the standardized commodity logic drive and write software codes to program the logic drive for his/her desired algorithms, architectures and/or applications, for example, in algorithms, architectures and/or applications of Artificial Intelligence (AI), machine learning, deep learning, big data, Internet Of Things (IOT), Virtual Reality (VR), Augmented Reality (AR), car electronics, Graphic Processing (GP), Digital Signal Processing (DSP), Micro Controlling (MC), and/or Central Processing.

BRIEF DESCRIPTION OF THE DRAWINGS

The drawings disclose illustrative embodiments of the present application. They do not set forth all embodiments. Other embodiments may be used in addition or instead. Details that may be apparent or unnecessary may be omitted to save space or for more effective illustration. Conversely, some embodiments may be practiced without all of the details that are disclosed. When the same reference number or reference indicator appears in different drawings, it may refer to the same or like components or steps.

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings:

FIG. 3G is a schematically top view showing a decoupling capacitor between four vertical through vias (VTVs) in accordance with an embodiment of the present application, wherein FIG. 3F is a schematically cross-sectional view along a cross-sectional line A-A on FIG. 3G.

FIG. 3O is a schematically top view showing a decoupling capacitor among four through silicon vias (TSVs) in accordance with another embodiment of the present application, wherein FIG. 3N is a schematically cross-sectional view along a cross-sectional line B-B on FIG. 3O.

FIGS. 5A and 5C are schematically cross-sectional views showing various interconnection-bridge wafers in accordance with an embodiment of the present application.

Figure 1A:
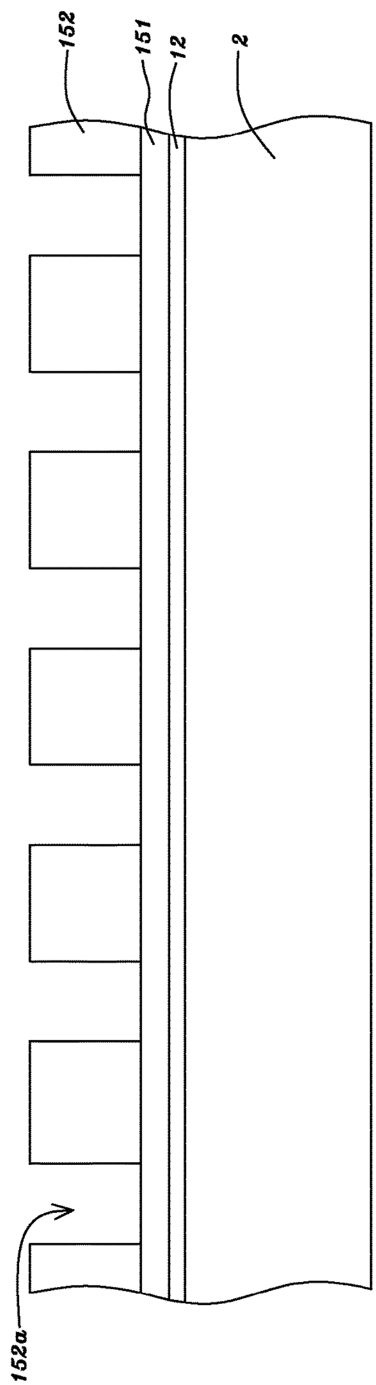
FIGS. 1A-1H are schematically cross-sectional views showing a process for forming first, second and third types of vertical-through-via (VTV) connectors for a first case in accordance with an embodiment of the present application.

While certain embodiments are depicted in the drawings, one skilled in the art will appreciate that the embodiments depicted are illustrative and that variations of those shown, as well as other embodiments described herein, may be envisioned and practiced within the scope of the present application.

DETAILED DESCRIPTION OF THE DISCLOSURE

Illustrative embodiments are now described. Other embodiments may be used in addition or instead. Details that may be apparent or unnecessary may be omitted to save space or for a more effective presentation. Conversely, some embodiments may be practiced without all of the details that are disclosed.

Specification and Process for First Through Twelfth Types of Vertical-Through-Via (VTV) Connectors (Vertical-Interconnect-Elevator (VIE) Chips or Components) Processed from Through-Silicon-Via (TSV) Wafer(s)

A vertical-through-via (VTV) connector is provided with multiple vertical through vias (VTVs) for vertical connection to transmit signals or clocks or deliver power or ground in a vertical direction. The vertical-through-via (VTV) connector may be processed from a through-silicon-via (TSV) wafer, mentioned as below:

1. First, Second and Third Types of Vertical-Through-Via (VTV) Connectors for Through-Silicon-Via Interconnect Elevators (TSVIEs) Processed from Through-Silicon-Via (TSV) Wafer FIGS. 1A-1H are schematically cross-sectional views showing a process for forming first, second and third types of vertical-through-via (VTV) connectors processed from a through-silicon-via (TSV) wafer for a first case in accordance with an embodiment of the present application. FIGS. 1I-1K are schematically cross-sectional views showing a process for forming first, second and third types of vertical-through-via (VTV) connectors processed from a through-silicon-via (TSV) wafer for a second case in accordance with an embodiment of the present application. FIGS. 1L-1N are schematically cross-sectional views showing a process for forming first, second and third types of vertical-through-via (VTV) connectors processed from a through-silicon-via (TSV) wafer for a third case in accordance with an embodiment of the present application. Referring to FIG. 1A, a semiconductor substrate, standard common wafer or semiconductor blank wafer 2 in a circular shape may be a silicon substrate or silicon wafer. After the semiconductor substrate 2 is provided, an insulating dielectric layer 12 may be formed on a top surface of the semiconductor substrate 2. The insulating dielectric layer 12 may include a silicon-oxide layer having a thickness between 0.1 and 2 μm. Next, a masking insulating layer 151 may be formed, using a thermal oxidation process or chemical vapor deposition (CVD) process, on a top surface of the insulating layer 12. The masking insulating layer 151 may include thermally grown silicon oxide ($SiO_2$) and/or CVD silicon nitride ($Si_3N_4$). Alternatively, the masking insulating layer 151 may include an oxide layer, oxynitride layer or nitride layer having a thickness between, for example, 3 nm and 500 nm, between 10 nm and 1,000 nm, between 10 nm and 2,000 nm or between 10 nm and 3,000 nm, or thinner than 5 nm, 10 nm, 30 nm, 50 nm, 100 nm, 200 nm, 300 nm, 500 nm, 1,000 nm or 2,000 nm. Next, a photoresist layer 152 may be formed, using a spin-on coating process, on the masking insulating layer 151. Next, multiple openings 152*a* may be formed, using a photolithography process, in the photoresist layer 152 to expose the masking insulating layer 151. Next, referring to FIG. 1B, multiple openings 151*a* may be formed, using an etching process, in the masking insulating layer 151 under the openings 152*a* in the photoresist layer 152 to expose the insulating dielectric layer 12. Next, the photoresist layer 152 may be removed. Next, multiple blind holes 2*a* may be formed in the insulating dielectric layer 12 and semiconductor substrate 2 under the openings 151*a* in the masking insulating layer 151 by etching the insulating dielectric layer 12 and semiconductor substrate 2 for a predetermined time period. Each of the blind holes 2*a* may have a depth between 30 μm and 2,000 μm and a diameter or largest transverse dimension between 2 μm and 20 μm or between 4 μm and 10 μm. Next, the masking insulating layer 151 may be removed.

Figure 1B:
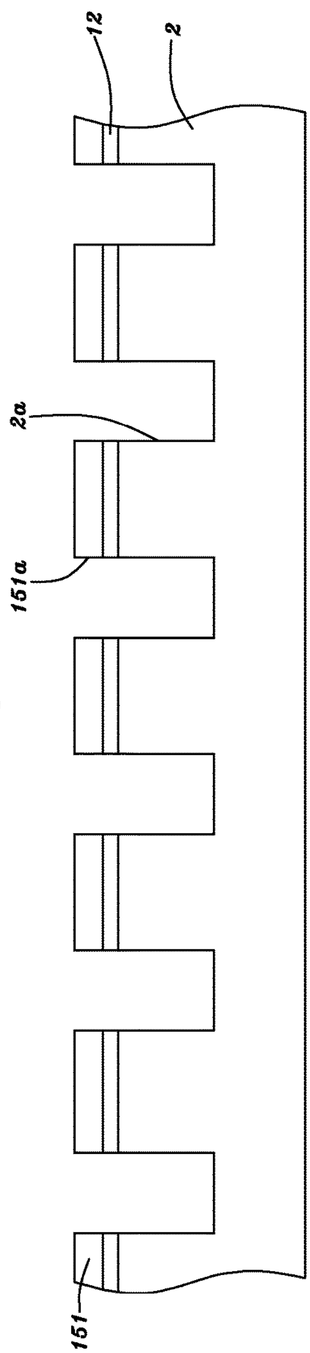

In an alternative process for forming the blind holes 2*a* in the insulating dielectric layer 12 and semiconductor substrate 2, the masking insulating layer 151 as seen in FIGS. 1A and 1B may be omitted. In the alternative process, the photoresist layer 152 may be formed, using a spin-on coating process, on the top surface of the insulating layer 12, and the openings 152*a* formed, using a photolithography process, in the photoresist layer 152 may expose the insulating layer 12. Next, the blind holes 2*a* may be formed in the insulating dielectric layer 12 and semiconductor substrate 2 under the openings 152*a* in the photoresist layer 152 by etching the insulating dielectric layer 12 and semiconductor substrate 2 for a predetermined time period. Next, the photoresist layer 152 may be removed.

Figure 1C:
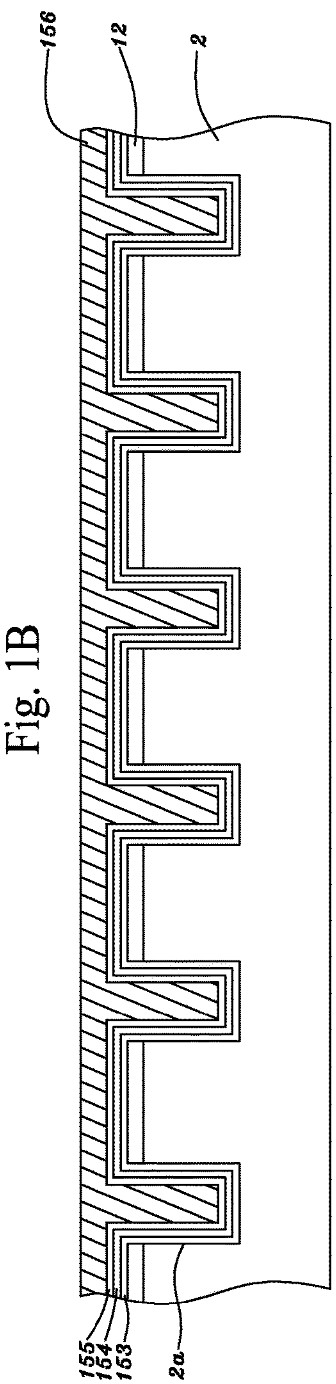

Next, referring to FIG. 1C, an insulating lining layer 153 may be formed, using a thermal oxidation process or chemical vapor deposition (CVD) process, on the sidewalls and bottoms of the blind holes 2*a* and on the top surface of the insulating dielectric layer 12. The insulating lining layer 153 may be, for example, a thermally grown silicon oxide ($SiO_2$) and/or a CVD silicon nitride ($Si_3N_4$). Next, an adhesion layer 154 may be deposited on the insulating lining layer 153 by, for example, sputtering or chemical vapor depositing (CVD) a titanium (Ti) or titanium nitride (TiN) layer 154 having a thickness between 1 nm to 50 nm on the insulating lining layer 153. Next, a seed layer 155 may be deposited on the adhesion layer 154 by, for example, sputtering or chemical vapor depositing (CVD) a copper seed layer 155 having a thickness between 3 nm and 200 nm on the adhesion layer 154. Next, a copper layer 156 having a thickness, for example, between 10 nm and 3,000 nm, between 10 nm and 1,000 nm or between 10 nm and 500 nm may be electroplated on the copper seed layer 155.

Figure 1D:
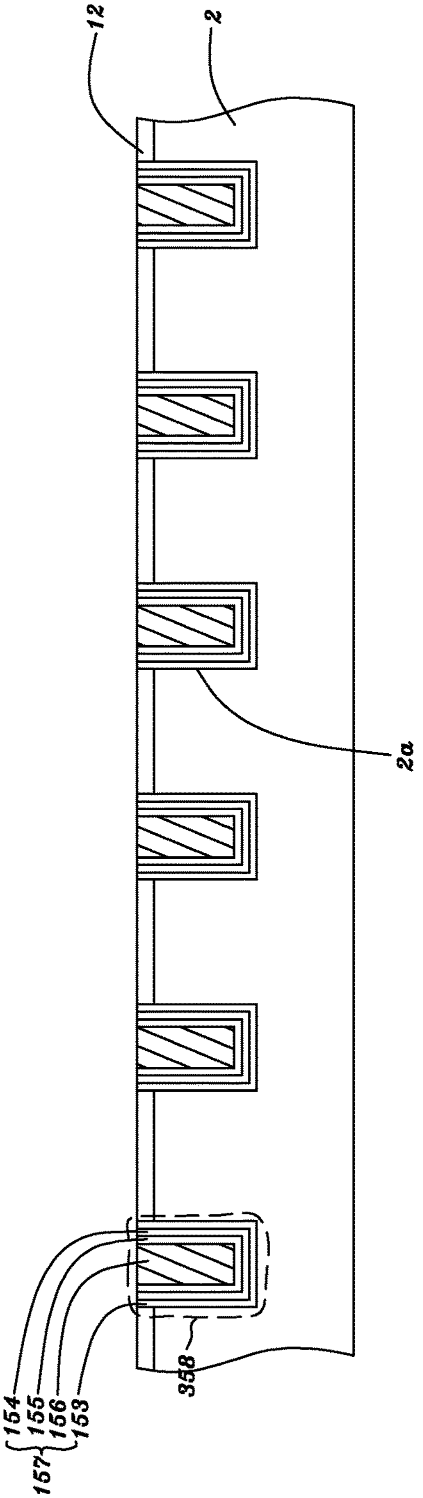

Next, the copper layer 156, seed layer 155, adhesion layer 154 and insulating lining layer 153 outside the blind holes 2*a* and over the insulating dielectric layer 12 may be removed as seen in FIG. 1D by a chemical-mechanical polishing (CMP) process to expose the top surface of the insulating dielectric layer 12. The remaining copper layer 156, seed layer 155, adhesion layer 154 and insulating lining layer 153 may be employed to form multiple through silicon vias (TSVs) 157. Thereby, each of the through silicon vias (TSVs) 157 may vertically extend in one of the blind holes 2*a* in the semiconductor substrate 2 and through the insulating dielectric layer 12. For each of the through silicon vias (TSVs) 157, its insulating lining layer 153 may be provided on a sidewall and bottom of one of the blind holes 2*a*, its copper layer 156 may be provided in said one of the blind holes 2*a* and have a top surface coplanar with a top surface of the insulating dielectric layer 12, its adhesion layer 154 may be provided on its insulating lining layer 153, between its insulating lining layer 153 and copper layer 156 and at a sidewall and bottom of its copper layer 156, and its seed layer 155 may be provided between its adhesion layer 154 and copper layer 156 and at a sidewall and bottom of its copper layer 156.

Figure 1E:
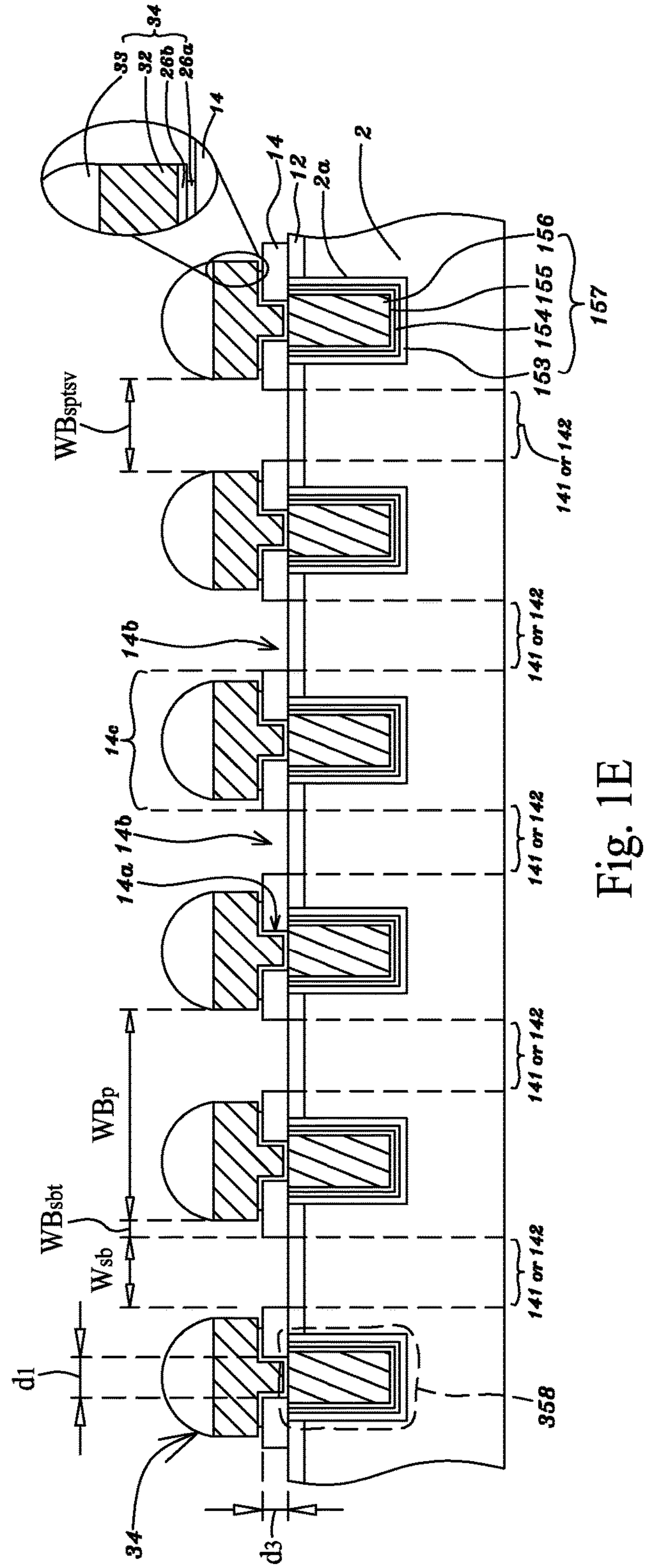
Figure 1F:
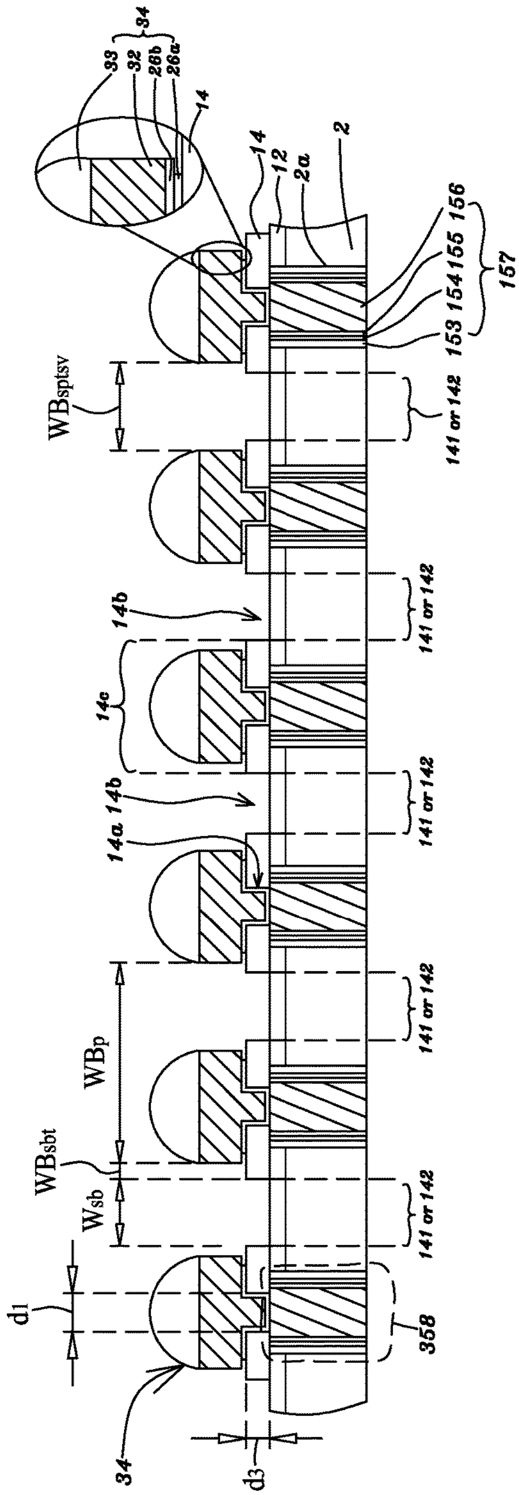
Figure 1G:
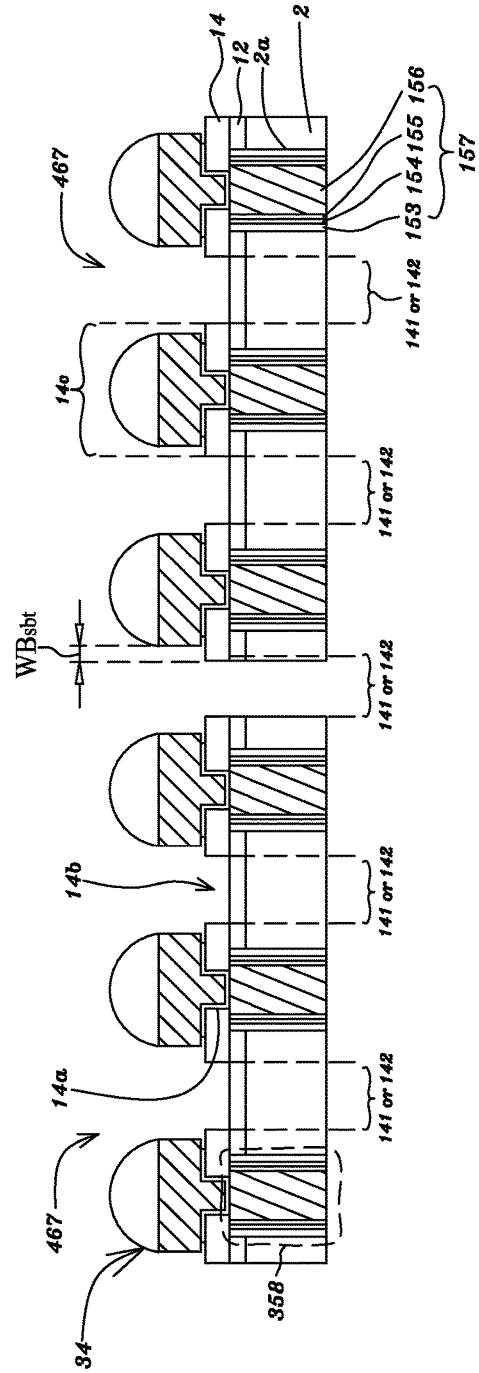

Next, for forming a first type of vertical-through-via (VTV) connector as seen in FIG. 1F, referring to FIG. 1E, a passivation layer 14 may be formed or deposited on the top surface of the insulating dielectric layer 12. The passivation layer 14 may include a mobile ion-catching layer or layers, for example, a combination of silicon nitride, silicon oxynitride, and/or silicon carbon nitride layer or layers deposited by a chemical vapor deposition (CVD) process. For example, the passivation layer 14 may include a silicon-nitride layer having a thickness of more than 0.3 micrometers. Alternatively, the passivation layer 14 may include a polymer layer, such as polyimide, having a thickness between 1 and 5 micrometers. Next, the passivation layer 14 may be patterned to form multiple trenches 14*b* in the passivation layer 14 and multiple openings 14*a* in the passivation layer 14, wherein each of the trenches 14*b* may extend in a direction across the semiconductor substrate 2 and is aligned with a scribe line 141 or 142 of the semiconductor wafer 2 as seen in FIG. 1E, wherein the passivation layer 14 is divided into a plurality of insulating-material islands 14*c* by the trenches 14*b*, wherein each of the openings 14*a* in the passivation layer 14 is over the top surface of the copper layer 156 of in one of the each of the through silicon vias (TSVs) 157. Each of the openings 14*a* may have a transverse dimension d1, from a top view, between 0.5 and 20 micrometers or between 20 and 200 micrometers. The shape of each of the openings 14*a* from a top view may be a circle, and the diameter of each of the circle-shaped openings 14*a* may be between 0.5 and 20 micrometers or between 20 and 200 micrometers. Alternatively, the shape of each of the openings 14*a* from a top view may be a square, and the width of each of the square-shaped openings 14*a* may be between 0.5 and 20 micrometers or between 20 and 200 micrometers. Alternatively, the shape of each of the openings 14*a* from a top view may be a polygon, such as hexagon or octagon, and each of the polygon-shaped openings 14*a* may have a between 0.5 and 20 micrometers or between 20 and 200 micrometers. Alternatively, the shape of each of the openings 14*a* from a top view may be a rectangle, and each of the rectangle-shaped openings 14*a* may have a shorter width between 0.5 and 20 micrometers or between 20 and 200 micrometers.

Next, for forming the first type of vertical-through-via (VTV) connector as seen in FIG. 1F, referring to FIG. 1E, a micro-bump or micro-pad 34 may be formed on the top surface of the copper layer 156 of each of the through silicon vias (TSVs) 157 at a bottom of one of the openings 14*a* in the passivation layer 14. The micro-bumps or micro-pads 34 may be one of various types. A first type of micro-bumps or micro-pads 34 may include (1) an adhesion layer 26*a*, such as titanium (Ti) or titanium nitride (TiN) layer having a thickness between 1 nm and 50 nm, on the top surface of the copper layer 156 of the through silicon vias (TSVs) 157, (2) a seed layer 26*b*, such as copper, on its adhesion layer 26*a* and (3) a copper layer 32 having a thickness between 1 μm and 60 μm on its seed layer 26*b*.

Alternatively, a second type of micro-bumps or micro-pads 34 may include the adhesion layer 26*a*, seed layer 26*b* and copper layer 32 as mentioned above, and may further include, as seen in FIG. 1E, a tin-containing solder cap 33 made of tin or a tin-silver alloy having a thickness between 1 μm and 50 μm on its copper layer 32.

Figure 8A:
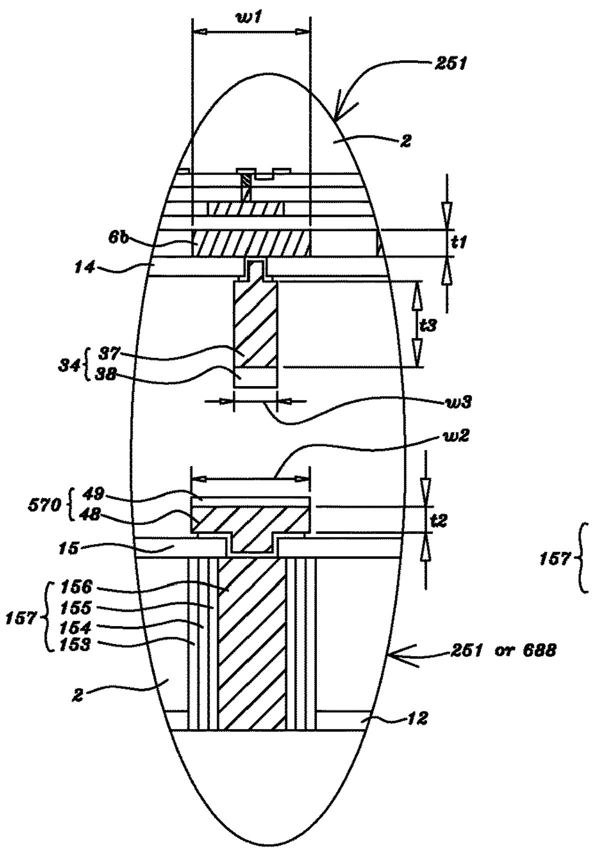
FIGS. 8A and 8B are schematically cross-sectional views showing a process of bonding a thermal compression bump to a thermal compression pad in accordance with an embodiment of the present application.

Alternatively, a third type of micro-bumps or micro-pads 34 may be thermal compression bumps, including the adhesion layer 26*a* and seed layer 26*b* as mentioned above, and may further include, as seen in any of FIG. 8A, a copper layer 37 having a thickness t3 between 2 μm and 20 μm, such as 3 μm, and a largest transverse dimension w3, such as diameter in a circular shape, between 1 μm and 15 μm, such as 3 μm, on its seed layer 26*b* and a solder cap 38 made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, between 1 μm and 15 μm, such as 3 μm, on its copper layer 37.

Alternatively, a fourth type of micro-bumps or micro-pads 34 may be thermal compression bumps, including the adhesion layer 26*a* and seed layer 26*b* as mentioned above, and may further include, as seen in FIG. 8A, a copper layer 48 having a thickness t2 between 2 μm and 20 μm, such as 3 μm, and a largest transverse dimension w2, such as diameter in a circular shape, greater than 25 μm or between 25 μm and 150 μm, on its seed layer 26*b* and a solder cap 49 made of a tin-silver alloy, a tin-gold alloy, a tin-copper alloy, a tin-indium alloy, indium, tin or gold, which has a thickness between 1 μm and 15 μm, such as 2 μm, and a largest transverse dimension, such as diameter in a circular shape, greater than 25 μm or between 25 μm and 150 μm, on its copper layer 48.

Next, the semiconductor substrate 2 as seen in FIG. 1E may have a backside to be polished by a chemically-mechanically polishing (CMP) process or a wafer backside grinding process until each of the through silicon vias (TSVs) 157 may have a backside to be exposed as seen in FIG. 1F. For each of the through silicon vias (TSVs) 157, its insulating lining layer 153, adhesion layer 154 and seed layer 155 at its backside may be removed to expose a backside of its copper layer 156, wherein the backside of its copper layer 156 may be coplanar to the backside of the semiconductor substrate 2. Each of the through silicon vias (TSVs) 157 may be used as a vertical through via (VTV) 358 for a dedicated vertical path. Each of the vertical through vias (VTVs) 358 formed by the through silicon vias (TSVs) may have a depth between 30 μm and 200 μm and a largest transverse dimension, such as diameter or width, between 2 μm and 20 μm or between 4 μm and 10 μm.

Figure 1H:
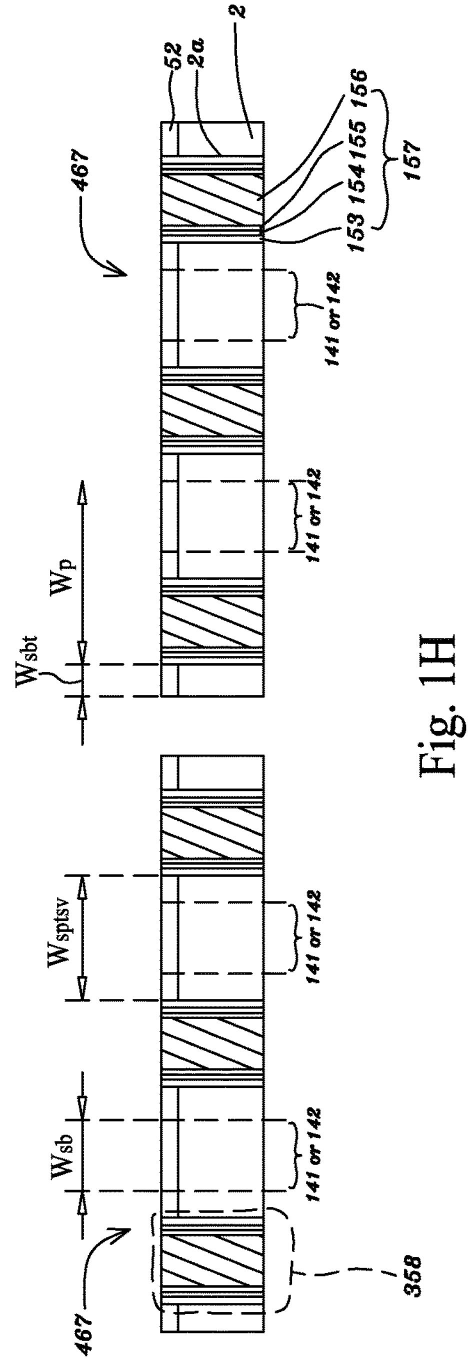
Figure 1I:
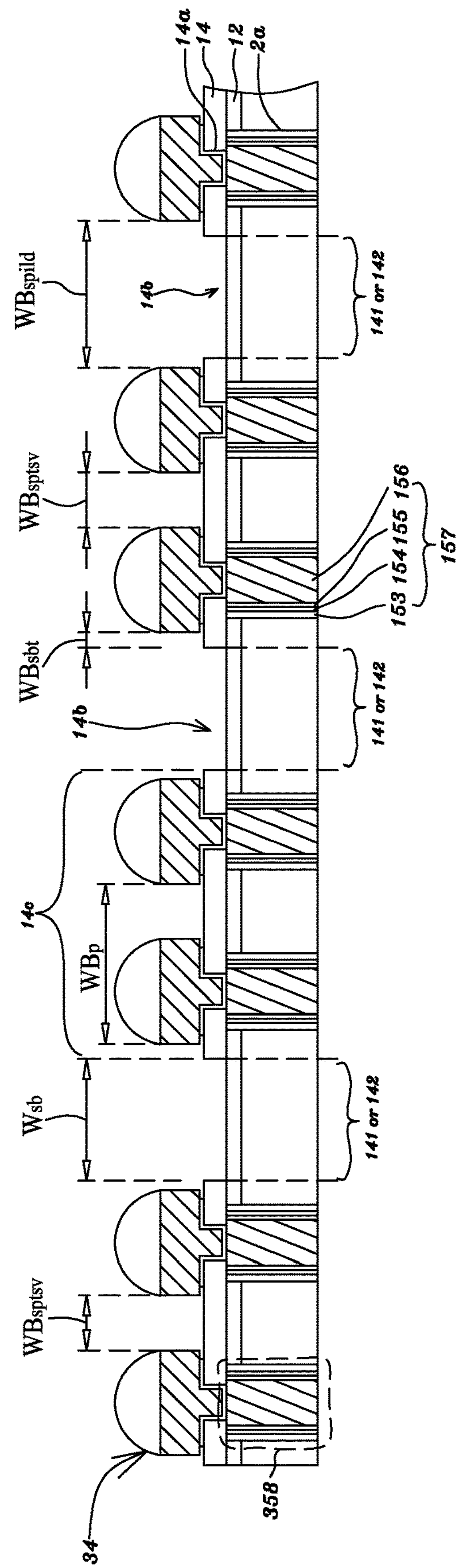
FIGS. 1I-1K are schematically cross-sectional views showing a process for forming first, second and third types of vertical-through-via (VTV) connectors for a second case in accordance with an embodiment of the present application.
Figure 1J:
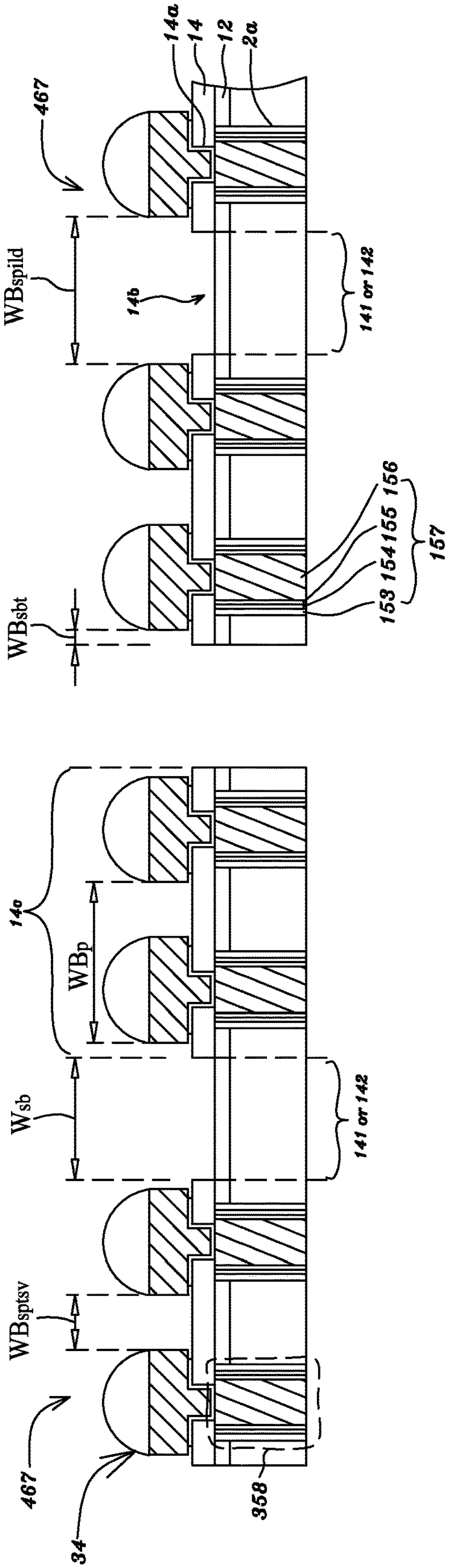
Figure 1K:
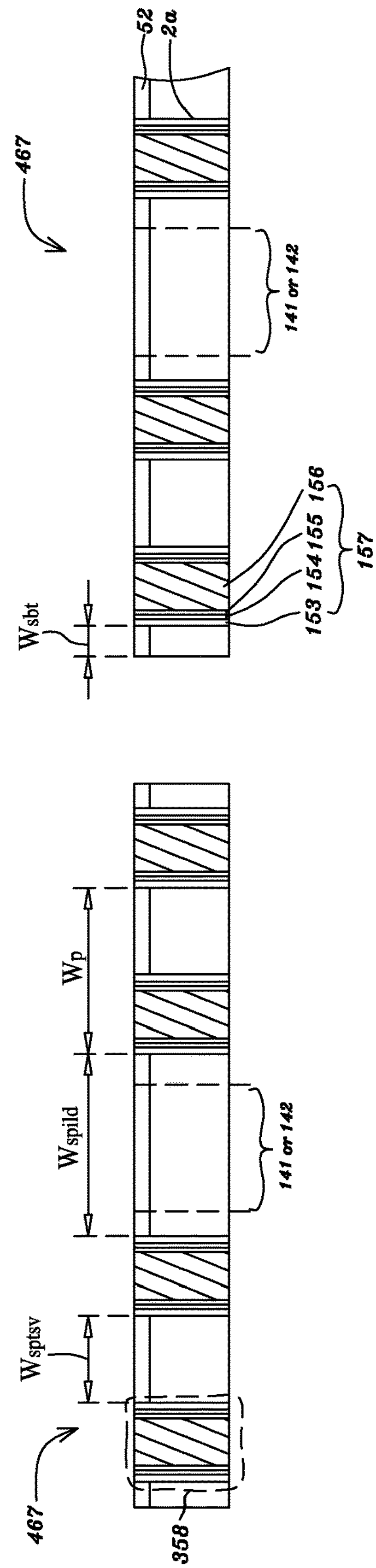
Figure 1L:
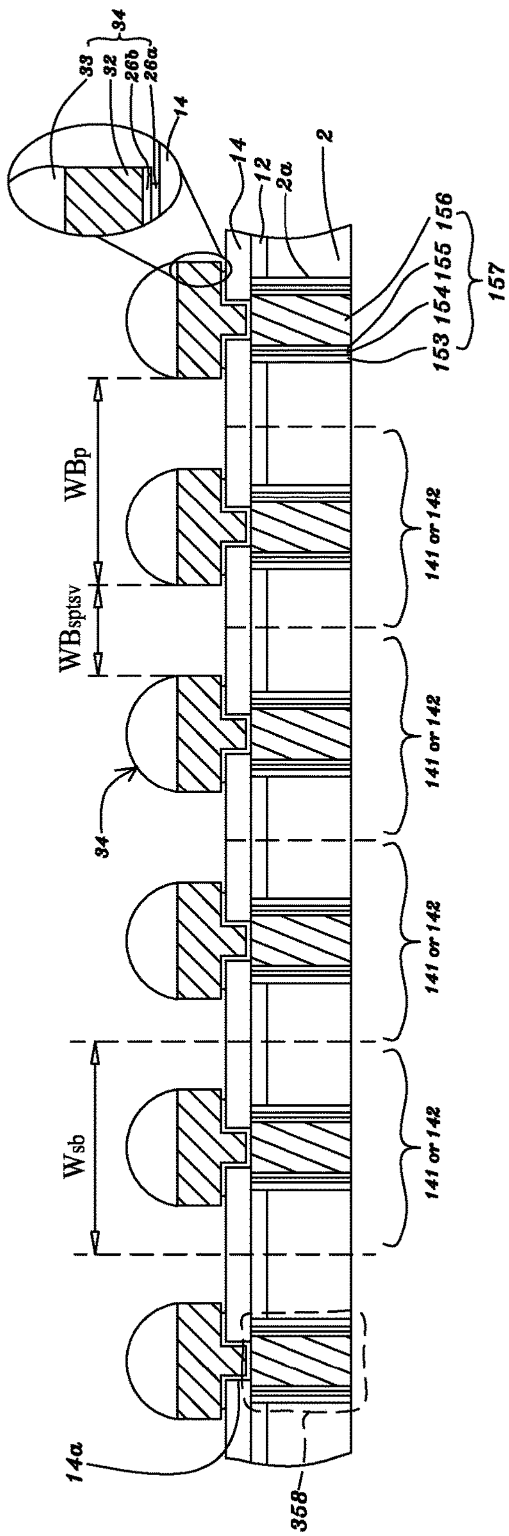
FIGS. 1L-1N are schematically cross-sectional views showing a process for forming first, second and third types of vertical-through-via (VTV) connectors for a third case in accordance with an embodiment of the present application.
Figure 1M:
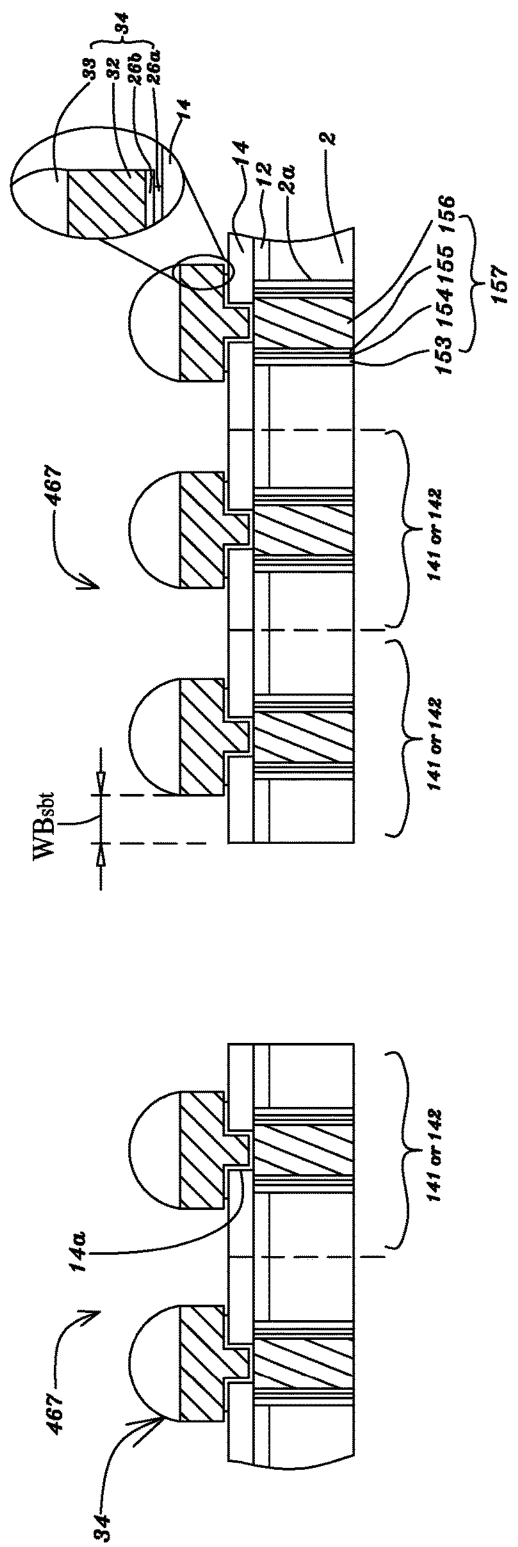
Figure 1N:
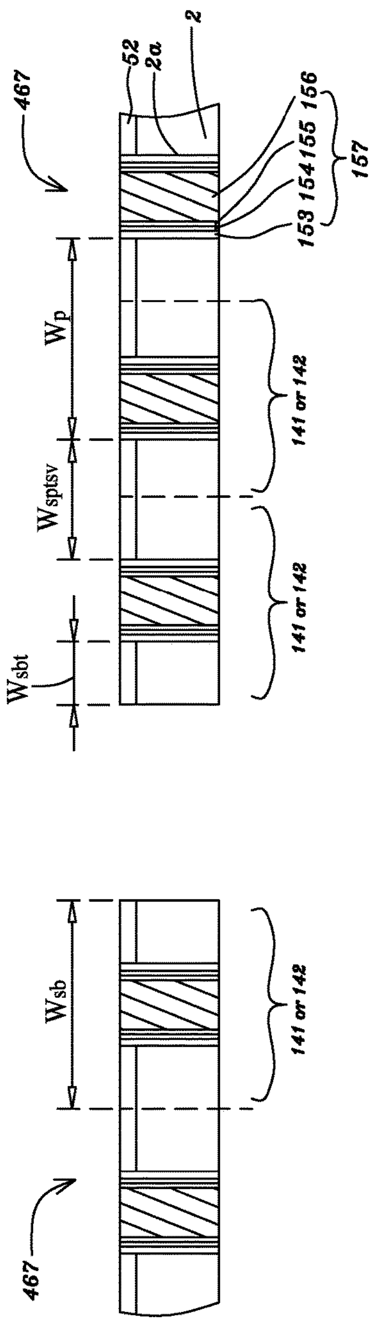

Alternatively, for forming a second type of vertical-through-via (VTV) connector as seen in FIG. 1H, which is similar to the process for forming the first type of vertical-through-via (VTV) connector 467 as illustrated in FIGS. 1A-1F, none of the passivation layer 14 and micro-bumps or micro-pads 34 as illustrated in FIG. 1E may be formed as seen in FIG. 1H and the insulating dielectric layer 12 may act as an insulating bonding layer 52.

Figure 4A:
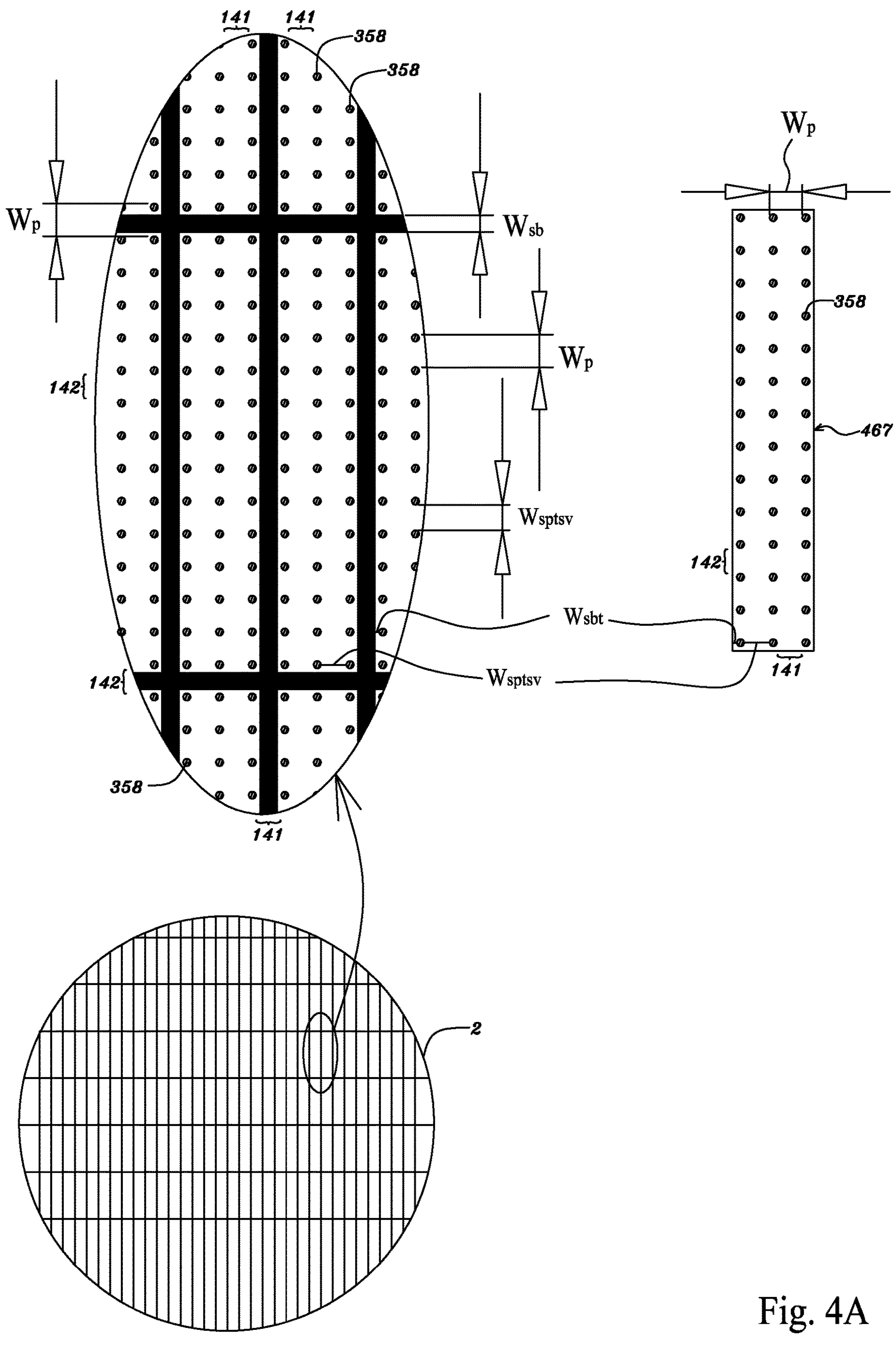
FIGS. 4A and 4B are schematically top views showing various arrangements of reserved scribe lines and vertical through vias (VTVs) for each of first and second types of vertical-through-via (VTV) connectors for a first case in accordance with an embodiment of the present application.
Figure 4B:
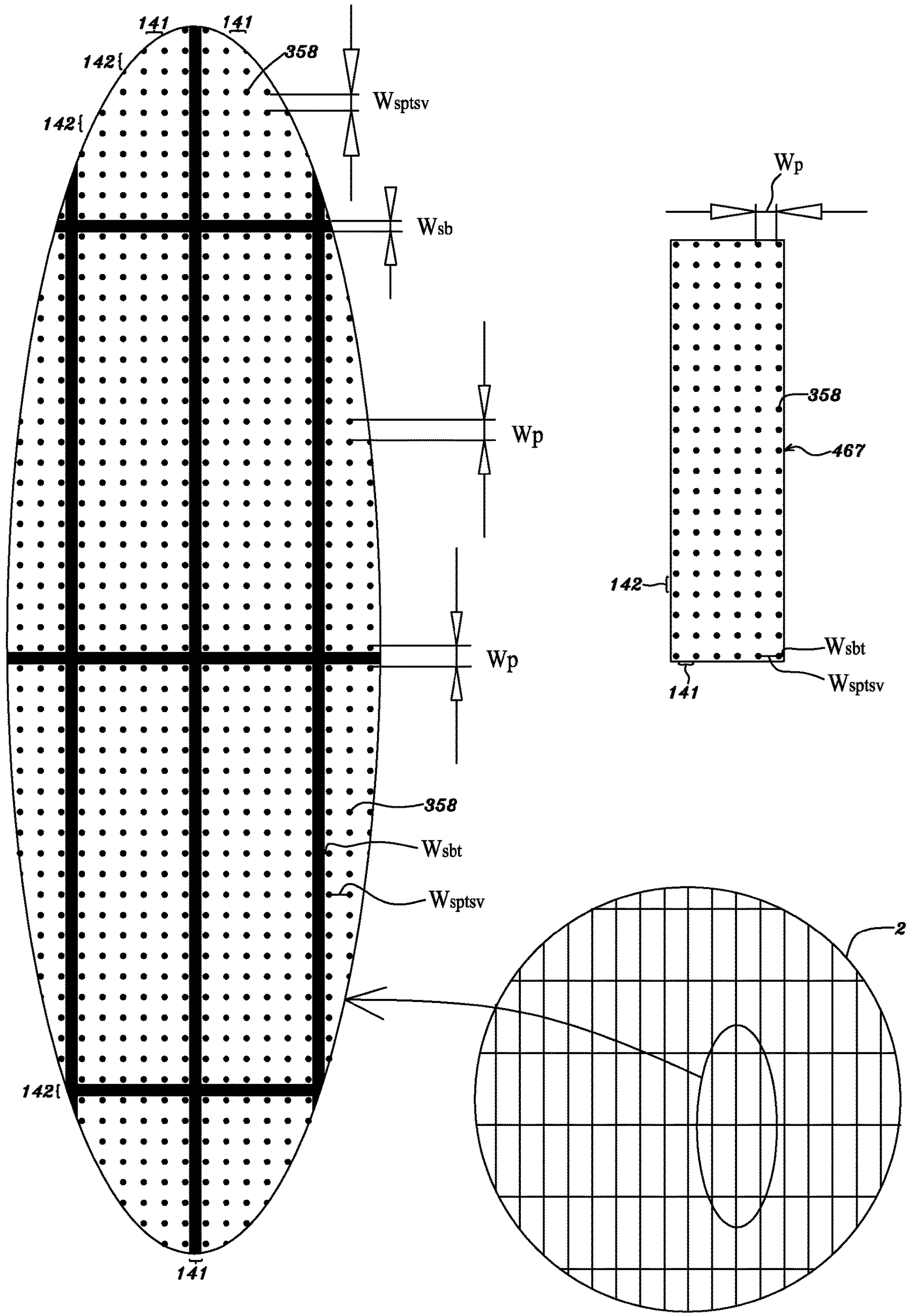
Figure 4C:
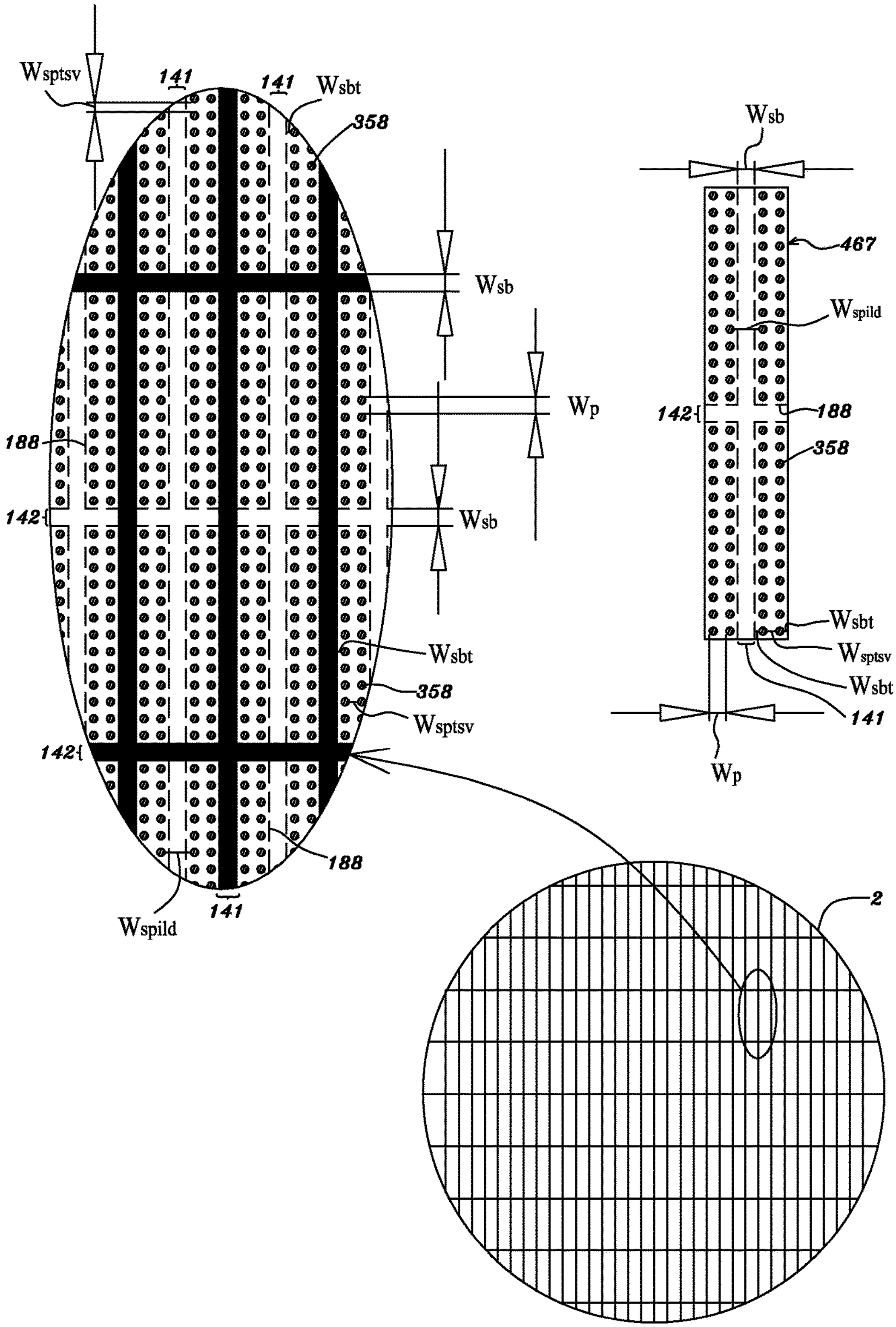
FIGS. 4C and 4D are schematically top views showing various arrangements of reserved scribe lines and vertical through vias (VTVs) for each of first and second types of vertical-through-via (VTV) connectors for a second case in accordance with an embodiment of the present application.
Figure 4D:
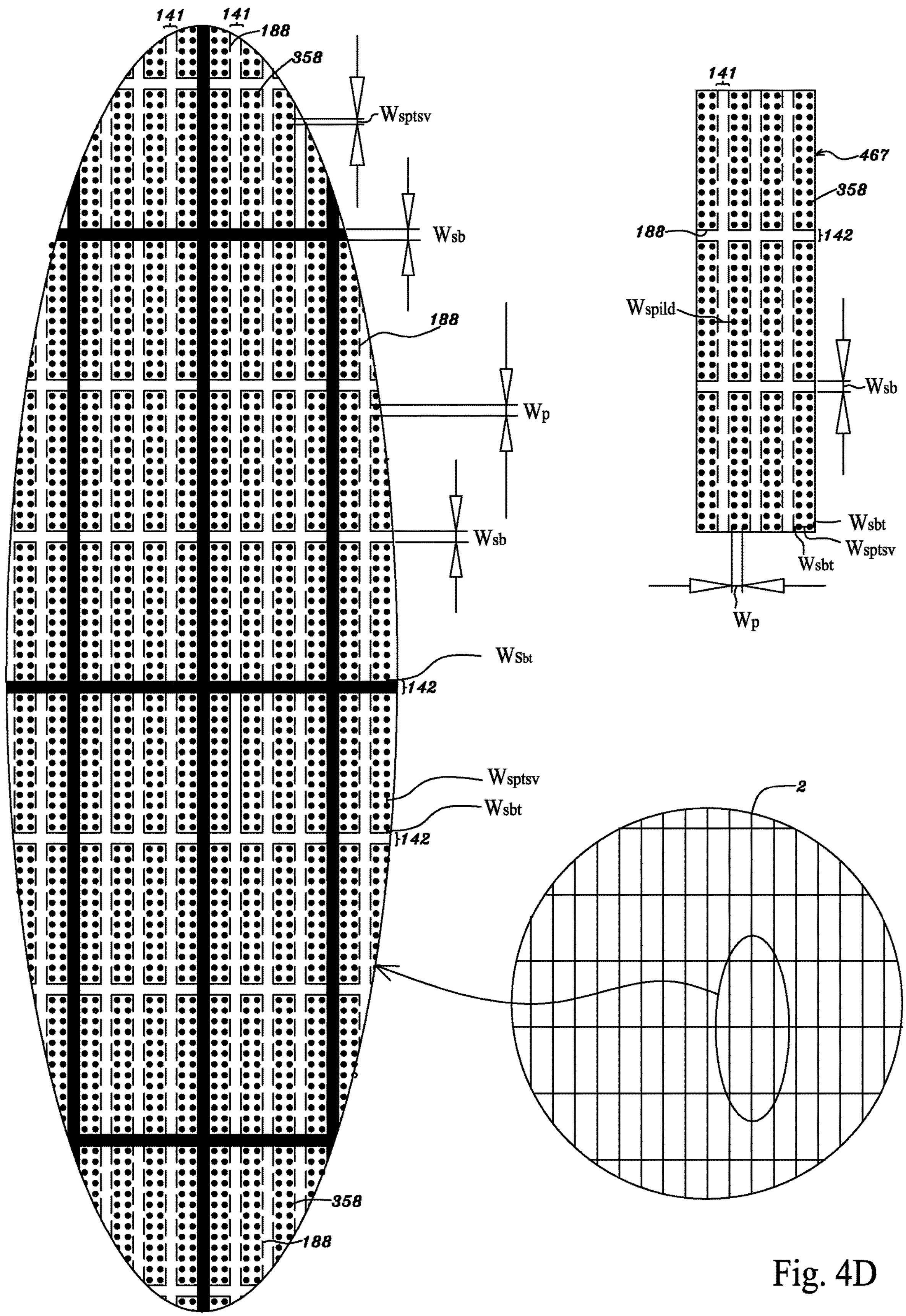
Figure 4E:
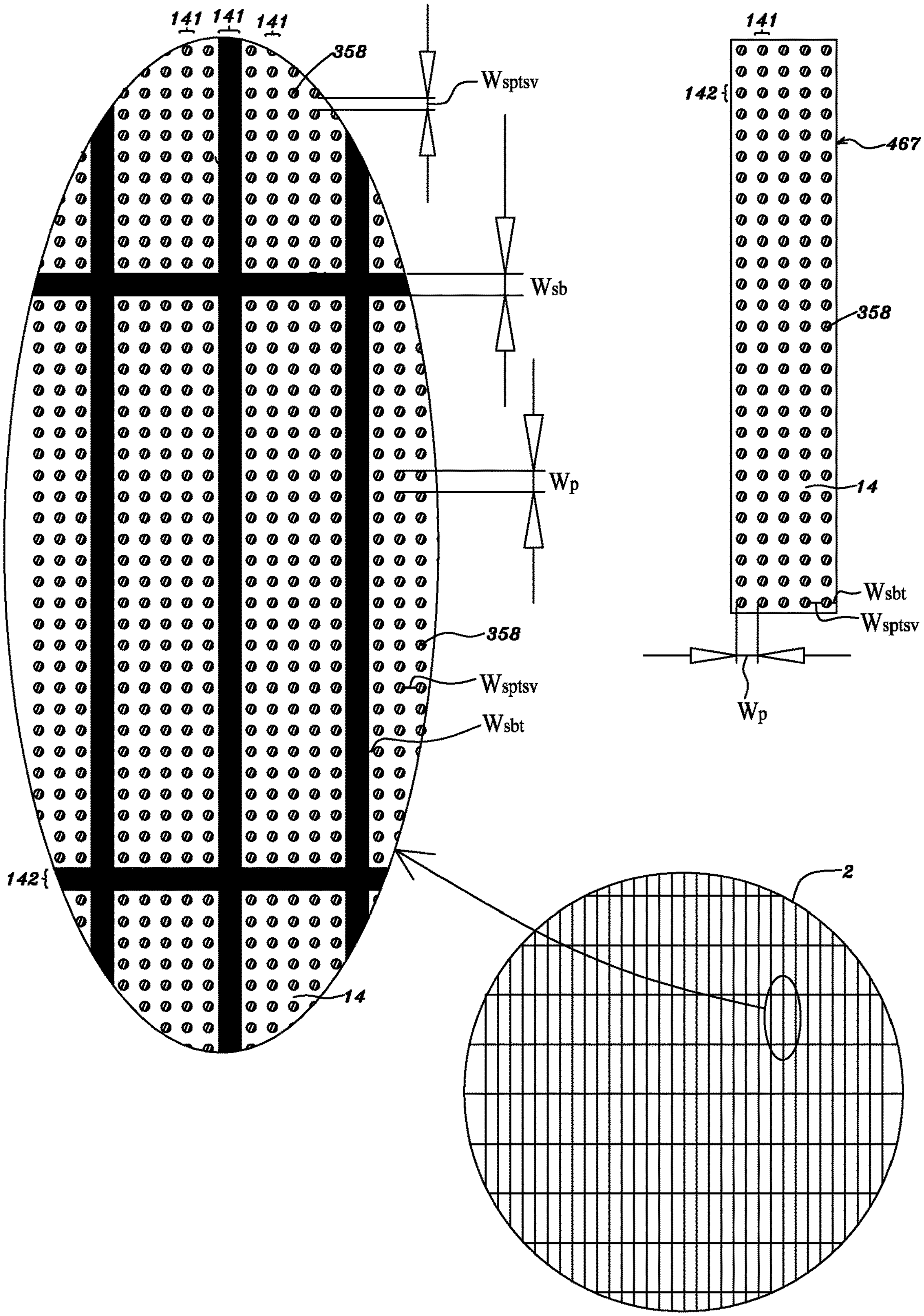
FIGS. 4E and 4F are schematically top views showing various arrangements of reserved scribe lines and vertical through vias (VTVs) for each of first and second types of vertical-through-via (VTV) connectors for a third case in accordance with an embodiment of the present application.
Figure 4F:
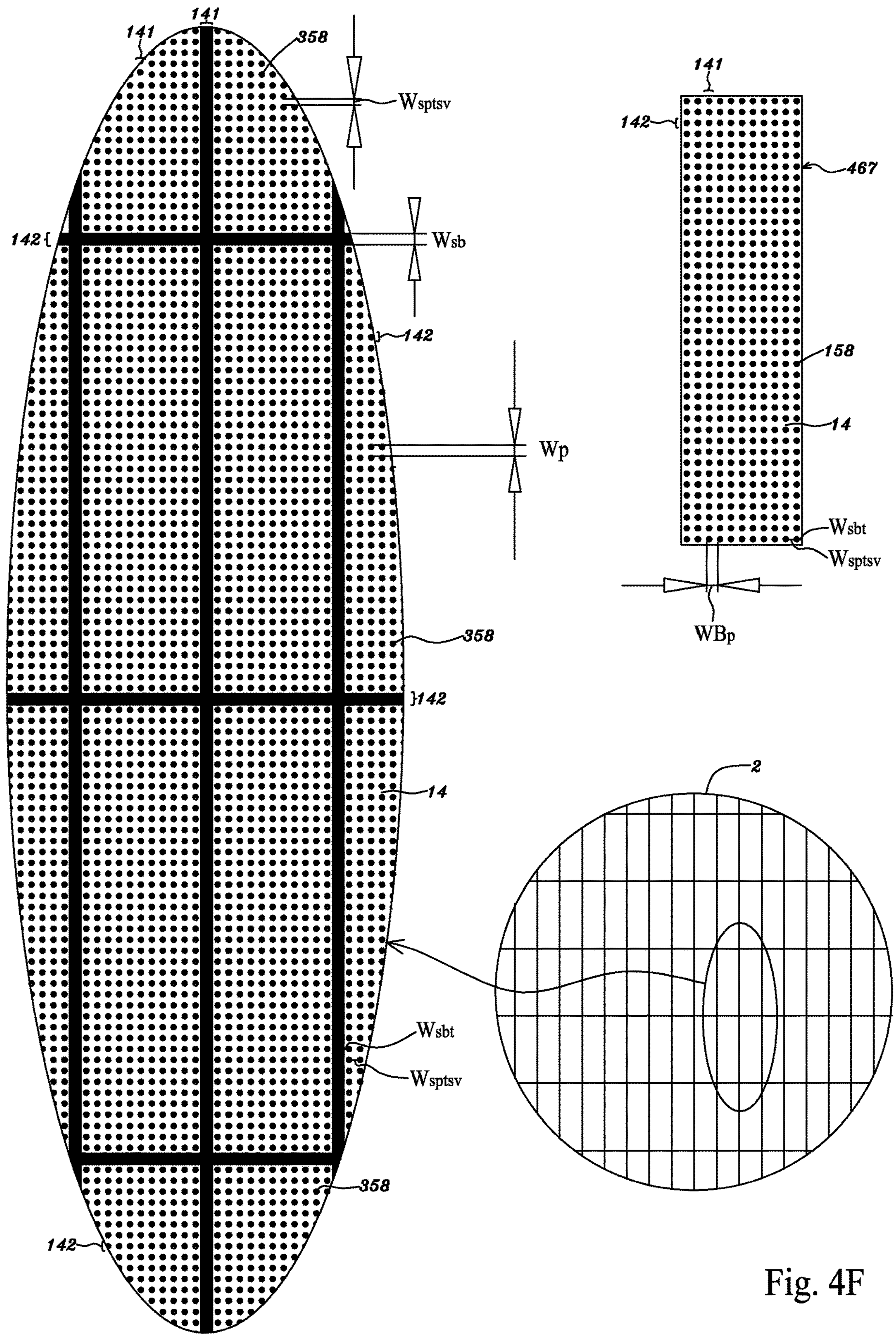

FIGS. 4A and 4B are schematically top views showing various arrangements of reserved scribe lines and vertical through vias (VTVs) for each of first and second types of vertical-through-via (VTV) connectors for a first case in accordance with an embodiment of the present application. FIGS. 4C and 4D are schematically top views showing various arrangements of reserved scribe lines and vertical through vias (VTVs) for each of first and second types of vertical-through-via (VTV) connectors for a second case in accordance with an embodiment of the present application. FIGS. 4E and 4F are schematically top views showing various arrangements of reserved scribe lines and vertical through vias (VTVs) for each of first and second types of vertical-through-via (VTV) connectors for a third case in accordance with an embodiment of the present application. For the first case, referring to FIGS. 1F, 1H, 4A and 4B, a pitch $W_p$ between each neighboring two of the vertical through vias (VTVs) 358 in the semiconductor substrate 2 may range from 20 to 150 micrometers or from 40 to 100 micrometers or may be smaller than 50, 40 or 30 micrometers; and a space $W_{sptsv}$ between each neighboring two of the vertical through vias (VTVs) 358 in the semiconductor substrate 2 may range from 20 to 150 micrometers or from 40 to 100 micrometers or may be smaller than 50, 40 or 30 micrometers. Multiple trenches 14*b* for reserved scribe lines may be formed in the passivation layer 14 to form multiple insulating-material islands 14*c* between neighboring two of the trenches 14*b*. The trenches 14*b* in a first group for multiple first reserved scribe lines 141 may extend in a y direction and the trenches 14*b* in a second group for multiple second reserved scribe lines 142 may extend in an x direction vertical to the y direction. The vertical through vias (VTVs) 358 arranged in only one line in the y direction are arranged between neighboring two of the first reserved scribe lines 141, and the vertical through vias (VTVs) 358 arranged in only one line in the x direction are arranged between neighboring two of the second reserved scribe lines 142. Each of the insulating-material islands 14*c* may be aligned with only one of the vertical through vias (VTVs)

358, and one of the openings 14*a* in said each of the insulating-material islands 14*c* may be arranged over said only one of the vertical through vias (VTVs) 358. None of the vertical through vias (VTVs) 358 may be arranged under each of the trenches 14*b*. Accordingly, the pitch $W_p$ and space $W_{sptsv}$ in the y direction between each neighboring two of the vertical through vias (VTVs) 358 may be greater than a width $W_{sb}$ of the second reserved scribe lines 142 or greater than the width $W_{sb}$ of the second reserved scribe lines 142 plus two times of a predetermined space $W_{sbt}$ between each of the second reserved scribe lines 142 and one of said each neighboring two of the vertical through vias (VTVs) 358 adjacent to said each of the second reserved scribe lines 142. The pitch $W_p$ and space $W_{sptsv}$ in the x direction between each neighboring two of the vertical through vias (VTVs) 358 may be greater than a width $W_{sb}$ of the first reserved scribe lines 141 or greater than the width $W_{sb}$ of the first reserved scribe lines 141 plus two times of a predetermined space $W_{sbt}$ between each of the first reserved scribe lines 141 and one of said each neighboring two of the vertical through vias (VTVs) 358 adjacent to said each of the first reserved scribe lines 141.

For the second case, referring to FIGS. 1I, 1K, 4C and 4D, the vertical through vias (VTVs) 358 may be populated regularly in multiple islands or regions 188 of arrays of vertical through vias (VTVs) with the first and second reserved scribe lines 141 and 142 each between neighboring two of the islands or regions 188 of arrays of vertical through vias (VTVs). A pitch $W_p$ between each neighboring two of the vertical through vias (VTVs) 358 aligned with one of the islands or regions 188 of arrays of vertical through vias (VTVs) may range from 5 to 50 micrometers or from 5 to 20 micrometers or may be smaller than 50, 40 or 30 micrometers; and a space $W_{sptsv}$ between neighboring two of the vertical through vias (VTVs) 358 aligned with one of the islands or regions 188 of arrays of vertical through vias (VTVs) may range from 5 to 50 micrometers or from 5 to 20 micrometers or may be smaller than 50, 40 or 30 micrometers. For each of the islands or regions 188 of arrays of vertical through vias (VTVs), its vertical through vias (VTVs) 358 may be arranged in multiple columns, such as two columns for an embodiment shown in FIGS. 1I, 1K, 4C and 4D, and in multiple rows, such as thirteen rows for an embodiment shown in FIGS. 1I, 1K, 4C and 4D; its insulating-material island 14*c* may be aligned with its vertical through vias (VTVs) 358, and multiple of the openings 14*a* in its insulating-material island 14*c* may be arranged over its vertical through vias (VTVs) 358 respectively. The pitch $W_p$ and space $W_{sptsv}$ in the y direction between each neighboring two of the vertical through vias (VTVs) 358 aligned with one of the islands or regions 188 of arrays of vertical through vias (VTVs) may be smaller than the width $W_{sb}$ of the second reserved scribe lines 142 and/or smaller than a first space $W_{spild}$ between neighboring two of the vertical through vias (VTVs) 358 and across one of the second reserved scribe lines 142 between said neighboring two of the islands or regions 188 of arrays of vertical through vias (VTVs). The first space $W_{spild}$ or a width of the trench 14*b* extending in the x direction between neighboring two of the insulating-material islands 14*c* may be greater than 50, 40 or 30 micrometers. The first space $W_{spild}$ may be greater than the width $W_{sb}$ of the second reserved scribe lines 142 or greater than the width $W_{sb}$ of the second reserved scribe lines 142 plus two times of a predetermined space $W_{sbt}$ in the y direction between each of the second reserved scribe lines 142 and one of the vertical through vias (VTVs) 358 adjacent to said each of the second reserved scribe lines 142. The pitch $W_p$ and space $W_{sptsv}$ in the x direction between each neighboring two of the vertical through vias (VTVs) 358 aligned with one of the islands or regions 188 of arrays of vertical through vias (VTVs) may be smaller than the width $W_{sb}$ of the first reserved scribe lines 141 and/or smaller than a second space $W_{spild}$ between neighboring two of the vertical through vias (VTVs) 358 and across one of the first reserved scribe lines 141 between said neighboring two of the islands or regions 188 of arrays of vertical through vias (VTVs). The second space $W_{spild}$ or a width of the trench 14*b* extending in the y direction between neighboring two of the insulating-material islands 14*c* may be greater than 50, 40 or 30 micrometers. The second space $W_{spild}$ may be greater than or equal to the width $W_{sb}$ of the first reserved scribe lines 141 or greater than or equal to the width $W_{sb}$ of the first reserved scribe lines 141 plus two times of a predetermined space $W_{sbt}$ in the x direction between each of the first reserved scribe lines 141 and one of the vertical through vias (VTVs) 358 adjacent to said each of the first reserved scribe lines 141.

For the third case, referring to FIGS. 1L, 1N, 4E and 4F, a pitch $W_p$ between each neighboring two of the vertical through vias (VTVs) 358 in the semiconductor substrate 2 may range from 5 to 50 micrometers or from 5 to 20 micrometers or may be smaller than 50, 40 or 30 micrometers; and a space $W_{sptsv}$ between neighboring two of the vertical through vias (VTVs) 358 may range from 5 to 50 micrometers or from 5 to 20 micrometers or may be smaller than 50, 40 or 30 micrometers. Multiple first reserved scribe lines 141 may extend in a y direction, wherein each of the first reserved scribe lines 141 may extend in line with multiple of the vertical through vias (VTVs) 358 arranged in a line in the y direction. Multiple second reserved scribe lines 142 may extend in an x direction, wherein each of the second reserved scribe lines 142 may extend in line with multiple of the vertical through vias (VTVs) 358 arranged in a line in the x direction. Accordingly, the pitch $W_p$ and space $W_{sptsv}$ in the y direction between each neighboring two of the vertical through vias (VTVs) 358 may be smaller than a width $W_{sb}$ of the second reserved scribe lines 142 or smaller than the width $W_{sb}$ of the second reserved scribe lines 142 plus two times of a predetermined space $W_{sbt}$ between each of the second reserved scribe lines 142 and one of the vertical through vias (VTVs) 358 adjacent to said each of the second reserved scribe lines 142. The pitch $W_p$ and space $W_{sptsv}$ in the x direction between each neighboring two of the vertical through vias (VTVs) 358 may be smaller than a width $W_{sb}$ of the first reserved scribe lines 141 or smaller than the width $W_{sb}$ of the first reserved scribe lines 141 plus two times of a predetermined space $W_{sbt}$ between each of the first reserved scribe lines 141 and one of the vertical through vias (VTVs) 358 adjacent to said each of the first reserved scribe lines 141.

Figure 4G:
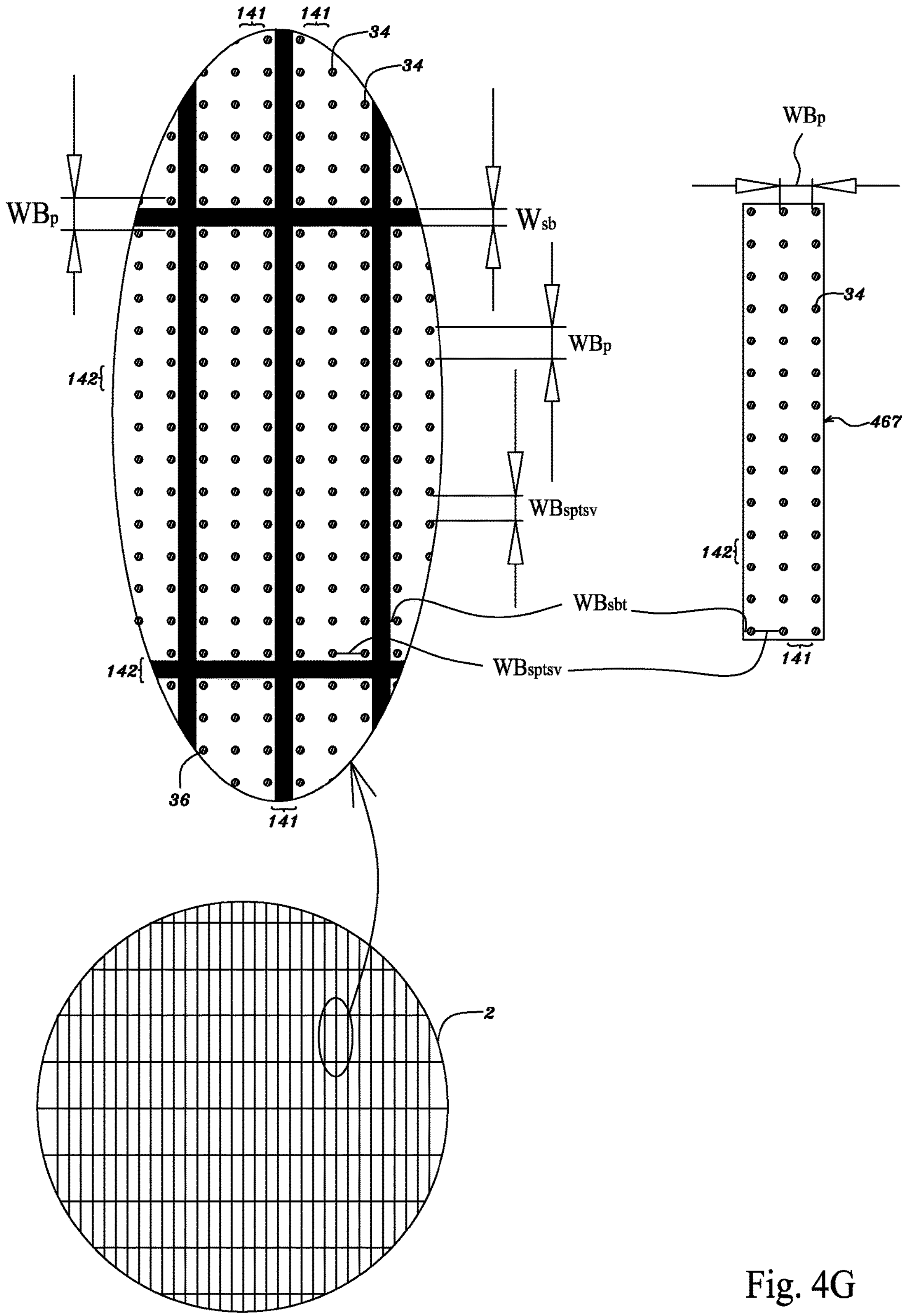
FIGS. 4G and 4H are schematically top views showing various arrangements of reserved scribe lines and micro-bumps or micro-pads for a first type of vertical-through-via (VTV) connector for the first case in accordance with an embodiment of the present application.
Figure 4H:
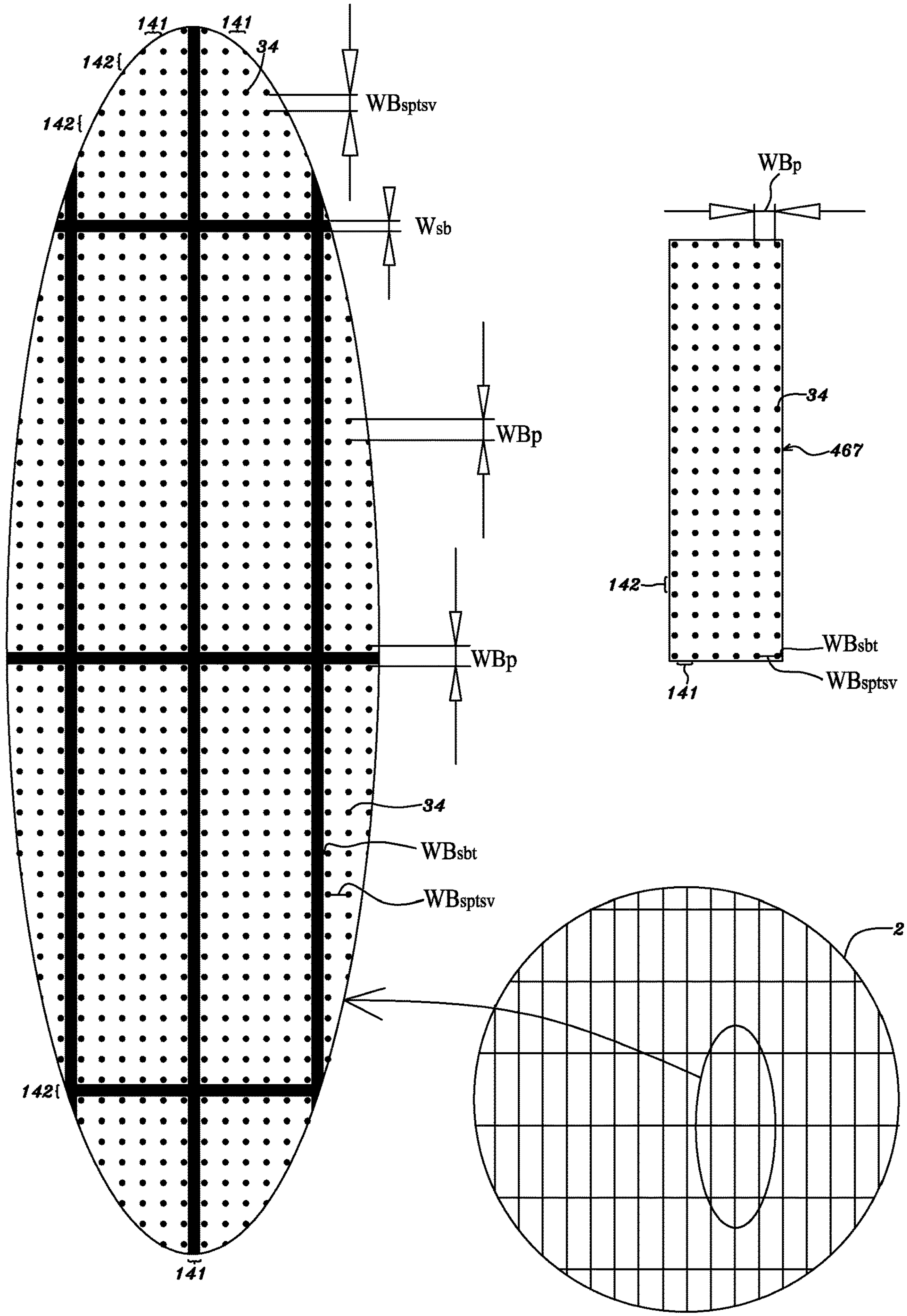
Figure 4I:
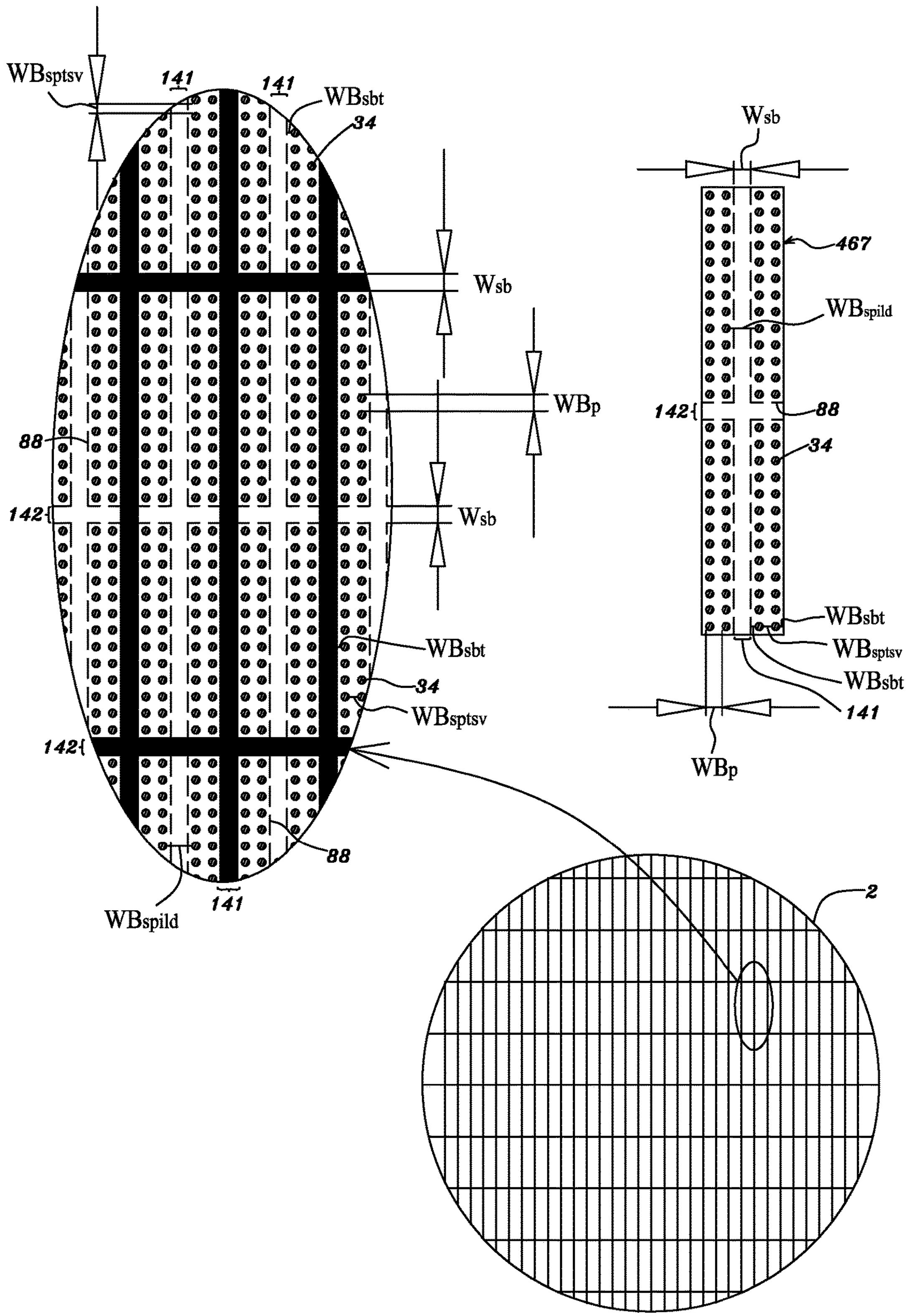
FIGS. 4I and 4J are schematically top views showing various arrangements of reserved scribe lines and micro-bumps or micro-pads for a first type of vertical-through-via (VTV) connector for the second case in accordance with an embodiment of the present application.
Figure 4J:
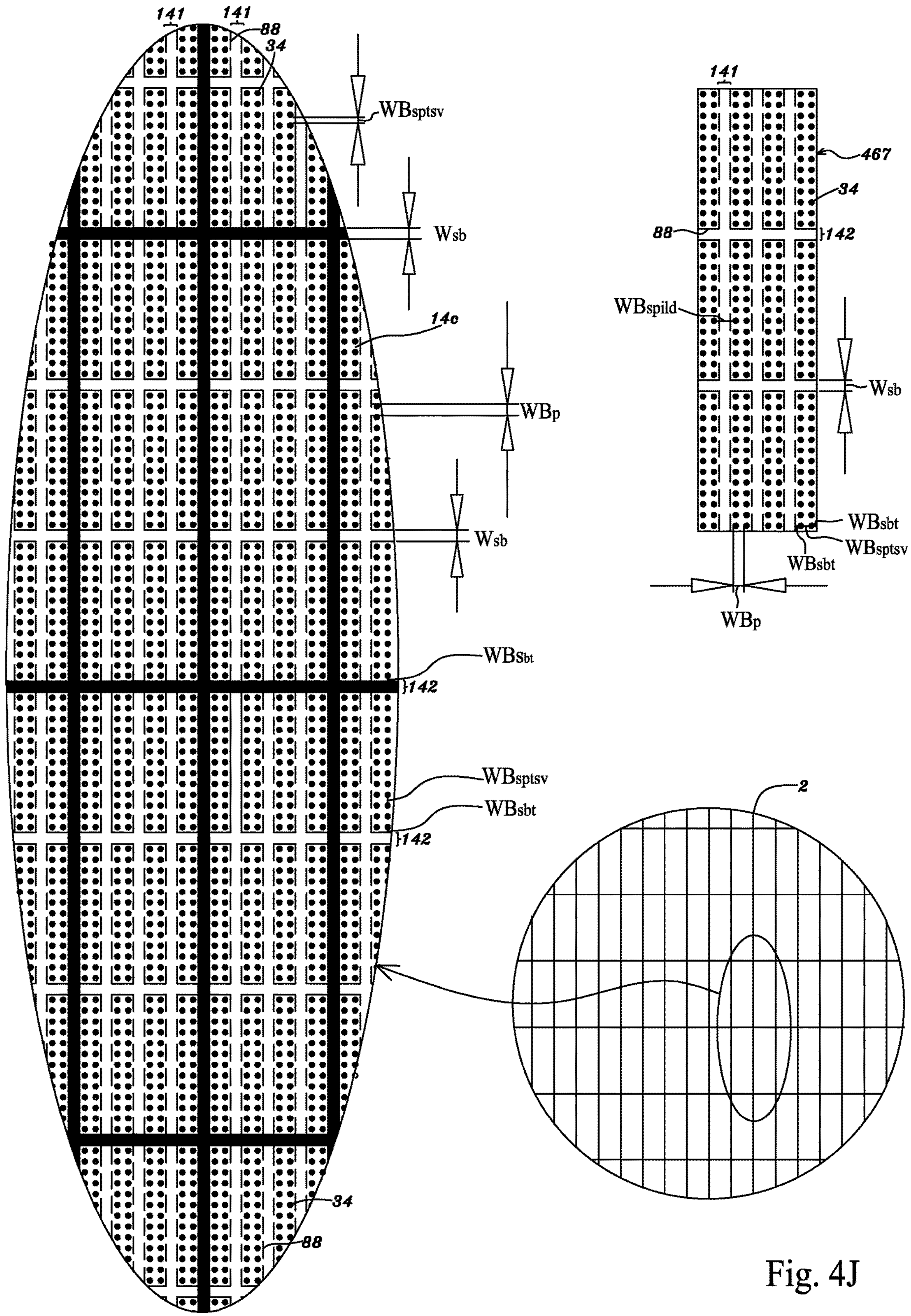
Figure 4K:
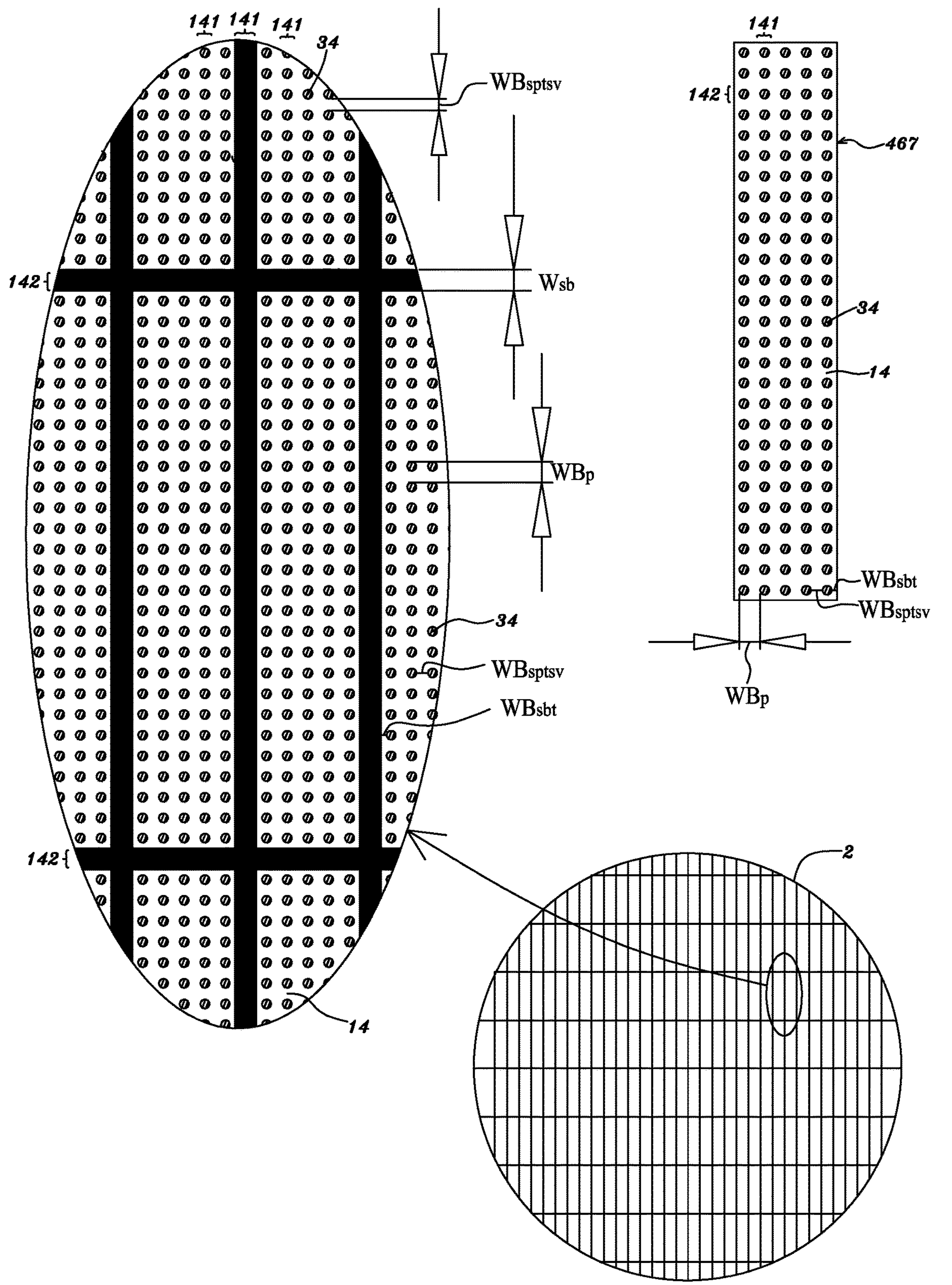
FIGS. 4K and 4L are schematically top views showing various arrangements of reserved scribe lines and micro-bumps or micro-pads for a first type of vertical-through-via (VTV) connector for the third case in accordance with an embodiment of the present application.
Figure 4L:
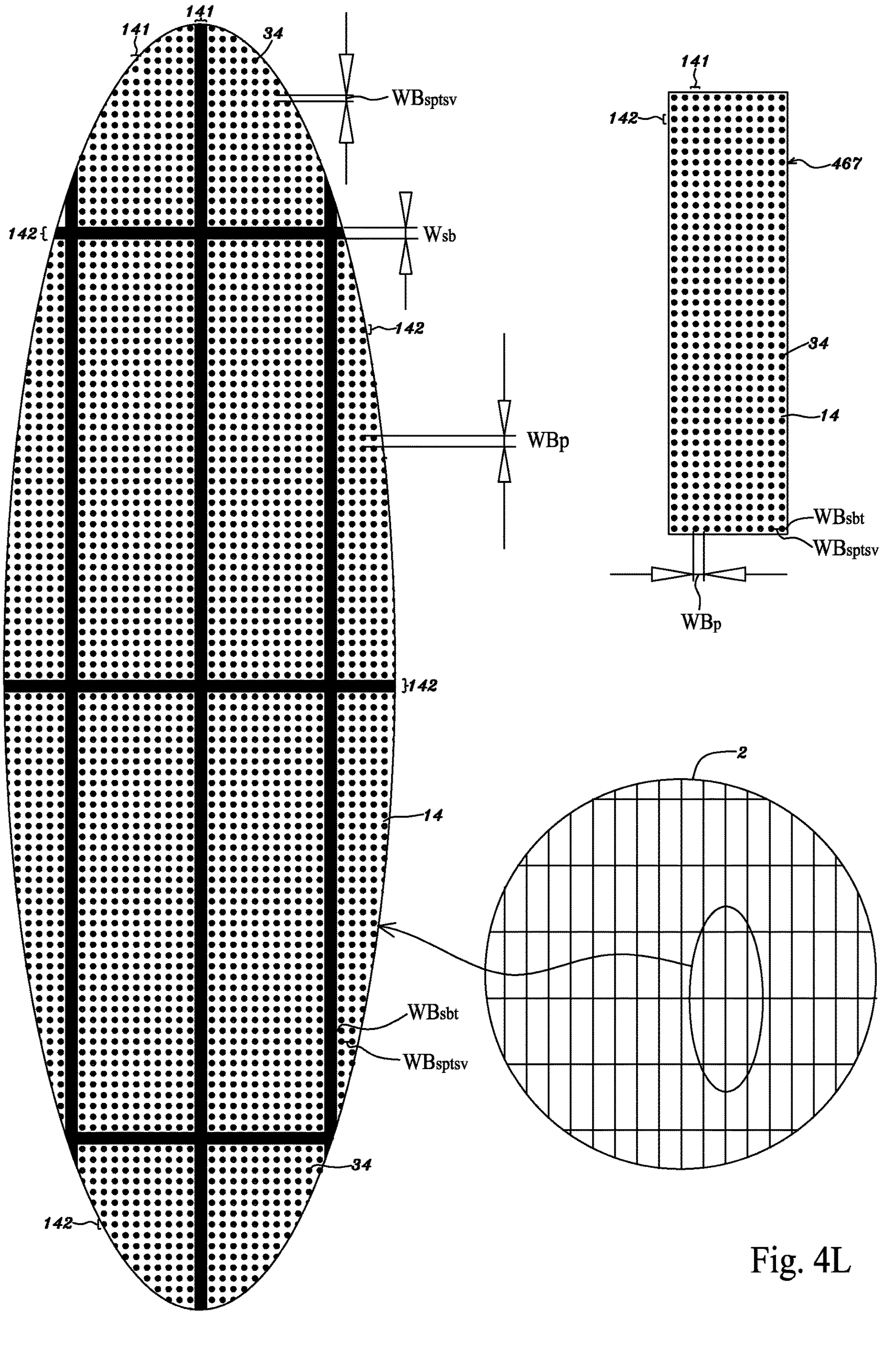

FIGS. 4G and 4H are schematically top views showing various arrangements of reserved scribe lines and micro-bumps or micro-pads for a first type of vertical-through-via (VTV) connector for the first case in accordance with an embodiment of the present application. FIGS. 4I and 4J are schematically top views showing various arrangements of reserved scribe lines and micro-bumps or micro-pads for a first type of vertical-through-via (VTV) connector for the second case in accordance with an embodiment of the present application. FIGS. 4K and 4L are schematically top views showing various arrangements of reserved scribe lines and micro-bumps or micro-pads for a first type of vertical-through-via (VTV) connector for the third case in accordance with an embodiment of the present application. For the first case, referring to FIGS. 1F, 4G and 4H, a pitch $WB_p$ between each neighboring two of the first, second, third or fourth type of micro-bumps or micro-pads 34 may range from 20 to 150 micrometers or from 40 to 100 micrometers; and a space $WB_{sptsv}$ between each neighboring two of the first, second, third or fourth type of micro-bumps or micro-pads 34 may range from 20 to 150 micrometers or from 40 to 100 micrometers. The first, second, third or fourth type of micro-bumps or micro-pads 34 arranged in only one line in the y direction are arranged between neighboring two of the first reserved scribe lines 141, and the first, second, third or fourth type of micro-bumps or micro-pads 34 arranged in only one line in the x direction are arranged between neighboring two of the second reserved scribe lines 142. Each of the insulating-material islands 14*c* may be aligned with only one of the first, second, third or fourth type of micro-bumps or micro-pads 34, and one of the openings 14*a* in said each of the insulating-material islands 14*c* may be arranged under said only one of the first, second, third or fourth type of micro-bumps or micro-pads 34. Accordingly, the pitch $WB_p$ and space $WB_{sptsv}$ in the y direction between each neighboring two of the first, second, third or fourth type of micro-bumps or micro-pads 34 may be greater than the width $W_{sb}$ of the second reserved scribe lines 142 or greater than the width $W_{sb}$ of the second reserved scribe lines 142 plus two times of a predetermined space $WB_{sbt}$ between one of the second reserved scribe lines 142 and one of said each neighboring two of the first, second, third or fourth type of micro-bumps or micro-pads 34 adjacent to said one of the second reserved scribe lines 142. The pitch $WB_p$ and space $WB_{sptsv}$ in the x direction between each neighboring two of the first, second, third or fourth type of micro-bumps or micro-pads 34 may be greater than the width $W_{sb}$ of the first reserved scribe lines 141 or greater than the width $W_{sb}$ of the first reserved scribe lines 141 plus two times of a predetermined space $WB_{sbt}$ between one of the first reserved scribe lines 141 and one of said each neighboring two of the first, second, third or fourth type of micro-bumps or micro-pads 34 adjacent to said one of the first reserved scribe lines 141.

For the second case, referring to FIGS. 1I, 4I and 4J, the first, second, third or fourth type of micro-bumps or micro-pads 34 may be populated regularly in multiple islands or regions 88 of arrays of micro-bumps or micro-pads with the first and second reserved scribe lines 141 and 142 each between neighboring two of the islands or regions 88 of arrays of micro-bumps or micro-pads. A pitch $WB_p$ between each neighboring two of the first, second, third or fourth type of micro-bumps or micro-pads 34 aligned with one of the islands or regions 88 of arrays of micro-bumps or micro-pads may range from 5 to 50 micrometers or from 5 to 20 micrometers or may be smaller than 50, 40 or 30 micrometers; and a space $WB_{sptsv}$ between neighboring two of the first, second, third or fourth type of micro-bumps or micro-pads 34 aligned with one of the islands or regions 88 of arrays of micro-bumps or micro-pads may range from 5 to 50 micrometers or from 5 to 20 micrometers or may be smaller than 50, 40 or 30 micrometers. For each of the islands or regions 88 of arrays of micro-bumps or micro-pads, its first, second, third or fourth type of micro-bumps or micro-pads 34 may be arranged in multiple columns, such as two columns for an embodiment shown in FIGS. 1I, 4I and 4J, and in multiple rows, such as thirteen rows for an embodiment shown in FIGS. 1I, 4I and 4J; its insulating-material island 14*c* may be aligned with its first, second, third or fourth type of micro-bumps or micro-pads 34, and multiple of the openings 14*a* in its insulating-material island 14*c* may be arranged under its first, second, third or fourth type of micro-bumps or micro-pads 34 respectively. The pitch $WB_p$ and space $WB_{sptsv}$ in the y direction between each neighboring two of the first, second, third or fourth type of micro-bumps or micro-pads 34 aligned with one of the islands or regions 88 of arrays of micro-bumps or micro-pads may be smaller than the width $W_{sb}$ of the second reserved scribe lines 142 and/or smaller than a first space $WB_{spild}$ between neighboring two of the first, second, third or fourth type of micro-bumps or micro-pads 34 and across one of the second reserved scribe lines 142 between said neighboring two of the islands or regions 88 of arrays of micro-bumps or micro-pads. The first space $WB_{spild}$ or a width of the trench 14*b* extending in the x direction between neighboring two of the insulating-material islands 14*c* may be greater than 50, 40 or 30 micrometers. The first space $WB_{spild}$ may be greater than the width $W_{sb}$ of the second reserved scribe lines 142 or greater than the width $W_{sb}$ of the second reserved scribe lines 142 plus two times of a predetermined space $WB_{sbt}$ in the y direction between one of the second reserved scribe lines 142 and one of the first, second, third or fourth type of micro-bumps or micro-pads 34 adjacent to said one of the second reserved scribe lines 142. The pitch $WB_p$ and space $WB_{sptsv}$ in the x direction between each neighboring two of the first, second, third or fourth type of micro-bumps or micro-pads 34 aligned with one of the islands or regions 88 of arrays of micro-bumps or micro-pads may be smaller than the width $W_{sb}$ of the first reserved scribe lines 141 and/or smaller than a second space $WB_{spild}$ between neighboring two of the first, second, third or fourth type of micro-bumps or micro-pads 34 and across one of the first reserved scribe lines 141 between said neighboring two of the islands or regions 88 of arrays of micro-bumps or micro-pads. The second space $WB_{spild}$ or a width of the trench 14*b* extending in the y direction between neighboring two of the insulating-material islands 14*c* may be greater than 50, 40 or 30 micrometers. The second space $WB_{spild}$ may be greater than or equal to the width $W_{sb}$ of the first reserved scribe lines 141 or greater than or equal to the width $W_{sb}$ of the first reserved scribe lines 141 plus two times of a predetermined space $WB_{sbt}$ in the x direction between one of the first reserved scribe lines 141 and one of the first, second, third or fourth type of micro-bumps or micro-pads 34 adjacent to said one of the first reserved scribe lines 141.

For the third case, referring to FIGS. 1L, 4K and 4L, a pitch $WB_p$ between each neighboring two of the first, second, third or fourth type of micro-bumps or micro-pads 34 may range from 5 to 50 micrometers or from 5 to 20 micrometers or may be smaller than 50, 40 or 30 micrometers; and a space $WB_{sptsv}$ between neighboring two of the first, second, third or fourth type of micro-bumps or micro-pads 34 may range from 5 to 50 micrometers or from 5 to 20 micrometers or may be smaller than 50, 40 or 30 micrometers. Each of the first reserved scribe lines 141 may extend in line with multiple of the first, second, third or fourth type of micro-bumps or micro-pads 34 arranged in a line in the y direction. Each of the second reserved scribe lines 142 may extend in line with multiple of the first, second, third or fourth type of micro-bumps or micro-pads 34 arranged in a line in the x direction. Accordingly, the pitch $WB_p$ and space $WB_{sptsv}$ in the y direction between each neighboring two of the first, second, third or fourth type of micro-bumps or micro-pads 34 may be smaller than the width $W_{sb}$ of the second reserved scribe lines 142 or smaller than the width $W_{sb}$ of the second reserved scribe lines 142 plus two times of a predetermined space $W_{sbt}$ between one of the second reserved scribe lines 142 and one of the first, second, third or fourth type of micro-bumps or micro-pads

34 adjacent to said one of the second reserved scribe lines 142. The pitch $WB_p$ and space $WB_{sptsv}$ in the x direction between each neighboring two of the first, second, third or fourth type of micro-bumps or micro-pads 34 may be smaller than the width $W_{sb}$ of the first reserved scribe lines 141 or smaller than the width $W_{sb}$ of the first reserved scribe lines 141 plus two times of a predetermined space $WB_{sbt}$ between one of the first reserved scribe lines 141 and one of the first, second, third or fourth type of micro-bumps or micro-pads 34 adjacent to said one of the first reserved scribe lines 141.

The first type of vertical-through-via (VTV) connector 467 to be processed from the through-silicon-via (TSV) wafer as seen in FIG. 1F, 1I or 1L may have a size to be selected from various sizes after the backside of the semiconductor substrate 2 is polished to expose the backside of each of the through silicon vias (TSVs) 157. When a size for the first type of vertical-through-via (VTV) connectors 467 is selected or determined, the through-silicon-via (TSV) wafer shown in FIG. 1F, 1I or 1L may be cut or diced along (or through) some or all of the first reserved scribe lines 141 and some or all of the second reserved scribe lines 142 to form a number of the first type of vertical-through-via (VTV) connectors 467 in a single-die type, i.e., through-silicon-via interconnect elevators (TSVIEs), each having the selected or predetermined size, as shown in FIG. 1G, 1J or 1M respectively, by a laser cutting process or by a mechanical cutting process.

The second type of vertical-through-via (VTV) connector 467 to be processed from the through-silicon-via (TSV) wafer as seen in FIG. 1F, 1I or 1L where, however, none of the passivation layer 14 and micro-bumps or micro-pads 34 is formed may have a size to be selected from various sizes after the backside of the semiconductor substrate 2 is polished to expose the backside of each of the through silicon vias (TSVs) 157. When a size for the second type of vertical-through-via (VTV) connectors 467 is selected or determined, the through-silicon-via (TSV) wafer as seen in FIG. 1D where, however, none of the passivation layer 14 and micro-bumps or micro-pads 34 is formed may be cut or diced along (or through) some or all of the first reserved scribe lines 141 and some or all of the second reserved scribe lines 142 to form a number of the second type of vertical-through-via (VTV) connectors 467 in a single-die type, i.e., through-silicon-via interconnect elevators (TSVIEs), each having the selected or predetermined size, as shown in FIG. 1H, 1K or 1N for the first, second or third case respectively, by a laser cutting process or by a mechanical cutting process.

The aspect ratio of the length to the width for each of the first and second types of vertical-through-via (VTV) connectors 467 may be between 2 and 10, between 4 and 10 or between 2 and 40. Each of the first and second types of vertical-through-via (VTV) connectors 467 may be provided with passive elements, such as capacitors, but without any active device, i.e., transistor, therein. Each of the first and second types of vertical-through-via (VTV) connectors 467 may be manufactured by packaging manufacturing companies or facilities without front-end of line manufacturing capability.

For the first case, referring to FIGS. 1G, 1H, 4A and 4B, for each of the first and second types of vertical-through-via (VTV) connectors 467, the distance $W_{sbt}$ between its edge and one of its vertical through vias (VTVs) 358 may be smaller than the space $W_{sptsv}$ between neighboring two of its vertical through vias (VTVs) 358 and the distance $W_{sbt}$ between its edge and one of its vertical through vias (VTVs) 358 may be smaller than 50, 40 or 30 micrometers; optionally, its edge may be aligned with an edge of said one of its vertical through vias (VTVs) 358. Furthermore, referring to FIGS. 1G, 4G and 4H, for the first type of vertical-through-via (VTV) connector 467, the distance $WB_{sbt}$ between its edge and one of its first, second, third or fourth type of micro-bumps or micro-pads 34 may be smaller than the space $WB_{sptsv}$ between neighboring two of its first, second, third or fourth type of micro-bumps or micro-pads 34 and the distance $WB_{sbt}$ between its edge and one of its first, second, third or fourth type of micro-bumps or micro-pads 34 may be smaller than 50, 40 or 30 micrometers; optionally, its edge may be aligned with an edge of one of its first, second, third or fourth type of micro-bumps or micro-pads 34.

For the second case, referring to FIGS. 1J, 1K, 4C and 4D, for each of the first and second types of vertical-through-via (VTV) connectors 467, each of its first and second spaces $W_{spild}$ between neighboring two of its vertical through vias (VTVs) 358 and across one of its first and second reserved scribe lines 141 and 142 between said neighboring two of its vertical through vias (VTVs) 358 may be greater than 50, 40 or 30 micrometers, and the distance $W_{sbt}$ between its edge and one of its vertical through vias (VTVs) 358 may be smaller than the space $W_{sptsv}$ between neighboring two of its vertical through vias (VTVs) 358 and the distance $W_{sbt}$ between its edge and one of its vertical through vias (VTVs) 358 may be smaller than 50, 40 or 30 micrometers; optionally, its edge may be aligned with an edge of said one of its vertical through vias (VTVs) 358. Furthermore, referring to FIGS. 1J, 4I and 4J, the first type of vertical-through-via (VTV) connector 467 may include the insulating-material islands 14*c* having the trench 14*b* therebetween having a width greater than 50, 40 or 30 micrometers; each of its first and second spaces $WB_{spild}$ between neighboring two of its first, second, third or fourth type of micro-bumps or micro-pads 34 and across one of its first and second reserved scribe lines 141 and 142 between said neighboring two of its first, second, third or fourth type of micro-bumps or micro-pads 34 may be greater than 50, 40 or 30 micrometers; the distance $WB_{sbt}$ between its edge and one of its first, second, third or fourth type of micro-bumps or micro-pads 34 may be smaller than the space $WB_{sptsv}$ between neighboring two of its first, second, third or fourth type of micro-bumps or micro-pads 34 and the distance $WB_{sbt}$ between its edge and one of its first, second, third or fourth type of micro-bumps or micro-pads 34 may be smaller than 50, 40 or 30 micrometers; optionally, its edge may be aligned with an edge of one of its first, second, third or fourth type of micro-bumps or micro-pads 34.

Figure 1O:
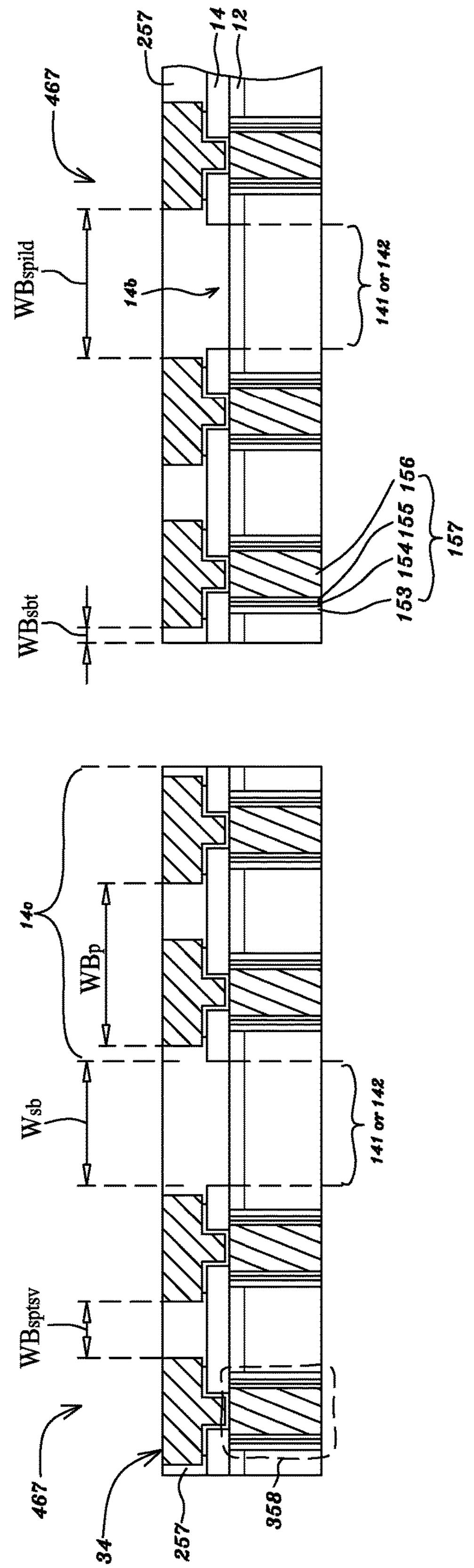
FIG. 1O-1U are schematically cross-sectional views showing third through ninth types of vertical-through-via (VTV) connectors for a second case in accordance with an embodiment of the present application.
Figure 1P:
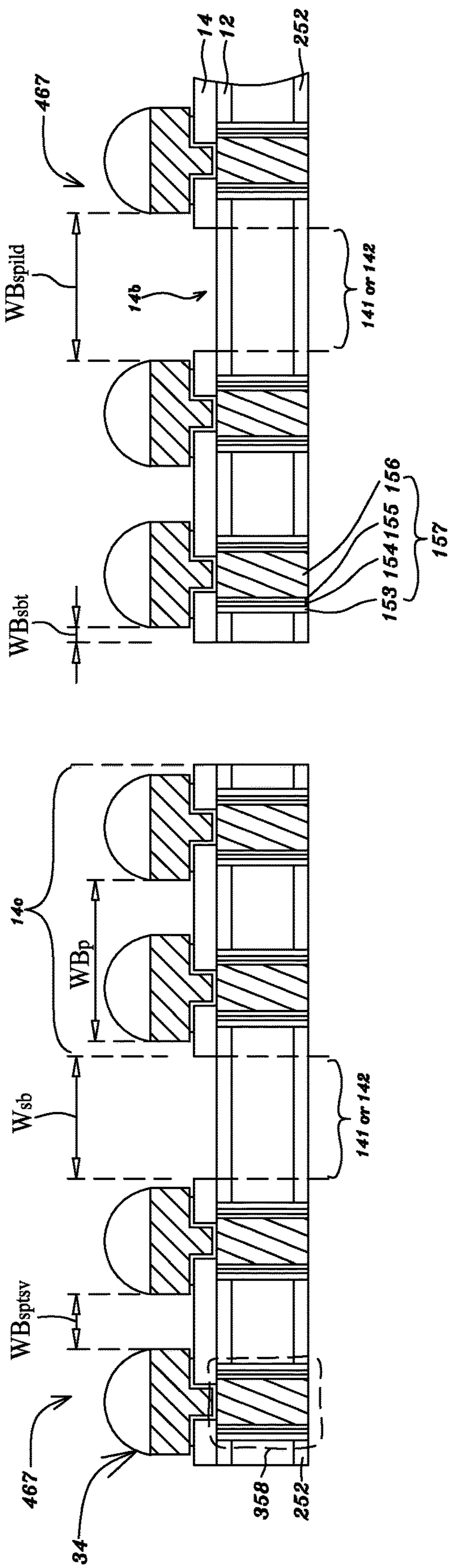
Figure 1Q:
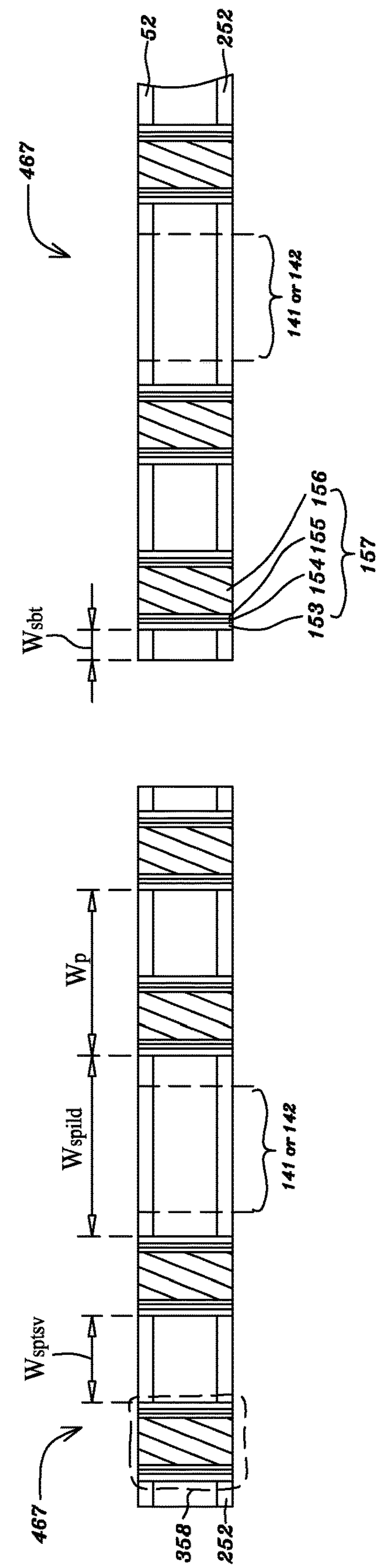
Figure 1R:
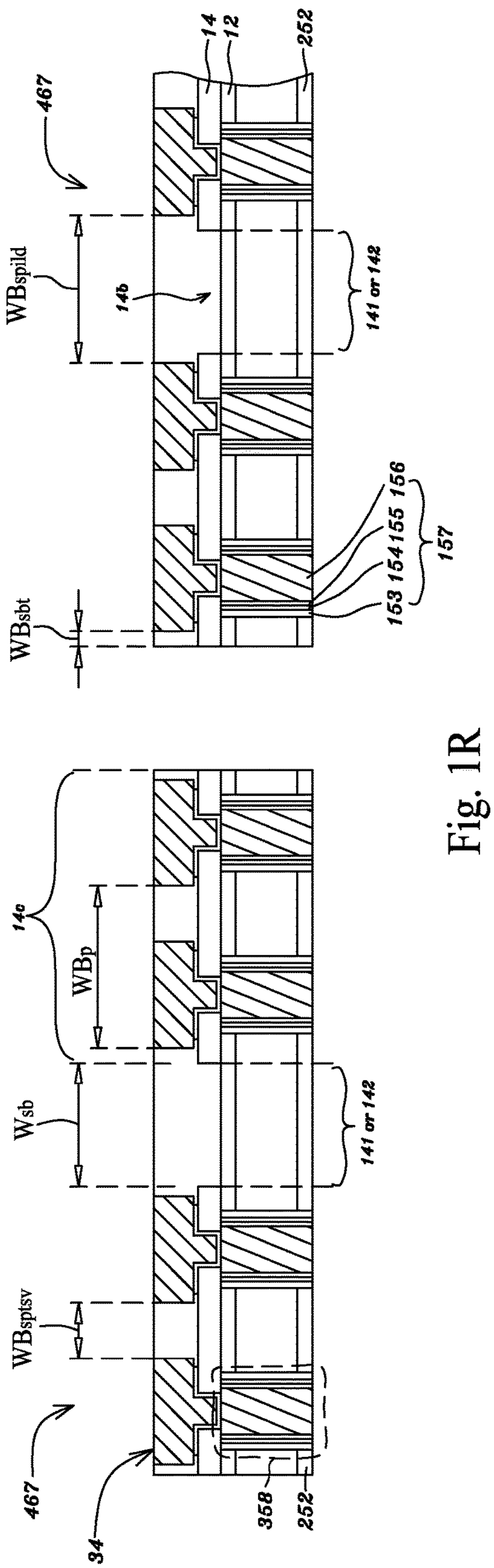
Figure 1S:
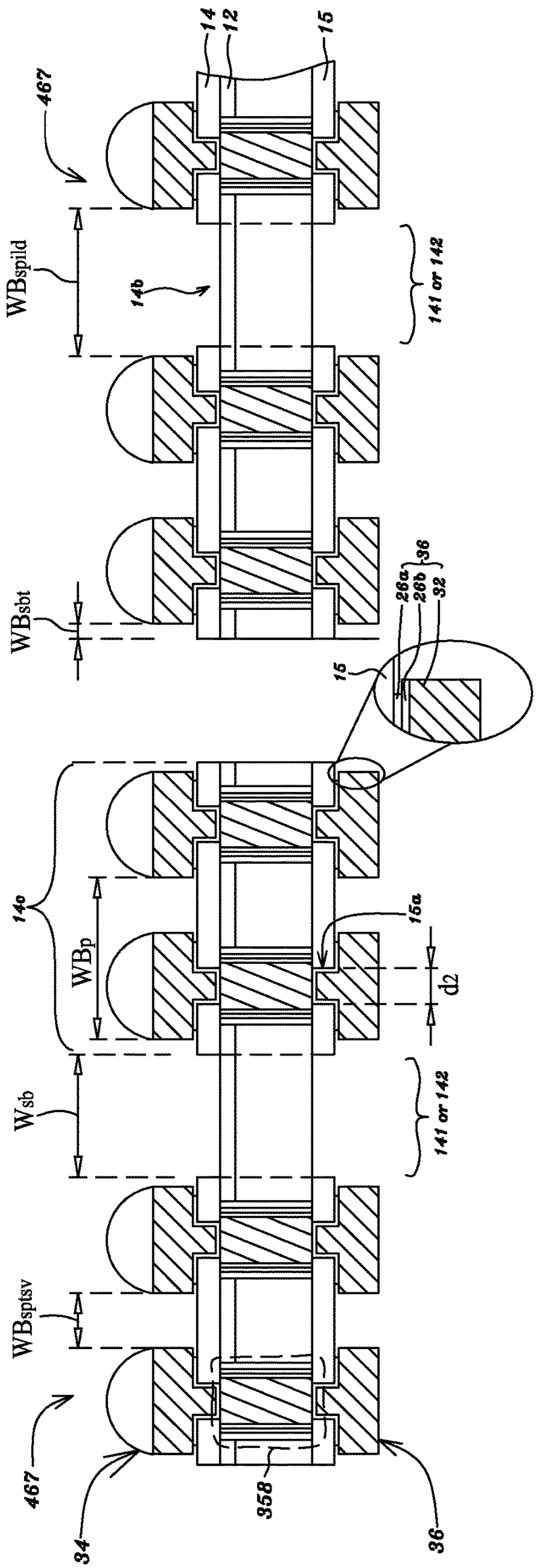
Figure 1T:
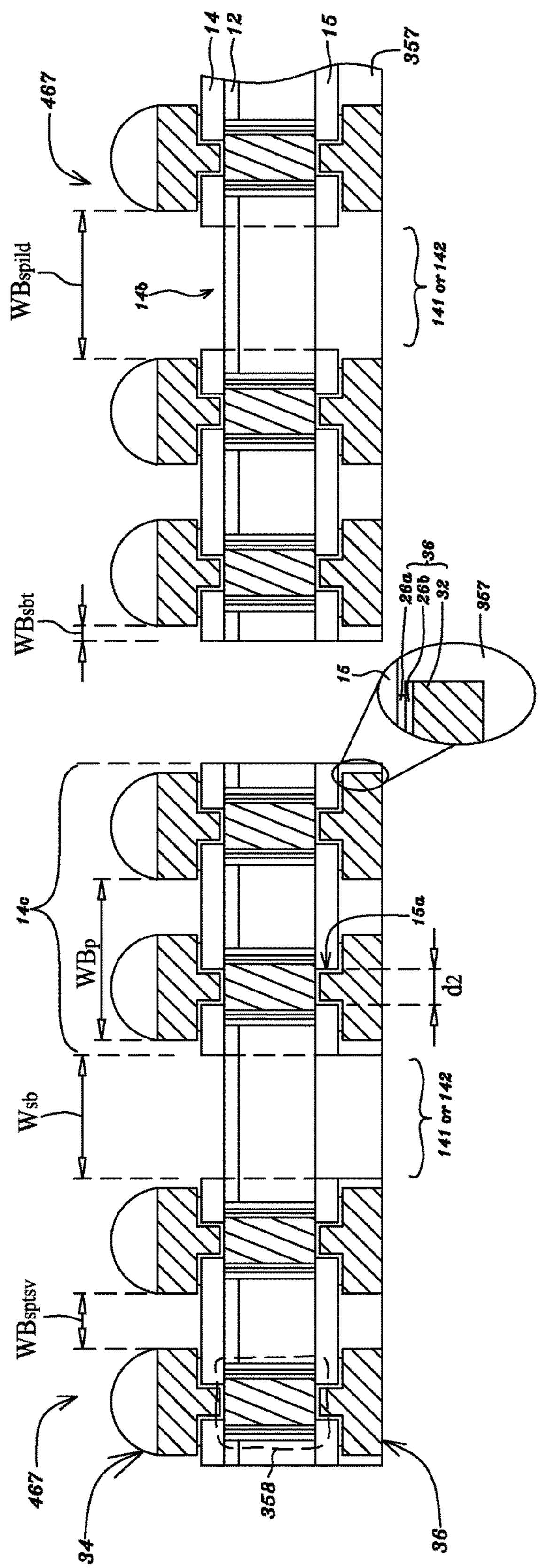
Figure 1U:
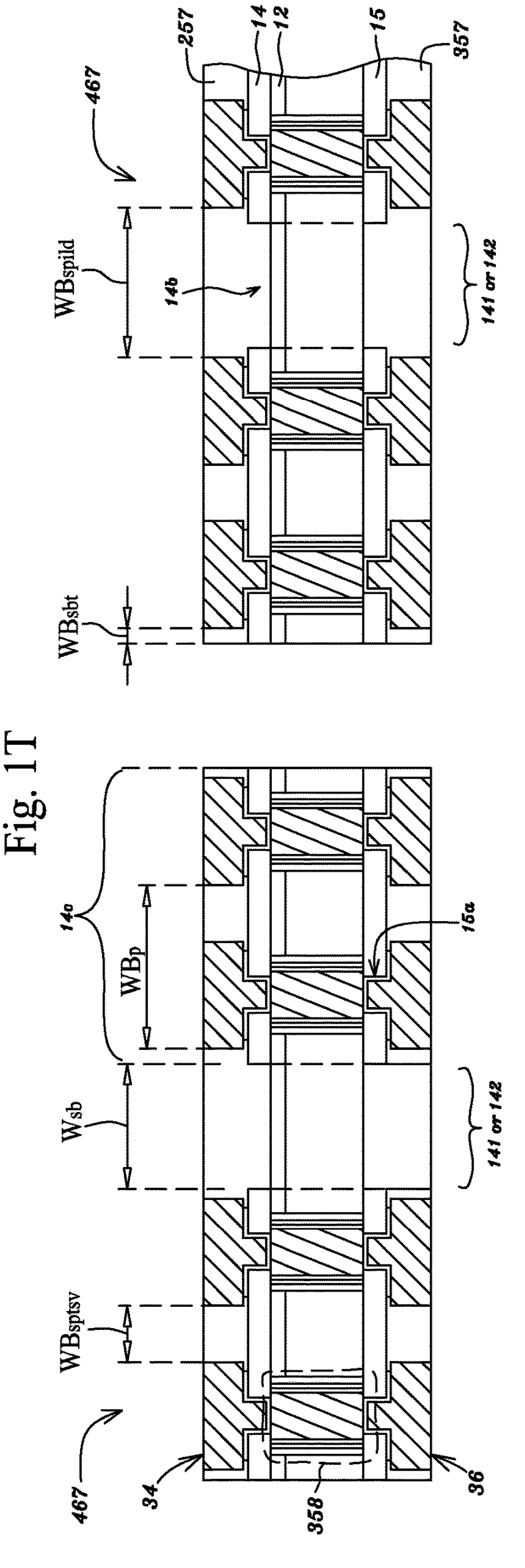
Figure 1V:
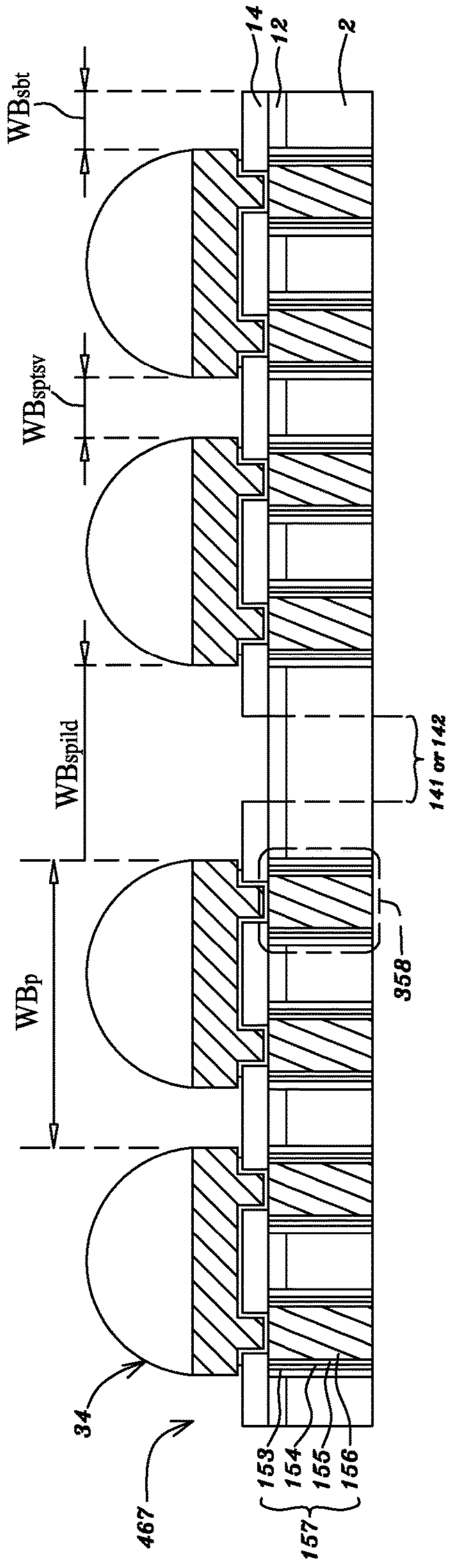
FIG. 1V is a schematically cross-sectional view showing a first type of vertical-through-via (VTV) connector for a second case in accordance with another embodiment of the present application.

Alternatively, for the first type of vertical-through-via (VTV) connectors 467 for the second case as seen in FIG. 1V, each of its first, second, third or fourth type of micro-bumps or micro-pads 34 may cover and align with two or more than two of its through silicon vias (TSVs) 157, having the adhesion layer 26*a* on its passivation layer 14 and the top surface of the copper layer 156 of each of said two or more than two of its through silicon vias (TSVs) 157. For an element indicated by the same reference number shown in FIGS. 1I, 1J and 1V, the specification of the element as seen in FIG. 1V may be referred to that of the element as illustrated in FIG. 1I or 1J.

For the third case, referring to FIGS. 1M, 1N, 4E and 4F, for each of the first and second types of vertical-through-via (VTV) connectors 467, the distance $W_{sbt}$ between its edge and one of its vertical through vias (VTVs) 358 may be smaller than the space $W_{sptsv}$ between neighboring two of its vertical through vias (VTVs) 358, wherein the space $W_{sptsv}$ between neighboring two of its vertical through vias (VTVs) 358 may be smaller than 50, 40 or 30 micrometers and the distance $W_{sbt}$ between its edge and one of its vertical through vias (VTVs) 358 may be smaller than 50, 40 or 30 micrometers; optionally, its edge may be aligned with an edge of said one of its vertical through vias (VTVs) 358. Furthermore, referring to FIGS. 1M, 4K and 4L, for the first type of vertical-through-via (VTV) connector 467, the distance $WB_{sbt}$ between its edge and one of its first, second, third or fourth type of micro-bumps or micro-pads 34 may be smaller than the space $WB_{sptsv}$ between neighboring two of its first, second, third or fourth type of micro-bumps or micro-pads 34, wherein the distance $WB_{sbt}$ between its edge and one of its first, second, third or fourth type of micro-bumps or micro-pads 34 may be smaller than 50, 40 or 30 micrometers; the space $WB_{sptsv}$ between neighboring two of its first, second, third or fourth type of micro-bumps or micro-pads 34 may be smaller than 50, 40 or 30 micrometers; optionally, its edge may be aligned with an edge of one of its first, second, third or fourth type of micro-bumps or micro-pads 34.

For the first case, referring to FIGS. 1G and 1H, each of the first and second types of vertical-through-via (VTV) connectors 467 may be arranged with a size as seen in FIG. 4A for containing 14-by-3 vertical through vias (VTVs) 358 or another size as seen in FIG. 4B for containing 21-by-6 vertical through vias (VTVs) 358, for example. Furthermore, for the first case, referring to FIG. 1G, the first type of vertical-through-via (VTV) connector 467 may be arranged with a size as seen in FIG. 4G for containing 14-by-3 first, second, third or fourth type of micro-bumps or micro-pads 34 and 14-by-3 insulating-material islands 14*c* or another size as seen in FIG. 4H for containing 21-by-6 first, second, third or fourth type of micro-bumps or micro-pads 34 and 21-by-6 insulating-material islands 14*c*, for example.

For the second case, referring to FIGS. 1J and 1K, each of the first and second types of vertical-through-via (VTV) connectors 467 may be arranged with a size as seen in FIG. 4C for containing 2-by-2 islands or regions 188 of arrays of vertical through vias (VTVs) 358, each island or region 188 of which contains 13-by-2 vertical through vias (VTVs) 358, or another size as seen in FIG. 4D for containing 3-by-4 islands or regions 188 of arrays of vertical through vias (VTVs) 358, each island or region 188 of which contains 13-by-2 vertical through vias (VTVs) 358, for example. Furthermore, for the second case, referring to FIG. 1J, the first type of vertical-through-via (VTV) connector 467 may be arranged with a size as seen in FIG. 4I for containing 2-by-2 islands or regions 88 of arrays of micro-bumps or micro-pads, each island or region 88 of which contains 13-by-2 first, second, third or fourth type of micro-bumps or micro-pads 34, and 2-by-2 insulating-material islands 14*c* or another size as seen in FIG. 4J for containing 3-by-4 islands or regions 88 of arrays of micro-bumps or micro-pads, each island or region 88 of which contains 13-by-2 first, second, third or fourth type of micro-bumps or micro-pads 34, and 3-by-4 insulating-material islands 14*c*, for example.

For the third case, referring to FIGS. 1M and 1N, each of the first and second types of vertical-through-via (VTV) connectors 467 may be arranged with a size as seen in FIG. 4E for containing 27-by-5 vertical through vias (VTVs) 358 or another size as seen in FIG. 4F for containing 41-by-11 vertical through vias (VTVs) 358, for example. Furthermore, for the third case, referring to FIG. 1M, the first type of vertical-through-via (VTV) connector 467 may be arranged with a size as seen in FIG. 4K for containing 27-by-5 first, second, third or fourth type of micro-bumps or micro-pads 34 or another size as seen in FIG. 4L for containing 41-by-11 first, second, third or fourth type of micro-bumps or micro-pads 34, for example.

Accordingly, for each of the first through third cases, each of the first and second types of vertical-through-via (VTV) connectors 467 may be arranged with a size for containing vertical through vias (VTVs) 358 arranged in an array with M1 row(s) by N1 column(s); furthermore, for each of the first through third cases, the first type of vertical-through-via (VTV) connector 467 may be arranged with a size for containing the first, second, third or fourth type of micro-bumps or micro-pads 34 arranged in an array with M2 row(s) by N2 column(s), wherein M1, M2, N1 and N2 are integers, M1 is greater than N1 and M2 is greater than N2. For an example, each of the numbers M1 and M2 may be greater than or equal to 50 and smaller than or equal to 500, and each of the numbers N1 and N2 may be greater than or equal to 1 and smaller than or equal to 15. For another example, each of the numbers N1 and N2 may be greater than or equal to 30 and smaller than or equal to 200, and each of the numbers M1 and M2 may be greater than or equal to 1 and smaller than or equal to 10. The standard common through-silicon-via (TSV) wafers as seen in FIG. 1F, 1I or 1L may have a fixed pattern of design and layout for locations of the vertical through vias (VTVs) 358 and first, second, third or fourth type of micro-bumps or micro-pads 34, and may be cut or diced to form a number of the first type of vertical-through-via (VTV) connectors 467 in a single-die type, i.e., through-silicon-via interconnect elevators (TSVIEs), as seen in FIG. 1G, 1J or 1M, having various dimensions or shapes, various numbers of the vertical through vias (VTVs) 358 and various numbers of the first, second, third or fourth type of micro-bumps or micro-pads 34. Alternatively, the standard common through-silicon-via (TSV) wafer as seen in FIG. 1F, 1I or 1L where, however, none of the passivation layer 14 and micro-bumps or micro-pads 34 is formed may have a fixed pattern of design and layout for locations of the vertical through vias (VTVs) 358, and may be cut or diced to form a number of the second type of vertical-through-via (VTV) connectors 467 in a single-die type, i.e., through-silicon-via interconnect elevators (TSVIEs), as seen in FIG. 1H, 1K or 1N for the first, second or third case respectively, having various dimensions or shapes, various numbers of the vertical through vias (VTVs) 358.

Alternatively, for forming a third type of vertical-through-via (VTV) connector 467 as seen in FIG. 1O, which is similar to the first type of vertical-through-via (VTV) connector 467 as illustrated in FIGS. 1A-1G, 1I-1J or 1L-1M for either of the first through third cases as illustrated in FIGS. 4A-4L, after the first type of micro-bumps or micro-pads 34 are formed as illustrated in FIG. 1E, an insulating dielectric layer 257 as seen in FIG. 1O may be further formed at a top side of the semiconductor substrate 2, covering a sidewall of the copper layer 32 of each of the first type of micro-bumps or micro-pads 34, wherein the insulating dielectric layer 257 may have a top surface coplanar to a top surface of each of the first type of micro-bumps or micro-pads 34. The insulating dielectric layer 257 may be a polymer, such as polyimide, BenzoCycloButene (BCB), parylene, polybenzoxazole (PBO), epoxy-based material or compound, photo epoxy SU-8, elastomer, or silicone. The insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan. Next, the backside of the semiconductor substrate 2 is polished to expose the backside of each of the through silicon vias (TSVs) 157 as illustrated in FIG. 1F. When a size for the third type of vertical-through-via (VTV) connectors 467 is selected or determined, the through-silicon-via (TSV) wafer as seen in FIG. 1F, 1I or 1L where the insulating dielectric layer 257 is further formed may be cut or diced along (or through) some or all of the first reserved scribe lines 141 and some or all of the second reserved scribe lines 142 to form a number of the third type of vertical-through-via (VTV) connectors 467 in a single-die type, i.e., through-silicon-via interconnect elevators (TSVIEs), each having the selected or predetermined size, as seen in FIG. 1G, 1J or 1M respectively where the insulating dielectric layer 257 is further formed, by a laser cutting process or by a mechanical cutting process. In this embodiment, the third type of vertical-through-via (VTV) connector 467 as seen in FIG. 1O is arranged for the second case as illustrated in FIGS. 1I, 1J, 4C, 4D, 4I and 4J.

Alternatively, for forming a fourth type of vertical-through-via (VTV) connector 467 as seen in FIG. 1P, which is similar to the process for forming the first type of vertical-through-via (VTV) connector 467 as illustrated in FIGS. 1A-1G, 1I-1J or 1L-1M for either of the first through third cases as illustrated in FIGS. 4A-4L, after the backside of the semiconductor substrate 2 is polished to expose the backside of each of the through silicon vias (TSVs) 157 as seen in FIG. 1F, an insulating bonding layer 252 as seen in FIG. 1P may be formed at the backside of the semiconductor substrate 2 by forming a recess from the backside of the copper layer 156 of each of the through silicon vias (TSVs) 157 using an etching process, next forming the insulating bonding layer 252 on the backside of the semiconductor substrate 2 and the backside of the copper layer 156 of each of the through silicon vias (TSVs) 157 and next removing the insulating bonding layer 252 on the backside of the copper layer 156 of each of the through silicon vias (TSVs) 157 using a chemical-mechanical polishing (CMP) process until the backside of the copper layer 156 of each of the through silicon vias (TSVs) 157 is exposed. Thus, the insulating bonding layer 252 may have a bottom surface substantially coplanar to the backside of the copper layer 156 of each of the through silicon vias (TSVs) 157 and have a thickness between 1 and 1,000 nanometers. When a size for the fourth type of vertical-through-via (VTV) connectors 467 is selected or determined, the through-silicon-via (TSV) wafer as seen in FIG. 1F, 1I or 1L where the insulating bonding layer 252 is further formed may be cut or diced along (or through) some or all of the first reserved scribe lines 141 and some or all of the second reserved scribe lines 142 to form a number of the fourth type of vertical-through-via (VTV) connectors 467 in a single-die type, i.e., through-silicon-via interconnect elevators (TSVIEs), each having the selected or predetermined size, as seen in FIG. 1G, 1J or 1M respectively where the insulating bonding layer 252 is further formed, by a laser cutting process or by a mechanical cutting process. In this embodiment, the fourth type of vertical-through-via (VTV) connector 467 as seen in FIG. 1P is arranged for the second case as illustrated in FIGS. 1I, 1J, 4C, 4D, 4I and 4J.

Alternatively, for forming a fifth type of vertical-through-via (VTV) connector 467 as seen in FIG. 1Q, which is similar to the process for forming the second type of vertical-through-via (VTV) connector 467 as illustrated in FIGS. 1A-1H, 1K or 1N for either of the first through third cases as illustrated in FIGS. 4A-4F, after the backside of the semiconductor substrate 2 is polished to expose the backside of each of the through silicon vias (TSVs) 157, an insulating bonding layer 252 as seen in FIG. 1Q may be formed at the backside of the semiconductor substrate 2. The specification for the insulating bonding layer 252 of the fifth type of vertical-through-via (VTV) connector 467 and the process for forming the same may be referred to the specification for the insulating bonding layer 252 of the fourth type of vertical-through-via (VTV) connector 467 and the process for forming the same as illustrated in FIG. 1P. When a size for the fifth type of vertical-through-via (VTV) connectors 467 is selected or determined, the through-silicon-via (TSV) wafer as seen in FIG. 1F, 1I or 1L where the insulating bonding layer 252 is further formed and none of the passivation layer 14 and micro-bumps or micro-pads 34 is formed may be cut or diced along (or through) some or all of the first reserved scribe lines 141 and some or all of the second reserved scribe lines 142 to form a number of the fifth type of vertical-through-via (VTV) connectors 467 in a single-die type, i.e., through-silicon-via interconnect elevators (TSVIEs), each having the selected or predetermined size, as seen in FIG. 1H, 1K or 1N respectively where the insulating bonding layer 252 is further formed, by a laser cutting process or by a mechanical cutting process. In this embodiment, the fifth type of vertical-through-via (VTV) connector 467 as seen in FIG. 1Q is arranged for the second case as illustrated in FIGS. 1K, 4C and 4D.

Alternatively, for forming a sixth type of vertical-through-via (VTV) connector 467 as seen in FIG. 1R, which is similar to the third type of vertical-through-via (VTV) connector 467 as illustrated in FIGS. 1A-1G, 1I-1J, 1L-1M or 1O for either of the first through third cases as illustrated in FIGS. 4A-4L, after the backside of the semiconductor substrate 2 is polished to expose the backside of each of the through silicon vias (TSVs) 157, an insulating bonding layer 252 as seen in FIG. 1R may be formed at the backside of the semiconductor substrate 2. The specification for the insulating bonding layer 252 of the sixth type of vertical-through-via (VTV) connector 467 and the process for forming the same may be referred to the specification for the insulating bonding layer 252 of the fourth type of vertical-through-via (VTV) connector 467 and the process for forming the same as illustrated in FIG. 1P. When a size for the sixth type of vertical-through-via (VTV) connectors 467 is selected or determined, the through-silicon-via (TSV) wafer as seen in FIG. 1F, 1I or 1L where the insulating bonding layer 252 and insulating dielectric layer 257 are further formed may be cut or diced along (or through) some or all of the first reserved scribe lines 141 and some or all of the second reserved scribe lines 142 to form a number of the sixth type of vertical-through-via (VTV) connectors 467 in a single-die type, i.e., through-silicon-via interconnect elevators (TSVIEs), each having the selected or predetermined size, as seen in FIG. 1H, 1K or IN respectively where the insulating bonding layer 252 and insulating dielectric layer 257 are further formed, by a laser cutting process or by a mechanical cutting process. In this embodiment, the sixth type of vertical-through-via (VTV) connector 467 as seen in FIG. 1R is arranged for the second case as illustrated in FIGS. 1I, 1J, 4C, 4D, 4I and 4J.

Alternatively, for forming a seventh type of vertical-through-via (VTV) connector 467 as seen in FIG. 1S, which is similar to the process for forming the first type of vertical-through-via (VTV) connector 467 as illustrated in FIGS. 1A-1G, 1I-1J or 1L-1M for either of the first through third cases as illustrated in FIGS. 4A-4L, after the backside of the semiconductor substrate 2 is polished to expose the backside of each of the through silicon vias (TSVs) 157 as seen in FIG. 1F, 1I or 1L, a passivation layer 15 as seen in FIG. 1S may be formed on a bottom surface of the semiconductor substrate 2. The passivation layer 15 may include a mobile ion-catching layer or layers, for example, a combination of silicon nitride, silicon oxynitride, and/or silicon carbon nitride layer or layers deposited by a chemical vapor deposition (CVD) process. For example, the passivation layer 15 may include a silicon-nitride layer having a thickness of more than 0.3 micrometers. Alternatively, the passivation layer 15 may include a polymer layer, such as polyimide, having a thickness between 1 and 5 micrometers. Next, multiple openings 15*a* as seen in FIG. 1S may be formed in the passivation layer 15 and each of the openings 15*a* may expose the backside of the copper layer 156 of one of the through silicon vias (TSVs) 157. Each of the openings 15*a* may have a transverse dimension d2, from a bottom view, between 0.5 and 20 micrometers or between 20 and 200 micrometers. The shape of each of the openings 15*a* from a bottom view may be a circle, and the diameter of each of the circle-shaped openings 14*a* may be between 0.5 and 20 micrometers or between 20 and 200 micrometers. Alternatively, the shape of each of the openings 15*a* from a bottom view may be a square, and the width of each of the square-shaped openings 15*a* may be between 0.5 and 20 micrometers or between 20 and 200 micrometers. Alternatively, the shape of the opening 15*a* from a bottom view may be a polygon, such as hexagon or octagon, and each of the polygon-shaped openings 15*a* may have a maximum length between 0.5 and 20 micrometers or between 20 and 200 micrometers. Alternatively, the shape of each of the openings 15*a* from a bottom view may be a rectangle, and each of the rectangle-shaped openings 15*a* may have a shorter width between 0.5 and 20 micrometers or between 20 and 200 micrometers. Each of the openings 15*a* in the passivation layer 15 may be aligned with one of the openings 14*a* in the passivation layer 14. Next, a micro-bump or micro-pad 36 as seen in FIG. 1S may be formed on the backside of the copper layer 156 of each of the through silicon vias (TSVs) 157 at a top of one of the openings 15*a* in the passivation layer 15. The micro-bumps or micro-pads 36 may be one of various types. A first type of micro-bumps or micro-pads 36 may include (1) an adhesion layer 26*a*, such as titanium (Ti) or titanium nitride (TiN) layer having a thickness between 1 nm and 50 nm, on the backside of the copper layer 156 of the through silicon vias (TSVs) 157, (2) a seed layer 26*b*, such as copper, on its adhesion layer 26*a* and (3) a copper layer 32 having a thickness between 1 μm and 60 μm on its seed layer 26*b*. A second type of micro-bumps or micro-pads 36 may include the adhesion layer 26*a*, seed layer 26*b* and copper layer 32 as mentioned above, and may further include a tin-containing solder cap made of tin or a tin-silver alloy having a thickness between 1 μm and 50 μm on its copper layer 32. A third type of micro-bumps or micro-pads 36 may be thermal compression bumps, including the adhesion layer 26*a* and seed layer 26*b* as mentioned above, and may further include a copper layer having a thickness between 2 μm and 20 μm, such as 3 μm, and a largest transverse dimension, such as diameter in a circular shape, between 1 μm and 15 μm, such as 3 μm, on its seed layer 26*b* and a solder cap made of a tin-silver alloy, a tin-gold alloy, a tin-copper alloy, a tin-indium alloy, indium or tin, which has a thickness between 1 μm and 15 μm, such as 2 μm, and a largest transverse dimension, such as diameter in a circular shape, between 1 μm and 15 μm, such as 3 μm, on its copper layer. A fourth type of micro-bumps or micro-pads 36 may be thermal compression bumps, including the adhesion layer 26*a* and seed layer 26*b* as mentioned above, and may further include a copper layer having a thickness between 2 μm and 20 μm, such as 3 μm, and a largest transverse dimension, such as diameter in a circular shape, greater than 25 μm or between 25 μm and 150 μm, on its seed layer 26*b* and a solder cap made of a tin-silver alloy, a tin-gold alloy, a tin-copper alloy, a tin-indium alloy, indium, tin or gold, which has a thickness between 1 μm and 15 μm, such as 2 μm, and a largest transverse dimension, such as diameter in a circular shape, greater than 25 μm or between 25 μm and 150 μm, on its copper layer. Each of the first, second, third or fourth type of micro-bumps or micro-pads 36 may be aligned with one of the first, second, third or fourth type of micro-bumps or micro-pads 34. Accordingly, the specification for the arrangement or layout for its first, second, third or fourth type of micro-bumps or micro-pads 36 may be the same as that for its first, second, third or fourth type of micro-bumps or micro-pads 34. When a size for the seventh type of vertical-through-via (VTV) connectors 467 is selected or determined, the through-silicon-via (TSV) wafer as seen in FIG. 1F, 1I or 1L where the passivation layer 15 and first, second, third or fourth type of micro-bumps or micro-pads 36 are further formed may be cut or diced along (or through) some or all of the first reserved scribe lines 141 and some or all of the second reserved scribe lines 142 to form a number of the seventh type of vertical-through-via (VTV) connectors 467 in a single-die type, i.e., through-silicon-via interconnect elevators (TSVIEs), each having the selected or predetermined size, as seen in FIG. 1H, 1K or IN respectively where the passivation layer 15 and first, second, third or fourth type of micro-bumps or micro-pads 36 are further formed, by a laser cutting process or by a mechanical cutting process. In this embodiment, the seventh type of vertical-through-via (VTV) connector 467 as seen in FIG. 1S is arranged for the second case as illustrated in FIGS. 1I, 1J, 4C, 4D, 4I and 4J.

Figure 1W:
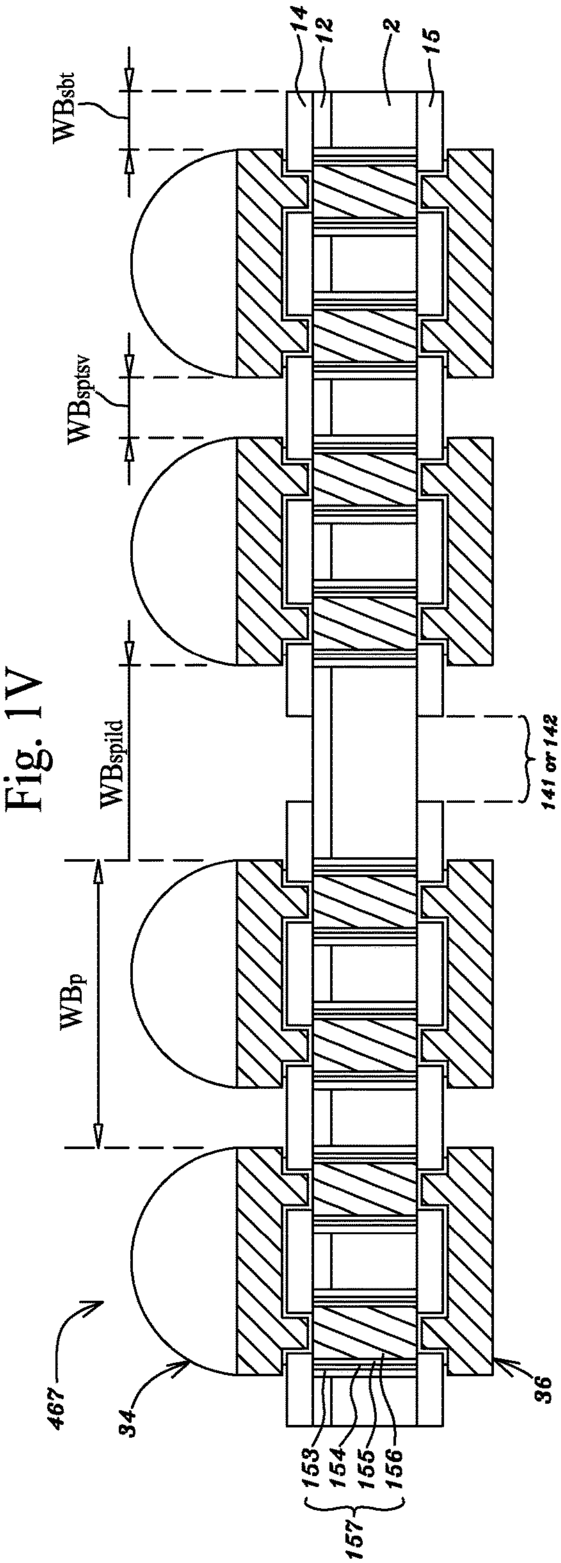
FIG. 1W is a schematically cross-sectional view showing a seventh type of vertical-through-via (VTV) connector for a second case in accordance with another embodiment of the present application.

Alternatively, for the seventh type of vertical-through-via (VTV) connector 467 for the second case as seen in FIG. 1W, each of its first, second, third or fourth type of micro-bumps or micro-pads 34 may cover and align with two or more than two of its through silicon vias (TSVs) 157, having the adhesion layer 26*a* on its passivation layer 14 and the top surface of the copper layer 156 of each of said two or more than two of its through silicon vias (TSVs) 157. Each of its first, second, third or fourth type of micro-bumps or micro-pads 36 may be vertically under and align with two or more than two of its through silicon vias (TSVs) 157 and one of its first, second, third or fourth type of micro-bumps or micro-pads 34, having the adhesion layer 26*a* on its passivation layer 15 and the backside of the copper layer 156 of each of said two or more than two of its through silicon vias (TSVs) 157. Accordingly, the specification for the arrangement or layout for its first, second, third or fourth type of micro-bumps or micro-pads 36 may be the same as that for its first, second, third or fourth type of micro-bumps or micro-pads 34. For an element indicated by the same reference number shown in FIGS. 1I, 1J, 15, 1V and 1W, the specification of the element as seen in FIG. 1W may be referred to that of the element as illustrated in FIGS. 1I, 1J, 15 or 1V.

Alternatively, for forming an eighth type of vertical-through-via (VTV) connector 467 as seen in FIG. 1T, which is similar to the process for forming the third type of vertical-through-via (VTV) connector 467 as illustrated in FIG. 1O for either of the first through third cases as illustrated in FIGS. 4A-4L, after the backside of the semiconductor substrate 2 is polished to expose the backside of each of the through silicon vias (TSVs) 157 as seen in FIG. 1F, 1I or 1L where the insulating dielectric layer 257 is further formed, a passivation layer 15 as seen in FIG. 1T, which may have the same specification as that illustrated in FIG. 1S, may be formed on a bottom surface of the semiconductor substrate 2, next multiple openings 15*a* as seen in FIG. 1T, which may have the same specification as that illustrated in FIG. 1S, may be formed in the passivation layer 15 and each of the openings 15*a* may expose the backside of the copper layer 156 of one of the through silicon vias (TSVs) 157, and next a micro-bump or micro-pad 36 as seen in FIG. 1T, which may be of one of the first through fourth types having the same specifications as the first through fourth types of micro-bumps or micro-pads 36 respectively as illustrated in FIG. 15, may be formed on the backside of the copper layer 156 of each of the through silicon vias (TSVs) 157 at a top of one of the openings 15*a* in the passivation layer 15. Each of the openings 15*a* in the passivation layer 15 may be aligned with one of the openings 14*a* in the passivation layer 14. Each of the first, second, third or fourth type of micro-bumps or micro-pads 36 may be aligned with one of the first type of micro-bumps or micro-pads 34. Accordingly, the specification for the arrangement or layout for its first, second, third or fourth type of micro-bumps or micro-pads 36 may be the same as that for its first, second, third or fourth type of micro-bumps or micro-pads 34. When a size for the eighth type of vertical-through-via (VTV) connectors 467 is selected or determined, the through-silicon-via (TSV) wafer as seen in FIG. 1F, 1I or 1L where the insulating dielectric layer 257, passivation layer 15 and first, second, third or fourth type of micro-bumps or micro-pads 36 are further formed may be cut or diced along (or through) some or all of the first reserved scribe lines 141 and some or all of the second reserved scribe lines 142 to form a number of the eighth type of vertical-through-via (VTV) connectors 467 in a single-die type, i.e., through-silicon-via interconnect elevators (TSVIEs), each having the selected or predetermined size, as seen in FIG. 1H, 1K or IN respectively where the insulating dielectric layer 257, passivation layer 15 and first, second, third or fourth type of micro-bumps or micro-pads 36 are further formed, by a laser cutting process or by a mechanical cutting process. In this embodiment, the eighth type of vertical-through-via (VTV) connector 467 as seen in FIG. 1T is arranged for the second case as illustrated in FIGS. 1I, 1J, 4C, 4D, 4I and 4J.

Alternatively, for the eighth type of vertical-through-via (VTV) connector 467 for the second case, each of its first type of micro-bumps or micro-pads 34 may cover and align with two or more than two of its through silicon vias (TSVs) 157, having the adhesion layer 26*a* on its passivation layer 14 and the top surface of the copper layer 156 of each of said two or more than two of its through silicon vias (TSVs) 157. Each of its first, second, third or fourth type of micro-bumps or micro-pads 36 may be vertically under and align with two or more than two of its through silicon vias (TSVs) 157 and one of its first type of micro-bumps or micro-pads 34, having the adhesion layer 26*a* on its passivation layer 15 and the backside of the copper layer 156 of each of said two or more than two of its through silicon vias (TSVs) 157. Accordingly, the specification for the arrangement or layout for its first, second, third or fourth type of micro-bumps or micro-pads 36 may be the same as that for its first, second, third or fourth type of micro-bumps or micro-pads 34. In this embodiment, the eighth type of vertical-through-via (VTV) connector 467 is similar to the seventh type of vertical-through-via (VTV) connector 467 as seen in FIG. 1W, but the difference therebetween is that the eighth type of vertical-through-via (VTV) connector 467 further include the insulating dielectric layer 257 as mentioned above.

Alternatively, for forming a ninth type of vertical-through-via (VTV) connector 467 as seen in FIG. 1U, which is similar to the eighth type of vertical-through-via (VTV) connector 467 as illustrated in FIG. 1T for either of the first through third cases as illustrated in FIGS. 4A-4L, after the first type of micro-bumps or micro-pads 36 are formed as illustrated in FIG. 1T, an insulating dielectric layer 357 as seen in FIG. 1U may be further formed at the backside of the semiconductor substrate 2, covering a sidewall of the copper layer 32 of each of the first type of micro-bumps or micro-pads 36, wherein the insulating dielectric layer 357 may have a bottom surface coplanar to a bottom surface of the copper layer 32 of each of the first type of micro-bumps or micro-pads 36. The insulating dielectric layer 357 may be a polymer, such as polyimide, BenzoCycloButene (BCB), parylene, polybenzoxazole (PBO), epoxy-based material or compound, photo epoxy SU-8, elastomer, or silicone. The insulating dielectric layer 357 may be, for example, photosensitive polyimide/PBO PIMEL™ supplied by Asahi Kasei Corporation, Japan, or epoxy-based molding compounds, resins or sealants provided by Nagase ChemteX Corporation, Japan. When a size for the ninth type of vertical-through-via (VTV) connectors 467 is selected or determined, the through-silicon-via (TSV) wafer as seen in FIG. 1F, 1I or 1L where the insulating dielectric layers 257 and 357, passivation layer 15 and first type of micro-bumps or micro-pads 36 are further formed may be cut or diced along (or through) some or all of the first reserved scribe lines 141 and some or all of the second reserved scribe lines 142 to form a number of the third type of vertical-through-via (VTV) connectors 467 in a single-die type, i.e., through-silicon-via interconnect elevators (TSVIEs), each having the selected or predetermined size, as seen in FIG. 1G, 1J or 1M respectively where the insulating dielectric layers 257 and 357, passivation layer 15 and first type of micro-bumps or micro-pads 36 are further formed, by a laser cutting process or by a mechanical cutting process. In this embodiment, the ninth type of vertical-through-via (VTV) connector 467 as seen in FIG. 1U is arranged for the second case as illustrated in FIGS. 1I, 1J, 4C, 4D, 4I and 4J.

Figure 1X:
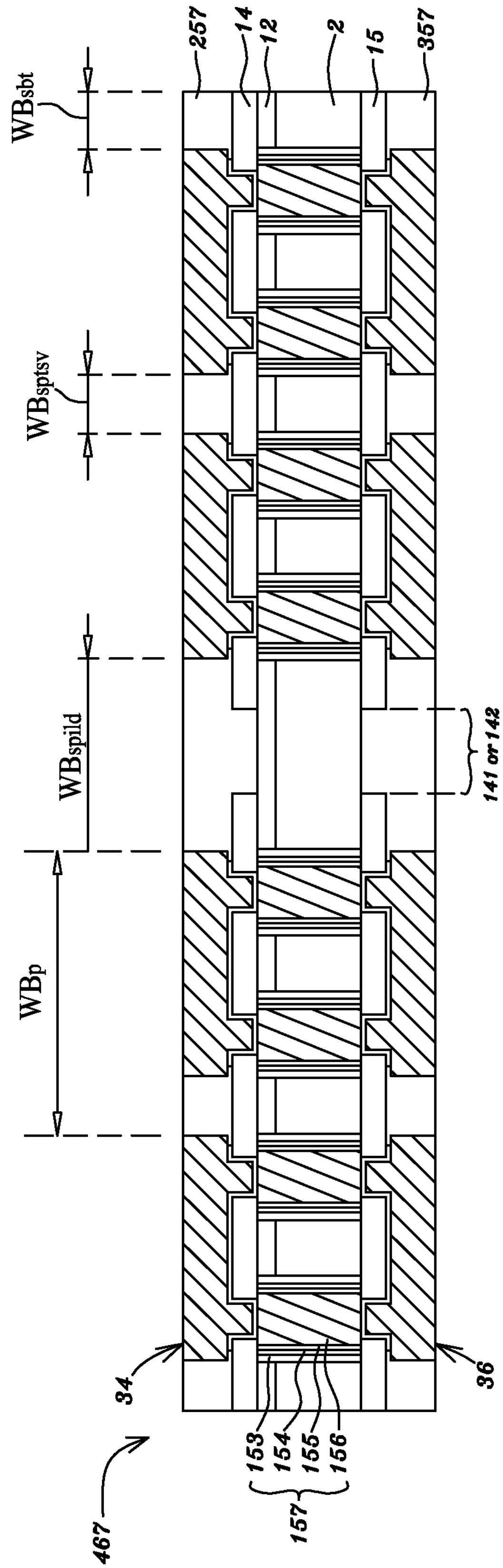
FIG. 1X is a schematically cross-sectional view showing a ninth type of vertical-through-via (VTV) connector for a second case in accordance with another embodiment of the present application.

Alternatively, for the ninth type of vertical-through-via (VTV) connector 467 for the second case as seen in FIG. 1X, each of its first type of micro-bumps or micro-pads 34 may cover and align with two or more than two of its through silicon vias (TSVs) 157, having the adhesion layer 26*a* on its passivation layer 14 and the top surface of the copper layer 156 of each of said two or more than two of its through silicon vias (TSVs) 157. Each of its first type of micro-bumps or micro-pads 36 may be vertically under and align with two or more than two of its through silicon vias (TSVs) 157 and one of its first type of micro-bumps or micro-pads 34, having the adhesion layer 26*a* on its passivation layer 15 and the backside of the copper layer 156 of each of said two or more than two of its through silicon vias (TSVs) 157. Accordingly, the specification for the arrangement or layout for its first, second, third or fourth type of micro-bumps or micro-pads 36 may be the same as that for its first, second, third or fourth type of micro-bumps or micro-pads 34. For an element indicated by the same reference number shown in FIGS. 1I, 1J, 1U, 1V and 1X, the specification of the element as seen in FIG. 1X may be referred to that of the element as illustrated in FIGS. 1I, 1J, 1U or 1V.

Figure 2A:
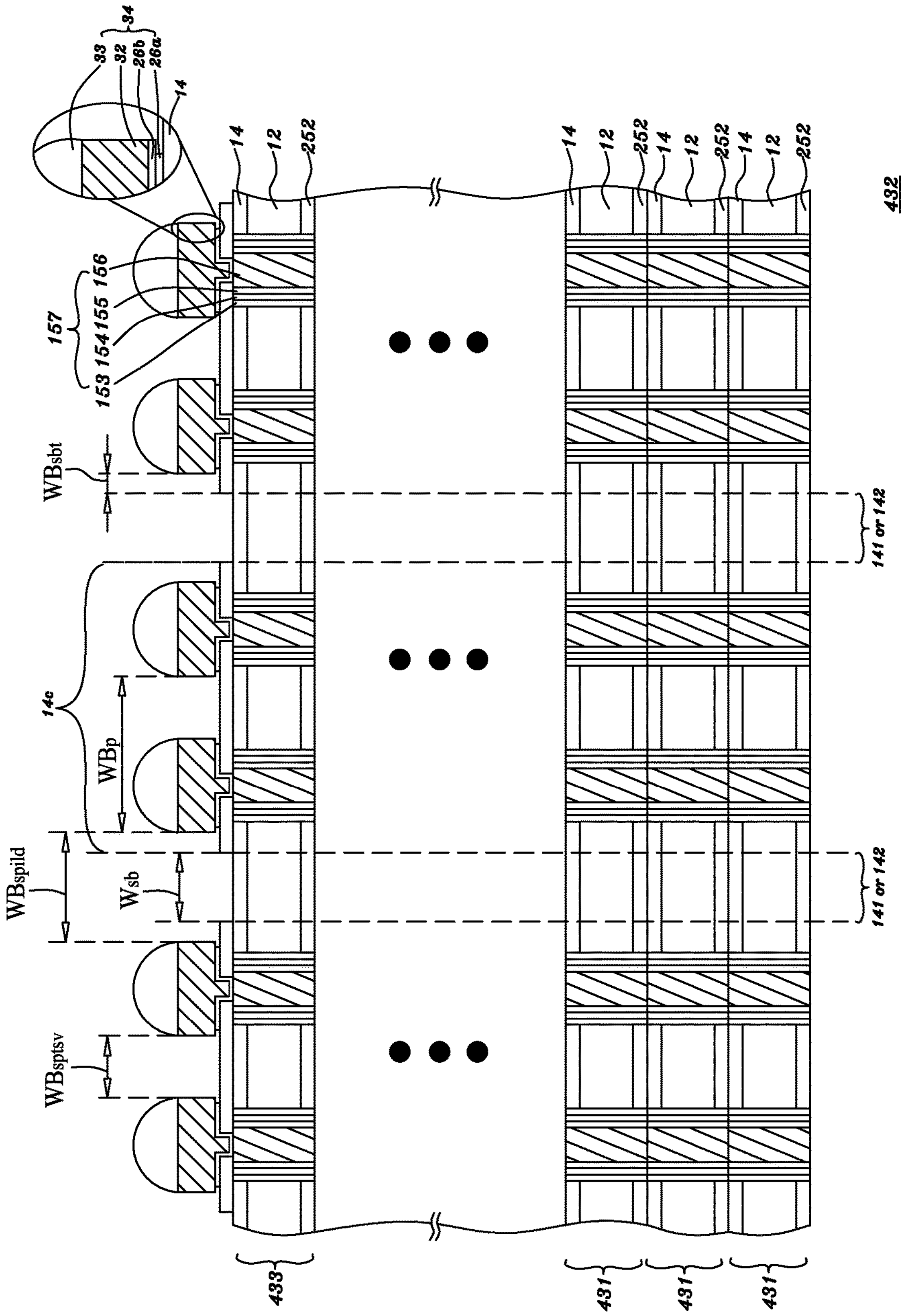
FIGS. 2A and 2B are schematically cross-sectional views showing a process for forming a tenth type of vertical-through-via (VTV) connector for a second case in accordance with an embodiment of the present application.
Figure 2B:
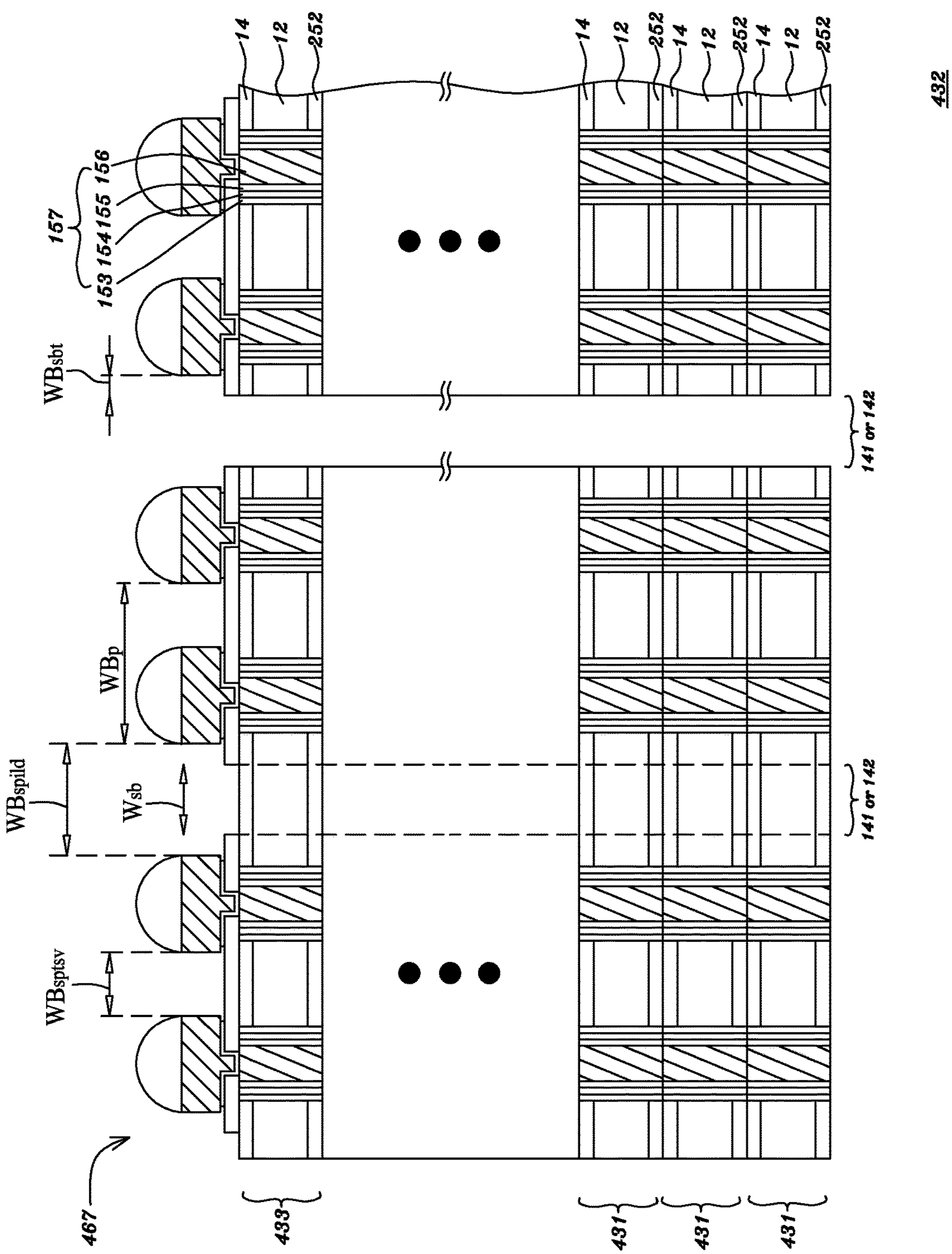

Alternatively, for forming a tenth type of vertical-through-via (VTV) connector 467 as illustrated in FIGS. 2A-2B, one or more through-silicon-via (TSV) wafers 431 may be provided to be stacked with each other or one another and a through-silicon-via (TSV) wafer 433 may be provided to be stacked on a topmost one of the through-silicon-via (TSV) wafers 431. Each of the through-silicon-via (TSV) wafers 431 may be fabricated as illustrated in FIGS. 1A-1F, 1I or 1L for either of the first through third cases as illustrated in FIGS. 4A-4F, in which none of the passivation layer 14 and micro-bumps or micro-pads 34 is formed, the insulating dielectric layer 12 acts as an insulating bonding layer 52, and after the backside of the semiconductor substrate 2 is polished to expose the backside of each of the through silicon vias (TSVs) 157, an insulating bonding layer 252 may be formed at the backside of the semiconductor substrate 2. The through-silicon-via (TSV) wafer 433 may be fabricated as illustrated in FIGS. 1A-1F, 1I or 1L for either of the first through third cases as illustrated in FIGS. 4A-4L, in which after the backside of the semiconductor substrate 2 is polished to expose the backside of each of the through silicon vias (TSVs) 157, an insulating bonding layer 252 may be formed at the backside of the semiconductor substrate 2. The specification for the insulating bonding layer 252 of each of the through-silicon-via (TSV) wafers 431 and 433 and the process for forming the same may be referred to the specification for the insulating bonding layer 252 of the fourth type of vertical-through-via (VTV) connector 467 and the process for forming the same as illustrated in FIG. 1P. Referring to FIG. 2A, an upper one of the through-silicon-via (TSV) wafers 431 and 433 may be stacked over a lower one of the through-silicon-via (TSV) wafers 431 by (1) activating a joining surface, i.e., silicon oxide, of the insulating dielectric layer 252 of the upper one of the through-silicon-via (TSV) wafers 431 and 433 and a joining surface, i.e., silicon oxide, of the insulating bonding layer 52 of the lower one of the through-silicon-via (TSV) wafers 431 with nitrogen plasma for increasing hydrophilic property thereof, (2) next rinsing the joining surface of the insulating dielectric layer 252 of the upper one of the through-silicon-via (TSV) wafers 431 and 433 and the joining surface, i.e., silicon oxide, of the insulating bonding layer 52 of the lower one of the through-silicon-via (TSV) wafers 431 with deionized water for water adsorption and cleaning, (3) next placing the upper one of the through-silicon-via (TSV) wafers 431 and 433 onto the lower one of the through-silicon-via (TSV) wafers 431 with each of the through silicon vias (TSVs) 157 of the third one of the through-silicon-via (TSV) wafers in contact with one of the through silicon vias (TSVs) 157 of the second one of the through-silicon-via (TSV) wafers and with the joining surface of the insulating dielectric layer 252 of the upper one of the through-silicon-via (TSV) wafers 431 and 433 in contact with the joining surface of the insulating bonding layer 52 of the lower one of the through-silicon-via (TSV) wafers 431, and (4) next performing a direct bonding process including (a) oxide-to-oxide bonding at a temperature between 100 and 200 degrees Celsius and for a time period between 5 and 20 minutes to bond the joining surface of the insulating dielectric layer 252 of the upper one of the through-silicon-via (TSV) wafers 431 and 433 to the joining surface of the insulating bonding layer 52 of the lower one of the through-silicon-via (TSV) wafers 431, and (b) copper-to-copper bonding at a temperature between 300 and 350 degrees Celsius and for a time period between 10 and 60 minutes to bond the backside of the copper layer 156 of each of the through silicon vias (TSVs) 157 of the upper one of the through-silicon-via (TSV) wafers 431 and 433 to the top surface of the copper layer 156 of one of the through silicon vias (TSVs) 157 of the lower one of the through-silicon-via (TSV) wafers 431, wherein the oxide-to-oxide bonding may be caused by water desorption from reaction between the joining surface of the insulating dielectric layer 252 of the upper one of the through-silicon-via (TSV) wafers 431 and 433 and the joining surface of the insulating bonding layer 52 of the lower one of the through-silicon-via (TSV) wafers 431, and the copper-to-copper bonding may be caused by metal inter-diffusion between the backside of the copper layer 156 of each of the through silicon vias (TSVs) 157 of the upper one of the through-silicon-via (TSV) wafers 431 and 433 and the top surface of the copper layer 156 of one of the through silicon vias (TSVs) 157 of the lower one of the through-silicon-via (TSV) wafers 431. Thereby, multiple of the through silicon vias (TSVs) 157 may be stacked with each other or one another to form a vertical through via (VTV) 358 for a dedicated vertical path, wherein an upper one of said multiple of the through silicon vias (TSVs) 157 may be aligned and stacked with a lower one of said multiple of the through silicon vias (TSVs) 157. Next, when a size for the tenth type of vertical-through-via (VTV) connectors 467 is selected or determined, the stacked assembly 432 of the through-silicon-via (TSV) wafers 431 and 433 as seen in FIG. 2A may be cut or diced along (or through) some or all of the first reserved scribe lines 141 of each of the through-silicon-via (TSV) wafers 431 and 433 and some or all of the second reserved scribe lines 142 of each of the through-silicon-via (TSV) wafers 431 and 433 to form a number of the tenth type of vertical-through-via (VTV) connectors 467 in a single-die type, i.e., through-silicon-via interconnect elevators (TSVIEs), each having the selected or predetermined size as seen in FIG. 2B by a laser cutting process or by a mechanical cutting process. In this embodiment, the tenth type of vertical-through-via (VTV) connector 467 as seen in FIG. 2B is arranged for the second case as illustrated in FIGS. 4C, 4D, 4I and 4J. Alternatively, the tenth type of vertical-through-via (VTV) connector 467 may be arranged for the first case as illustrated in FIGS. 4A, 4B, 4G and 4H or the third case as illustrated in FIGS. 4E, 4F, 4K and 4L. For the tenth type of vertical-through-via (VTV) connector 467, each of its vertical through vias (VTVs) 358 may be formed by stacking multiple of its through silicon vias (TSVs) 157 up to a total height between 100 and 2,000 micrometers, between 100 and 1,000 micrometers or between 100 and 500 micrometers.

Figure 2C:
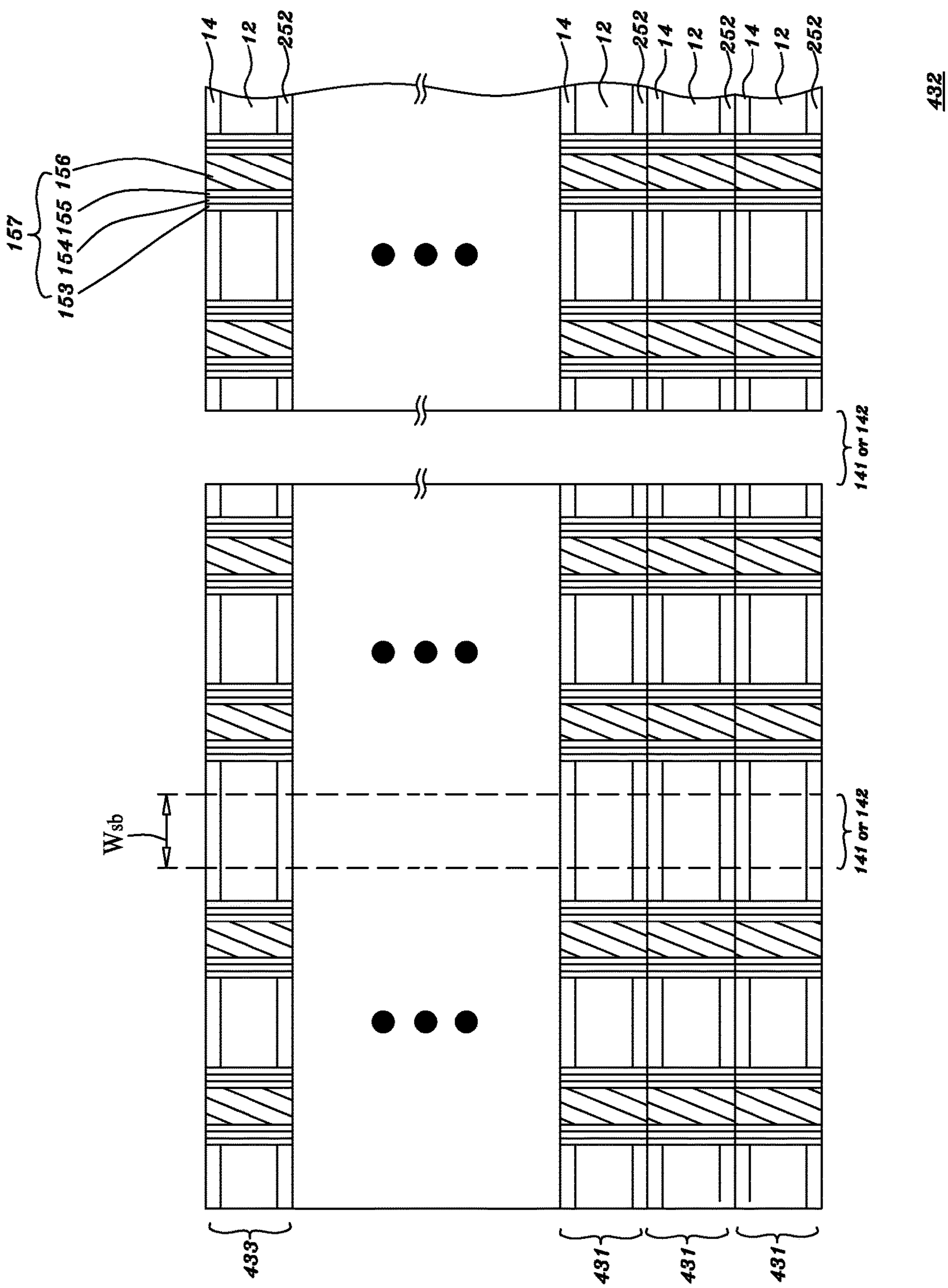
FIG. 2C is a schematically cross-sectional view showing an eleventh type of vertical-through-via (VTV) connector for a second case in accordance with an embodiment of the present application.

Alternatively, for forming an eleventh type of vertical-through-via (VTV) connector 467 as illustrated in FIG. 2C, which is similar to the tenth type of vertical-through-via (VTV) connector 467 as illustrated in FIGS. 2A and 2B for either of the first through third cases as illustrated in FIGS. 4A-4F, the through-silicon-via (TSV) wafer 433 may be fabricated as illustrated in FIGS. 1A-1F, 1I or 1L for either of the first through third cases as illustrated in FIGS. 4A-4F, in which none of the passivation layer 14 and micro-bumps or micro-pads 34 is formed, the insulating dielectric layer 12 acts as an insulating bonding layer 52 and after the backside of the semiconductor substrate 2 is polished to expose the backside of each of the through silicon vias (TSVs) 157, an insulating bonding layer 252 may be formed at the backside of the semiconductor substrate 2. The specification for the insulating bonding layer 252 of the through-silicon-via (TSV) wafer 433 and the process for forming the same may be referred to the specification for the insulating bonding layer 252 of the fourth type of vertical-through-via (VTV) connector 467 and the process for forming the same as illustrated in FIG. 1P. When a size for the eleventh type of vertical-through-via (VTV) connectors 467 is selected or determined, the stacked assembly 432 of the through-silicon-via (TSV) wafers 431 and 433 as seen in FIG. 2A where none of the passivation layer 14 and micro-bumps or micro-pads 34 is formed may be cut or diced along (or through) some or all of the first reserved scribe lines 141 of each of the through-silicon-via (TSV) wafers 431 and 433 and some or all of the second reserved scribe lines 142 of each of the through-silicon-via (TSV) wafers 431 and 433 to form a number of the eleventh type of vertical-through-via (VTV) connectors 467 in a single-die type, i.e., through-silicon-via interconnect elevators (TSVIEs), each having the selected or predetermined size as seen in FIG. 2C by a laser cutting process or by a mechanical cutting process. In this embodiment, the eleventh type of vertical-through-via (VTV) connector 467 as seen in FIG. 2C is arranged for the second case as illustrated in FIGS. 4C and 4D. Alternatively, the eleventh type of vertical-through-via (VTV) connector 467 may be arranged for the first case as illustrated in FIGS. 4A and 4B or the third case as illustrated in FIGS. 4E and 4F. For the eleventh type of vertical-through-via (VTV) connector 467, each of its vertical through vias (VTVs) 358 may be formed by stacking multiple of its through silicon vias (TSVs) 157 up to a total height between 100 and 2,000 micrometers, between 100 and 1,000 micrometers or between 100 and 500 micrometers.

Figure 2D:
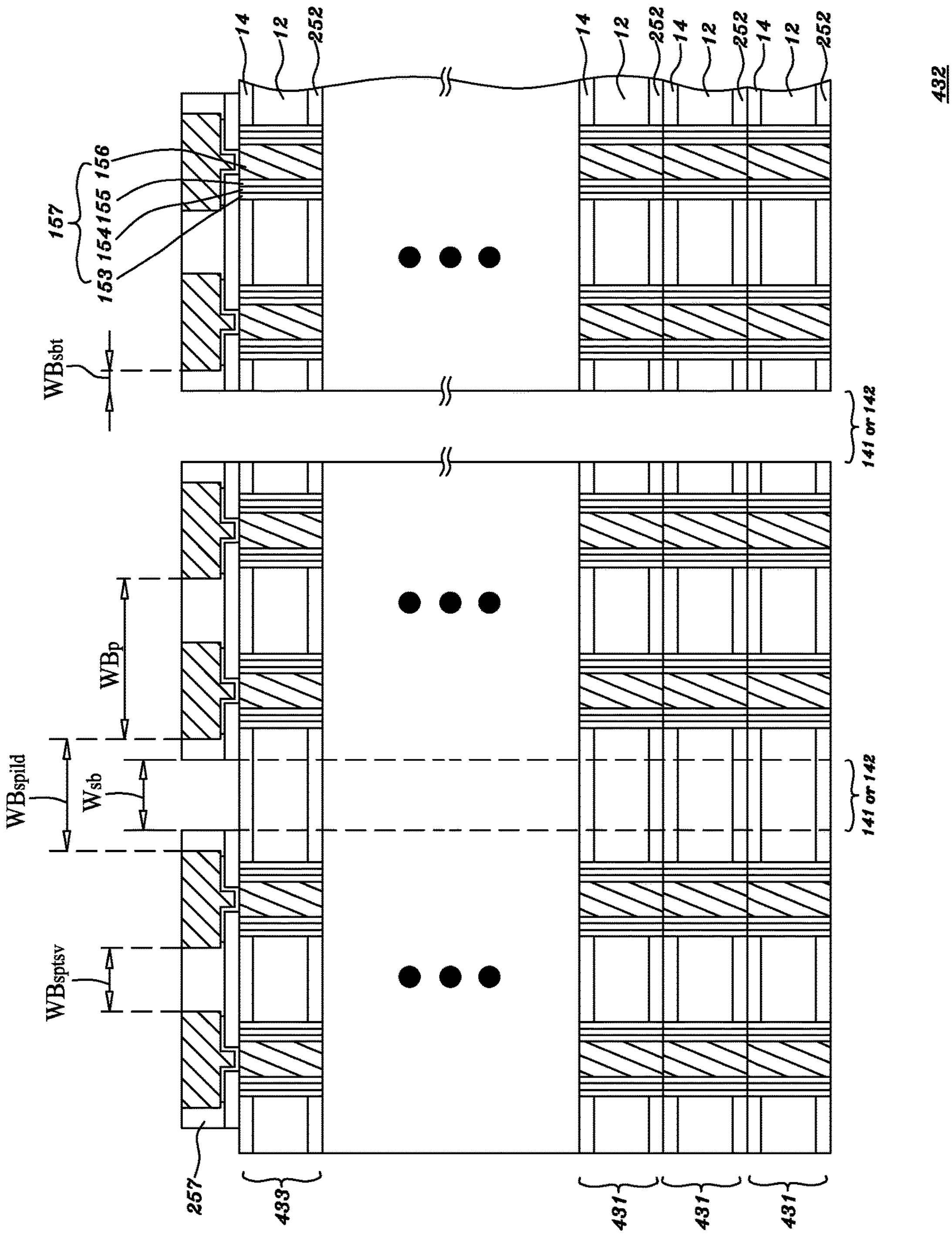
FIG. 2D is a schematically cross-sectional view showing a twelfth type of vertical-through-via (VTV) connector for a second case in accordance with an embodiment of the present application.

Alternatively, for forming an twelfth type of vertical-through-via (VTV) connector 467 as illustrated in FIG. 2D, which is similar to the tenth type of vertical-through-via (VTV) connector 467 as illustrated in FIGS. 2A and 2B for either of the first through third cases as illustrated in FIGS. 4A-4L, the through-silicon-via (TSV) wafer 433 may be fabricated as illustrated in FIGS. 1A-1F, 1I or 1L for either of the first through third cases as illustrated in FIGS. 4A-4L, in which an insulating dielectric layer 257 as seen in FIG. 2D may be further formed at the top side of the semiconductor substrate 2, covering a sidewall of the copper layer 32 of each of the first type of micro-bumps or micro-pads 34, wherein the insulating dielectric layer 257 may have a top surface coplanar to a top surface of each of the first type of micro-bumps or micro-pads 34, and after the backside of the semiconductor substrate 2 is polished to expose the backside of each of the through silicon vias (TSVs) 157, an insulating bonding layer 252 may be formed at the backside of the semiconductor substrate 2. The specification for the insulating dielectric layer 257 of the through-silicon-via (TSV) wafer 433 and the process for forming the same may be referred to the specification for the insulating dielectric layer 257 of the third type of vertical-through-via (VTV) connector 467 and the process for forming the same as illustrated in FIG. 1O. The specification for the insulating bonding layer 252 of the through-silicon-via (TSV) wafer 433 and the process for forming the same may be referred to the specification for the insulating bonding layer 252 of the fourth type of vertical-through-via (VTV) connector 467 and the process for forming the same as illustrated in FIG. 1P. When a size for the twelfth type of vertical-through-via (VTV) connectors 467 is selected or determined, the stacked assembly 432 of the through-silicon-via (TSV) wafers 431 and 433 as seen in FIG. 2A where the insulating dielectric layer 257 and insulating bonding layer 252 are further formed may be cut or diced along (or through) some or all of the first reserved scribe lines 141 of each of the through-silicon-via (TSV) wafers 431 and 433 and some or all of the second reserved scribe lines 142 of each of the through-silicon-via (TSV) wafers 431 and 433 to form a number of the twelfth type of vertical-through-via (VTV) connectors 467 in a single-die type, i.e., through-silicon-via interconnect elevators (TSVIEs), each having the selected or predetermined size as seen in FIG. 2D by a laser cutting process or by a mechanical cutting process. In this embodiment, the twelfth type of vertical-through-via (VTV) connector 467 as seen in FIG. 2D is arranged for the second case as illustrated in FIGS. 4C, 4D, 4I and 4J. Alternatively, the twelfth type of vertical-through-via (VTV) connector 467 may be arranged for the first case as illustrated in FIGS. 4A, 4B, 4G and 4H or the third case as illustrated in FIGS. 4E, 4F, 4K and 4L. For the twelfth type of vertical-through-via (VTV) connector 467, each of its vertical through vias (VTVs) 358 may be formed by stacking multiple of its through silicon vias (TSVs) 157 up to a total height between 100 and 2,000 micrometers, between 100 and 1,000 micrometers or between 100 and 500 micrometers.

For more elaboration, the aspect ratio of the length to the width for each of the first through twelfth types of vertical-through-via (VTV) connectors 467 as mentioned above may be between 2 and 10, between 4 and 10 or between 2 and 40. Each of the first through twelfth types of vertical-through-via (VTV) connector 467 may be provided therein with passive elements, such as capacitors, but without any active device, i.e., transistor.

2. Decoupling Capacitors Formed in First or Third Type of Vertical-Through-Via (VTV) Connector for Through-Silicon-Via Interconnect-Elevator (TSVIE)

Figure 3A:
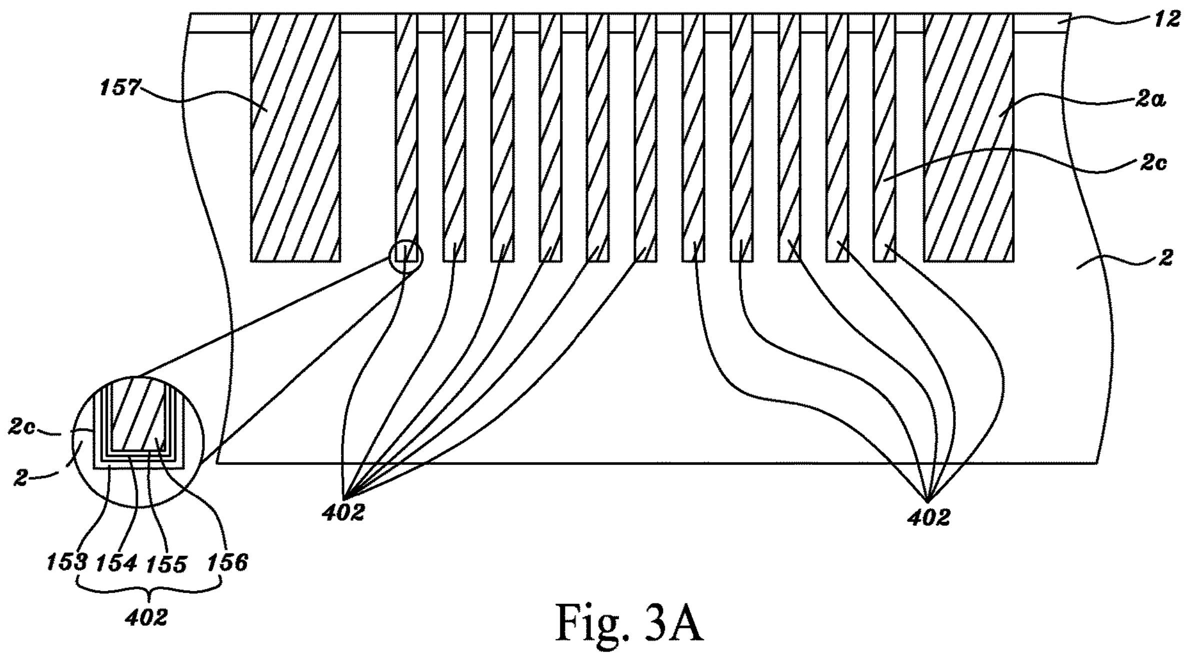
FIGS. 3A-3F are schematically cross-sectional views showing a process for forming a decoupling capacitor in a first type of vertical-through-via (VTV) connector in accordance with an embodiment of the present application.
Figure 3B:
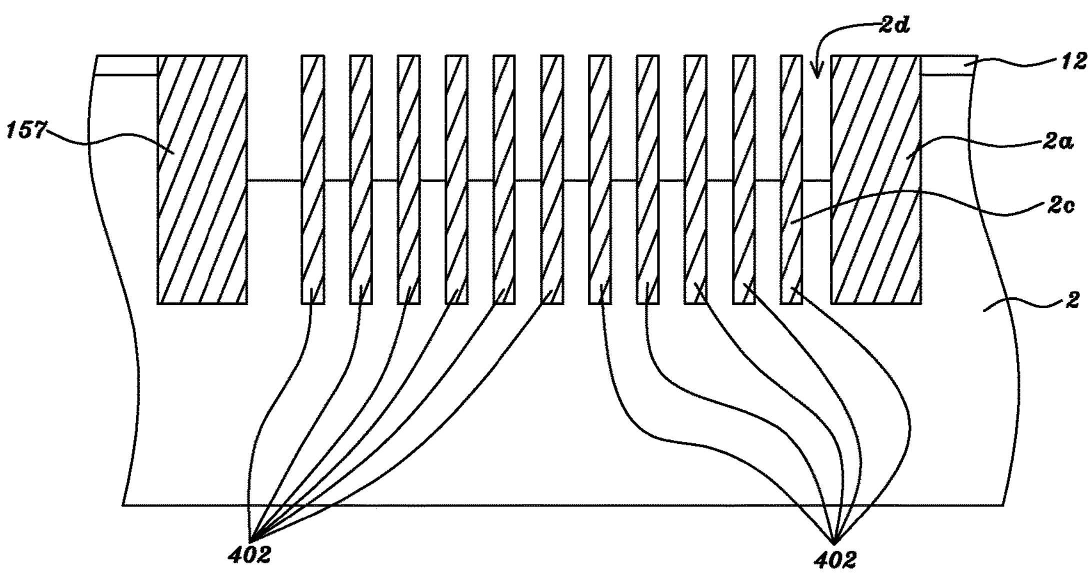
Figure 3C:
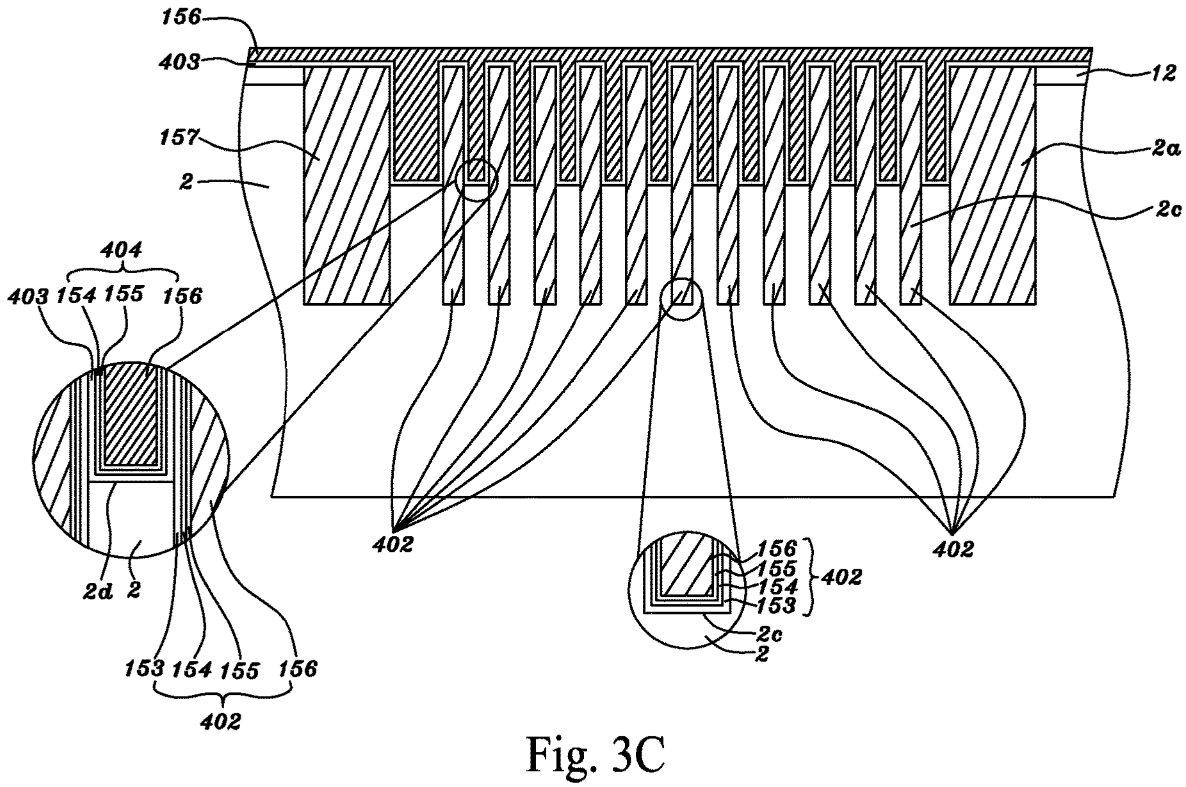
Figure 3D:
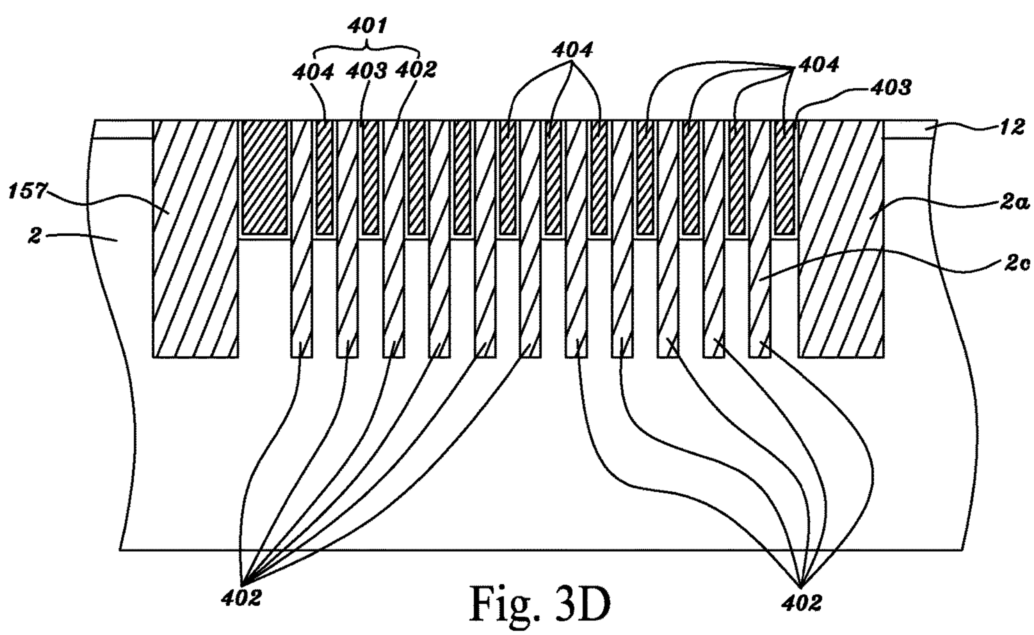
Figure 3E:
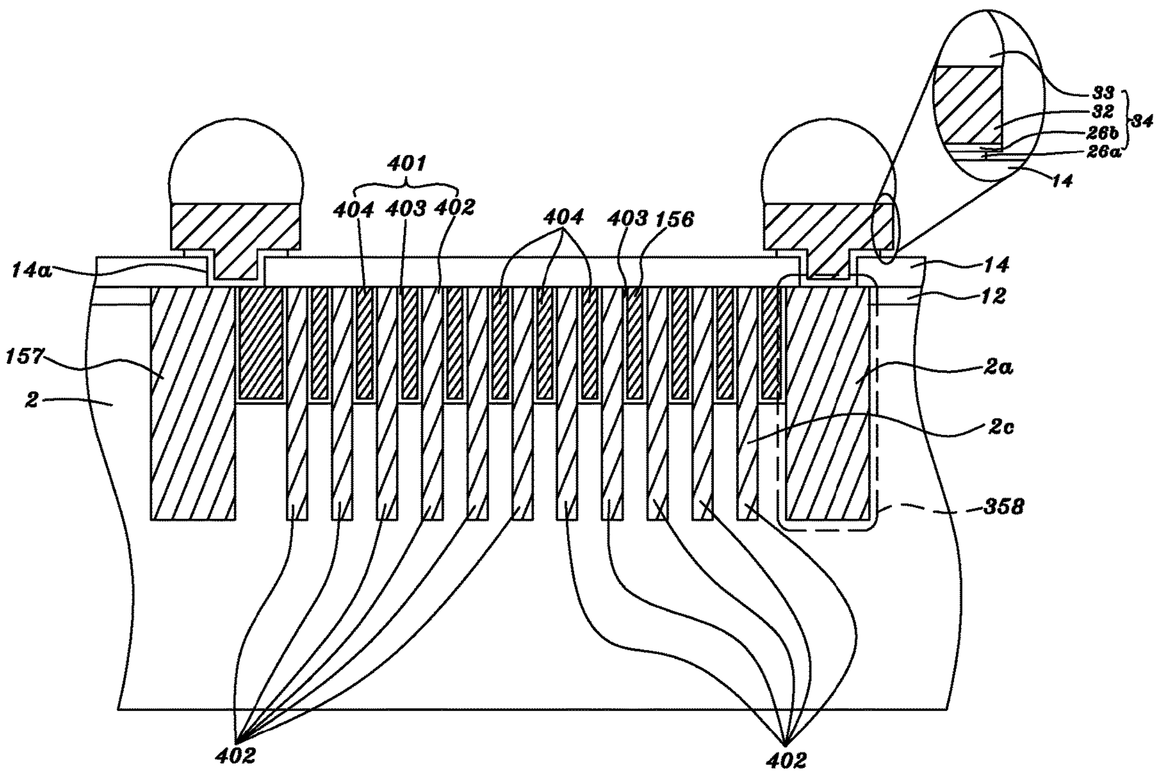
Figure 3F:
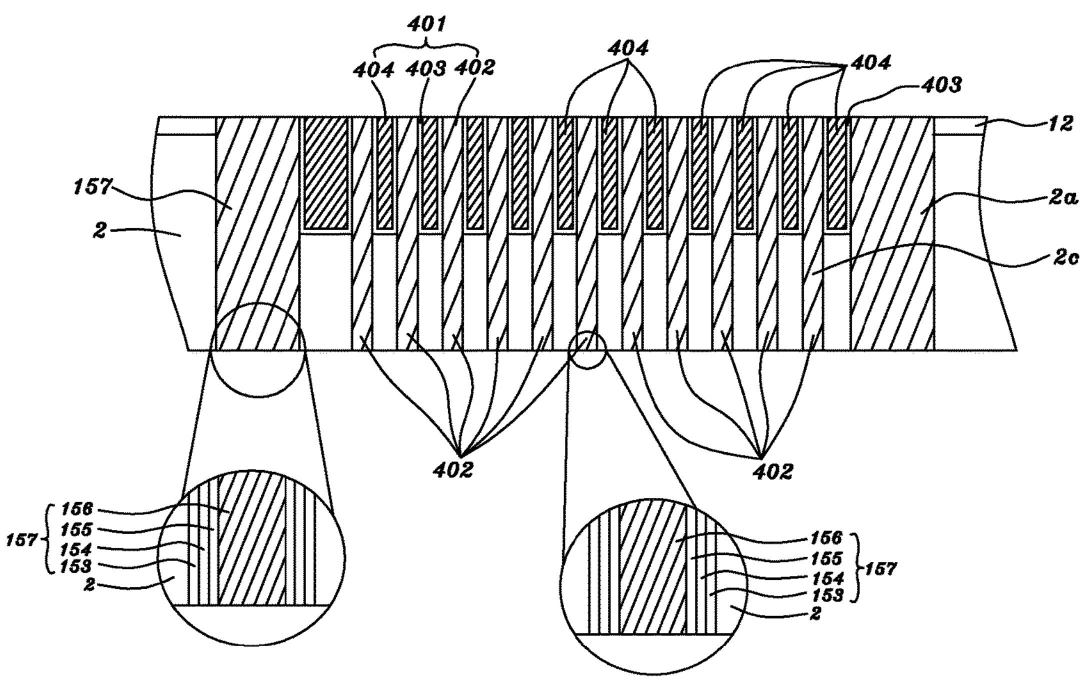
Figure 3G:
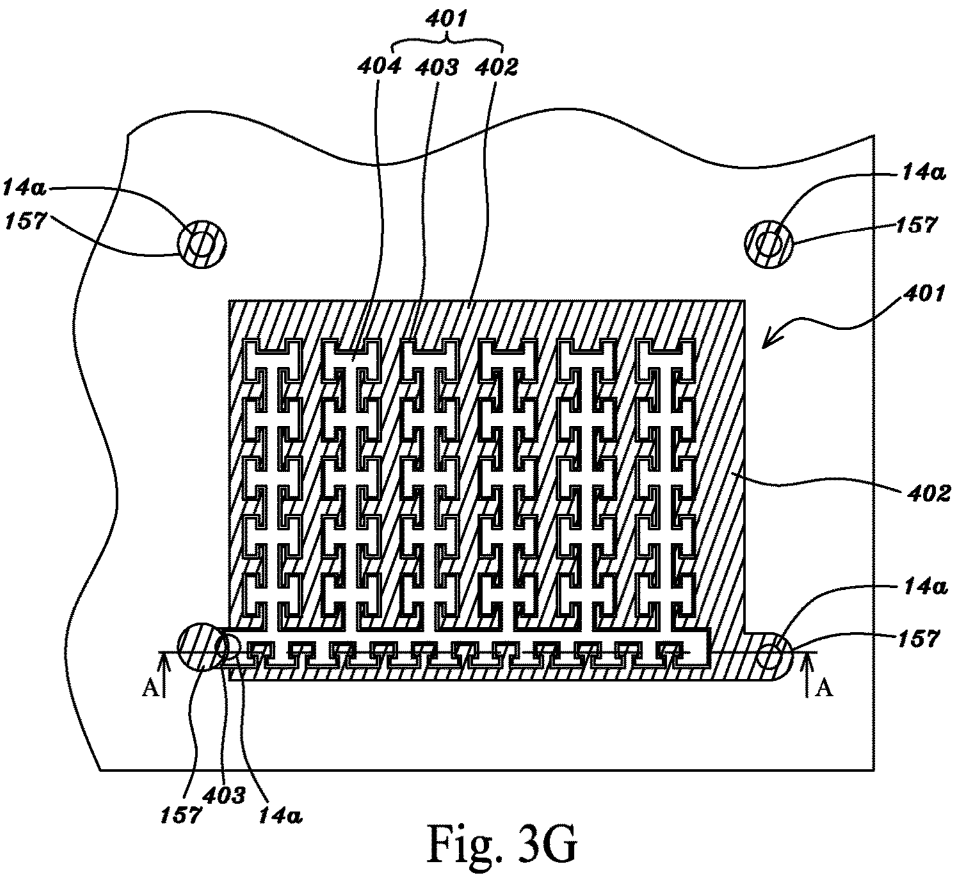

FIGS. 3A-3F are schematically cross-sectional views showing a process for forming a decoupling capacitor in a first type of vertical-through-via (VTV) connector in accordance with an embodiment of the present application. FIG. 3G is a schematically top view showing a decoupling capacitor between four vertical through vias (VTVs) in accordance with an embodiment of the present application, wherein FIG. 3F is a schematically cross-sectional view along a cross-sectional line A-A on FIG. 3G. Referring to FIG. 3A, for forming the first type of vertical-through-via (VTV) connector 467 as seen in FIGS. 1A-1G for the first case as illustrated in FIGS. 4A, 4B, 4G and 4H, as seen in FIGS. 1I and 1J for the second case as illustrated in FIGS. 4C, 4D, 4I and 4J, 4L or as seen in FIGS. 1L and 1M for the third case as illustrated in FIGS. 4E, 4F, 4K and 4L, after the insulating dielectric layer 12 is formed on the semiconductor substrate 2, multiple deep trenches 2*c* having a depth between 30 μm and 2,000 μm may be formed in the insulating dielectric layer 12 and semiconductor substrate 2 by forming a first masking insulating layer or photoresist layer (not shown) on the insulating dielectric layer 12, patterning the first masking insulating layer or photoresist layer to form multiple openings in the first masking insulating layer or photoresist layer and then etching the insulating dielectric layer 12 and semiconductor substrate 2 under the openings in the first masking insulating layer or photoresist layer for a predetermined time period. The specification for the insulating dielectric layer 12 and semiconductor substrate 2 may be referred to that as illustrated in FIG. 1A. The specification and process for forming the deep trenches 2*c* in the insulating dielectric layer 12 and semiconductor substrate 2 may be referred to those for forming the blind holes 2*a* in the insulating dielectric layer 12 and semiconductor substrate 2 as illustrated in FIGS. 1A and 1B.

Next, the first masking insulating layer or photoresist layer may be removed. Next, referring to FIGS. 3A and 3G, an insulating lining layer 153, adhesion layer 154, seed layer 155 and copper layer 156 as illustrated in FIG. 1C may be formed in the deep trenches 2*c* to form a first electrode 402 of a decoupling capacitor 401 and multiple through silicon vias (TSVs) 157, wherein the first electrode 402 of the decoupling capacitor 401 couples to one of the through silicon vias (TSVs) 157, e.g., a right one of the two through silicon vias (TSVs) 157. The specification and process for forming the insulating lining layer 153, adhesion layer 154, seed layer 155 and copper layer 156 in the deep trenches 2*c* may be referred to those for forming the insulating lining layer 153, adhesion layer 154, seed layer 155 and copper layer 156 in the blind holes 2*a* as illustrated in FIGS. 1C and 1D. Each of the through silicon vias (TSVs) 157 may have a depth between 30 μm and 2,000 μm and a diameter or largest transverse dimension between 2 μm and 20 μm or between 4 μm and 10 μm. A pitch between neighboring two of the through silicon vias (TSVs) 157 may range from 5 to 50 micrometers or from 5 to 20 micrometers or may be smaller than 50, 40 or 30 micrometers.

Next, referring to FIG. 3B, a shallow trench 2*d* having a depth between 5 μm and 30 μm and less than the depth of the deep trenches 2*c* may be formed in the insulating dielectric layer 12 and semiconductor substrate 2 by forming a second masking insulating layer or photoresist layer (not shown) on the insulating dielectric layer 12, through silicon vias (TSVs) 157 and first electrode 402 of the decoupling capacitor 401, patterning the second masking insulating layer or photoresist layer to form multiple openings in the second masking insulating layer or photoresist layer and then etching the insulating dielectric layer 12 and semiconductor substrate 2 under the openings in the second masking insulating layer or photoresist layer for a predetermined time period. The process for forming the shallow trench 2*d* in the insulating dielectric layer 12 and semiconductor substrate 2 may be referred to that for forming the blind holes 2*a* in the insulating dielectric layer 12 and semiconductor substrate 2 as illustrated in FIGS. 1A and 1B.

Next, the second masking insulating layer may be removed. Next, referring to FIGS. 3C and 3G, a dielectric layer 403, such as tantalum oxide ($Ta_2O_5$), hafnium oxide ($HfO_2$), zirconium oxide ($ZrO_2$), titanium oxide ($TiO_2$) or silicon nitride ($Si_3N_4$), having a thickness between 100 and 1,000 angstroms, may be formed on a sidewall and bottom of the shallow trench 2*d* and on a sidewall and top of the first electrode 402 of the decoupling capacitor 401, on a top of each of the through silicon vias (TSVs) 157 and on a top surface of the insulating dielectric layer 12. Next, an adhesion layer 154 may be formed on the dielectric layer 403 and in the shallow trench 2*d*. Next, a seed layer 155 may be deposited on the adhesion layer 154 and in the shallow trench 2*d*. Next, a copper layer 156 may be electroplated on the seed layer 155 and in the shallow trench 2*d*. The specification and process for forming the adhesion layer 154, seed layer 155 and copper layer 156 in the shallow trenches 2*d* and over the first electrode 402 of the decoupling capacitor 401, through silicon vias (TSVs) 157 and insulating dielectric layer 12 may be referred to those for forming the adhesion layer 154, seed layer 155 and copper layer 156 in the blind holes 2*a* and over the insulating dielectric layer 12 as illustrated in FIG. 1C.

Next, the copper layer 156, seed layer 155, adhesion layer 154 and dielectric layer 403 outside the shallow trench 2*d* may be removed as seen in FIG. 3D by a chemical-mechanical polishing (CMP) process to expose the top surface of the insulating dielectric layer 12, the top of the first electrode 402 of the decoupling capacitor 401 and the top of each of the through silicon vias (TSVs) 157. The copper layer 156, seed layer 155 and adhesion layer 154 in the shallow trench 2*d* may be employed as a second electrode 404 of the decoupling capacitor 401 as seen in FIGS. 3D and 3G. Thereby, the decoupling capacitor 401 may be provided with the dielectric layer 403 between its first and second electrodes 402 and 404, wherein its first electrode 402 may have a depth between 30 and 2,000 micrometers and its second electrode 404 may have a depth between 5 and 20 micrometers.

Next, referring to FIGS. 3E and 3G, the passivation layer 14 as illustrated in FIG. 1E may be formed on the top surface of the insulating dielectric layer 12 and on the tops of the first and second electrodes 402 and 404 of the decoupling capacitor 401. Next, the openings 14*a* as illustrated in FIG. 1E may be formed in the passivation layer 14 and each of the openings 14*a* may expose a backside of the copper layer 156 of one of the through silicon vias (TSVs) 157. One of the openings 14*a* in the passivation layer 14 may further expose the second electrode 404 of the decoupling capacitor 401 beside the copper layer 156 of one of the through silicon vias (TSVs) 157, e.g., a left one of the through silicon vias (TSVs) 157. Next, the micro-bump or micro-pad 34, which may be of one of the first through fourth types having the same specifications as the first through fourth types of micro-bumps or micro-pads 34 as illustrated in FIG. 1E respectively, may be formed on the copper layer 156 of each of the through silicon vias (TSVs) 157 at a bottom of one of the openings 14*a* in the passivation layer 14. One of the micro-bumps or micro-pads 34 may be further formed on the second electrode 404 of the decoupling capacitor 401 beside the copper layer 156 of said one of the through silicon vias (TSVs) 157 to couple said one of the through silicon vias (TSVs) 157 to the second electrode 404 of the decoupling capacitor 401.

Next, the semiconductor substrate 2 as seen in FIG. 3E may have a backside to be polished by a chemically-mechanically polishing (CMP) process or a wafer backside grinding process until each of the through silicon vias (TSVs) 157 and first electrode 402 may have a backside to be exposed as seen in FIG. 3F. For each of the through silicon vias (TSVs) 157 and first electrode 402, its insulating lining layer 153, adhesion layer 154 and seed layer 155 at its backside may be removed to expose a backside of its copper layer 156, wherein the backside of its copper layer 156 may be coplanar to the backside of the semiconductor substrate 2. Each of the through silicon vias (TSVs) 157 may be used as a vertical through via (VTV) 358 for a dedicated vertical path. Each of the vertical through vias (VTVs) 358 formed by the through silicon vias (TSVs) may have a depth between 30 μm and 200 μm and a largest transverse dimension, such as diameter or width, between 2 μm and 20 μm or between 4 μm and 10 μm. The first electrode 402 may have a depth between 30 μm and 200 μm.

Figure 3H:
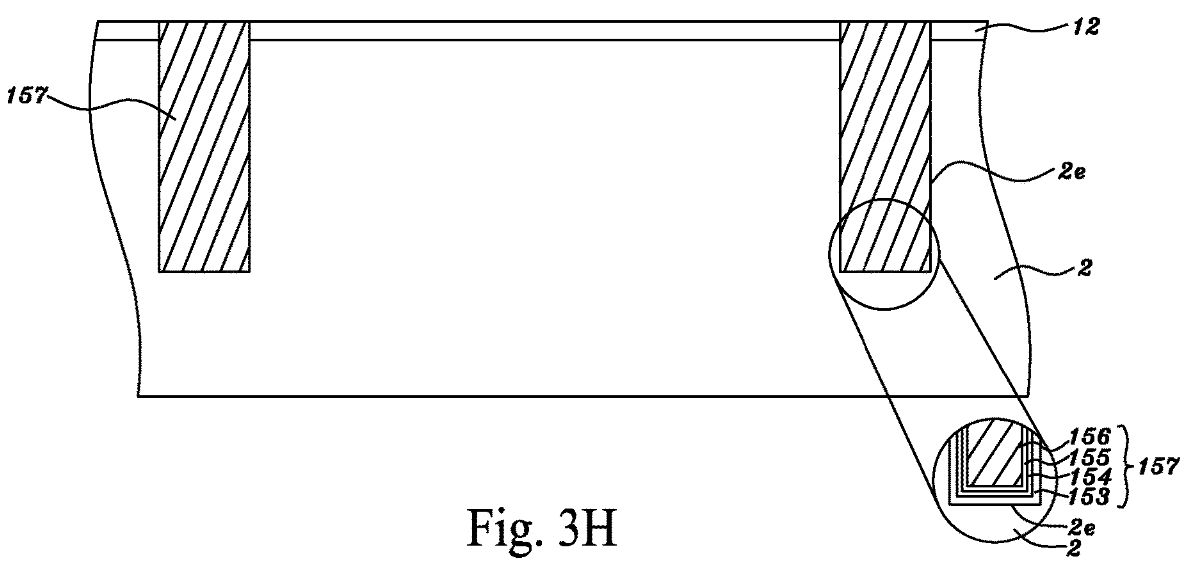
FIGS. 3H-3N are schematically cross-sectional views showing a process for forming a decoupling capacitor in a first type of vertical-through-via (VTV) connector in accordance with another embodiment of the present application.
Figure 3I:
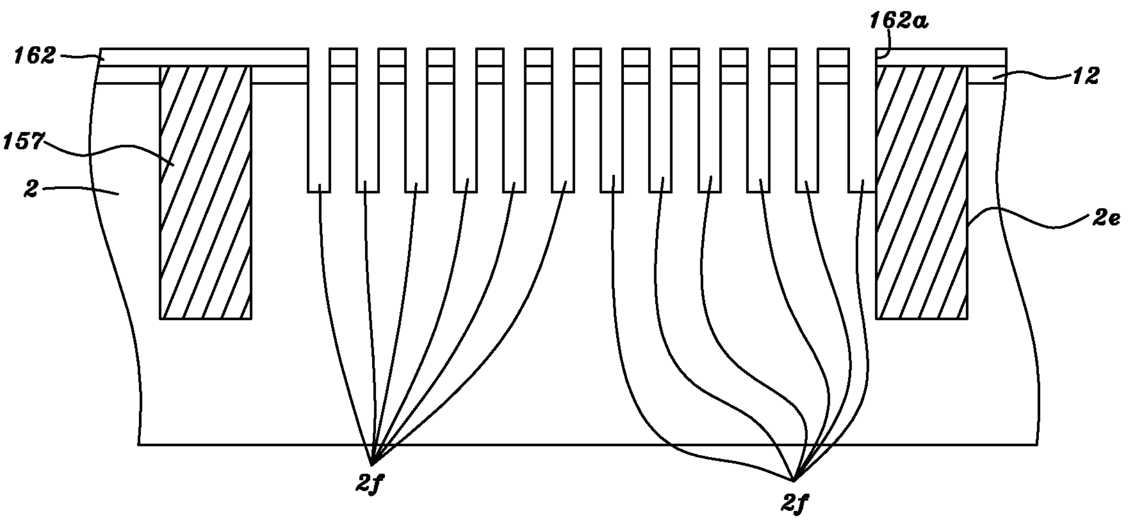
Figure 3J:
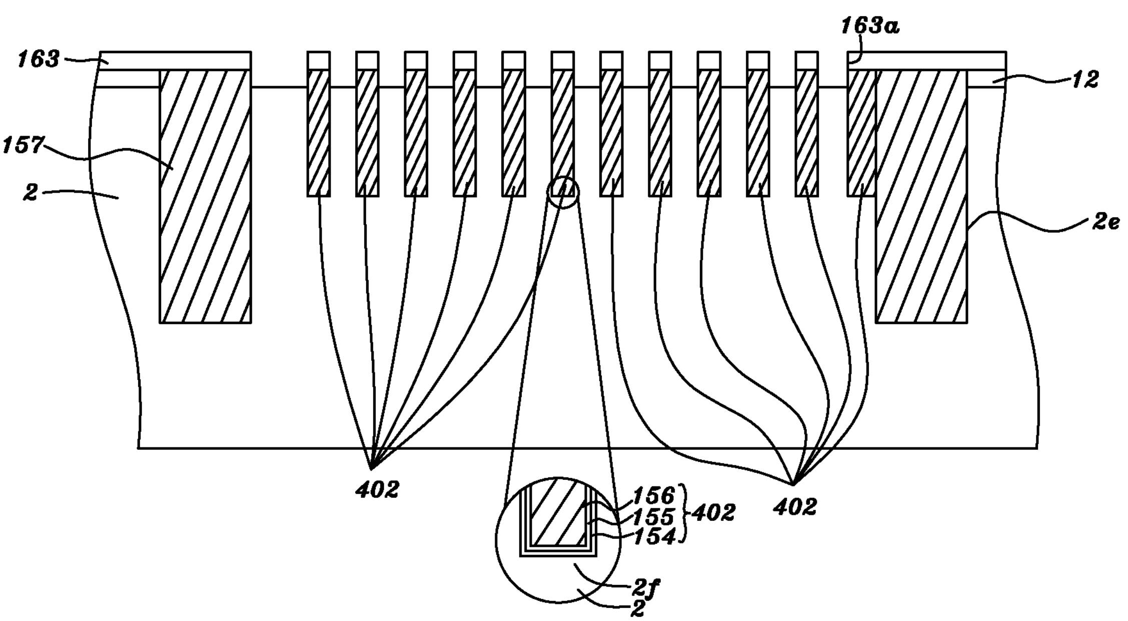
Figure 3K:
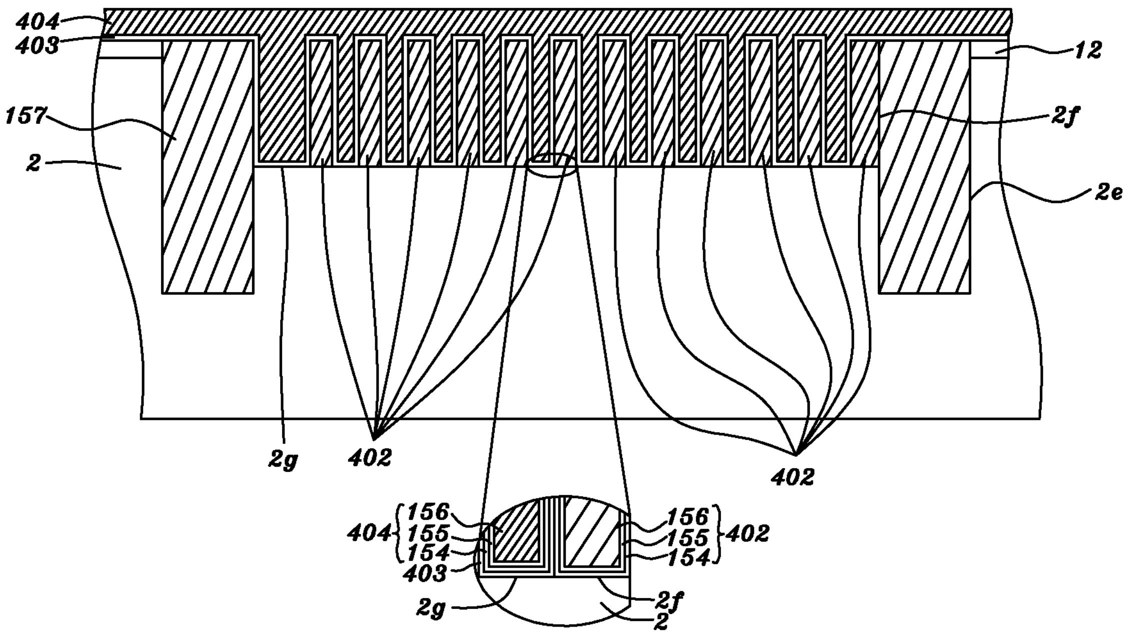
Figure 3L:
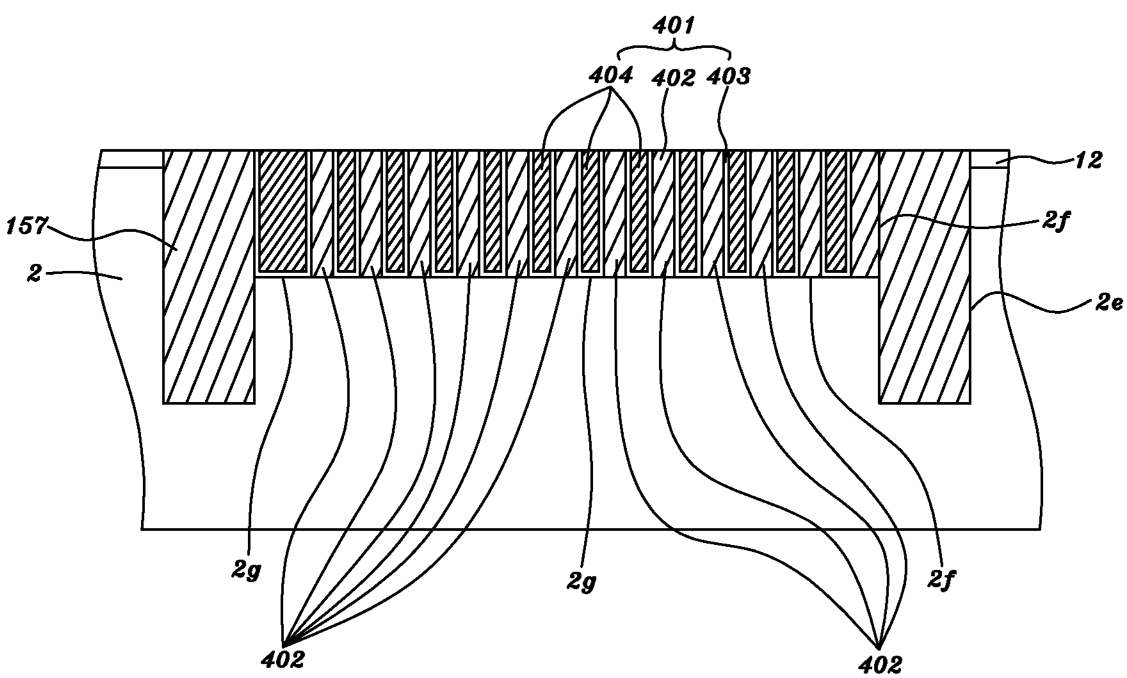
Figure 3M:
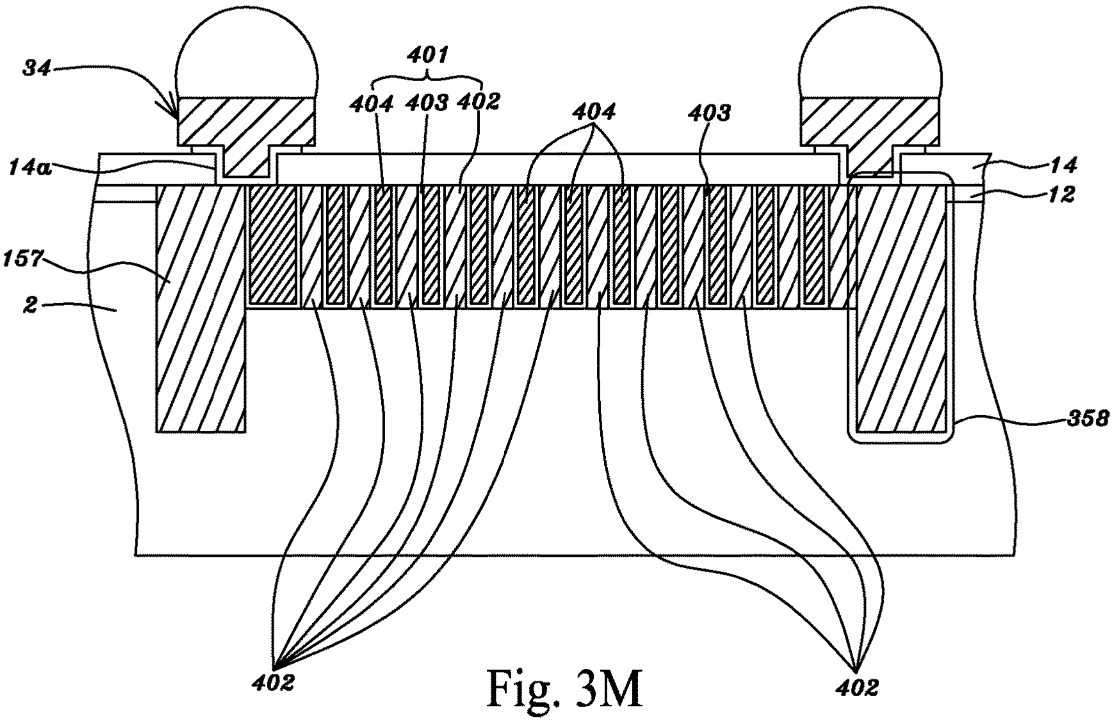
Figure 3N:
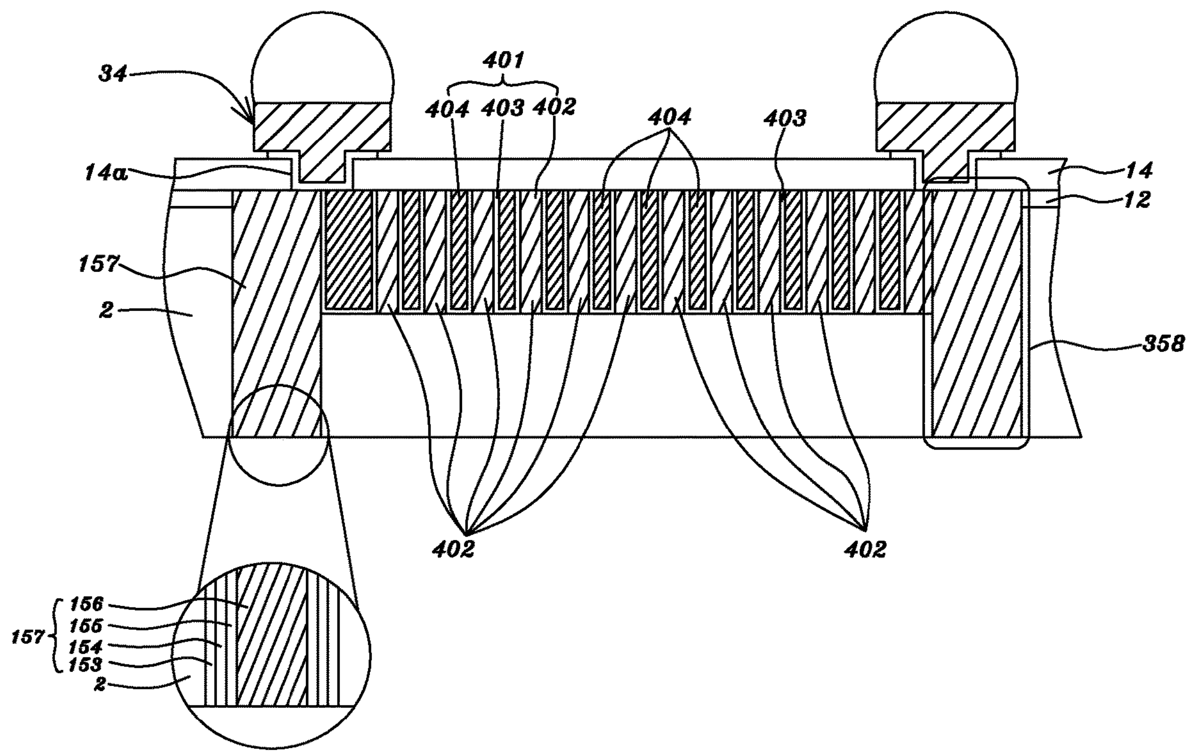
Figure 3O:
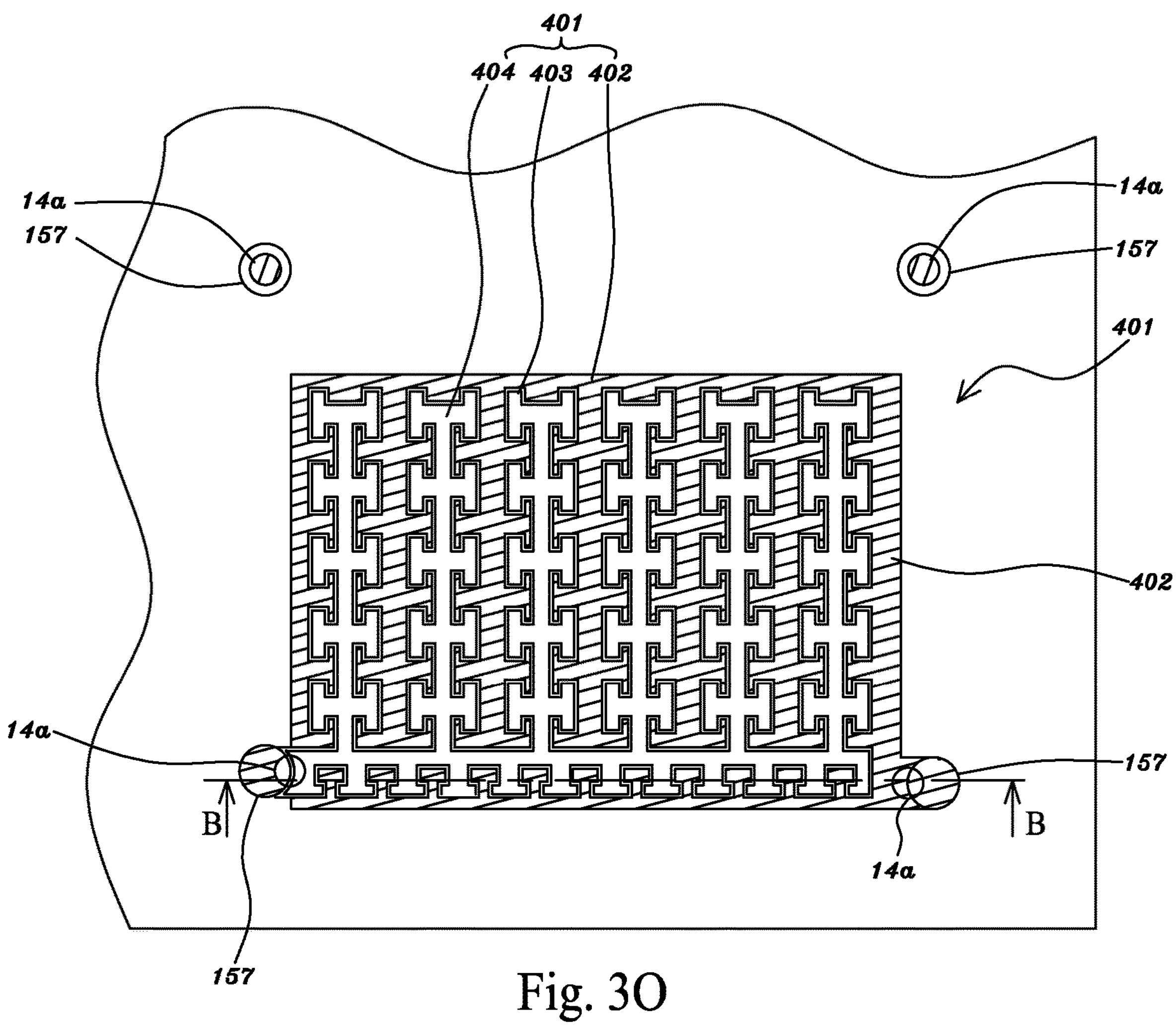

Alternatively, FIGS. 3H-3N are schematically cross-sectional views showing a process for forming a decoupling capacitor in a first type of vertical-through-via (VTV) connector in accordance with another embodiment of the present application. FIG. 3O is a schematically top view showing a decoupling capacitor among four through silicon vias (TSVs) in accordance with another embodiment of the present application, wherein FIG. 3N is a schematically cross-sectional view along a cross-sectional line B-B on FIG. 3O. Referring to FIG. 3H, for forming the first type of vertical-through-via (VTV) connector 467 as seen in FIGS. 1A-1G for the first case as illustrated in FIGS. 4A, 4B, 4G and 4H, as seen in FIGS. 1I and 1J for the second case as illustrated in FIGS. 4C, 4D, 4I and 4J, 4L or as seen in FIGS. 1L and 1M for the third case as illustrated in FIGS. 4E, 4F, 4K and 4L, after the insulating dielectric layer 12 is formed on the semiconductor substrate 2, multiple deep trenches 2*e* having a depth between 30 μm and 2,000 μm may be formed in the insulating dielectric layer 12 and semiconductor substrate 2 by forming a first masking insulating layer or photoresist layer (not shown) on the insulating dielectric layer 12, patterning the first masking insulating layer or photoresist layer to form multiple openings in the first masking insulating layer or photoresist layer and then etching the insulating dielectric layer 12 and semiconductor substrate 2 under the openings in the first masking insulating layer or photoresist layer for a predetermined time period. The specification for the insulating dielectric layer 12 and semiconductor substrate 2 may be referred to that as illustrated in FIG. 1A. The specification and process for forming the deep trenches 2*e* in the insulating dielectric layer 12 and semiconductor substrate 2 may be referred to those for forming the blind holes 2*a* in the insulating dielectric layer 12 and semiconductor substrate 2 as illustrated in FIGS. 1A and 1B.

Next, the first masking insulating layer or photoresist layer may be removed. Next, referring to FIGS. 3H and 3O, an insulating lining layer 153, adhesion layer 154, seed layer 155 and copper layer 156 as illustrated in FIG. 1C may be formed in the deep trenches 2*e* to form multiple through silicon vias (TSVs) 157. The specification and process for forming the insulating lining layer 153, adhesion layer 154, seed layer 155 and copper layer 156 in the deep trenches 2*e* may be referred to those for forming the insulating lining layer 153, adhesion layer 154, seed layer 155 and copper layer 156 in the blind holes 2*a* as illustrated in FIGS. 1C and 1D. Each of the through silicon vias (TSVs) 157 may have a depth between 30 μm and 2,000 μm and a diameter or largest transverse dimension between 2 μm and 20 μm or between 4 μm and 10 μm. A pitch between neighboring two of the through silicon vias (TSVs) 157 may range from 5 to 50 micrometers or from 5 to 20 micrometers or may be smaller than 50, 40 or 30 micrometers.

Next, referring to FIGS. 3I and 3O, a first shallow trench 2*f* having a depth between 5 μm and 30 μm and less than the depth of the deep trenches 2*e* may be formed in the insulating dielectric layer 12 and semiconductor substrate 2 by forming a second masking insulating layer or photoresist layer 162 on the insulating dielectric layer 12 and through silicon vias (TSVs) 157, patterning the second masking insulating layer or photoresist layer 162 to form an opening 162*a* in the second masking insulating layer or photoresist layer 162 and then etching the insulating dielectric layer 12 and semiconductor substrate 2 under the opening 162*a* in the second masking insulating layer or photoresist layer 162 for a predetermined time period. The process for forming the first shallow trench 2*f* in the insulating dielectric layer 12 and semiconductor substrate 2 may be referred to that for forming the blind holes 2*f* in the insulating dielectric layer 12 and semiconductor substrate 2 as illustrated in FIGS. 1A and 1B.

Next, the second masking insulating layer 162 as seen in FIG. 3I may be removed as see in FIG. 3J. Next, referring to FIGS. 3J and 3O, an adhesion layer 154 may be deposited on the sidewall and bottom of the first shallow trench 2*f* and on the top surface of the insulating dielectric layer 12 by, for example, sputtering or chemical vapor depositing (CVD) a titanium (Ti) or titanium nitride (TiN) layer 154 having a thickness between 1 nm to 50 nm on the sidewall and bottom of the first shallow trench 2*f* and on the top surface of the insulating dielectric layer 12. Next, a seed layer 155 may be deposited on the adhesion layer 154 by, for example, sputtering or chemical vapor depositing (CVD) a copper seed layer 155 having a thickness between 3 nm and 200 nm on the adhesion layer 154. Next, a copper layer 156 having a thickness, for example, between 10 nm and 3,000 nm, between 10 nm and 1,000 nm or between 10 nm and 500 nm may be electroplated on the copper seed layer 155. The specification and process for forming the adhesion layer 154, seed layer 155 and copper layer 156 in the first shallow trenches 2*f* and over the through silicon vias (TSVs) 157 and insulating dielectric layer 12 may be referred to those for forming the adhesion layer 154, seed layer 155 and copper layer 156 in the blind holes 2*a* and over the insulating dielectric layer 12 as illustrated in FIG. 1C. Next, the copper layer 156, seed layer 155 and adhesion layer 154 outside the first shallow trench 2*f* and over the insulating dielectric layer 12 may be removed by a chemical-mechanical polishing (CMP) process to expose the top surface of the insulating dielectric layer 12. The remaining copper layer 156, seed layer 155 and adhesion layer 154 in the first shallow trench 2*f* may be employed to form a first electrode 402 of a decoupling capacitor 401 as seen in FIG. 3L. For the first electrode 402 of the decoupling capacitor 401, its copper layer 156 may be provided in the first shallow trench 2*f* and have a front side coplanar with a front side of the insulating dielectric layer 12, its adhesion layer 154 may be provided on the sidewall and bottom of the first shallow trench 2*f* and at a sidewall and bottom of its copper layer 156, and its seed layer 155 may be provided between its adhesion layer 154 and copper layer 156 and at a sidewall and bottom of its copper layer 156.

Next, referring to FIGS. 3K and 3L, a second shallow trench 2*g* having a depth between 5 μm and 30 μm and less than the depth of the deep trenches 2*e* may be formed in the insulating dielectric layer 12 and semiconductor substrate 2 by forming a third masking insulating layer or photoresist layer 163 on the insulating dielectric layer 12, through silicon vias (TSVs) 157 and first electrode 402 of the decoupling capacitor 401, patterning the third masking insulating layer or photoresist layer 163 to form an opening 163*a* in the third masking insulating layer or photoresist layer 163, etching, as seen in FIG. 3J, the insulating dielectric layer 12 under the opening 163*a* in the third masking insulating layer or photoresist layer 163 until a top surface of the semiconductor substrate 2 is exposed via the opening 163*a* in the third masking insulating layer or photoresist layer 163, and then etching, as seen in FIG. 3K, the semiconductor substrate 2 under the openings 163*a* in the third masking insulating layer or photoresist layer 163 for a predetermined time period. The process for forming the second shallow trench 2*g* in the insulating dielectric layer 12 and semiconductor substrate 2 may be referred to that for forming the blind holes 2*a* in the insulating dielectric layer 12 and semiconductor substrate 2 as illustrated in FIGS. 1A and 1B.

Next, the third masking insulating layer or photoresist layer 163 as seen in FIG. 3J may be removed as seen in FIG. 3K. Next, referring to FIGS. 3K and 3O, a dielectric layer 403, such as tantalum oxide ($Ta_2O_5$), hafnium oxide ($HfO_2$), zirconium oxide ($ZrO_2$), titanium oxide ($TiO_2$) or silicon nitride ($Si_3N_4$), having a thickness between 100 and 1,000 angstroms, may be formed on a sidewall and bottom of the second shallow trench 2*g* and on a sidewall and top of the first electrode 402 of the decoupling capacitor 401, on a top of each of the through silicon vias (TSVs) 157 and on a top surface of the insulating dielectric layer 12. Next, an adhesion layer 154 may be formed on the dielectric layer 403 and in the second shallow trench 2*g*. Next, a seed layer 155 may be deposited on the adhesion layer 154 and in the second shallow trench 2*g*. Next, a copper layer 156 may be electroplated on the seed layer 155 and in the second shallow trench 2*g*. The specification and process for forming the adhesion layer 154, seed layer 155 and copper layer 156 in the second shallow trenches 2*g* and over the first electrode 402 of the decoupling capacitor 401, through silicon vias (TSVs) 157 and insulating dielectric layer 12 may be referred to those for forming the adhesion layer 154, seed layer 155 and copper layer 156 in the blind holes 2*a* and over the insulating dielectric layer 12 as illustrated in FIG. 1C.

Next, the copper layer 156, seed layer 155, adhesion layer 154 and dielectric layer 403 outside the second shallow trench 2*g* may be removed as seen in FIG. 3L by a chemical-mechanical polishing (CMP) process to expose the top surface of the insulating dielectric layer 12, the top of the first electrode 402 of the decoupling capacitor 401 and the top of each of the through silicon vias (TSVs) 157. The copper layer 156, seed layer 155 and adhesion layer 154 in the second shallow trench 2*g* may be employed as a second electrode 404 of the decoupling capacitor 401 as seen in FIGS. 3L and 3O. Thereby, the decoupling capacitor 401 may be provided with the dielectric layer 403 between its first and second electrodes 402 and 404, wherein its first electrode 402 may have a depth between 5 and 20 micrometers and its second electrode 404 may have a depth between 5 and 20 micrometers.

Next, referring to FIGS. 3M and 3O, the passivation layer 14 as illustrated in FIG. 1E may be formed on the top surface of the insulating dielectric layer 12 and on the tops of the first and second electrodes 402 and 404 of the decoupling capacitor 401. Next, the openings 14*a* as illustrated in FIG. 1E may be formed in the passivation layer 14 and each of the openings 14*a* may expose a backside of the copper layer 156 of one of the through silicon vias (TSVs) 157. A first one of the openings 14*a* in the passivation layer 14 may further expose the first electrode 402 of the decoupling capacitor 401 beside the copper layer 156 of a first one of the through silicon vias (TSVs) 157, e.g., a right one of the through silicon vias (TSVs) 157; a second one of the openings 14*a* in the passivation layer 14 may further expose the second electrode 404 of the decoupling capacitor 401 beside the copper layer 156 of a second one of the through silicon vias (TSVs) 157, e.g., a left one of the through silicon vias (TSVs) 157. Next, the micro-bump or micro-pad 34, which may be of one of the first through fourth types having the same specifications as the first through fourth types of micro-bumps or micro-pads 34 as illustrated in FIG. 1E respectively, may be formed on the copper layer 156 of each of the through silicon vias (TSVs) 157 at a bottom of one of the openings 14*a* in the passivation layer 14. A first one of the micro-bumps or micro-pads 34 may be further formed on the first electrode 402 of the decoupling capacitor 401 beside the copper layer 156 of the first one of the through silicon vias (TSVs) 157 to couple the first one of the through silicon vias (TSVs) 157 to the first electrode 402 of the decoupling capacitor 401; a second one of the micro-bumps or micro-pads 34 may be further formed on the second electrode 404 of the decoupling capacitor 401 beside the copper layer 156 of the second one of the through silicon vias (TSVs) 157 to couple the second one of the through silicon vias (TSVs) 157 to the second electrode 404 of the decoupling capacitor 401.

Next, the semiconductor substrate 2 as seen in FIG. 3M may have a backside to be polished by a chemically-mechanically polishing (CMP) process or a wafer backside grinding process until each of the through silicon vias (TSVs) 157 may have a backside to be exposed as seen in FIG. 3N. For each of the through silicon vias (TSVs) 157, its insulating lining layer 153, adhesion layer 154 and seed layer 155 at its backside may be removed to expose a backside of its copper layer 156, wherein the backside of its copper layer 156 may be coplanar to the backside of the semiconductor substrate 2. Each of the through silicon vias (TSVs) 157 may be used as a vertical through via (VTV) 358 for a dedicated vertical path. The first electrode 402 of the decoupling capacitor 401 is configured to electrically couple to the semiconductor substrate 2 and configured to electrically couple to a voltage Vss of ground reference via the first one of the micro-bumps or micro-pads 34. The first and second electrodes 402 and 404 of the decoupling capacitor 401 as shown in FIG. 3M may have substantially the same depth between 5 and 30 μm less than the depth of the through silicon vias (TSVs) 157, wherein the depth of the through silicon vias (TSVs) 157 may range from 30 to 2,000 μm. For an element indicated by the same reference number shown in FIGS. 3A-30, the specification of the element as seen in FIGS. 3H-30 may be referred to that of the element as illustrated in FIGS. 3A-3G.

For example, the decoupling capacitor 401 as illustrated in each of FIGS. 3F and 3N may have capacitance between 10 and 5,000 nF. The decoupling capacitor 401 as illustrated in each of FIGS. 3F and 3N may be formed (1) for the first case among any four of the vertical through vias (VTVs) 358, as seen in FIGS. 4A and 4B, and in the semiconductor substrate 2 of either of the first through ninth types of vertical-through-via (VTV) connectors 467, (2) for the second case among any four of the vertical through vias (VTVs) 358, as seen in FIGS. 4C and 4D, and in the semiconductor substrate 2 of either of the first through ninth types of vertical-through-via (VTV) connector 467, or (3) for the third case among any four of the vertical through vias (VTVs) 358, as seen in FIGS. 4E and 4F, and in the semiconductor substrate 2 of either of the first through ninth types of vertical-through-via (VTV) connector 467. Alternatively, the decoupling capacitor 401 as illustrated in each of FIGS. 3L and 3N may be formed (1) for the first case among any four of the vertical through vias (VTVs) 358 as seen in FIGS. 4A and 4B, i.e., among any four of the through silicon vias (TSVs) 157, and in one of the stacked through-silicon-via (TSV) wafers 431 and 433 to be cut for either of the tenth through twelfth types of vertical-through-via (VTV) connectors 467, (2) for the second case among any four of the vertical through vias (VTVs) 358 as seen in FIGS. 4C and 4D, i.e., among any four of the through silicon vias (TSVs) 157, and in one of the stacked through-silicon-via (TSV) wafers 431 and 433 to be cut for either of the tenth through twelfth types of vertical-through-via (VTV) connectors 467, or (3) for the third case among any four of the vertical through vias (VTVs) 358 as seen in FIGS. 4E and 4F, i.e., among any four of the through silicon vias (TSVs) 157, and in one of the stacked through-silicon-via (TSV) wafers 431 and 433 to be cut for either of the tenth through twelfth types of vertical-through-via (VTV) connectors 467.

Embodiment for Fine-Line Interconnection Bridge (FIB)

Figure 5A:
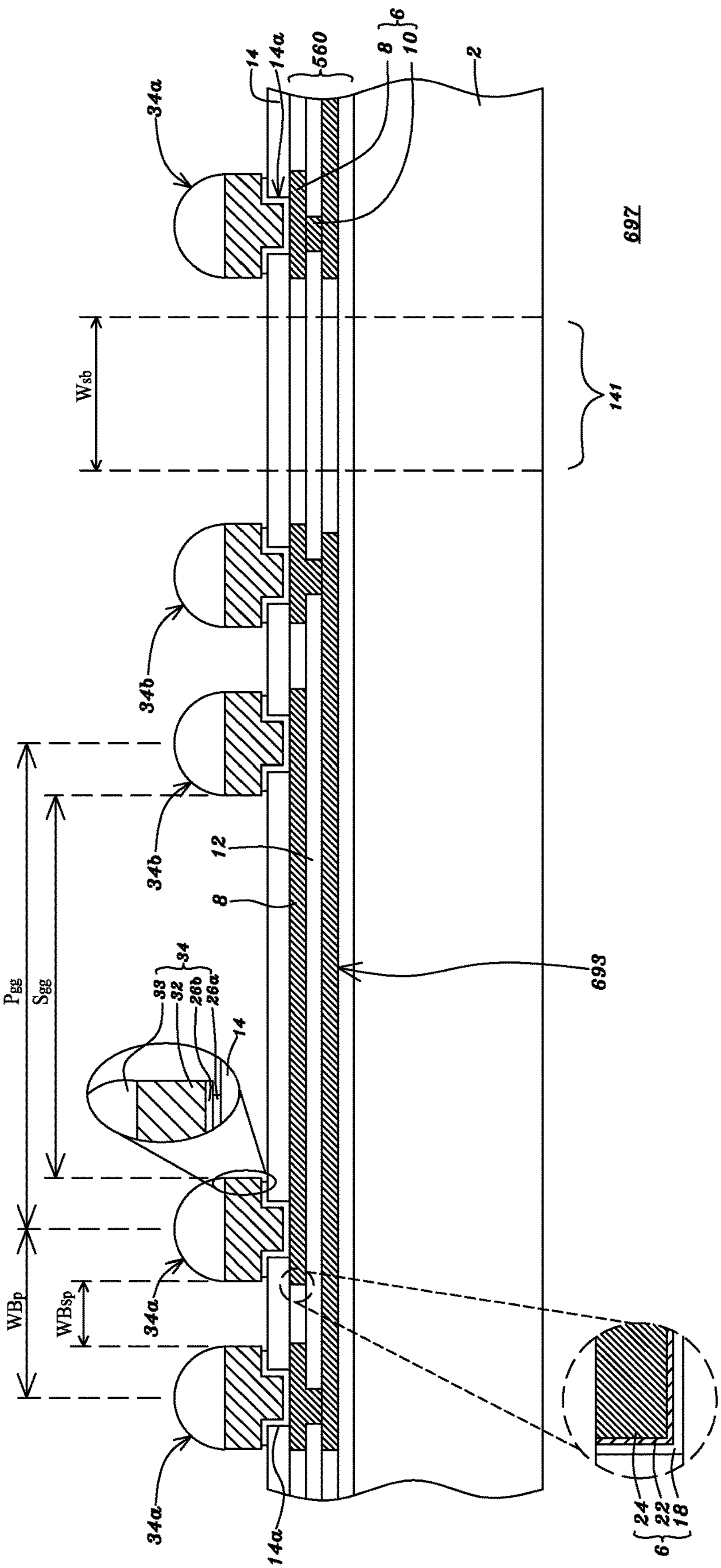
Figure 5B:
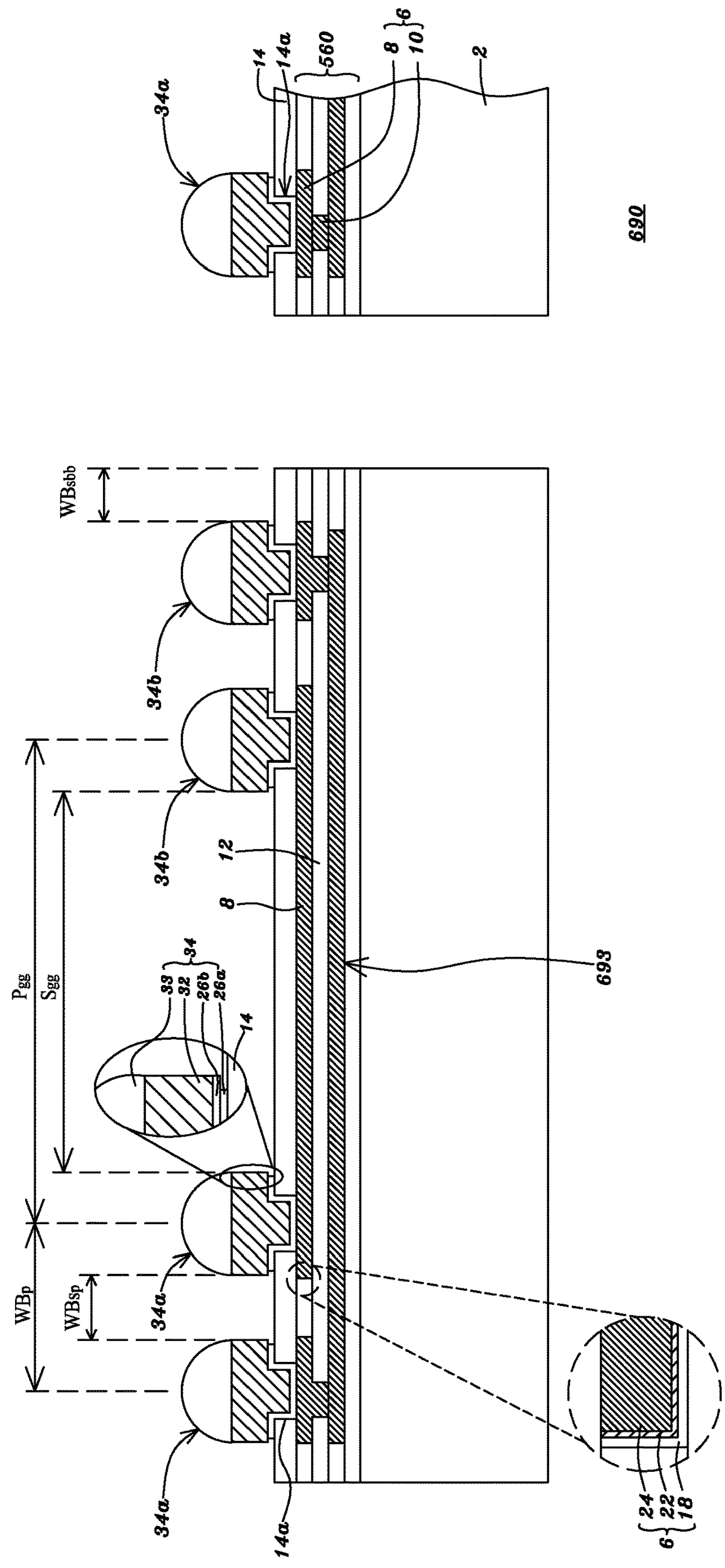
FIG. 5B is a first type of fine-line interconnection bridge in accordance with an embodiment of the present application.
Figure 5D:
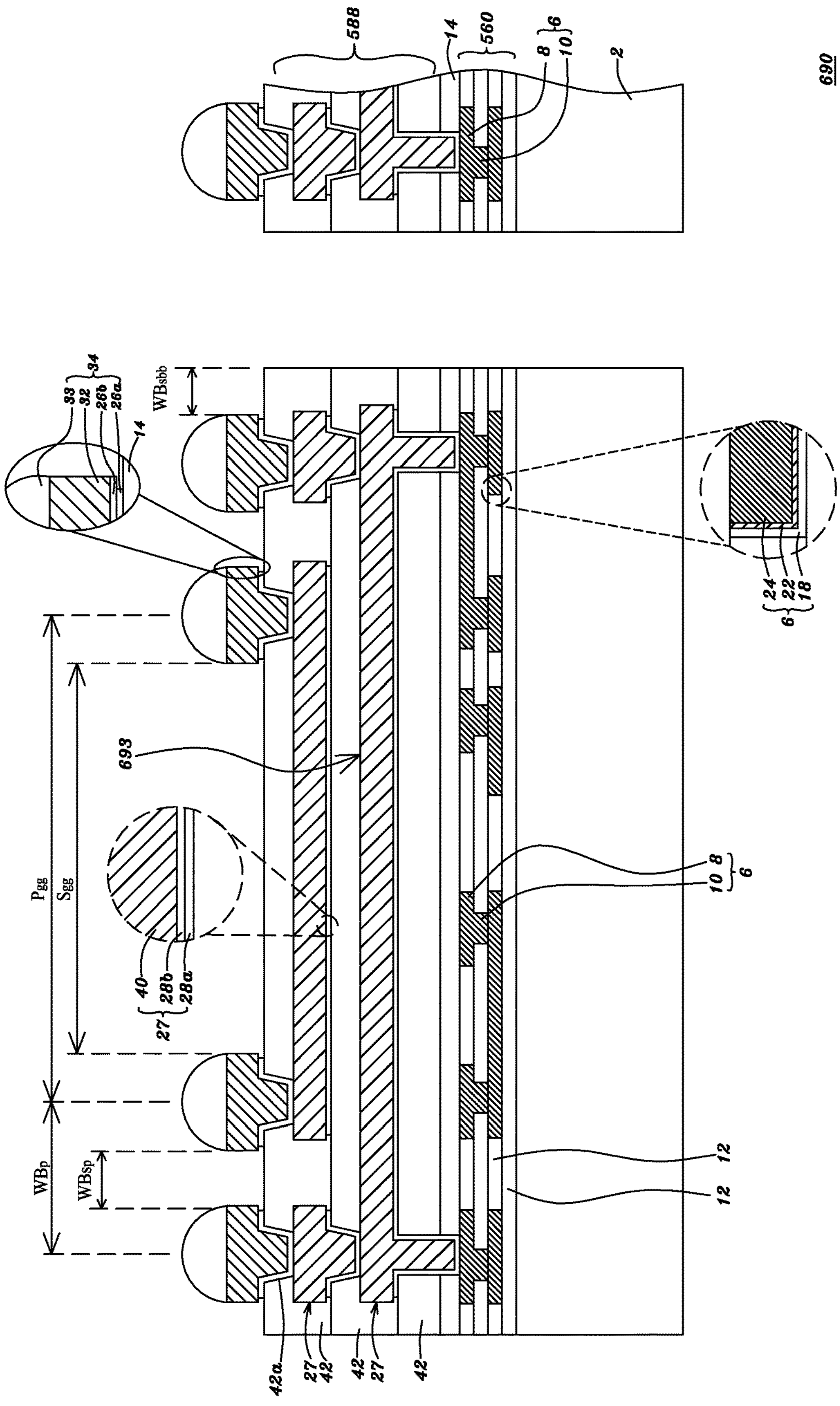
FIG. 5D is a schematically cross-sectional view showing a second type of fine-line interconnection bridge in accordance with an embodiment of the present application.
Figure 5E:
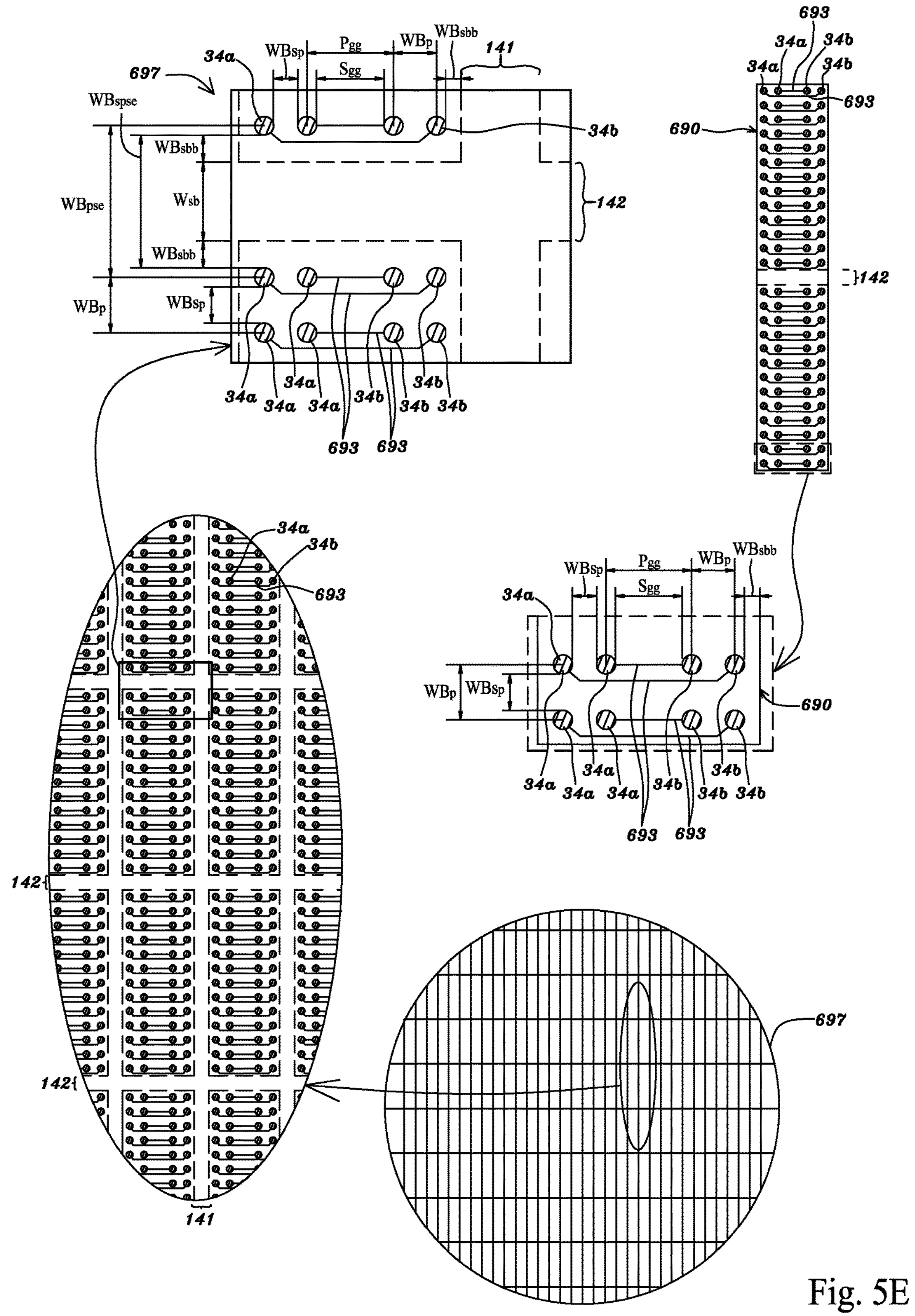
FIGS. 5E and 5F are schematically top views showing various arrangements of reserved scribe lines and micro-bumps or micro-pads for each of first and second types of fine-line interconnection bridges for a first case in accordance with an embodiment of the present application.
Figure 5F:
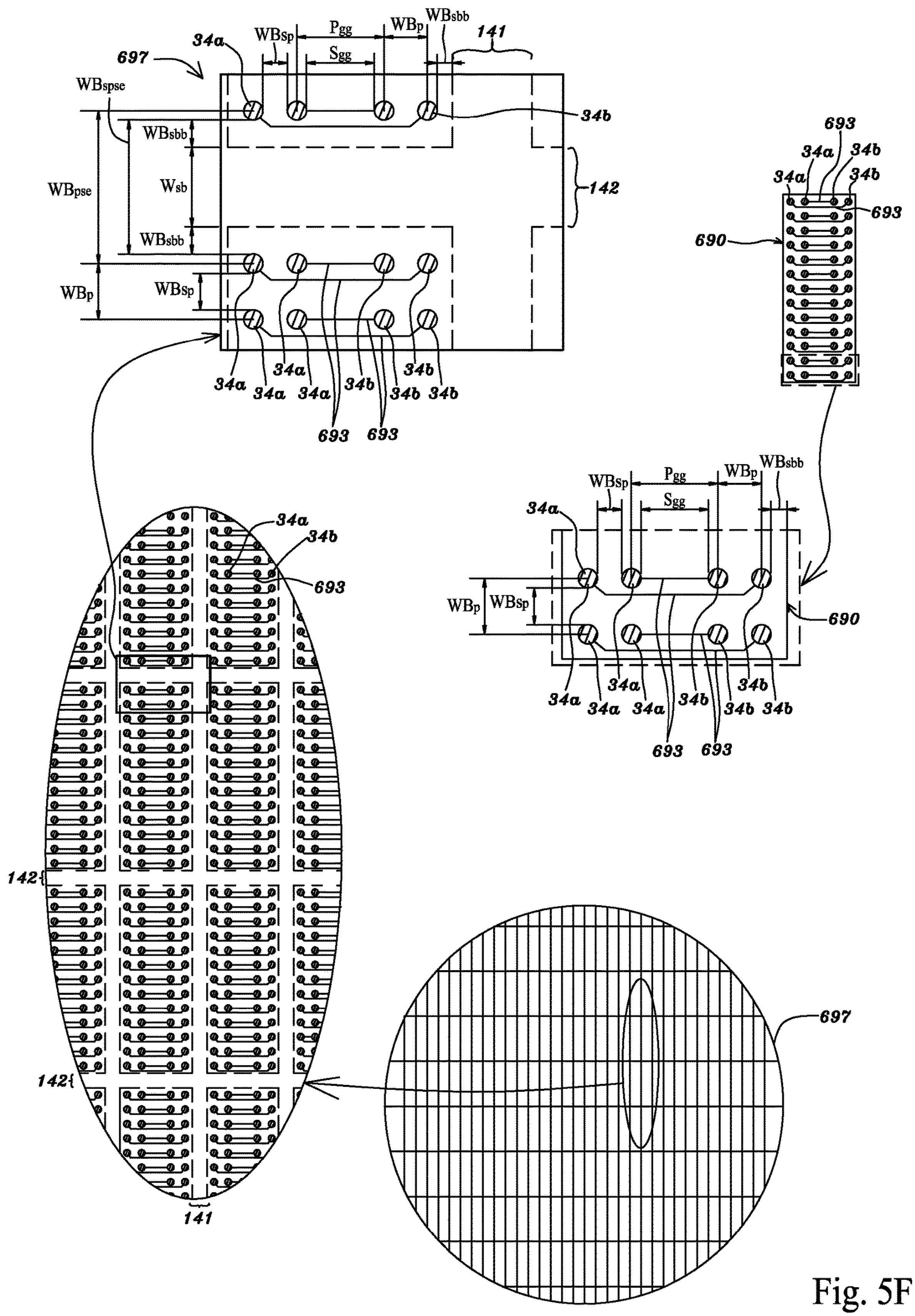
Figure 5G:
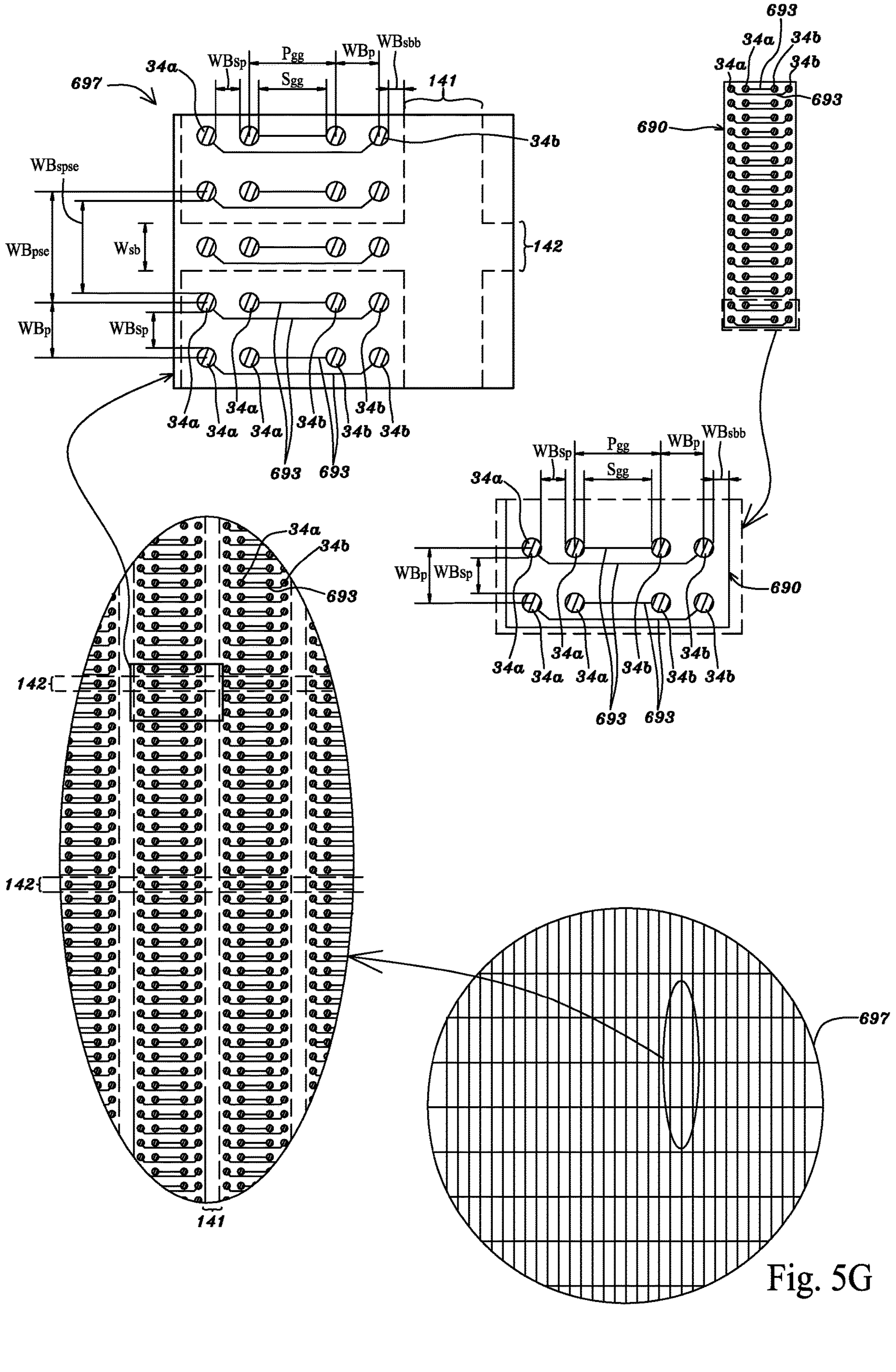
FIGS. 5G and 5H are schematically top views showing various arrangements of reserved scribe lines and micro-bumps or micro-pads for each of first and second types of fine-line interconnection bridges for a second case in accordance with an embodiment of the present application.
Figure 5H:
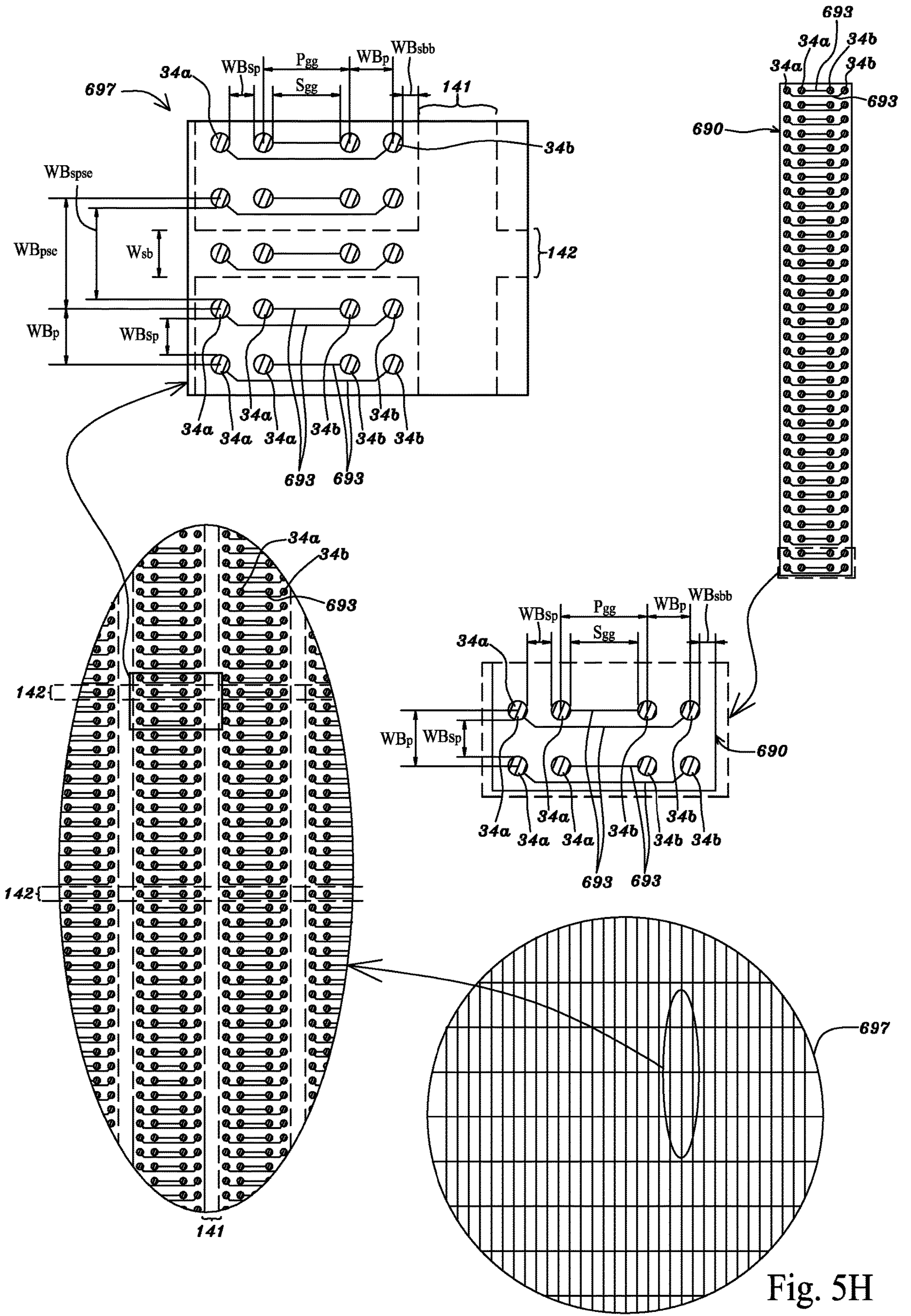

FIGS. 5A and 5C are schematically cross-sectional views showing various interconnection-bridge wafers in accordance with an embodiment of the present application. FIG. 5B is a first type of fine-line interconnection bridge in accordance with an embodiment of the present application. FIG. 5D is a schematically cross-sectional view showing a second type of fine-line interconnection bridge in accordance with an embodiment of the present application. FIGS. 5E and 5F are schematically top views showing various arrangements of reserved scribe lines and micro-bumps or micro-pads for each of first and second types of fine-line interconnection bridges for a first case in accordance with an embodiment of the present application. FIGS. 5G and 5H are schematically top views showing various arrangements of reserved scribe lines and micro-bumps or micro-pads for each of first and second types of fine-line interconnection bridges for a second case in accordance with an embodiment of the present application.

For a first case, either the first or second type of fine-line interconnection bridge (FIB) 690 as seen in FIG. 5B or 5D may have a size to be selected from various sizes after an interconnection-bridge wafer 697 as seen in FIGS. 5A, 5C, 5E and 5F is well formed. Referring to FIGS. 5A, 5C, 5E and 5F, the interconnection-bridge wafer 697 may include multiple first reserved scribe lines 141 extending in a y direction and multiple second reserved scribe lines 142 extending in an x direction vertical to the y direction. The interconnection-bridge wafer 697 may be cut along or diced along (or through) all of its first reserved scribe lines 141 and some or all of its second reserved scribe lines 142 to form a number of the first or second type of fine-line interconnection bridges 690 in a single-die type as seen in FIG. 5B or 5D respectively. The interconnection-bridge wafer 697 may include (1) a left group of micro-bumps or micro-pads 34*a* in a section or region between each neighboring two of its first reserved scribe lines 141 and between each neighboring two of its second reserved scribe lines 142, (2) a right group of micro-bumps or micro-pads 34*b* in the section or region and (3) multiple metal lines or traces 693 in the section or region, each coupling one of its left group of micro-bumps or micro-pads 34*a* in the section or region to one of its right group of micro-bumps or micro-pads 34*b* in the section or region. A pitch $WB_p$ between each neighboring two of its left group of micro-bumps or micro-pads 34*a* in the section or region may be smaller than 50, 40 or 30 micrometers; and a space $WB_{sp}$ between each neighboring two of its left group of micro-bumps or micro-pads 34*a* in the section or region may be smaller than 50, 40 or 30 micrometers. A pitch $WB_p$ between each neighboring two of its right group of micro-bumps or micro-pads 34*b* in the section or region may be smaller than 50, 40 or 30 micrometers; and a space $WB_{sp}$ between each neighboring two of its right group of micro-bumps or micro-pads 34*b* in the section or region may be smaller than 50, 40 or 30 micrometers. A pitch $P_{gg}$ between each micro-bump or micro-pad of its left group of micro-bumps or micro-pads 34*a* in the rightmost column in the section or region and a corresponding micro-bump or micro-pad of its right group of micro-bumps or micro-pads 34*b* in the leftmost column in the section or region may range from 60 micrometers to 500 micrometers, or optionally from 60 micrometers to 200 micrometers, wherein said each micro-bump or micro-pad and said corresponding micro-bump or micro-pad are in the same row in the section or region; and a space $S_{gg}$ between said each metal pad and said corresponding metal pad may range from 60 micrometers to 500 micrometers, or optionally from 60 micrometers to 200 micrometers. Each of the pitches $WB_p$ and spaces $WB_{sp}$ may be smaller than a width $W_{sb}$ of the second reserved scribe lines 142 and smaller than a space $WB_{spse}$ in the y direction between neighboring two of its left or right group of micro-bumps or micro-pads 34*a* or 34*b* in neighboring two of the sections or regions of the interconnection-bridge wafer 697 respectively and across one of the second reserved scribe lines 142 between said neighboring two of its left or right group of micro-bumps or micro-pads 34*a* or 34*b*; each of the pitches $WB_p$ and spaces $WB_{sp}$ may be smaller than a pitch $WB_{spse}$ in the y direction between neighboring two of its left or right group of micro-bumps or micro-pads 34*a* or 34*b* in neighboring two of the sections or regions of the interconnection-bridge wafer 697 respectively and across one of the second reserved scribe lines 142 between said neighboring two of its left or right group of micro-bumps or micro-pads 34*a* or 34*b*. Each of the space $WB_{spse}$ and pitch $WB_{spse}$ may be greater than 50, 40 or 30 micrometers. The space $WB_{spse}$ may be greater than the width $W_{sb}$ of the second reserved scribe lines 142 and equal to the width $W_{sb}$ of the second reserved scribe lines 142 plus two times of a predetermined space $WB_{sbb}$ in the y direction between each of its second reserved scribe lines 142 and one of its left or right group of micro-bumps or micro-pads 34*a* adjacent to said each of its second reserved scribe lines 142, wherein the predetermined space $WB_{sbb}$ in the y direction may be smaller than each of the pitches $WB_p$ and spaces $WB_{sp}$.

Alternatively, for a second case, either the first or second type of fine-line interconnection bridge 690 as seen in FIG. 5B or 5D may have a size to be selected from various sizes after an interconnection-bridge wafer 698 as seen in FIGS. 5A, 5C, 5G and 5H is well formed. For an element indicated by the same reference number shown in FIGS. 5E-5H, the specification of the element as seen in FIG. 5G or 5H may be referred to that of the element as illustrated in FIG. 5E or 5F. Referring to FIGS. 5A, 5C, 5G and 5H, the interconnection-bridge wafer 698 may include multiple first reserved scribe lines 141 extending in a y direction and multiple second reserved scribe lines 142 extending in an x direction vertical to the y direction. The interconnection-bridge wafer 698 may include (1) a left group of micro-bumps or micro-pads 34*a* in a section or region between each neighboring two of its first reserved scribe lines 141 extending in a y direction, (2) a right group of micro-bumps or micro-pads 34*b* in the section or region and (3) multiple metal lines or traces 693 in the section or region, each coupling one of its left group of micro-bumps or micro-pads 34*a* in the section or region to one of its right group of micro-bumps or micro-pads 34*b* in the section or region. For the interconnection-bridge wafer 698, each of its second reserved scribe lines 142 may extend in line with its left and right groups of micro-bumps or micro-pads 34*a* and 34*b* in any row horizontally extending in its sections or region. The interconnection-bridge wafer 698 may be cut along or diced along (or through) its first reserved scribe lines 141 and along (or through) its left and right groups of micro-bumps or micro-pads 34*a* and 34*b* in its second reserved scribe lines 142 to form a number of the first or second type of fine-line interconnection bridges 690 in a single-die type as seen in FIG. 5B or 5D respectively. For the interconnection-bridge wafer 698, A pitch $WB_p$ between each neighboring two of its left group of micro-bumps or micro-pads 34*a* in each of the sections or regions of the interconnection-bridge wafer 698 may be smaller than 50, 40 or 30 micrometers; a space $WB_{sp}$ between each neighboring two of its left group of micro-bumps or micro-pads 34*a* in each of the sections or regions of the interconnection-bridge wafer 698 may be smaller than 50, 40 or 30 micrometers. A pitch $WB_p$ between each neighboring two of its right group of micro-bumps or micro-pads 34*b* in each of the sections or regions of the interconnection-bridge wafer 698 may be smaller than 50, 40 or 30 micrometers; a space $WB_{sp}$ between each neighboring two of its right group of micro-bumps or micro-pads 34*b* in each of the sections or regions of the interconnection-bridge wafer 698 may be smaller than 50, 40 or 30 micrometers. Each of the pitch $WB_p$ and space $WB_{sp}$ may be smaller than a width $W_{sb}$ of the second reserved scribe lines 142 and than a width $W_{sb}$ of the first reserved scribe lines 141.

Referring to FIG. 5A, each of the interconnection-bridge wafers 697 and 698 as seen in FIGS. 5E-5H may include (1) a semiconductor substrate 2, (2) a first interconnection scheme for an interconnection bridge (FISIB) 560 on the semiconductor substrate 2, wherein its first interconnection scheme 560 may include multiple insulating dielectric layers 123 and multiple interconnection metal layers 6 each in neighboring two of the insulating dielectric layers 123, wherein each of the interconnection metal layers 6 of its first interconnection scheme 560 is patterned with multiple metal pads, lines or traces 8 in an upper one of the neighboring two of the insulating dielectric layers 123 of its first interconnection scheme 560 and multiple metal vias 10 in a lower one of the neighboring two of the insulating dielectric layers 123 of its first interconnection scheme 560, wherein between each neighboring two of the interconnection metal layers 6 of its first interconnection scheme 560 is provided one of the insulating dielectric layers 123 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 123 of its first interconnection scheme 560 between the upper and lower ones of the interconnection metal layers 6 of its first interconnection scheme 560, (3) a passivation layer 14 on its first interconnection scheme 560, wherein the topmost one of the interconnection metal layers 6 of its first interconnection scheme 560 may have the metal pads 8 at bottoms of multiple openings 14*a* in the passivation layer 14, wherein the specification for its passivation layer 14 and the openings 14*a* therein may be referred to the specification for the passivation layer 14 and the openings 14*a* therein of the first type of vertical-through-via (VTV) connector 467 as illustrated in FIG. 1E, and (4) multiple micro-bumps or micro-pads 34*a* and 34*b*, each of which may be of one of the first through fourth types having the same specification as the first through fourth types of micro-bumps or micro-pads 34 respectively as illustrated in FIG. 1E, on the metal pads 8 of the topmost one of the interconnection metal layers 6 of its first interconnection scheme 560 at the bottoms of the openings 14*a* in its passivation layer 14.

Referring to FIG. 5A, for the first interconnection scheme for an interconnection bridge (FISIB) 560, each of its insulating dielectric layers 123 may include a layer of silicon oxide, silicon oxynitride or silicon oxycarbide. Each of its interconnection metal layers 6 may include (1) a copper layer 24 having lower portions in openings in a lower one of the insulating dielectric layers 123, such as silicon-oxycarbide layer having a thickness of between 3 nm and 500 nm, and upper portions having a thickness of between 3 nm and 500 nm over the lower one of the insulating dielectric layers 123 and in openings in an upper one of the insulating dielectric layers 123, (2) an adhesion layer 18, such as titanium or titanium nitride having a thickness of between 1 nm and 50 nm, at a bottom and sidewall of each of the lower portions of the copper layer 24 and at a bottom and sidewall of each of the upper portions of the copper layer 24, and (3) a seed layer 22, such as copper, between the copper layer 24 and the adhesion layer 18, wherein the copper layer 24 has a top surface substantially coplanar with a top surface of the upper one of the insulating dielectric layers 123. For an example, the first interconnection scheme 560 may be formed with one or more passive devices, such as resistors, capacitors or inductors. Its interconnection metal layers 6 may be formed for its metal lines or traces 693 as seen in FIGS. 5E-5H, each coupling one of its left group of micro-bumps or micro-pads 34*a* to one of its right group of micro-bumps or micro-pads and 34*b*.

Referring to FIG. 5A, for the first interconnection scheme for an interconnection bridge (FISIB) 560, each of its interconnection metal layers 6 may be patterned with the metal pads, lines or traces 8 having a thickness between 3 nm and 500 nm, between 10 nm and 1,000 nm, or between 10 nm and 2,000 nm or thinner than or equal to 50 nm, 100 nm, 200 nm, 300 nm, 500 nm, 1,000 nm, 1,500 nm or 2,000 nm, and a minimum width equal to or smaller than 50 nm, 100 nm, 150 nm, 200 nm, 300 nm, 500 nm, 1,000 nm, 1,500 nm or 2,000 nm. A minimum space between neighboring two of the metal pads, lines or traces 8 of each of its interconnection metal layers 6 may be equal to or smaller than 50 nm, 100 nm, 150 nm, 200 nm, 300 nm, 500 nm, 1,000 nm, 1,500 nm or 2,000 nm. A minimum pitch between neighboring two of the metal pads, lines or traces 8 of each of its interconnection metal layers 6 may be equal to or smaller than 100 nm, 200 nm, 300 nm, 400 nm, 600 nm, 1,000 nm, 3,000 nm or 4,000 nm. Each of its insulating dielectric layers 123 may have a thickness between 3 nm and 500 nm, between 10 nm and 1,000 nm, or between 10 nm and 2,000 nm or thinner than or equal to 50 nm, 100 nm, 200 nm, 300 nm, 500 nm, 1,000 nm or 2,000 nm.

Alternatively, each of the interconnection-bridge wafers 697 and 698 as seen in FIGS. 5E-5H may have a structure as seen in FIG. 5C, which is similar to that as illustrated in FIG. 5A. For an element indicated by the same reference number shown in FIGS. 5A and 5C, the specification of the element as seen in FIG. 5C may be referred to that of the element as illustrated in FIG. 5A. The difference therebetween is that each of the interconnection-bridge wafers 697 and 698 as seen in FIGS. 5E-5H may further include a second interconnection scheme for an interconnection bridge (SISIB) 588 over the passivation layer 14, wherein the second interconnection scheme 588 may include one or more interconnection metal layers 27 coupling to the metal pads 8 of the topmost one of the interconnection metal layers 6 of its first interconnection scheme 560 through the openings 14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, and multiple micro-bumps or micro-pads 34*a* and 34*b*, each of which may be of one of the first through fourth types having the same specification as the first through fourth types of micro-bumps or micro-pads 34 respectively as illustrated in FIG. 1E, may be formed on the metal pads of the topmost one of the interconnection metal layers 27 of its second interconnection scheme 588 at the bottoms of the openings 42*a* in the topmost one of the polymer layers 42 of its second interconnection scheme 588. Its interconnection metal layers 6 and 27 may be formed for its metal lines or traces 693 as seen in FIGS. 5E-5H, each coupling one of its left group of micro-bumps or micro-pads 34*a* to one of its right group of micro-bumps or micro-pads and 34*b*.

Referring to FIG. 5C, for the second interconnection scheme for an interconnection bridge (SISIB) 588, each of its interconnection metal layers 27 may include (1) a copper layer 40 having lower portions in openings in one of the polymer layers 42 having a thickness of between 0.3 μm and 20 μm, and upper portions having a thickness 0.3 μm and 20 μm over said one of the polymer layers 42, (2) an adhesion layer 28*a*, such as titanium or titanium nitride having a thickness of between 1 nm and 50 nm, at a bottom and sidewall of each of the lower portions of the copper layer 40 and at a bottom of each of the upper portions of the copper layer 40, and (3) a seed layer 28*b*, such as copper, between the copper layer 40 and the adhesion layer 28*a*, wherein said each of the upper portions of the copper layer 40 may have a sidewall not covered by the adhesion layer 28*a*. For an example, each of the first and second interconnection schemes 560 and 588 may be formed with one or more passive devices, such as resistors, capacitors or inductors.

Referring to FIG. 5C, for the second interconnection scheme for an interconnection bridge (SISIB) 588, each of its interconnection metal layers 27 may be patterned with multiple metal lines or traces each having a thickness between 0.3 μm and 20 μm, between 0.5 μm and 10 μm, between 1 μm and 5 μm, between 1 μm and 10 μm or between 2 μm and 10 μm or thicker than or equal to 0.3 μm, 0.5 μm, 0.7 μm, 1 μm, 1.5 μm, 2 μm or 3 μm, and a width between 0.3 μm and 20 μm, between 0.5 μm and 10 μm, between 1 μm and 5 μm, between 1 μm and 10 μm or between 2 μm and 10 μm, or wider than or equal to 0.3 μm, 0.5 μm, 0.7 μm, 1 μm, 1.5 μm, 2 μm or 3 μm. Each of its polymer layers 42 may have a thickness between 0.3 μm and 20 μm, between 0.5 μm and 10 μm, between 1 μm and 5 μm or between 1 μm and 10 μm, or thicker than or equal to 0.3 μm, 0.5 μm, 0.7 μm, 1 μm, 1.5 μm, 2 μm or 3 μm.

As mentioned above, each of the first and second types of fine-line interconnection bridge (FIB) 690 as seen in FIGS. 5B and 5D may have a size to be selected or determined after the interconnection-bridge wafer 697 as seen in FIGS. 5A, 5C, 5E and 5F or the interconnection-bridge wafer 698 as seen in FIGS. 5A, 5C, 5G and 5H is well formed. For the first case as seen in FIGS. 5A, 5C, 5E and 5F, when a size for each of the first and second types of fine-line interconnection bridge (FIB) 690 is selected or determined, the interconnection-bridge wafer 697 may be cut or diced along (or through) all of the first reserved scribe lines 141 of the interconnection-bridge wafer 697 and some or all of the second reserved scribe lines 142 of the interconnection-bridge wafer 697 to form a number of said each of the first and second types of fine-line interconnection bridge (FIB) 690 in a single-die type as seen in FIGS. 5B and 5D respectively by a laser cutting process or by a mechanical cutting process. For the second case as seen in FIGS. 5A, 5C, 5G and 5H, when a size for each of the first and second types of fine-line interconnection bridge (FIB) 690 is selected or determined, the interconnection-bridge wafer 698 may be cut or diced along (or through) the first reserved scribe lines 141 of the interconnection-bridge wafer 698 and along (or through) the left and right groups of micro-bumps or micro-pads 34*a* and 34*b* in the second reserved scribe lines 142 of the interconnection-bridge wafer 698 to form a number of said each of the first and second types of fine-line interconnection bridges (FIB) 690 in a single-die type as seen in FIGS. 5B and 5D respectively by a laser cutting process or by a mechanical cutting process.

Referring to FIGS. 5A-5H, the aspect ratio of the length to the width for each of the first and second types of fine-line interconnection bridges (FIB) 690 may be between 2 and 10, between 4 and 10 or between 2 and 40. Each of the first and second types of fine-line interconnection bridges (FIB) 690 may be provided with passive elements, such as capacitors, but without any active device, i.e., transistor, therein. Each of the first and second types of fine-line interconnection bridges (FIB) 690 may be manufactured by packaging manufacturing companies or facilities without front-end of line manufacturing capability.

For the first case as seen in FIGS. 5B, 5D-5F, each of the first and second types of fine-line interconnection bridges (FIB) 690 may have the sections or regions separated by its second reserved scribe line(s) 142, wherein the sections or regions of each of the first and second types of fine-line interconnection bridges (FIB) 690 may have the number between 2 and 20. Alternatively, each of the first and second types of fine-line interconnection bridges (FIB) 690 may have only one of the sections or regions without any of the second reserved scribe lines as seen in FIGS. 5E and 5F. Each of the first and second types of fine-line interconnection bridges (FIB) 690 may have the left and right groups of micro-bumps or micro-pads 34*a* and 34*b* arranged in an array of M1 by N1, wherein the number of M1 may be between 25 and 250, and the number of N1 may be between 2 and 100; alternatively, the number of M1 may be between 15 and 100, and the number of N1 may be between 2 and 50. Each of the first and second types of fine-line interconnection bridges (FIB) 690 may have the left and right groups of micro-bumps or micro-pads 34*a* and 34*b* arranged in an array of M2 by N2 in each of the sections or regions thereof, wherein the number of M2 may be between 10 and 50, and the number of N2 may be between 2 and 100; alternatively, the number of M2 may be between 15 and 30, and the number of N2 may be between 2 and 50. For example, each of the first and second types of fine-line interconnection bridges (FIB) 690 may be arranged with a size as seen in FIG. 5C for containing 2-by-1 sections or regions, each of which contains 13-by-2 left group of micro-bumps or micro-pads 34*a* and 13-by-2 right group of micro-bumps or micro-pads 34*b*, or another size as seen in FIG. 5D for containing only one section or region, which contains 13-by-2 left group of micro-bumps or micro-pads 34*a* and 13-by-2 right group of micro-bumps or micro-pads 34*b*. The pitch $WB_p$ between each neighboring two of the left or right group of micro-bumps or micro-pads 34*a* or 34*b* in each of the sections or regions of each of the first and second types of fine-line interconnection bridges (FIB) 690 may be smaller than 50, 40 or 30 micrometers; and the space $WB_{sp}$ between each neighboring two of the left or right group of micro-bumps or micro-pads 34*a* or 34*b* in each of the sections or regions of each of the first and second types of fine-line interconnection bridges (FIB) 690 may be smaller than 50, 40 or 30 micrometers. The pitch $P_{gg}$ between each micro-bump or micro-pad of the left group of micro-bumps or micro-pads 34*a* in the rightmost column in each of the sections or regions of each of the first and second types of fine-line interconnection bridges (FIB) 690 and a corresponding micro-bump or micro-pad of the right group of micro-bumps or micro-pads 34*b* in the leftmost column in said each of the sections or regions may range from 60 micrometers to 500 micrometers, or optionally from 60 micrometers to 200 micrometers, wherein said each micro-bump or micro-pad and said corresponding micro-bump or micro-pad are in the same row in said each of the sections or regions; and the space $S_{gg}$ between said each metal pad and said corresponding metal pad may range from 60 micrometers to 500 micrometers, or optionally from 60 micrometers to 200 micrometers. Each of the pitches $WB_p$ and spaces $WB_{sp}$ may be smaller than the width $W_{sb}$ of each of the second reserved scribe lines 142 between neighboring two of the sections or regions of each of the first and second types of fine-line interconnection bridges (FIB) 690 and smaller than the space $WB_{spse}$ in the y direction between neighboring two of the left or right group of micro-bumps or micro-pads 34*a* or 34*b* in neighboring two of the sections or regions of each of the first and second types of fine-line interconnection bridges (FIB) 690 respectively and across one of the second reserved scribe lines 142 between said neighboring two of the left or right group of micro-bumps or micro-pads 34*a* or 34*b*; each of the pitches $WB_p$ and spaces $WB_{sp}$ may be smaller than the pitch $WB_{pse}$ in the y direction between neighboring two of the left or right group of micro-bumps or micro-pads 34*a* or 34*b* in neighboring two of the sections or regions of each of the first and second types of fine-line interconnection bridges (FIB) 690 respectively and across one of the second reserved scribe lines 142 between said neighboring two of the left or right group of micro-bumps or micro-pads 34*a* or 34*b*. Each of the space $WB_{spse}$ and pitch $WB_{pse}$ may be greater than 50, 40 or 30 micrometers. For each of the first and second types of fine-line interconnection bridges (FIB) 690, the distance $W_{sbt}$ between its edge and one of its left or right group of micro-bumps or micro-pads 34*a* or 34*b* may be smaller than 50, 40 or 30 micrometers; optionally, its edge may be aligned with an edge of one of its left or right group of micro-bumps or micro-pads 34*a* or 34*b*.

For the second case as seen in FIGS. 5B, 5D, 5G and 5H, each of the first and second types of fine-line interconnection bridges (FIB) 690 may be arranged with a size as seen in FIG. 5E for containing 13-by-2 left group of micro-bumps or micro-pads 34*a* and 13-by-2 right group of micro-bumps or micro-pads 34*b*, or another size as seen in FIG. 5F for containing 26-by-2 left group of micro-bumps or micro-pads 34*a* and 26-by-2 right group of micro-bumps or micro-pads 34*b*. The pitch $WB_p$ between each neighboring two of the left or right group of micro-bumps or micro-pads 34*a* or 34*b* of each of the first and second types of fine-line interconnection bridges (FIB) 690 may be smaller than 50, 40 or 30 micrometers; the space $WB_{sp}$ between each neighboring two of the left or right group of micro-bumps or micro-pads 34*a* or 34*b* of each of the first and second types of fine-line interconnection bridges (FIB) 690 may be smaller than 50, 40 or 30 micrometers. For each of the first and second types of fine-line interconnection bridges (FIB) 690, the distance $W_{sbt}$ between its edge and one of its left or right group of micro-bumps or micro-pads 34*a* or 34*b* may be smaller than 50, 40 or 30 micrometers; optionally, its edge may be aligned with an edge of one of its left or right group of micro-bumps or micro-pads 34*a* or 34*b*.

Specification for Semiconductor Integrated-Circuit (IC) Chip

1. First Type of Semiconductor Integrated-Circuit (IC) Chip

Figure 6A:
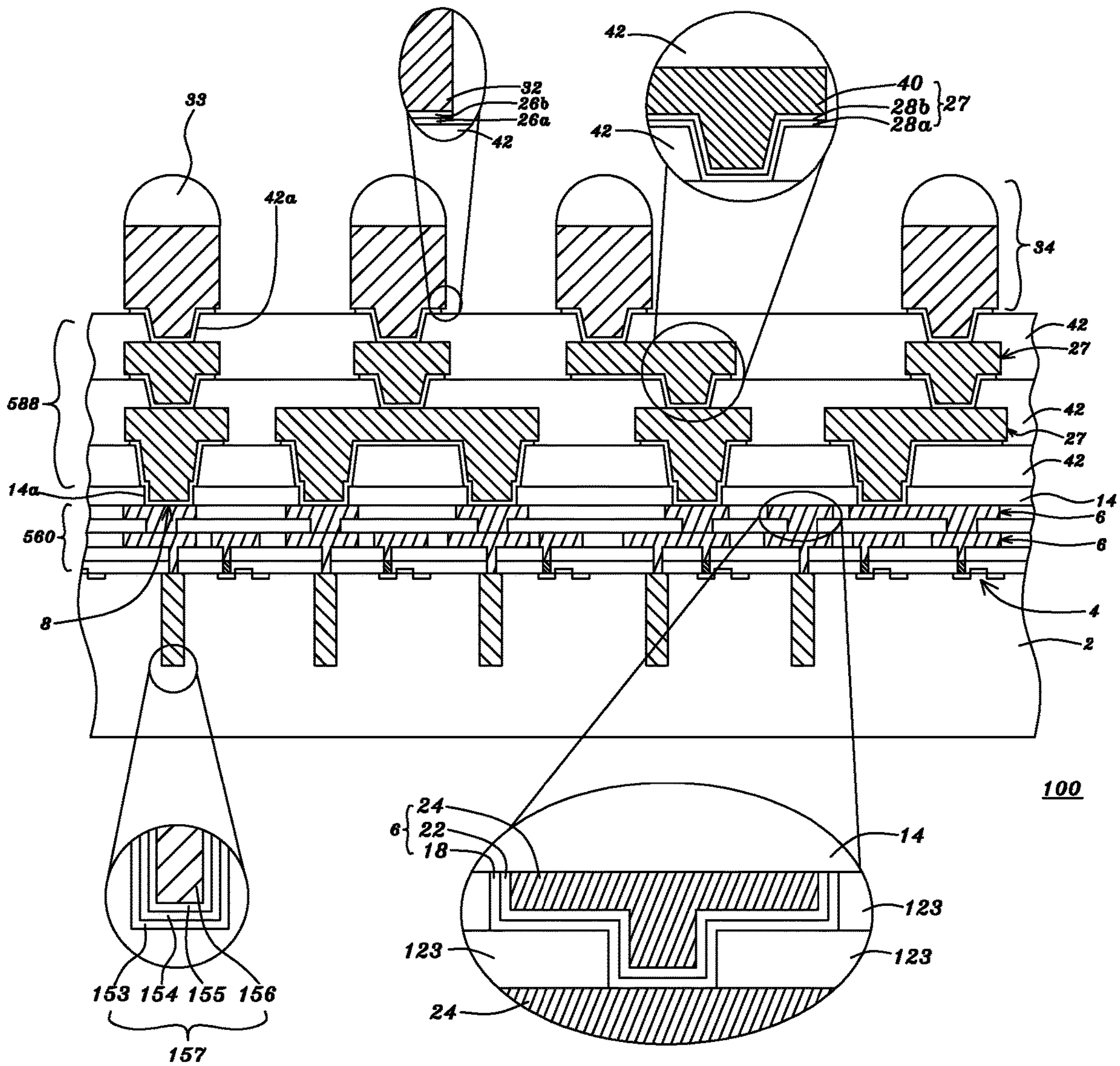
FIG. 6A is a schematically cross-sectional view showing a first type of semiconductor integrated-circuit (IC) chip in accordance with an embodiment of the present application.

FIG. 6A is a schematically cross-sectional view showing a first type of semiconductor integrated-circuit (IC) chip in accordance with an embodiment of the present application. Referring to FIG. 6A, a first type of semiconductor chip 100 may include (1) a semiconductor substrate 2, such as silicon substrate, (2) multiple semiconductor devices 4, such as transistors or passive devices, at an active surface of its semiconductor substrate 2, (3) multiple through silicon vias (TSVs) 157 each vertically extending through a blind hole in its semiconductor substrate 2, (3) a first interconnection scheme 560 on the semiconductor substrate 2, wherein its first interconnection scheme 560 may include multiple insulating dielectric layers 123 and multiple interconnection metal layers 6 each in neighboring two of the insulating dielectric layers 123, wherein each of the interconnection metal layers 6 of its first interconnection scheme 560 may have the same specification as that of the first interconnection scheme for an interconnection bridge (FISIB) 560 as illustrated in FIG. 5A and each of the insulating dielectric layers 123 of its first interconnection scheme 560 may have the same specification as that of the first interconnection scheme for an interconnection bridge (FISIB) 560 as illustrated in FIG. 5A, wherein each of its interconnection metal layers 6 may couple to one or more of its semiconductor devices 4 and one or more of its through silicon vias (TSVs) 157, wherein each of the interconnection metal layers 6 of its first interconnection scheme 560 is patterned with multiple metal pads, lines or traces 8 in an upper one of the neighboring two of the insulating dielectric layers 123 of its first interconnection scheme 560 and multiple metal vias 10 in a lower one of the neighboring two of the insulating dielectric layers 123 of its first interconnection scheme 560, wherein between each neighboring two of the interconnection metal layers 6 of its first interconnection scheme 560 is provided one of the insulating dielectric layers 123 of its first interconnection scheme 560, wherein an upper one of the interconnection metal layers 6 of its first interconnection scheme 560 may couple to a lower one of the interconnection metal layers 6 of its first interconnection scheme 560 through an opening in one of the insulating dielectric layers 123 of its first interconnection scheme 560 between the upper and lower ones of the interconnection metal layers 6 of its first interconnection scheme 560, (4) a passivation layer 14 on its first interconnection scheme 560, wherein the topmost one of the interconnection metal layers 6 of its first interconnection scheme 560 may have the metal pads 8 at bottoms of multiple openings 14*a* in the passivation layer 14, wherein its passivation layer 14 may have the same specification as the specification of the passivation layer 14 as illustrated in FIG. 1E, wherein multiple openings 14*a* in its passivation layer 14 may be vertically over the metal pads, lines or traces 8 of the topmost one of the interconnection metal layers 6 of its first interconnection scheme 560, wherein each of the openings 14*a* in its passivation layer 14 may have the same specification as that illustrated in FIG. 1E, (5) a second interconnection scheme 588 optionally provided over the passivation layer 14, wherein its second interconnection scheme 588 may include one or more interconnection metal layers 27 coupling to the metal pads 8 of the topmost one of the interconnection metal layers 6 of its first interconnection scheme 560 through the openings 14*a* in its passivation layer 14, and one or more polymer layers 42, i.e., insulating dielectric layers, each between neighboring two of the interconnection metal layers 27 of its second interconnection scheme 588, under a bottommost one of the interconnection metal layers 27 of its second interconnection scheme 588 or over a topmost one of the interconnection metal layers 27 of its second interconnection scheme 588, wherein an upper one of the interconnection metal layers 27 of its second interconnection scheme 588 may couple to a lower one of the interconnection metal layers 27 of its second interconnection scheme 588 through an opening in one of the polymer layers 42 of its second interconnection scheme 588 between the upper and lower ones of the interconnection metal layers 27 of its second interconnection scheme 588, wherein the topmost one of the interconnection metal layers 27 of its second interconnection scheme 588 may have multiple metal pads at bottoms of multiple openings 42*a* in the topmost one of the polymer layers 42 of its second interconnection scheme 588, wherein each of the interconnection metal layers 27 of its second interconnection scheme 588 may have the same specification as that of the second interconnection scheme for an interconnection bridge (SISIB) 588 as illustrated in FIG. 5C and each of the insulating dielectric layers 42 of its second interconnection scheme 588 may have the same specification as that of the second interconnection scheme for an interconnection bridge (SISIB) 588 as illustrated in FIG. 5C, and (6) multiple micro-bumps or micro-pads 34 on the metal pads of the topmost one of the interconnection metal layers 27 of its second interconnection scheme 588 at the bottoms of the openings 42*a* in the topmost one of the polymer layers 42 of its second interconnection scheme 588, or, in the case that its second interconnection scheme 588 is not provided, on the metal pads of the topmost one of the interconnection metal layers 6 of its first interconnection scheme 560 at the bottoms of the openings 14*a* in its passivation layer 14, wherein each of its micro-bumps or micro-pads 34 may be of one of the first through fourth types having the same specifications as the first through fourth types of micro-bumps or micro-pads 34 respectively as illustrated in FIG. 1E.

Referring to FIG. 6A, for the first type of semiconductor chip 100, each of its through silicon vias (TSVs) 157 may couple to one or more of its semiconductor devices 4 through one or more of the interconnection metal layers 6 of its first interconnection scheme 560. Each of its through silicon vias (TSVs) 157 may include (1) an insulating lining layer 153, such as a layer of thermally grown silicon oxide ($SiO_2$), a layer of CVD silicon nitride ($Si_3N_4$) or a combination thereof, on a sidewall and bottom of each of the blind holes in its semiconductor substrate 2, (2) a copper layer 156 electroplated in said each of the blind holes in its semiconductor substrate 2, (3) an adhesion layer 154, such as a layer of titanium (Ti) or titanium nitride (TiN) having a thickness between 1 nm to 50 nm, on the insulating lining layer 153, between the insulating lining layer 153 and copper layer 156 and at a sidewall and bottom of the copper layer 156, and (4) a seed layer 155, such as a layer of copper having a thickness between 3 nm and 200 nm, between the adhesion layer 154 and copper layer 156 and at a sidewall and bottom of the copper layer 156.

2. Second Type of Semiconductor Integrated-Circuit (IC) Chip

Figure 6B:
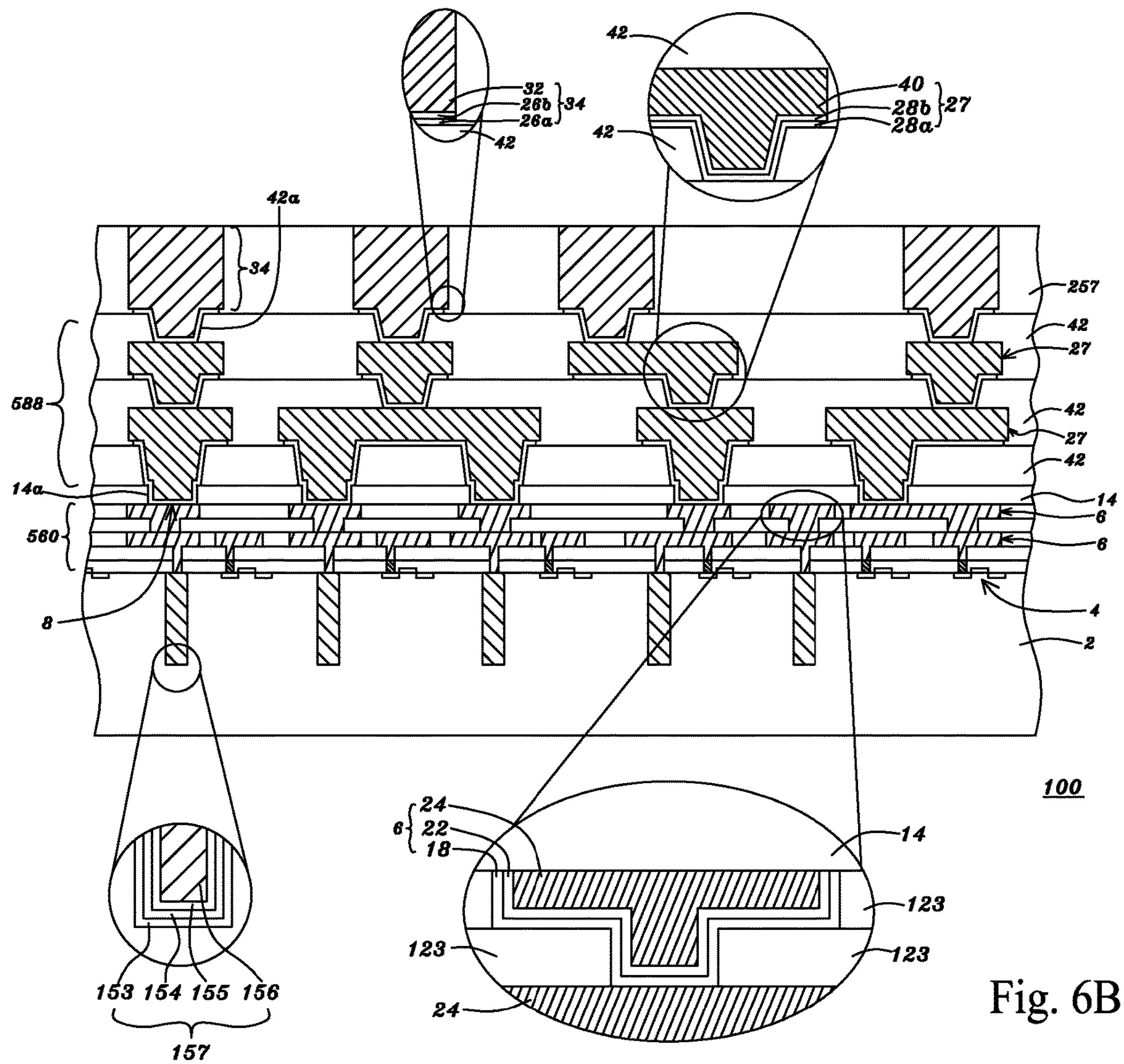
FIG. 6B is a schematically cross-sectional view showing a second type of semiconductor integrated-circuit (IC) chip in accordance with an embodiment of the present application.

FIG. 6B is a schematically cross-sectional view showing a second type of semiconductor integrated-circuit (IC) chip in accordance with an embodiment of the present application. Referring to FIG. 6B, a second type of semiconductor integrated-circuit (IC) chip 100 may have a similar structure to the first type of semiconductor integrated-circuit (IC) chip 100 illustrated in FIG. 6A. For an element indicated by the same reference number shown in FIGS. 6A and 6B, the specification of the element as seen in FIG. 6B may be referred to that of the element as illustrated in FIG. 6A. The difference between the first and second types of semiconductor integrated-circuit (IC) chips 100 is that the second type of semiconductor integrated-circuit (IC) chip 100 may further include an insulating dielectric layer 257, such as polymer layer, on the topmost one of the polymer layers 42 of its second interconnection scheme 588 or, in the case that its second interconnection scheme 588 is not formed, on its passivation layer 14. For the second type of semiconductor integrated-circuit (IC) chip 100, its micro-bumps or micro-pads 34 may be of the first type as illustrated in FIG. 1E, and its insulating dielectric layer 257 may cover a sidewall of the copper layer 32 of each of its micro-bumps or micro-pads 34, wherein its insulating dielectric layer 257 may have a top surface coplanar to a top surface of the copper layer 32 of each of its micro-bumps or micro-pads 34, wherein its insulating dielectric layer 257 may be, for example, polyimide, BenzoCycloButene (BCB), parylene, polybenzoxazole (PBO), epoxy-based material or compound, photo epoxy SU-8, elastomer, or silicone; its insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan.

3. Third Type of Semiconductor Integrated-Circuit (IC) Chip

Figure 6C:
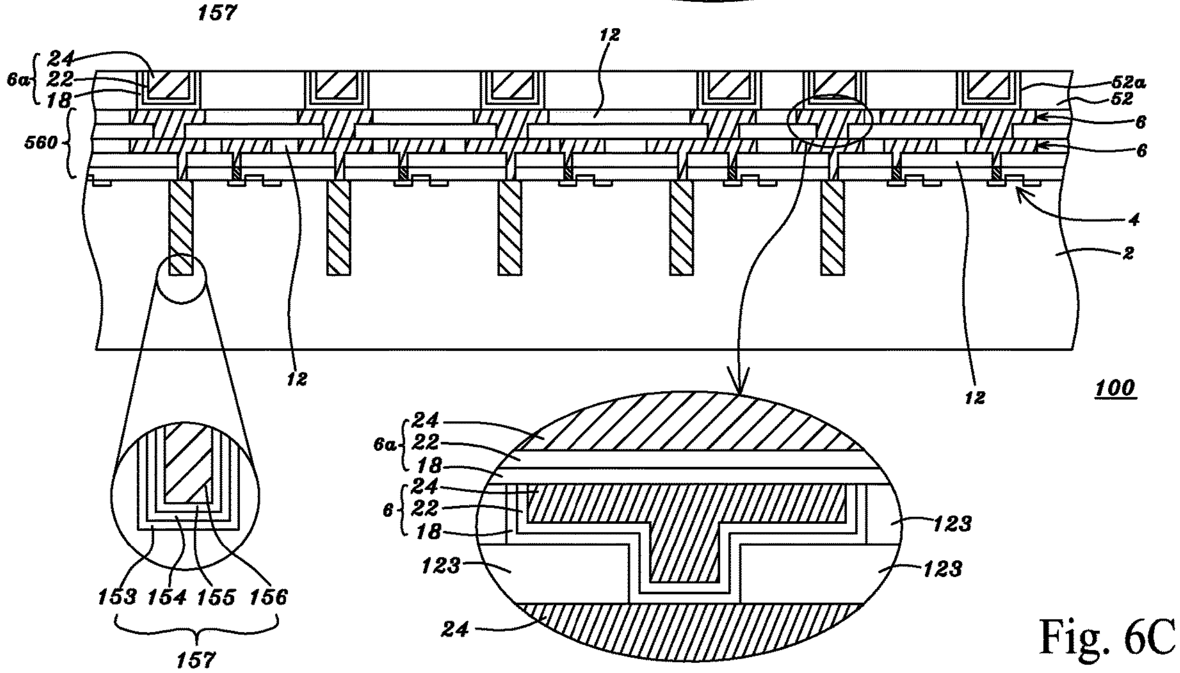
FIG. 6C is a schematically cross-sectional view showing a third type of semiconductor integrated-circuit (IC) chip in accordance with an embodiment of the present application.

FIG. 6C is a schematically cross-sectional view showing a third type of semiconductor integrated-circuit (IC) chip in accordance with an embodiment of the present application. Referring to FIG. 6C, a third type of semiconductor integrated-circuit (IC) chip 100 may have a similar structure to the first type of semiconductor integrated-circuit (IC) chip 100 illustrated in FIG. 6A. For an element indicated by the same reference number shown in FIGS. 6A and 6C, the specification of the element as seen in FIG. 6C may be referred to that of the element as illustrated in FIG. 6A. The difference between the first and third types of semiconductor integrated-circuit (IC) chips 100 is that the third type of semiconductor integrated-circuit (IC) chip 100 may be provided with (1) an insulating bonding layer 52 at its active side and on the topmost one of the insulating dielectric layers 123 of its first interconnection scheme 560 and (2) multiple metal pads 6*a* at its active side and in multiple openings 52*a* in its insulating bonding layer 52 and on the topmost one of the interconnection metal layers 6 of its first interconnection scheme 560, instead of the passivation layer 14, second interconnection scheme 588 and micro-bumps or micro-pads 34 as seen in FIG. 6A. For the third type of semiconductor integrated-circuit (IC) chip 100, its insulating bonding layer 52 may include a silicon-oxide layer having a thickness between 0.1 and 2 μm. Each of its metal pads 6*a* may include (1) a copper layer 24 having a thickness of between 3 nm and 500 nm in one of the openings 52*a* in its insulating bonding layer 52, (2) an adhesion layer 18, such as titanium or titanium nitride having a thickness of between 1 nm and 50 nm, at a bottom and sidewall of the copper layer 24 of said each of its metal pads 6*a*, and (3) a seed layer 22, such as copper, between the copper layer 24 and adhesion layer 18 of said each of its metal pads 6*a*, wherein the copper layer 24 of said each of its metal pads 6*a* may have a top surface substantially coplanar with a top surface of the silicon-oxide layer of its insulating bonding layer 52.

Specification for Memory Module or Unit

1. First Type of Memory Module or Unit

Figure 7A:
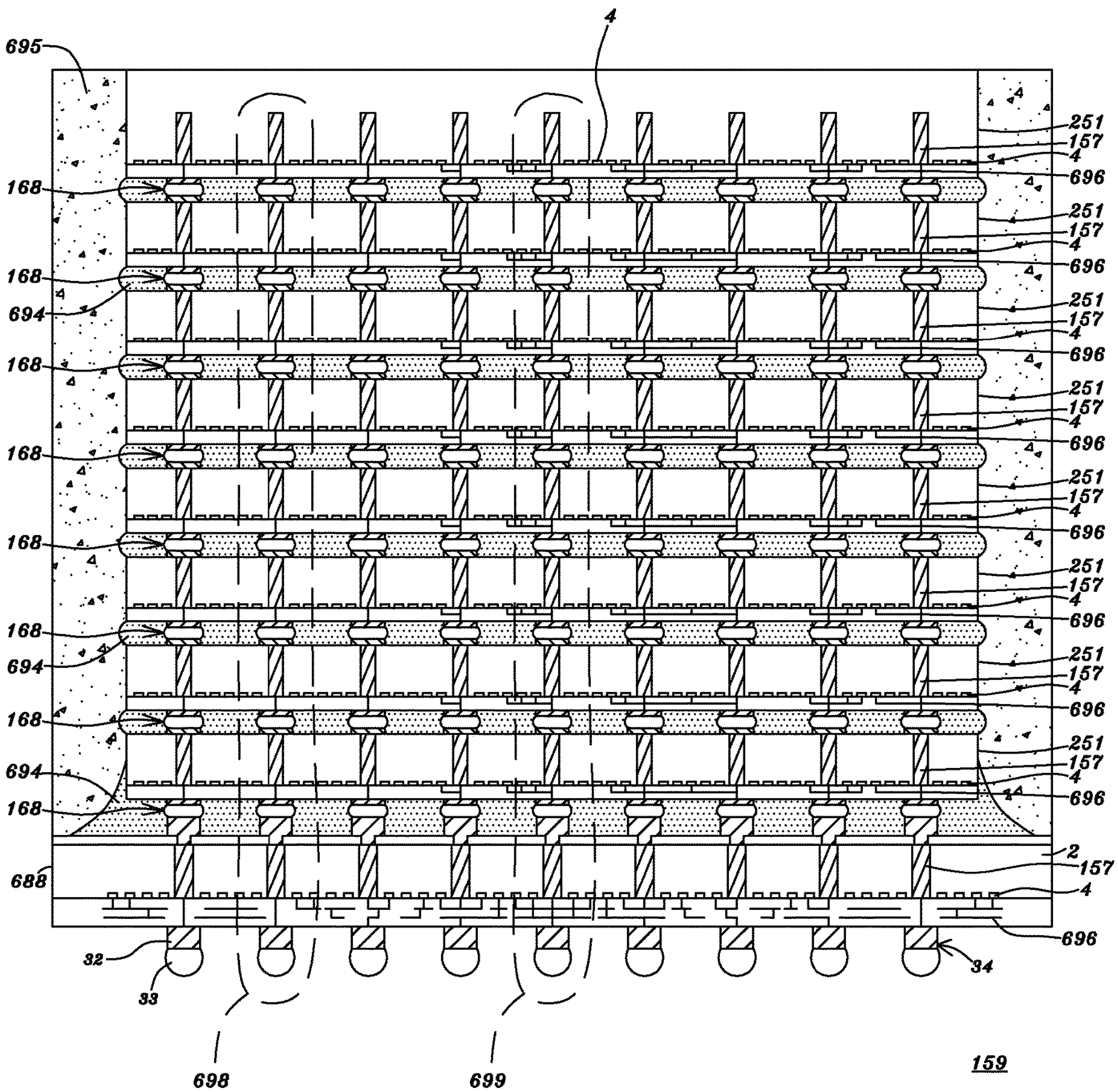
FIG. 7A is a schematically cross-sectional view showing a first type of memory module in accordance with an embodiment of the present application.

FIG. 7A is a schematically cross-sectional view showing a first type of memory module in accordance with an embodiment of the present application. Referring to FIG. 7A, a memory module 159 may include (1) multiple memory chips 251, such as volatile-memory (VM) integrated circuit (IC) chips for a VM module, dynamic-random-access-memory (DRAM) IC chips for a high-bitwidth memory (HBM) module, statistic-random-access-memory (SRAM) IC chips for a SRAM module, magnetoresistive random-access-memory (MRAM) IC chips for a MRAM module, resistive random-access-memory (RRAM) IC chips for a RRAM module, ferroelectric random-access-memory (FRAM) IC chips for a FRAM module or phase change random access memory (PCM) IC chips for a PCM module, vertically stacked together, wherein the number of its memory chips 251 may have the number equal to or greater than 2, 4, 8, 16, 32, (2) a control chip 688, i.e., ASIC or logic chip, under its memory chips 251 stacked thereover, and (3) multiple bonded metal bumps or contacts 168 between neighboring two of its memory chips 251 and between the bottommost one of its memory chips 251 and its control chip 688.

Referring to FIG. 7A, each of the memory chips 251 and control chip 688 may be provided with the same specification as the first type of semiconductor integrated-circuit (IC) chip 100 illustrated in FIG. 6A and turned upside down. For an element indicated by the same reference number shown in FIGS. 6B and 7A, the specification of the element as seen in FIG. 7A may be referred to that of the element as illustrated in FIG. 6B. Referring to FIGS. 6B and 7A, for each of the memory chips 251 and control chip 688 of the first type of memory module 159, its semiconductor substrate 2 may be ground or polished from a top surface thereof at its backside, other than the topmost one of the memory chips 251, to have a top surface of the copper layer 156 of each of its through silicon vias (TSVs) 157 exposed at its backside, wherein the top surface of the copper layer 156 of each of its through silicon vias (TSVs) 157 may be coplanar to the top surface of its semiconductor substrate 2, and each of its through silicon vias (TSVs) 157 may be aligned with one of its micro-bumps or micro-pads 34.

Figure 8B:
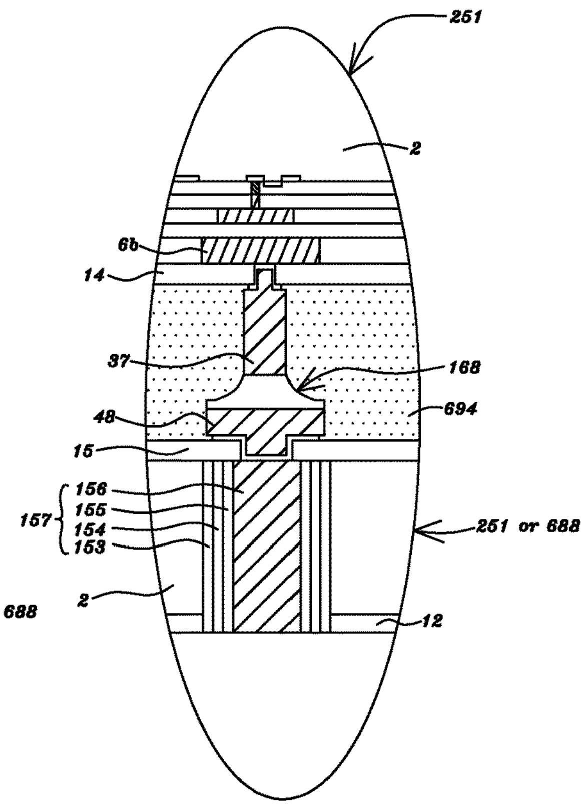

FIGS. 8A and 8B are schematically cross-sectional views showing a process of bonding a thermal compression bump to a thermal compression pad in accordance with an embodiment of the present application. Referring to FIGS. 6B, 7A, 8A and 8B, each of upper ones of the memory chips 251 may be bonded to a lower one of the memory chips 251 or to the control chip 688. Each of the lower ones of the memory chips 251 and the control chip 688 may be formed with (1) a passivation layer 15 on the top surface of its semiconductor substrate 2 at its backside as seen in FIGS. 8A and 8B, wherein each opening 15*a* in its passivation layer 15 may be aligned with the top surface of the copper layer 156 of one of its through silicon vias (TSVs) 157 and its passivation layer 15 may have the same specification as the passivation layer 14 as illustrated in FIG. 1E, and (2) multiple micro-bumps or micro-pads 570 each on the top surface of the copper layer 156 of one of its through silicon vias (TSVs) 157, wherein each of its micro-bumps or micro-pads 570 may be of one of the first through fourth types having the same specifications as the first through fourth types of micro-bumps or micro-pads 34 as illustrated in FIG. 1E respectively, having the adhesion layer 26*a* formed on the top surface of the copper layer 156 of one of its through silicon vias (TSVs) 157.

For a first case, referring to FIGS. 7A, 8A and 8B, an upper one of the memory chips 251 may have the third type of micro-bumps or micro-pads 34 to be bonded to the fourth type of micro-bumps or micro-pads 570 of a lower one of the memory chips 251 or the control chip 688. For example, the third type of micro-bumps or micro-pads 34 of the upper one of the memory chips 251 may have the solder caps 38 to be thermally compressed, at a temperature between 240 and 300 degrees Celsius, at a pressure between 0.3 and 3 MPa and for a time period between 3 and 15 seconds, onto the metal caps 49 of the fourth type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. A force applied to the upper one of the memory chips 251 in the thermal compression process may be substantially equal to the pressure times a contact area between one of the third type of micro-bumps or micro-pads 34 and one of the fourth type of micro-bumps or micro-pads 570 times the total number of the third type of micro-bumps or micro-pads 34 of the upper one of the memory chips 251. Each of the third type of micro-bumps or micro-pads 34 of the upper one of the memory chips 251 may have the copper layer 37 having the thickness t3 greater than the thickness t2 of the copper layer 48 of each of the fourth type of micro-bumps or micro-pads 570 of the lower one of the memory chips 251 or the control chip 688 and having the largest transverse dimension w3 equal to between 0.7 and 0.1 times of the largest transverse dimension w2 of the copper layer 48 of each of the fourth type of micro-bumps or micro-pads 570 of the lower one of the memory chips 251 or the control chip 688. Alternatively, each of the third type of micro-bumps or micro-pads 34 may be provided with the copper layer 37 having a cross-sectional area equal to between 0.5 and 0.01 times of the cross-sectional area of the copper layer 48 of each of the fourth type of micro-bumps or micro-pads 570 of the lower one of the memory chips 251 or the control chip 688. For example, for the upper one of the memory chips 251, its third type of micro-bumps or micro-pads 34 may be formed respectively on a front surface of the metal pads 6*b* provided by the frontmost one of the interconnection metal layers 27 of its second interconnection scheme 588 or by, if the second interconnection scheme 588 is not provided, the frontmost one of the interconnection metal layers 6 of its first interconnection scheme 560, wherein each of the metal pads 6*b* may have a thickness t1 between 1 and 10 micrometers or between 2 and 10 micrometers and a largest transverse dimension w1, such as diameter in a circular shape, between 1 μm and 25 μm and each of its third type of micro-bumps or micro-pads 34 may be provided with the copper layer 37 having the thickness t3 greater than the thickness t1 of its metal pads 6*b* and having the largest transverse dimension w3 equal to between 0.7 and 0.1 times of the largest transverse dimension w1 of its metal pads 6*b*; alternatively, each of its third type of micro-bumps or micro-pads 34 may be provided with the copper layer 37 having a cross-sectional area equal to between 0.5 and 0.01 times of the cross-sectional area of its metal pads 6*b*. A bonded solder between the copper layers 37 and 48 of each of the bonded metal bumps or contacts 168 may be mostly kept on a top surface of the copper layer 48 of one of the fourth type of micro-bumps or micro-pads 570 of the lower one of the memory chips 251 or the control chip 688 and extends out of the edge of the copper layer 48 of said one of the fourth type of micro-bumps or micro-pads 570 of the lower one of the memory chips 251 or the control chip 688 less than 0.5 micrometers. Thus, a short between neighboring two of the bonded metal bumps or contacts 168 even in a fine-pitched fashion may be avoided.

Alternatively, for a second case, referring to FIG. 7A, an upper one of the memory chips 251 may have the second type of micro-bumps or micro-pads 34 to be bonded to the first type of micro-bumps or micro-pads 570 of a lower one of the memory chips 251 or the control chip 688. For example, the second type of micro-bumps or micro-pads 34 of the upper one of the memory chips 251 may have the solder caps 33 to be bonded onto the copper layer 32 of the first type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the second type of micro-bumps or micro-pads 34 of the upper one of the memory chips 251 may have the copper layer 32 having a thickness greater than that of the copper layer 32 of each of the first type of micro-bumps or micro-pads 570 of the lower one of the memory chips 251 or the control chip 688.

Alternatively, for a third case, referring to FIG. 7A, an upper one of the memory chips 251 may have the first type of micro-bumps or micro-pads 34 to be bonded to the second type of micro-bumps or micro-pads 570 of a lower one of the memory chips 251 or the control chip 688. For example, the first type of micro-bumps or micro-pads 34 of the upper one of the memory chips 251 may have the electroplated metal layer 32, e.g. copper layer, to be bonded onto the solder caps 33 of the second type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the first type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251 or the control chip 688.

Alternatively, for a fourth case, referring to FIG. 7A, an upper one of the memory chips 251 may have the second type of micro-bumps or micro-pads 34 to be bonded to the second type of micro-bumps or micro-pads 570 of a lower one of the memory chips 251 or the control chip 688. For example, the second type of micro-bumps or micro-pads 34 of the upper one of the memory chips 251 may have the solder caps 33 to be bonded onto the solder caps 33 of the second type of micro-bumps or micro-pads 570 of the lower one of the memory chips 251 or the control chip 688 into multiple bonded metal bumps or contacts 168 between the upper and lower ones of the memory chips 251 or between the upper one of the memory chips 251 and the control chip 688. Each of the second type of micro-bumps or micro-pads 34 of the upper one of the memory chips 251 may have the copper layer 32 having a thickness greater than that of the copper layer 32 of each of the second type of micro-bumps or micro-pads 570 of the lower one of the memory chips 251 or the control chip 688.

Referring to FIG. 7A, each of the through silicon vias (TSVs) 157 of each of the memory chips 251 and control chip 688, other than the topmost one of the memory chips 251, may be aligned with and connected to one of the bonded metal bumps or contacts 168 at the backside thereof. The through silicon vias (TSVs) 157 of the memory chips 251, which are aligned in a vertical direction, may couple to each other or one another through the bonded metal bumps or contacts 168 therebetween aligned with the through silicon vias (TSVs) 157 thereof in the vertical direction. Each of the memory chips 251 and control chip 688 may include multiple interconnects 696 each provided by the interconnection metal layers 6 of its first interconnection scheme 560 and/or the interconnection metal layers 27 of its second interconnection scheme 588 to connect one or more of its through silicon vias (TSVs) 157 to one or more of the bonded metal bumps or contacts 168 at its bottom surface. An underfill 694, e.g., polymer layer, may be provided between each neighboring two of the memory chips 251 to enclose the bonded metal bumps or contacts 168 therebetween and between the bottommost one of the memory chips 251 and the control chip 688 to enclose the bonded metal bumps or contacts 168 therebetween. A molding compound 695, e.g. a polymer, may be formed around the memory chips 251 and over the control chip 688, wherein the topmost one of the memory chips 251 may have a top surface coplanar with a top surface of the molding compound 695.

Referring to FIG. 7A, for the first type of memory module 159, each of its memory chips 251 may have a data bit-width, equal to or greater than 64, 128, 256, 512, 1024, 2048, 4096, 8K, or 16K, with external circuits of the first type of memory module 159 via the micro-bumps or micro-pads 34 of its control chip 688.

The first type of memory module 159 may include multiple vertical interconnects 699 each composed of one of the through silicon vias (TSVs) 157 of each of the memory chips 251 and control chip 688 of the first type of memory module 159, wherein the through silicon vias (TSVs) 157 for each of the vertical interconnects 699 of the first type of memory module 159 may be aligned with each other or one another and connected to one or more transistors of the semiconductor devices 4 of each of the memory chips 251 and control chip 688 of the first type of memory module 159. The first type of memory module 159 may further include multiple dedicated vertical bypasses 698 each composed of one of the through silicon vias (TSVs) 157 of each of the memory chips 251 and control chip 688 of the first type of memory module 159, wherein the through silicon vias (TSVs) 157 for each of the dedicated vertical bypasses 698 of the first type of memory module 159 may be aligned with each other or one another but not connected to any transistor of each of the memory chips 251 and control chip 688 of the first type of memory module 159. Each of the memory chips 251 and control chip 688 may be provided with one or more small I/O circuits, each having driving capability, loading, output capacitance or input capacitance between 0.05 pF and 2 pF, or 0.05 pF and 1 pF, or smaller than 2 pF or 1 pF, coupling to one of the vertical interconnects 699 of the first type of memory module 159; alternatively each of the small input/output (I/O) circuits may have an I/O power efficiency smaller than 0.5 pico-Joules per bit, per switch or per voltage swing, or between 0.01 and 0.5 pico-Joules per bit, per switch or per voltage swing, coupling to one of the vertical interconnects 699 of the first type of memory module 159.

Figure 7B:
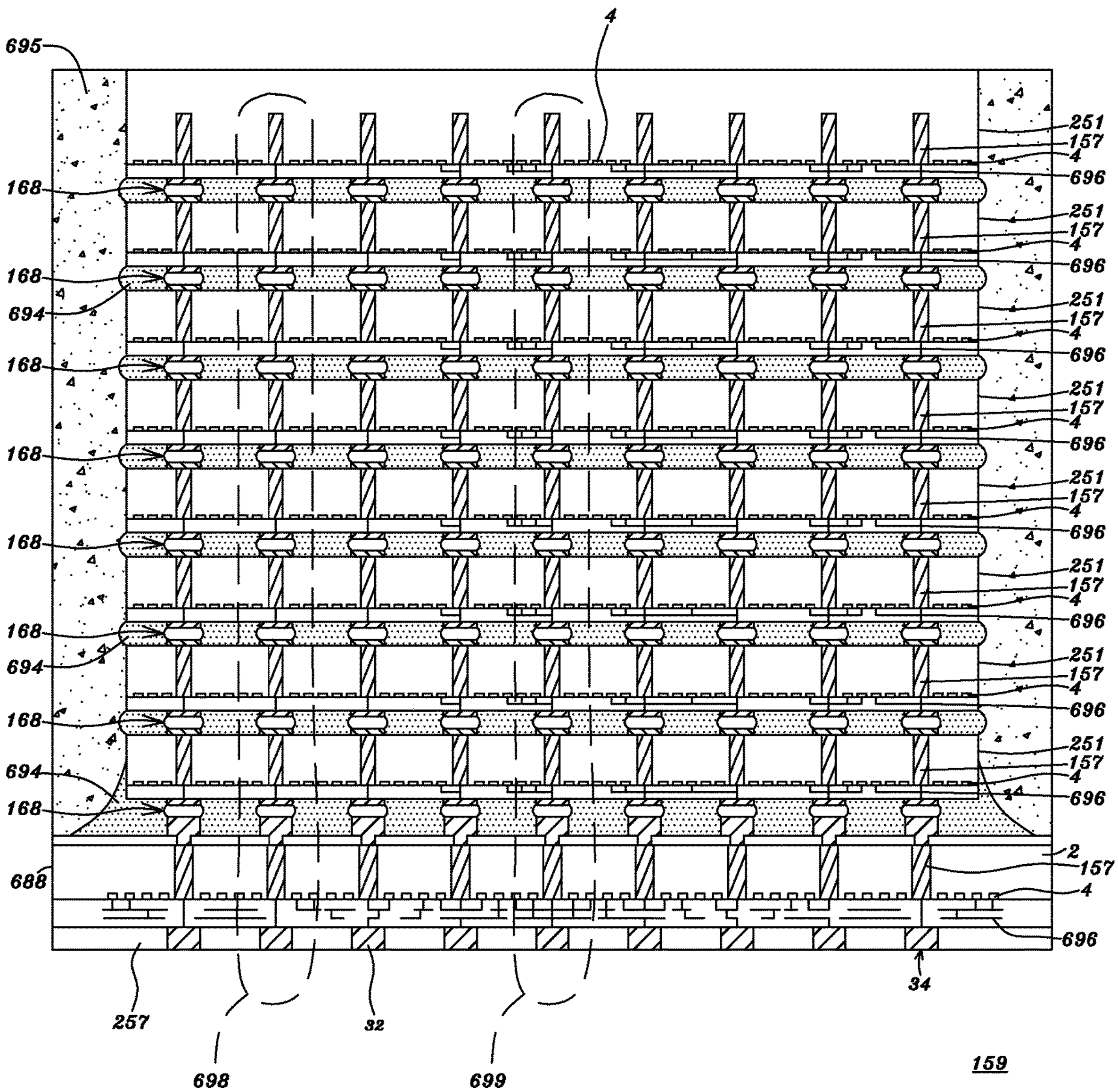
FIG. 7B is a schematically cross-sectional view showing a second type of memory module in accordance with an embodiment of the present application.

Referring to FIG. 7A, the control chip 688 may be configured to control data access to the memory chips 251. The control chip 688 may be used for buffering and controlling the memory chips 251. Each of the through silicon vias (TSVs) 157 of the control chip 688 may be aligned with and connected to one of the micro-bumps or micro-pads 34 of the control chip 688 at the bottom surface thereof 2. Second Type of Memory Module or Unit FIG. 7B is a schematically cross-sectional view showing a second type of memory module in accordance with an embodiment of the present application. Referring to FIG. 7B, a second type of memory module 159 may have a similar structure to the first type of memory module 159 as illustrated in FIG. 7A. For an element indicated by the same reference number shown in FIGS. 7A and 7B, the specification of the element as seen in FIG. 7B may be referred to that of the element as illustrated in FIG. 7A. The difference between the first and second types of memory modules 159 is mentioned as below: for the second type of memory module 159, its control chip may further include an insulating dielectric layer 257, such as polymer layer, on the bottommost one of the polymer layers 42 of the second interconnection scheme 588 of its control chip 688 or, in the case that the second interconnection scheme 588 of its control chip 688 is not formed, on and under the passivation layer 14 of its control chip 688. The micro-bumps or micro-pads 34 of its control chip 688 may be of the first type as illustrated in FIG. 1E, and the insulating dielectric layer 257 of its control chip 688 may cover a sidewall of the copper layer 32 of each of the micro-bumps or micro-pads 34 of its control chip 688, wherein the insulating dielectric layer 257 of its control chip 688 may have a bottom surface coplanar to a bottom surface of the copper layer 32 of each of the micro-bumps or micro-pads 34 of its control chip 688. The insulating dielectric layer 257 of its control chip 688 may have the same specification as the insulating dielectric layer 257 of the second type of semiconductor integrated-circuit (IC) chip 100 illustrated in FIG. 6B.

3. Third Type of Memory Module or Unit

Figure 7C:
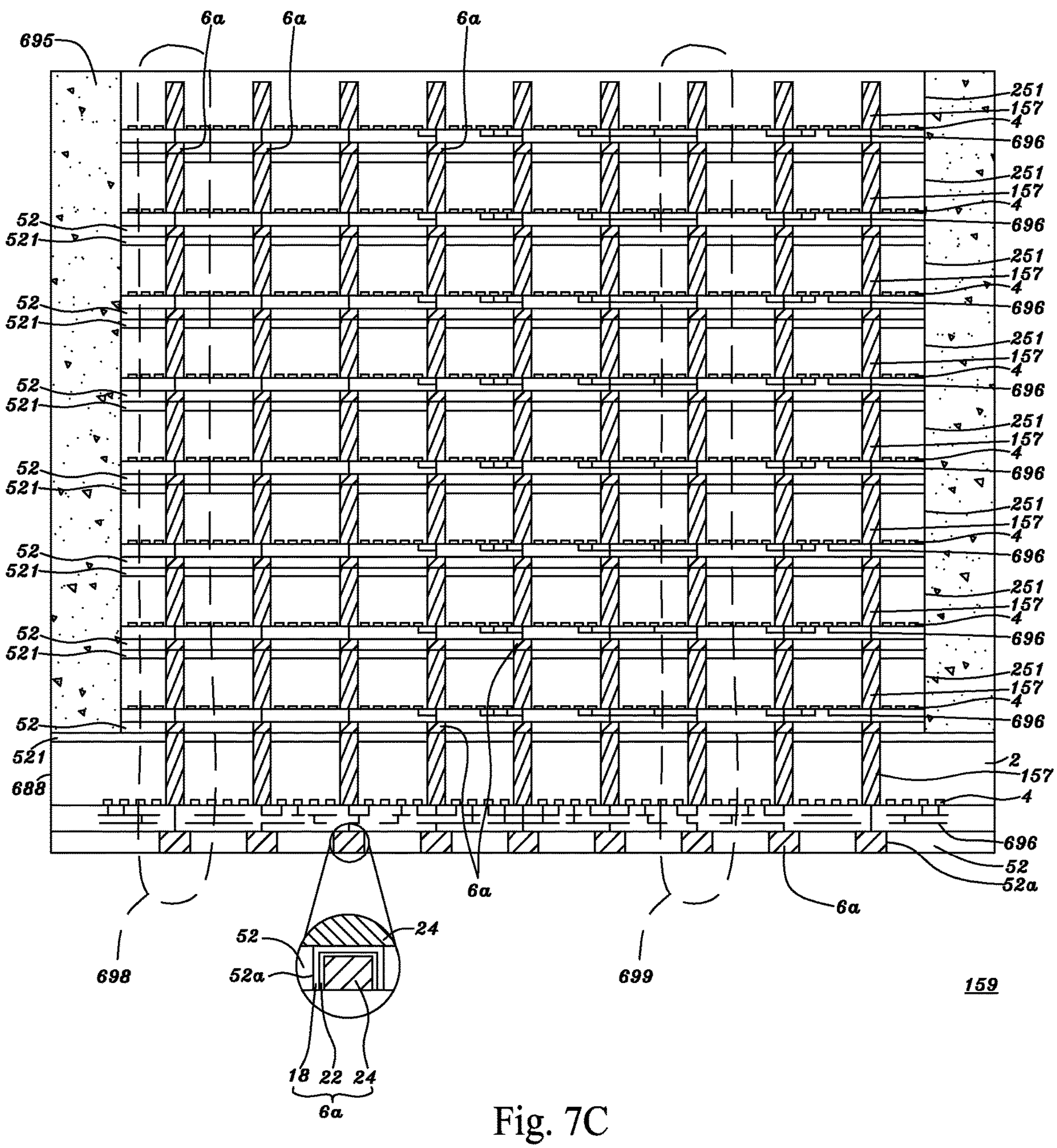
FIG. 7C is a schematically cross-sectional view showing a third type of memory module in accordance with an embodiment of the present application.
Figure 8C:
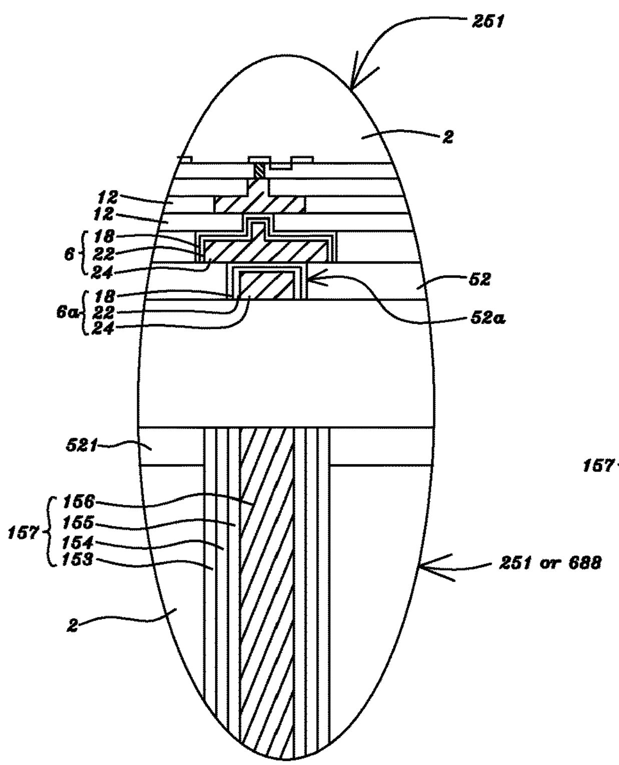
FIGS. 8C and 8D are schematically cross-sectional views showing a direct bonding process in accordance with an embodiment of the present application.
Figure 8D:
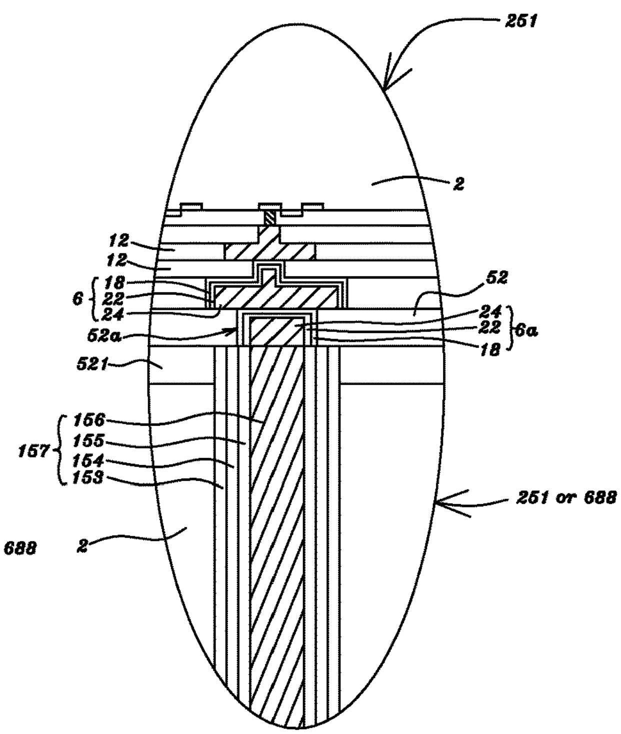

FIG. 7C is a schematically cross-sectional view showing a third type of memory module in accordance with an embodiment of the present application. Referring to FIG. 7C, a third type of memory module 159 may have a similar structure to the first type of memory module 159 illustrated in FIG. 7A. For an element indicated by the same reference number shown in FIGS. 7A and 7C, the specification of the element as seen in FIG. 7C may be referred to that of the element as illustrated in FIG. 7A. The difference between the first and third types of memory modules 159 is that a direct bonding process may be performed for the third type of memory module 159 as seen in FIG. 7C. FIGS. 8C and 8D are schematically cross-sectional views showing a direct bonding process in accordance with an embodiment of the present application. Referring to FIG. 7C, each of the memory chips 251 and control chip 688 may have the same specification as the third type of semiconductor integrated-circuit (IC) chip 100 illustrated in FIG. 6C and turned upside down. For an element indicated by the same reference number shown in FIGS. 6C and 7C, the specification of the element as seen in FIG. 7C may be referred to that of the element as illustrated in FIG. 6C. Referring to FIGS. 6C and 7C, for each of the memory chips 251 and control chip 688 of the third type of memory module 159, its semiconductor substrate 2 may be ground or polished from a top surface thereof at its backside, other than the topmost one of the memory chips 251, to have a top surface of the copper layer 156 of each of its through silicon vias (TSVs) 157 exposed at its backside, wherein the top surface of the copper layer 156 of each of its through silicon vias (TSVs) 157 may be coplanar to the top surface of its semiconductor substrate 2, and each of its through silicon vias (TSVs) 157 may be aligned with one of its metal pads 6*a*.

Referring to FIGS. 6C, 7C, 8C and 8D, each of upper ones of the memory chips 251 may be bonded to a lower one of the memory chips 251 or to the control chip 688. Each of the lower ones of the memory chips 251 and the control chip 688 may be formed with an insulating bonding layer 521 on the top surface of its semiconductor substrate 2 at its backside as seen in FIGS. 8C and 8D, wherein its insulating bonding layer 521 may include a silicon-oxide layer having a thickness between 0.1 and 2 μm, wherein its insulating bonding layer 521 may have a top surface coplanar to the top surface of the copper layer 156 of each of its through silicon vias (TSVs) 157.

Referring to FIGS. 7C, 8C and 8D, an upper one of the memory chips 251 may join a lower one of the memory chips 251 or the control chip 688 by (1) activating a joining surface, i.e., silicon oxide, of the insulating bonding layer 52 at the active side of the upper one of the memory chips 251 and a joining surface, i.e., silicon oxide, of the insulating bonding layer 521 at the backside of the lower one of the memory chips 251 or the control chip 688 with nitrogen plasma for increasing hydrophilic property thereof, (2) next rinsing the joining surface of the insulating bonding layer 52 at the active side of the upper one of the memory chips 251 and the joining surface of the insulating bonding layer 521 at the backside of the lower one of the memory chips 251 or the control chip 688 with deionized water for water adsorption and cleaning, (3) next placing the upper one of the memory chips 251 onto the lower one of the memory chips 251 or the control chip 688 with each of the metal pads 6*a* at the active side of the upper one of the memory chips 251 in contact with one of the through silicon vias (TSVs) 157 of the lower one of the memory chips 251 and control chip 688 and with the joining surface of the insulating bonding layer 52 at the active side of the upper one of the memory chips 251 in contact with the joining surface of the insulating bonding layer 521 at the backside of the lower one of the memory chips 251 or the control chip 688, and (4) next performing a direct bonding process including (a) oxide-to-oxide bonding at a temperature between 100 and 200 degrees Celsius and for a time period between 5 and 20 minutes to bond the joining surface of the insulating bonding layer 52 at the active side of the upper one of the memory chips 251 to the joining surface of the insulating bonding layer 521 at the backside of the lower one of the memory chips 251 or the control chip 688 and (b) copper-to-copper bonding at a temperature between 300 and 350 degrees Celsius and for a time period between 10 and 60 minutes to bond the copper layer 24 of each of the metal pads 6*a* at the active side of the upper one of the memory chips 251 to the copper layer 156 of one of the through silicon vias (TSVs) 157 of the lower one of the memory chips 251 or the control chip 688, wherein the oxide-to-oxide bonding may be caused by water desorption from reaction between the joining surface of the insulating bonding layer 52 at the active side of the upper one of the memory chips 251 and the joining surface of the insulating bonding layer 521 at the backside of the lower one of the memory chips 251 or the control chip 688, and the copper-to-copper bonding may be caused by metal inter-diffusion between the copper layer 24 of the metal pads 6*a* at the active side of the upper one of the memory chips 251 and the copper layer 156 of the through silicon vias (TSVs) 157 of the lower one of the memory chips 251 or the control chip 688.

Specification for Chip-On-Chip (COC) Package for Sub-System Module or Unit

1. First Type of Sub-System Module or Unit

Figure 9A:
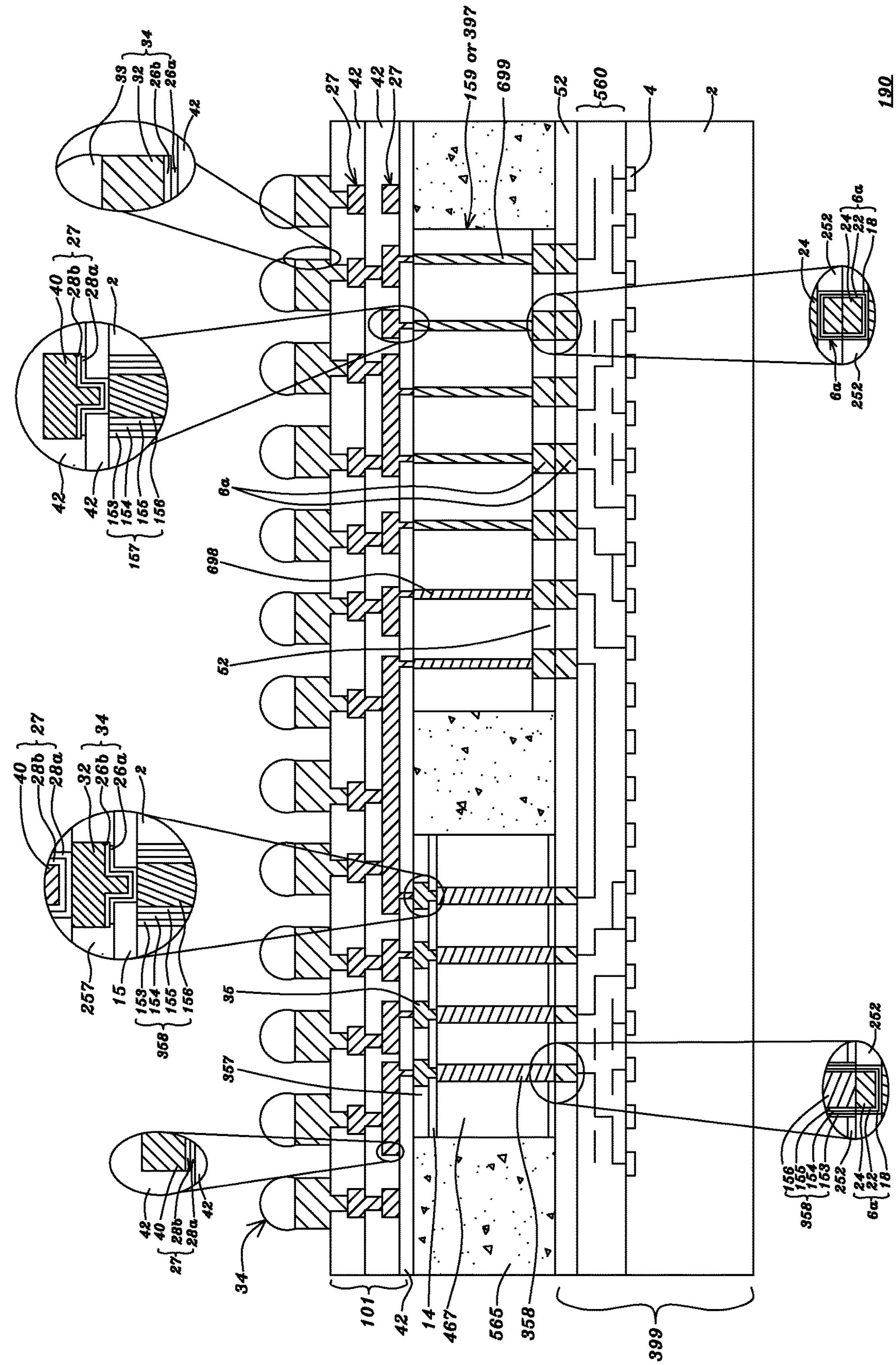
FIG. 9A is a schematically cross-sectional view showing a first type of sub-system module in accordance with an embodiment of the present application.

FIG. 9A is a schematically cross-sectional view showing a first type of sub-system module in accordance with an embodiment of the present application. Referring to FIG. 9A, a first type of sub-system module 190 may include an application specific integrated-circuit (ASIC) chip 399 having the same specification as the third type of semiconductor integrated-circuit (IC) chip 100 illustrated in FIG. 6C, wherein the application specific integrated-circuit (ASIC) chip 399 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example.

Referring to FIG. 9A, the first type of sub-system module 190 may include a memory module 159 having the same specification as the third type of memory module 159 illustrated in FIG. 7C to be bonded to its application specific integrated-circuit (ASIC) chip 399 using an oxide-to-oxide and metal-to-metal direct bonding method. The oxide-to-oxide and metal-to-metal direct bonding method may include (1) oxide-to-oxide bonding the insulating bonding layer 52 of its memory module 159 to the insulating bonding layer 52 of its application specific integrated-circuit (ASIC) chip 399, and (2) metal-to-metal bonding, e.g., copper-to-copper bonding, the metal pads 6*a*, such as copper pads, of its memory module 159 to the metal pads 6*a*, such as copper pads, of its application specific integrated-circuit (ASIC) chip 399. The control chip 688 of its memory module 159 may have the semiconductor devices 4 such as transistors at the active surface of the semiconductor substrate 2 thereof as illustrated in FIG. 7C, and the active surface of the semiconductor substrate 2 of the control chip 688 of its memory module 159 may face an active surface of the semiconductor substrate 2 of its application specific integrated-circuit (ASIC) logic chip 399, wherein its application specific integrated-circuit (ASIC) logic chip 399 may have the semiconductor devices 4 such as transistors at the active surface of the semiconductor substrate 2 thereof as illustrated in FIG. 6C. Alternatively, its memory module 159 may be replaced with a known-good memory or application-specific-integrated-circuit (ASIC) chip 397, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip, cryptography or security integrated-circuit (IC) chip, innovated ASIC or customer-owned-tooling (COT) integrated-circuit (IC) chip or power-management integrated-circuit (IC) chip. For the first type of sub-system module 190, its known-good memory or application-specific-integrated-circuit (ASIC) chip 397 in case of replacing its memory module 159 may have the same specification as the third type of semiconductor integrated-circuit (IC) chip 100 illustrated in FIG. 6C, and may be bonded to its application specific integrated-circuit (ASIC) chip 399 using an oxide-to-oxide and metal-to-metal direct bonding method. The oxide-to-oxide and metal-to-metal direct bonding method may include (1) oxide-to-oxide bonding the insulating bonding layer 52 at the active side of its known-good memory or application-specific-integrated-circuit (ASIC) chip 397 to the insulating bonding layer 52 of its application specific integrated-circuit (ASIC) chip 399, and (2) metal-to-metal bonding, e.g., copper-to-copper bonding, the metal pads 6*a*, such as copper pads, at the active side of its known-good memory or application-specific-integrated-circuit (ASIC) chip 397 to the metal pads 6*a*, such as copper pads, of its application specific integrated-circuit (ASIC) chip 399. For the first type of sub-system module 190, its known-good memory or ASIC chip 397 in case of replacing its memory module 159 may have the semiconductor devices 4 such as transistors at the active surface of the semiconductor substrate 2 thereof as illustrated in FIG. 6C, and the active surface of the semiconductor substrate 2 of its known-good memory or ASIC chip 397 may face an active surface of the semiconductor substrate 2 of its application specific integrated-circuit (ASIC) logic chip 399, wherein its application specific integrated-circuit (ASIC) logic chip 399 may have the semiconductor devices 4 such as transistors at the active surface of the semiconductor substrate 2 thereof as illustrated in FIG. 6C. For the first type of sub-system module 190, its known-good memory or ASIC chip 397 may be used as the auxiliary and cooperating (AC) integrated-circuit (IC) chip for supporting and co-working with its application specific integrated-circuit (ASIC) logic chip 399.

Alternatively, for the first type of sub-system module 190, its memory module 159 may have the same specification as the first type of memory module 159 illustrated in FIG. 7A, its known-good memory or ASIC chip 397 in case of replacing its memory module 159 may have the same specification as the first type of semiconductor integrated-circuit chip 100 illustrated in FIG. 6A and its application specific integrated-circuit (ASIC) chip 399 may have the same specification as the first type of semiconductor integrated-circuit (IC) chip as illustrated in FIG. 6A, wherein its memory module 159, or known-good memory or ASIC chip 397 in case of replacing its memory module 159, may be provided with the first, second, third or fourth type of micro-bumps or micro-pads 34 each bonded to one of the first, second, third or fourth type of micro-bumps or micro-pads 34 of its application specific integrated-circuit (ASIC) chip 399 to form a bonded metal bump or contact 168 therebetween by a step for one of the first through fourth cases as illustrated in FIGS. 7A, 8A and 8B in which its memory module 159, or known-good memory or ASIC chip 397 in case of replacing its memory module 159, may be considered as the upper one of the memory chips 251 of the memory module 159 illustrated in FIGS. 7A, 8A and 8B, and its application specific integrated-circuit (ASIC) chip 399 may be considered as the lower one of the memory chips 251 or the control chip 688 of the memory module 159 illustrated in FIGS. 7A, 8A and 8B. In this case, the first type of sub-system module 190 may further include an underfill, e.g., polymer layer, between its memory module 159, or known-good memory or ASIC chip 397 in case of replacing its memory module 159, and application specific integrated-circuit (ASIC) chip 399, covering a sidewall of each of its bonded metal bumps or contacts 168 between its memory module 159, or known-good memory or ASIC chip 397 in case of replacing its memory module 159, and application specific integrated-circuit (ASIC) chip 399.

Referring to FIG. 9A, the first type of sub-system module 190 may include a vertical-through-via (VTV) connector 467 having the same specification as the sixth type of vertical-through-via (VTV) connector 467 illustrated in FIG. 1R provided with the insulating bonding layer 252 bonded to the insulating bonding layer 52 of its application specific integrated-circuit (ASIC) chip 399 by oxide-to-oxide bonding and the vertical through vias (VTVs) 358 bonded to the metal pads 6*a* of its application specific integrated-circuit (ASIC) chip 399 by metal-to-metal bonding, e.g., copper-to-copper bonding.

Referring to FIG. 9A, the first type of sub-system module 190 may include a polymer layer 565, e.g., resin or compound, on the insulating bonding layer 52 of its application specific integrated-circuit (ASIC) chip 399, wherein its polymer layer 565 has a portion between its memory module 159, or its known-good memory or ASIC chip 397 in case of replacing its memory module 159, and its vertical-through-via (VTV) connector 467, and its polymer layer 565 has a top surface coplanar to a top surface of its memory module 159, or a top surface of its known-good memory or ASIC chip 397 in case of replacing its memory module 159, and a top surface of its vertical-through-via (VTV) connector 467. Its polymer layer 565 may be, for example, polyimide, BenzoCycloButene (BCB), parylene, polybenzoxazole (PBO), epoxy-based material or compound, photo epoxy SU-8, elastomer, silicon organic glass (SOG) or silicone. For more elaboration, its polymer layer 565 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Referring to FIG. 9A, for the first type of sub-system module 190, its memory module 159, or its known-good memory or ASIC chip 397 in case of replacing its memory module 159, may be ground or polished from the backside thereof such that the insulating lining layer 153, adhesion layer 154 and seed layer 155 of the topmost one of the memory chips 251 of its memory module 159 at the backside thereof, or the insulating lining layer 153, adhesion layer 154 and seed layer 155 of its known-good memory or ASIC chip 397 in case of replacing its memory module 159, may be removed. Thus, a top surface of the copper layer 32 of each of the micro-bumps or micro-pads 34 of its vertical-through-via (VTV) connector 467 and, optionally, a backside of the copper layer 156 of each of the through silicon vias (TSVs) 157 of the topmost one of the memory chips 251 of its memory module 159, or a backside of the copper layer 156 of each of the through silicon vias (TSVs) 157 of its known-good memory or ASIC chip 397 in case of replacing its memory module 159, may be coplanar to a top surface of the insulating dielectric layer 257 of its vertical-through-via (VTV) connector 467, a top surface of the semiconductor substrate 2 of the topmost one of the memory chips 251 of its memory module 159, or a top surface of the semiconductor substrate 2 of its known-good memory or ASIC chip 397 in case of replacing its memory module 159, and the top surface of its polymer layer 565. The insulating lining layer 153, adhesion layer 154 and seed layer 155 of each of the through silicon vias (TSVs) 157 of the topmost one of the memory chips 251 of its memory module 159, or the insulating lining layer 153, adhesion layer 154 and seed layer 155 of each of the through silicon vias (TSVs) 157 of its known-good memory or ASIC chip 397 in case of replacing its memory module 159, may be left at a sidewall of the copper layer 156 of each of the through silicon vias (TSVs) 157 of the topmost one of the memory chips 251 of its memory module 159, or a sidewall of the copper layer 156 of each of the through silicon vias (TSVs) 157 of its known-good memory or ASIC chip 397 in case of replacing its memory module 159.

Referring to FIG. 9A, the first type of sub-system module 190 may include a frontside interconnection scheme for a device (FISD) 101 on its memory module 159, or its known-good memory or ASIC chip 397 in case of replacing its memory module 159, its vertical-through-via (VTV) connector 467 and its polymer layer 565. For the first type of sub-system module 190, its frontside interconnection scheme for a device (FISD) 101 may include (1) one or more interconnection metal layers 27 coupling to the micro-bumps or micro-pads 34 of its vertical-through-via (VTV) connector 467 and the through silicon vias (TSVs) 157 of the memory chips 251 and control chip 688 of its memory module 159, or the through silicon vias (TSVs) 157 of its known-good memory or ASIC chip 397 in case of replacing its memory module 159, and (2) one or more polymer layers 42, i.e., insulating dielectric layers, each between neighboring two of the interconnection metal layers 27 of its frontside interconnection scheme for a device (FISD) 101, between a bottommost one of the interconnection metal layers 27 of its frontside interconnection scheme for a device (FISD) 101 and a planar surface composed of the top surface of the insulating dielectric layer 257 of its vertical-through-via (VTV) connector 467, the top surface of the semiconductor substrate 2 of the topmost one of the memory chips 251 of its memory module 159, or the top surface of the semiconductor substrate 2 of its known-good memory or ASIC chip 397 in case of replacing its memory module 159, and the top surface of its polymer layer 565, or on and above a topmost one of the interconnection metal layers 27 of its frontside interconnection scheme for a device (FISD) 101, wherein the topmost one of the interconnection metal layers 27 of its frontside interconnection scheme for a device (FISD) 101 may have multiple metal pads at bottoms of multiple openings 42*a* in the topmost one of the polymer layers 42 of its frontside interconnection scheme for a device (FISD) 101. Each of the interconnection metal layers 27 of its frontside interconnection scheme for a device (FISD) 101 may have the same specification as that of the second interconnection scheme 588 of the first type of semiconductor integrated-circuit (IC) chip 100 as illustrated in FIG. 6A, and each of the polymer layers 42 of its frontside interconnection scheme for a device (FISD) 101 may have the same specification as that of the second interconnection scheme 588 of the first type of semiconductor integrated-circuit (IC) chip 100 as illustrated in FIG. 6A. Each of the interconnection metal layers 27 of its frontside interconnection scheme for a device (FISD) 101 may extend horizontally across an edge of its memory module 159, or its known-good memory or ASIC chip 397 in case of replacing its memory module 159, and an edge of its vertical-through-via (VTV) connector 467.

Referring to FIG. 9A, the first type of sub-system module 190 may include multiple micro-bumps or micro-pads 34, which may be of one of the first through fourth types having the same specification as the first through fourth types of micro-bumps or micro-pillars 34 as illustrated in FIG. 6A respectively, each having the adhesion layer 26*a* formed on one of the metal pads of the topmost one of the interconnection metal layers 27 of its frontside interconnection scheme for a device (FISD) 101 at the bottoms of the openings 42*a* in the topmost one of the polymer layers 42 of its frontside interconnection scheme for a device (FISD) 101.

Referring to FIG. 9A, for the first type of sub-system module 190, each of the memory chips 251 and control chip 688 of its memory module 159, or its known-good memory or ASIC chip 397 in case of replacing its memory module 159, may have multiple small I/O circuits each coupling to one of multiple small I/O circuits of its application specific integrated-circuit (ASIC) chip 399 through, in sequence, one of the bonded metal pads 6*a* of its memory module 159, or its known-good memory or ASIC chip 397 in case of replacing its memory module 159, and one of the bonded metal pads 6*a* of its application specific integrated-circuit (ASIC) chip 399 for data transmission with a data bit width of equal to or greater than 64, 128, 256, 512, 1024, 2048, 4096, 8K, or 16K, wherein each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 399 may have an output capacitance or driving capability or loading, for example, between 0.05 pF and 2 pF or between 0.05 pF and 1 pF, or smaller than 2 pF or 1 pF, and an input capacitance between 0.15 pF and 4 pF or between 0.15 pF and 2 pF, or greater than 0.15 pF. Alternatively, each of the small I/O circuits of each of the memory chips 251 and control chip 688 of its memory module 159, or its known-good memory or ASIC chip 397 in case of replacing its memory module 159, and each of the small I/O circuits of its application specific integrated-circuit (ASIC) chip 399 may have an I/O power efficiency smaller than 0.5 pico-Joules per bit, per switch or per voltage swing, or between 0.01 and 0.5 pico-Joules per bit, per switch or per voltage swing. Further, its application specific integrated-circuit (ASIC) chip 399 may include multiple programmable logic cells (LC) therein and multiple configurable switches therein, employed for a hardware accelerator or machine-learning operator. Further, its memory module 159, or its known-good memory or ASIC chip 397 in case of replacing its memory module 159, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store a password or key and a cryptography block or circuit configured (1) to encrypt, in accordance with the password or key, configuration data transmitted from or stored in the memory cells for the look-up tables (LUT) of the programmable logic cells (LC) of its application specific integrated-circuit (ASIC) logic chip 399 or the memory cells of the programmable switch cells of its application specific integrated-circuit (ASIC) logic chip 399 as encrypted configuration data to be passed to its micro-bumps or micro-pads 34 and (2) to decrypt, in accordance with the password or key, encrypted configuration data from its micro-bumps or micro-pads 34 as decrypted configuration data to be passed to and stored in the memory cells for the look-up tables (LUT) of the programmable logic cells (LC) of its application specific integrated-circuit (ASIC) logic chip 399 or the memory cells of the programmable switch cells of its application specific integrated-circuit (ASIC) logic chip 399. Further, its memory module 159, or its known-good memory or ASIC chip 397 in case of replacing its memory module 159, may include multiple non-volatile memory cells, such as NAND memory cells, NOR memory cells, resistive-random-access-memory (RRAM) cells, magnetoresistive-random-access-memory (MRAM) cells, ferroelectric-random-access-memory (FRAM) cells or phase-change-random-access-memory (PCM) cells, configured to store configuration data therein to be passed to the memory cells for the look-up tables (LUT) of the programmable logic cells (LC) of its application specific integrated-circuit (ASIC) logic chip 399 to be stored therein for programming or configuring the programmable logic cells (LC) of its application specific integrated-circuit (ASIC) logic chip 399 or to the memory cells of the programmable switch cells of its application specific integrated-circuit (ASIC) logic chip 399 to be stored therein for programming or configuring the programmable switch cells of its application specific integrated-circuit (ASIC) logic chip 399. Further, its memory module 159, or its known-good memory or ASIC chip 397 in case of replacing its memory module 159, may include a regulating block configured to regulate a voltage of power supply from an input voltage of 12, 5, 3.3 or 2.5 volts as an output voltage of 3.3, 2.5, 1.8, 1.5, 1.35, 1.2, 1.0, 0.75 or 0.5 volts to be delivered to its application specific integrated-circuit (ASIC) logic chip 399.

Referring to FIG. 9A, for the first type of sub-system module 190, each of the memory chips 251 and control chip 688 of its memory module 159, or its known-good memory or ASIC chip 397 in case of replacing its memory module 159, may have multiple large input/output (I/O) circuits each coupling to one of its micro-bumps or micro-pads 34 for signal transmission or power or ground delivery through the interconnection metal layers 27 of its frontside interconnection scheme for a device (FISD) 101, wherein each of the large input/output (I/O) circuits of each of the memory chips 251 and control chip 688 of its memory module 159, or its known-good memory or ASIC chip 397 in case of replacing its memory module 159, may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of each of the memory chips 251 and control chip 688 of its memory module 159, or its known-good memory or ASIC chip 397 in case of replacing its memory module 159, may have an I/O power efficiency greater than 3, 5 or 10 pico-Joules per bit, per switch or per voltage swing. Further, its application specific integrated-circuit (ASIC) logic chip 399 may have multiple large input/output (I/O) circuits each coupling to one of its micro-bumps or micro-pads 34 for signal transmission or power or ground delivery through, in sequence, one of the vertical through vias (VTVs) 358 of its vertical-through-via (VTV) connector 467, or one of the dedicated vertical bypasses 698 of its memory module 159 as illustrated in FIG. 7C, or one of the through silicon vias (TSVs) 157 of its known-good memory or ASIC chip 397 in case of replacing its memory module 159, and the interconnection metal layers 27 of its frontside interconnection scheme for a device (FISD) 101, wherein said one of the dedicated vertical bypasses 698 is not connected to any transistor of each of the memory chips 251 and control chip 688 of its memory module 159, or said one of the through silicon vias (TSVs) 157 is not connected to any transistor of its known-good memory or ASIC chip 397 in case of replacing its memory module 159, wherein each of the large input/output (I/O) circuits of its application specific integrated-circuit (ASIC) logic chip 399 may have an output capacitance or driving capability or loading between 2 pF and 100 pF, between 2 pF and 50 pF, between 2 pF and 30 pF, between 2 pF and 20 pF, between 2 pF and 15 pF, between 2 pF and 10 pF, or between 2 pF and 5 pF, or greater than 2 pF, 5 pF, 10 pF, 15 pF or 20 pF, and an input capacitance between 0.15 pF and 4 pF or between 0.15 pF and 2 pF, or greater than 0.15 pF for example; alternatively, each of the large input/output (I/O) circuits of its application specific integrated-circuit (ASIC) logic chip 399 may have an I/O power efficiency greater than 3, 5 or 10 pico-Joules per bit, per switch or per voltage swing. One of the vertical interconnects 699 of its memory module 159 as illustrated in FIG. 7C, or one of the through silicon vias (TSVs) 157 of its known-good memory or ASIC chip 397 in case of replacing its memory module 159, may couple to one of its micro-bumps or micro-pads 34 through the interconnection metal layers 27 of its frontside interconnection scheme for a device (FISD) 101 and to its application specific integrated-circuit (ASIC) chip 399 through one of the metal pads 6*a* of the control chip 688 of its memory module 159 as seen in FIG. 7C, or one of the metal pads 6*a* of its known-good memory or ASIC chip 397 in case of replacing its memory module 159.

Referring to FIG. 9A, for the first type of sub-system module 190, each of the memory chips 251 and control chip 688 of its memory module 159, or its known-good memory or ASIC chip 397 in case of replacing its memory module 159, may be implemented using a semiconductor node or generation less advanced than or equal to, or above or equal to 20 nm, 30 nm, 40 nm, 50 nm, 90 nm, 130 nm, 250 nm, 350 nm or 500 nm; while its application specific integrated-circuit (ASIC) logic chip 399 may be implemented using a semiconductor node or generation more advanced than or equal to, or below or equal to 20 nm or 10 nm, and for example using a semiconductor node or generation of 16 nm, 14 nm, 12 nm, 10 nm, 7 nm, 5 nm, 3 nm or 2 nm. The semiconductor technology node or generation used in each of the memory chips 251 and control chip 688 of its memory module 159, or its known-good memory or ASIC chip 397 in case of replacing its memory module 159, may be 1, 2, 3, 4, 5 or greater than 5 nodes or generations older, more matured or less advanced than that used in its application specific integrated-circuit (ASIC) logic chip 399. Transistors used in each of the memory chips 251 and control chip 688 of its memory module 159, or its known-good memory or ASIC chip 397 in case of replacing its memory module 159, may be provided with fully depleted silicon-on-insulator (FDSOI) metal-oxide-semiconductor field effect transistors (MOSFETs), partially depleted silicon-on-insulator (PD-SOI) MOSFETs or a planar MOSFETs. Transistors used in each of the memory chips 251 and control chip 688 of its memory module 159, or its known-good memory or ASIC chip 397 in case of replacing its memory module 159, may be different from that used in its application specific integrated-circuit (ASIC) logic chip 399; each of the memory chips 251 and control chip 688 of its memory module 159, or its known-good memory or ASIC chip 397 in case of replacing its memory module 159, may use planar MOSFETs, while its application specific integrated-circuit (ASIC) logic chip 399 may use fin field effect transistors (FINFETs) or gate-all-around field effect transistors (GAAFETs). A power supply voltage (Vcc) applied in each of the memory chips 251 and control chip 688 of its memory module 159, or its known-good memory or ASIC chip 397 in case of replacing its memory module 159, may be greater than or equal to 1.5, 2.0, 2.5, 3, 3.3, 4, or 5 voltages, while a power supply voltage (Vcc) applied in its application specific integrated-circuit (ASIC) logic chip 399 may be smaller than or equal to 1.8, 1.5 or 1 voltage. The power supply voltage applied in each of the memory chips 251 and control chip 688 of its memory module 159, or its known-good memory or ASIC chip 397 in case of replacing its memory module 159, may be higher than that applied in its application specific integrated-circuit (ASIC) logic chip 399. A gate oxide of a field effect transistor (FET) of each of the memory chips 251 and control chip 688 of its memory module 159, or its known-good memory or ASIC chip 397 in case of replacing its memory module 159, may have a physical thickness greater than or equal to 5 nm, 6 nm, 7.5 nm, 10 nm, 12.5 nm, or 15 nm, while a gate oxide of a field effect transistor (FET) of its application specific integrated-circuit (ASIC) logic chip 399 may have a physical thickness less than 4.5 nm, 4 nm, 3 nm or 2 nm. The thickness of the gate oxide of the field effect transistor (FET) of each of the memory chips 251 and control chip 688 of its memory module 159, or its known-good memory or ASIC chip 397 in case of replacing its memory module 159, may be greater than that of its application specific integrated-circuit (ASIC) logic chip 399.

For more elaboration, referring to FIG. 9A, for the first type of sub-system module 190, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in an old technology node when its application specific integrated-circuit (ASIC) logic chip 399 is redesigned using a new technology node or for new application. Alternatively, its known-good memory or ASIC chip 397 in case of replacing its memory module 159 may be the intellectual-property (IP) chip, such as interface chip, networking chip, universal-serial-bus (USB) chip, Serdes chip, analog integrated-circuit (IC) chip or power-management integrated-circuit (IC) chip, which may not need to be redesigned or recompiled and may be kept using an original design in a new technology node when its application specific integrated-circuit (ASIC) logic chip 399 is redesigned using the new technology node for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 399 manufactured using a new technology node. Alternatively, each of the memory chips 251 and control chip 688 of its memory module 159, or its known-good memory or ASIC chip 397 in case of replacing its memory module 159, may use an old technology node to cooperate with its application specific integrated-circuit (ASIC) logic chip 399 for different applications for a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example. Alternatively, a technology process for forming its known-good memory or ASIC chip 397 in case of replacing its memory module 159 may not be compatible to that for forming its application specific integrated-circuit (ASIC) logic chip 399, wherein its known-good memory or ASIC chip 397 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phasechange-random-access-memory (PCM) integrated-circuit (IC) chip, ferroelectric random-access-memory (FRAM) integrated-circuit (IC) chip.

Alternatively, referring to FIG. 9A, for the first type of sub-system module 190, its application specific integrated-circuit (ASIC) chip 399 may be a high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip, logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip, cryptography or security integrated-circuit (IC) chip, innovated ASIC or customer-owned-tooling (COT) integrated-circuit (IC) chip or power-management integrated-circuit (IC) chip, and its known-good memory or ASIC chip 397 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example.

2. Second Type of Sub-System Module or Unit

Figure 9B:
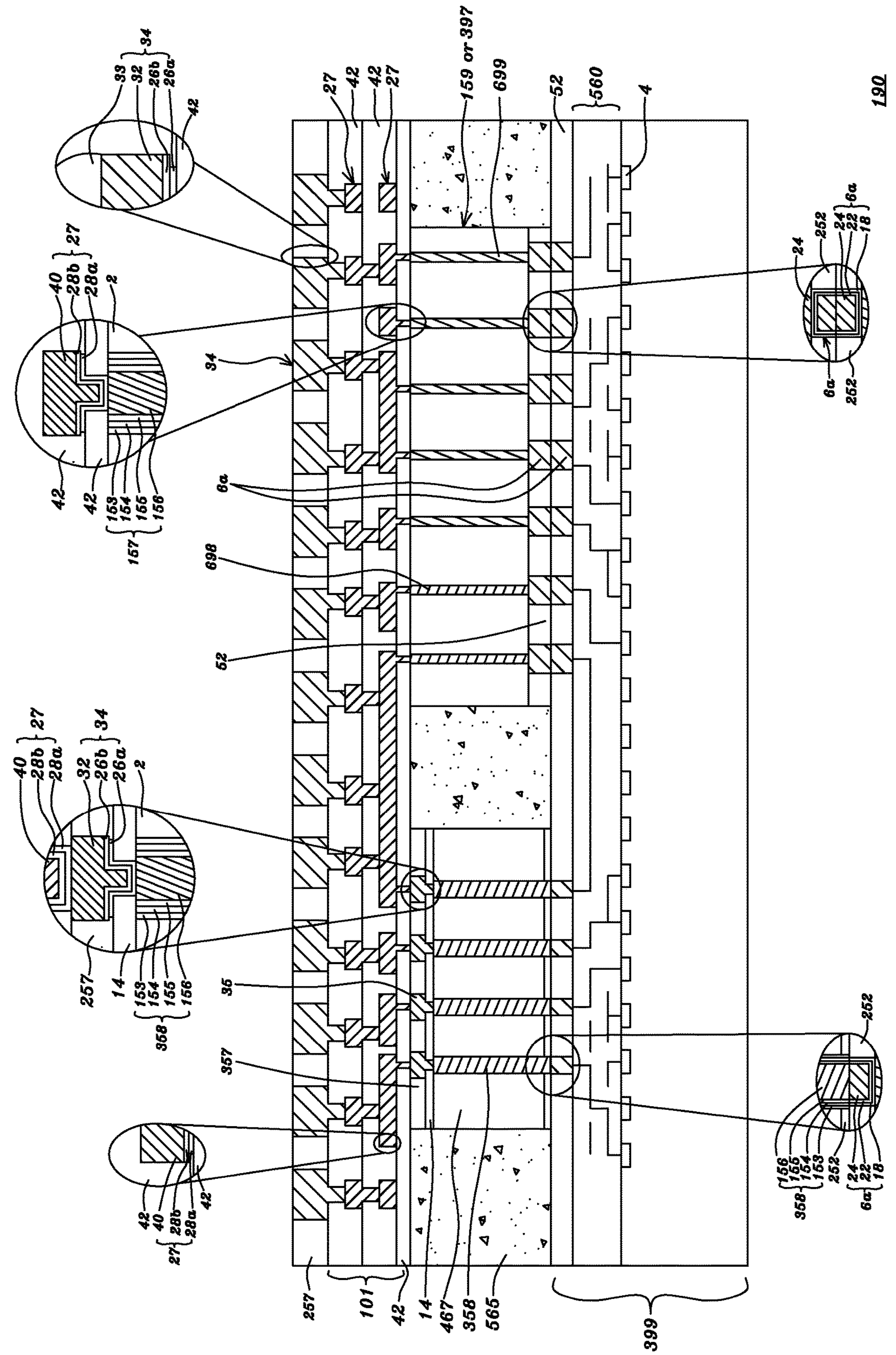
FIG. 9B is a schematically cross-sectional view showing a second type of sub-system module in accordance with an embodiment of the present application.

FIG. 9B is a schematically cross-sectional view showing a second type of sub-system module in accordance with an embodiment of the present application. Referring to FIG. 9B, a second type of sub-system module 190 may have a similar structure to the first type of sub-system module 190 illustrated in FIG. 9A. For an element indicated by the same reference number shown in FIGS. 9A and 9B, the specification of the element as seen in FIG. 9B may be referred to that of the element as illustrated in FIG. 9A. The difference between the first and second types of sub-system modules 190 is that the second type of sub-system module 190 may further include an insulating dielectric layer 257, such as polymer layer, on the topmost one of the polymer layers 42 of its frontside interconnection scheme for a device (FISD) 101. For the second type of sub-system module 190, its micro-bumps or micro-pads 34 may be of the first type as illustrated in FIGS. 6A and 9A, and its insulating dielectric layer 257 may cover a sidewall of the copper layer 32 of each of its first type of micro-bumps or micro-pads 34, wherein its insulating dielectric layer 257 may have a top surface coplanar to a top surface of the copper layer 32 of each of its first type of micro-bumps or micro-pads 34, wherein its insulating dielectric layer 257 may be, for example, polyimide, BenzoCycloButene (BCB), parylene, polybenzoxazole (PBO), epoxy-based material or compound, photo epoxy SU-8, elastomer, silicon organic glass (SOG) or silicone; its insulating dielectric layer 257 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Structure and Process for First Type of Chip Package

Figure 10A:
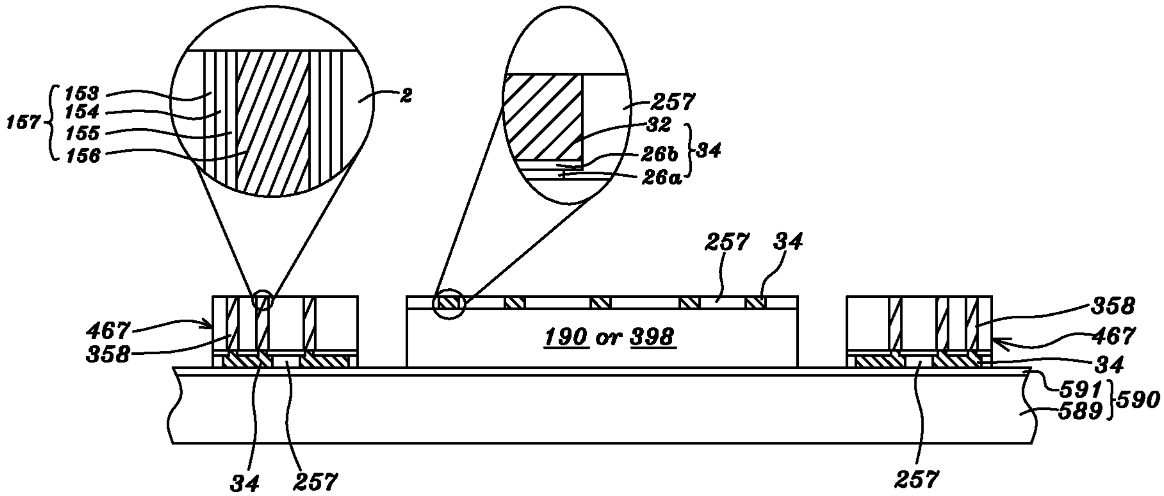
FIGS. 10A-10E are schematically cross-sectional views showing a process for forming a first type of chip package in accordance with an embodiment of the present application.

FIGS. 10A-10E are schematically cross-sectional views showing a process for forming a first type of chip package in accordance with an embodiment of the present application. Referring to FIG. 10A, a temporary substrate 590 may be provided with a glass or silicon substrate 589 and a sacrificial bonding layer 591 on the glass or silicon substrate 589 thereof. The sacrificial bonding layer 591 may have the glass or silicon substrate 589 to be easily debonded or released from a structure subsequently formed on the sacrificial bonding layer 591. For example, the sacrificial bonding layer 591 may be a material of light-to-heat conversion (LTHC) that may be deposited on the glass or silicon substrate 589 by printing or spin-on coating and then cured or dried with a thickness of about 1 micrometer or between 0.5 and 2 micrometers. The LTHC material may be a liquid ink containing carbon black and binder in a mixture of solvents.

Next, referring to FIG. 10A, multiple application specific integrated-circuit (ASIC) chips 398 (only one is shown), each having the same specification as the second type of semiconductor integrated-circuit (IC) chip 100 illustrated in FIG. 6B, each may include the semiconductor substrate 2 having a bottom surface at a backside thereof attached to the sacrificial bonding layer 591 of the temporary substrate 590. Each of the application specific integrated-circuit (ASIC) chips 398 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example. Alternatively, each of the application specific integrated-circuit (ASIC) chips 398 may be a memory chip, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip. Alternatively, each of the application specific integrated-circuit (ASIC) chips 398 may be a logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip, cryptography or security integrated-circuit (IC) chip, innovated ASIC or customer-owned-tooling (COT) integrated-circuit (IC) chip or power-management integrated-circuit (IC) chip. Alternatively, each of the application specific integrated-circuit (ASIC) chips 398 may be replaced with a sub-system module 190 having the same specification as the second type of sub-system module 190 as illustrated in FIG. 9B, which may include the application specific integrated-circuit (ASIC) chip 399 having a bottom surface at a backside thereof attached to the sacrificial bonding layer 591 of the temporary substrate 590.

Further, referring to FIG. 10A, multiple third type of vertical-through-via (VTV) connectors 467 may be provided, each having the same specification as that as illustrated in FIG. 1O but optionally having the first type of micro-bumps or micro-pads 34 each covering and aligning with two or more than two of its vertical through vias (VTVs) 358, that is, each of its first type of micro-bumps or micro-pads 34 may have the adhesion layer 26*a* on its passivation layer 14 and the top surface of the copper layer 156 of each of said two or more than two of its vertical through vias (VTVs) 358. Alternatively, each of the third type of vertical-through-via (VTV) connectors 467 may be replaced with the sixth or twelfth type of vertical-through-via (VTV) connector 467 as illustrated in FIG. 1R or 1X but optionally having the first type of micro-bumps or micro-pads 34 each covering and aligning with two or more than two of its vertical through vias (VTVs) 358, that is, each of its first type of micro-bumps or micro-pads 34 may have the adhesion layer 26*a* on its passivation layer 14 and the top surface of the copper layer 156 of each of said two or more than two of its vertical through vias (VTVs) 358. Each of the third type of vertical-through-via (VTV) connectors 467, or the sixth or twelfth type of vertical-through-via (VTV) connectors 467 in case of replacing the third type of vertical-through-via (VTV) connectors 467, may be turned upside down to have its insulating dielectric layer 257 attached to the sacrificial bonding layer 591 of the temporary substrate 590 and its first type of micro-bumps or micro-pads 34 attached to the sacrificial bonding layer 591 of the temporary substrate 590.

Figure 10B:
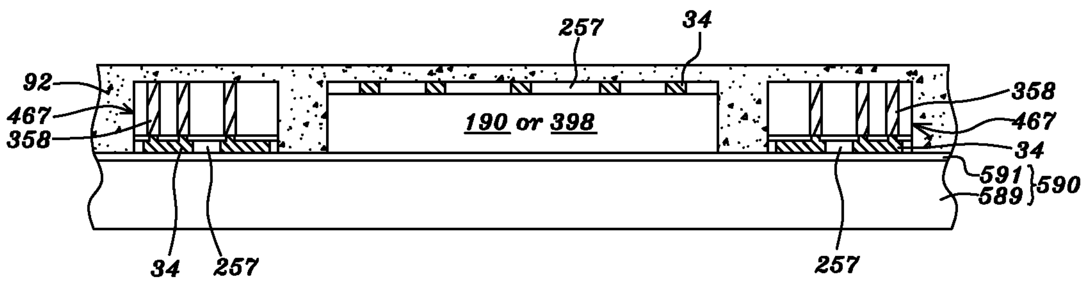

Next, referring to FIG. 10B, a polymer layer 92, or insulating dielectric layer, may be applied to fill a gap between each neighboring two of the application specific integrated-circuit (ASIC) chips 398, or the sub-system modules 190 in case of replacing the application specific integrated-circuit (ASIC) chips 398, and the vertical-through-via (VTV) connectors 467 and to cover the insulating dielectric layer 257 and first type of micro-bumps or micro-pads 34 of each of the application specific integrated-circuit (ASIC) chips 398, or the sub-system modules 190 in case of replacing the application specific integrated-circuit (ASIC) chips 398, and to (1) cover the backside of the semiconductor substrate 2 of each of the third type of vertical-through-via (VTV) connectors 467 and the backside of the copper layer 156 of each of the vertical through vias (VTVs) 358 of each of the third type of vertical-through-via (VTV) connectors 467 or (2) cover the or the topmost insulating bonding layer 252 of each of the sixth or twelfth type of vertical-through-via (VTV) connectors 467 in case of replacing the third type of vertical-through-via (VTV) connectors 467 and the backside of the copper layer 156 of each of the vertical through vias (VTVs) 358 of each of the sixth or twelfth type of vertical-through-via (VTV) connectors 467 in case of replacing the third type of vertical-through-via (VTV) connectors 467, by a method of spin-on coating, screen-printing, dispensing or molding. The polymer layer 92 may be, for example, polyimide, BenzoCycloButene (BCB), parylene, polybenzoxazole (PBO), epoxy-based resin or compound, photo epoxy SU-8, elastomer, silicon organic glass (SOG) or silicone. The polymer layer 92 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Figure 10C:
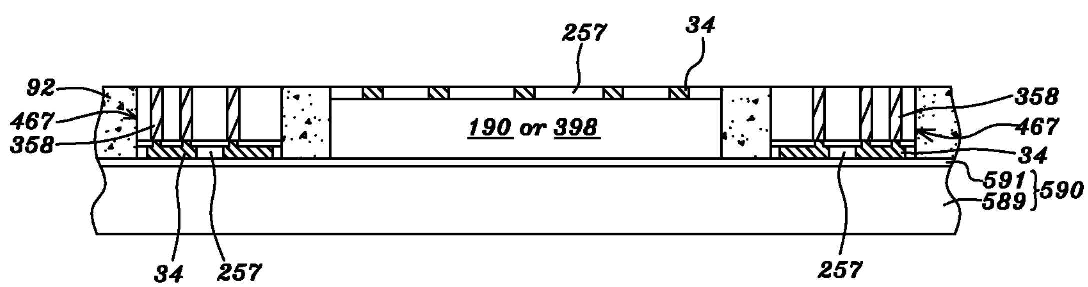

Next, referring to FIG. 10C, a chemical mechanical polishing (CMP), polishing or grinding process may be applied to remove a top portion of the polymer layer 92 and to expose a top planar surface composed of (1) a top surface of the polymer layer 92, (2) the backside of the semiconductor substrate 2 of each of the third type of vertical-through-via (VTV) connectors 467 and the backside of the copper layer 156 of each of the vertical through vias (VTVs) 358 of each of the third type of vertical-through-via (VTV) connectors 467, or the or the topmost insulating bonding layer 252 of each of the sixth or twelfth type of vertical-through-via (VTV) connectors 467 in case of replacing the third type of vertical-through-via (VTV) connectors 467 and the backside of the copper layer 156 of each of the vertical through vias (VTVs) 358 of each of the sixth or twelfth type of vertical-through-via (VTV) connectors 467 in case of replacing the third type of vertical-through-via (VTV) connectors 467, and (3) the top surface of the copper layer 32 of each of the first type of micro-bumps or micro-pads 34 of each of the application specific integrated-circuit (ASIC) chips 398 and the top surface of the insulating dielectric layer 257 of each of the application specific integrated-circuit (ASIC) chips 398, or the top surface of the copper layer 32 of each of the first type of micro-bumps or micro-pads 34 of each of the sub-system modules 190 in case of replacing the application specific integrated-circuit (ASIC) chips 398 and the top surface of the insulating dielectric layer 257 of each of the sub-system modules 190 in case of replacing the application specific integrated-circuit (ASIC) chips 398.

Figure 10D:
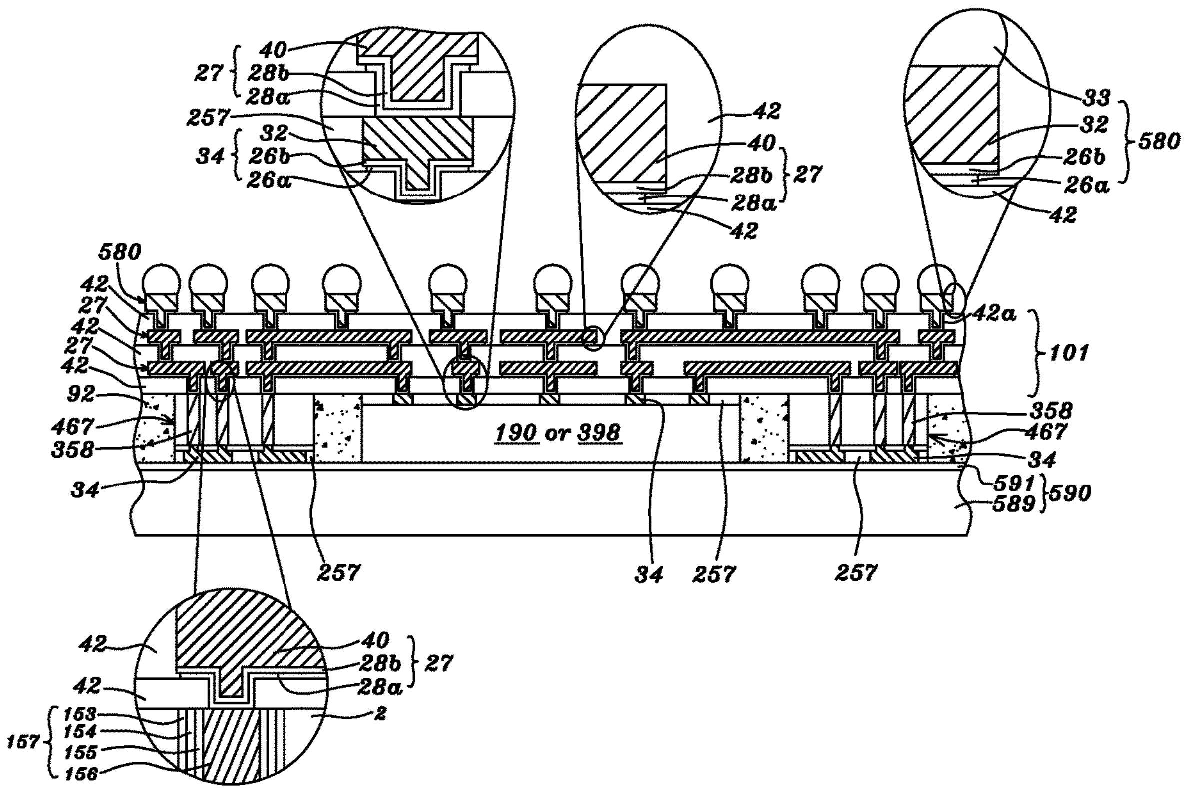

Referring to FIG. 10D, a frontside interconnection scheme for a device (FISD) 101 may be formed on the top planar surface, including (1) one or more interconnection metal layers 27 coupling to the first type of micro-bumps or micro-pads 34 of each of the application specific integrated-circuit (ASIC) chips 398, or the sub-system modules 190 in case of replacing the application specific integrated-circuit (ASIC) chips 398, and the vertical through vias (VTVs) 358 of each of the third type of vertical-through-via (VTV) connectors 467, or the sixth or twelfth type of vertical-through-via (VTV) connectors 467 in case of replacing the third type of vertical-through-via (VTV) connectors 467, and (2) one or more polymer layers 42, i.e., insulating dielectric layers, each between neighboring two of its interconnection metal layers 27, between the top planar surface and a bottommost one of its interconnection metal layers 27 or on and above a topmost one of its interconnection metal layers 27, wherein the topmost one of its interconnection metal layers 27 may be patterned with multiple metal pads at bottoms of multiple openings 42*a* in the topmost one of its polymer layers 42. Each of the interconnection metal layers 27 of the frontside interconnection scheme for a device (FISD) 101 may have the same specification as that of the second interconnection scheme for an interconnection bridge (SISIB) 588 as illustrated in FIGS. 5C and 5D, and each of the polymer layers 42 of the frontside interconnection scheme for a device (FISD) 101 may have the same specification as that of the second interconnection scheme for an interconnection bridge (SISIB) 588 as illustrated in FIGS. 5C and 5D. Each of the interconnection metal layers 27 of the frontside interconnection scheme for a device (FISD) 101 may extend across over (1) an edge of each of the application specific integrated-circuit (ASIC) chips 398, or the sub-system modules 190 in case of replacing the application specific integrated-circuit (ASIC) chips 398, and (2) an edge of each of the third type of vertical-through-via (VTV) connectors 467, or an edge of each of the sixth or twelfth type of vertical-through-via (VTV) connectors 467 in case of replacing the third type of vertical-through-via (VTV) connectors 467.

Next, referring to FIG. 10D, multiple metal bumps or pads 580, i.e., metal contacts, in an array, which may be of one of the first through fourth types having the same specification as the first through fourth types of micro-bumps or micro-pillars 34 as illustrated in FIG. 1E respectively, may have the adhesion layer 26*a* formed on the metal pads of the topmost one of the interconnection metal layers 27 of the frontside interconnection scheme for a device (FISD) 101 at the bottoms of the respective openings 42*a* in the topmost one of the polymer layers 42 of the frontside interconnection scheme for a device (FISD) 101.

Figure 10E:
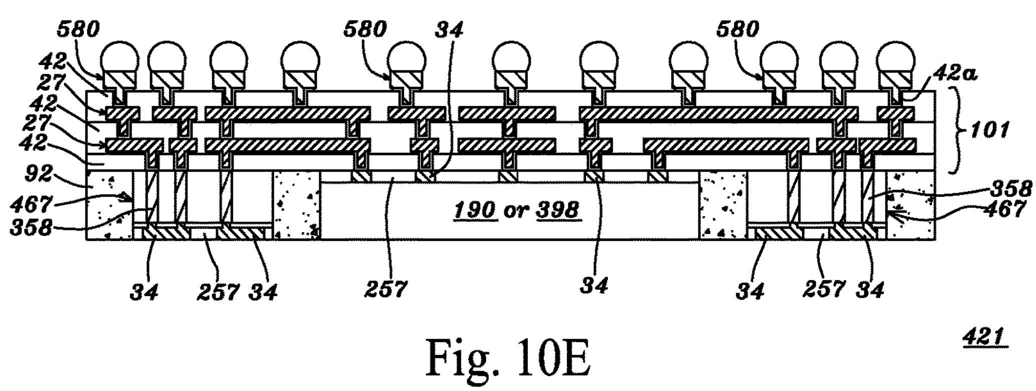

Next, the glass or silicon substrate 589 as seen in FIG. 10D may be released from the sacrificial bonding layer 591. For example, in the case that the sacrificial bonding layer 591 is the material of light-to-heat conversion (LTHC) and the substrate 589 is made of glass, a laser light, such as YAG laser having a wavelength of about 1064 nm, an output power between 20 and 50 W and a spot size of 0.3 mm in diameter at a focal point, may be generated to pass from the backside of the glass substrate 589 to the sacrificial bonding layer 591 through the glass substrate 589 to scan the sacrificial bonding layer 591 at a speed of 8.0 m/s, for example, such that the sacrificial bonding layer 591 may be decomposed and thus the glass substrate 589 may be easily released from the sacrificial bonding layer 591. Next, an adhesive peeling tape (not shown) may be attached to a bottom surface of the remainder of the sacrificial bonding layer 591. Next, the adhesive peeling tape may be peeled off to pull off the remainder of the sacrificial bonding layer 591 attached to the adhesive peeling tape to expose a planar bottom surface composed of: (1) the bottom surface of the semiconductor substrate of each of the application specific integrated-circuit (ASIC) chips 398, or the bottom surface of the application specific integrated-circuit (ASIC) chip 399 of each of the sub-system modules 190 in case of replacing the application specific integrated-circuit (ASIC) chips 398, (2) a bottom surface of the polymer layer 92, (3) the bottom surface of the insulating dielectric layer 257 of each of the third type of vertical-through-via (VTV) connectors 467, or the sixth or twelfth type of vertical-through-via (VTV) connectors 467 in case of replacing the third type of vertical-through-via (VTV) connectors 467, and (4) the bottom surface of the copper layer 32 of each of the first type of micro-bumps or micro-pads 34 of each of the third type of vertical-through-via (VTV) connectors 467, or the sixth or twelfth type of vertical-through-via (VTV) connectors 467 in case of replacing the third type of vertical-through-via (VTV) connectors 467. Next, the polymer layers 42 of the frontside interconnection scheme for a device (FISD) 101 and the polymer layer 92 may be cut or diced to separate multiple individual units (only one is shown) each for a first type of chip package 421 as shown in FIG. 10E by a laser cutting process or mechanical cutting process.

Structure and Process for Second Type of Chip Package

Figure 11A:
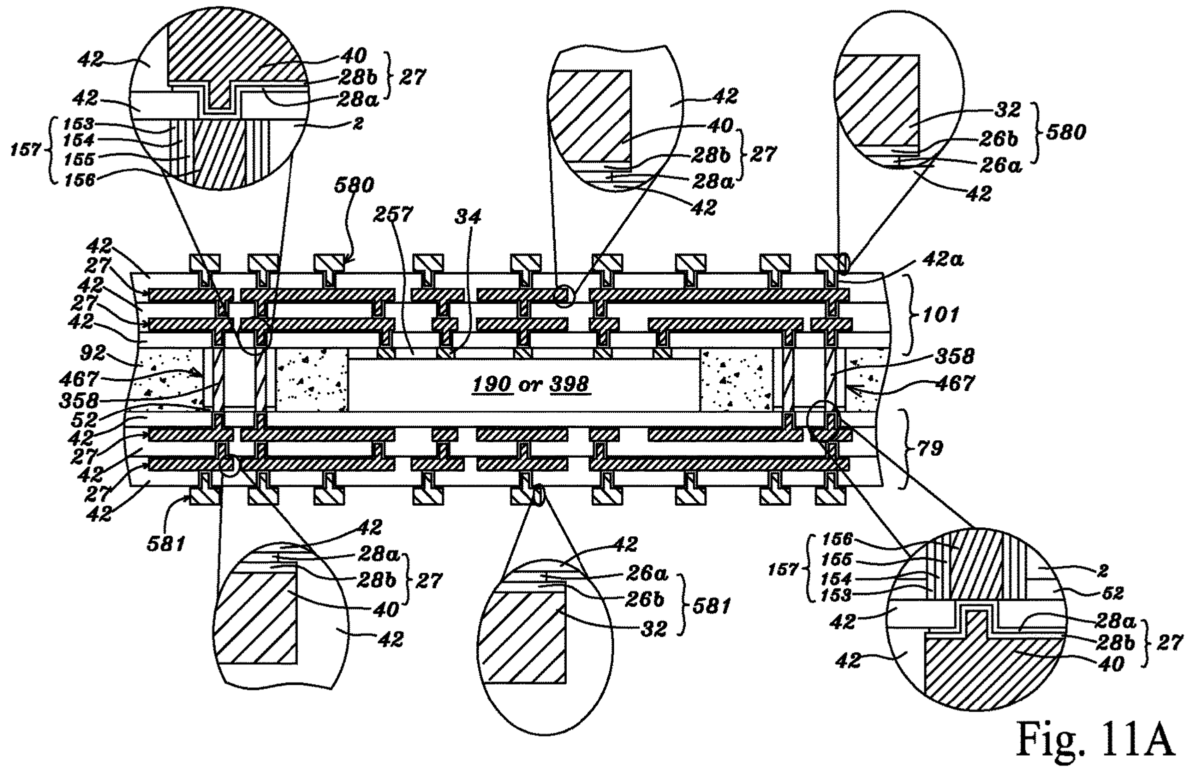
FIG. 11A-11C are schematically cross-sectional views showing a second type of chip package in accordance with an embodiment of the present application.
Figure 11B:
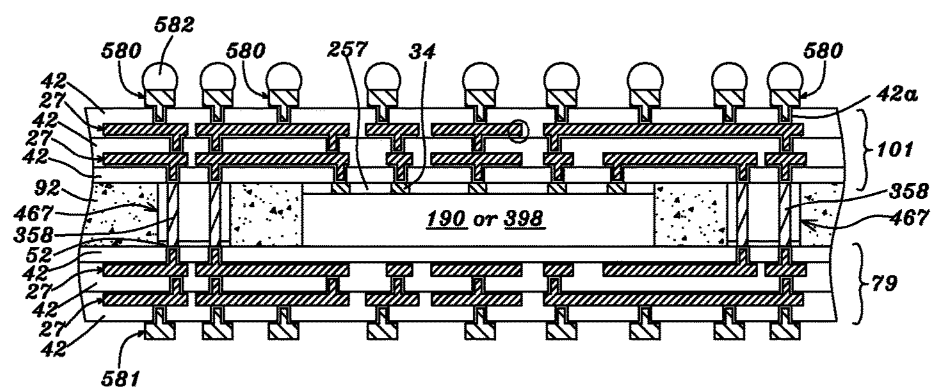
Figure 11C:
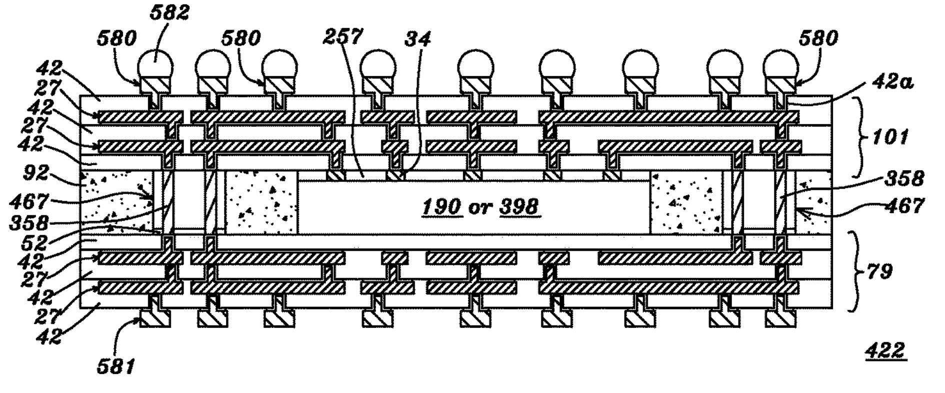

FIG. 11A-11C are schematically cross-sectional views showing a second type of chip package in accordance with an embodiment of the present application. Referring to FIG. 11A-11C, the process for forming a second type of chip package 422 may be referred to that for forming the first type of chip package 421 as illustrated in FIGS. 10A-10E. For an element indicated by the same reference number shown in FIGS. 10A-10E and 11A-11C, the specification of the element as seen in FIGS. 11A-11C may be referred to that of the element as illustrated in FIGS. 10A-10E. The difference between the processes for forming the first and second types of chip packages 421 and 422 is that in the step as illustrated in FIG. 10A, the second type of vertical-through-via (VTV) connectors 467 as illustrated in FIG. 1H, 1K or 1N may be provided to be turned upside down in replace of the third type of vertical-through-via (VTV) connectors 467 for forming the first type of chip package 421 respectively. Each of the second type of vertical-through-via (VTV) connectors 467 may have the insulating bonding layer 52 to be attached to the sacrificial bonding layer 591 of the temporary substrate 590 and the vertical through vias (VTVs) 358 to be attached to the sacrificial bonding layer 591 of the temporary substrate 590. Alternatively, each of the sixth or twelfth type of vertical-through-via (VTV) connectors 467 for forming the first type of chip package 421 may be replaced respectively with the fifth or eleventh type of vertical-through-via (VTV) connector 467 as illustrated in FIG. 1Q or 2C for forming the second type of chip package 422 to be provided upside down. Each of the fifth or eleventh type of vertical-through-via (VTV) connectors 467 may have the or the bottommost insulating bonding layer 52 to be attached to the sacrificial bonding layer 591 of the temporary substrate 590 and the vertical through vias (VTVs) 358 to be attached to the sacrificial bonding layer 591 of the temporary substrate 590.

Further, referring to FIG. 11A, after the adhesive peeling tape is peeled off to pull off the remainder of the sacrificial bonding layer 591 as illustrated in FIG. 10D, (1) the bottom surface of the semiconductor substrate of each of the application specific integrated-circuit (ASIC) chips 398, or the bottom surface of the application specific integrated-circuit (ASIC) chip 399 of each of the sub-system modules 190 in case of replacing the application specific integrated-circuit (ASIC) chips 398, (2) the bottom surface of the polymer layer 92, (3) the bottom surface of the insulating bonding layer 52 of each of the second type of vertical-through-via (VTV) connectors 467, or the bottom surface of the or the bottommost insulating bonding layer 52 of each of the fifth or eleventh type of vertical-through-via (VTV) connectors 467 in case of replacing the second type of vertical-through-via (VTV) connectors 467, and (4) the bottom surface of the copper layer 156 of each of the vertical through vias (VTVs) 358 of each of the second type of vertical-through-via (VTV) connectors 467, or the fifth or eleventh type of vertical-through-via (VTV) connectors 467 in case of replacing the second type of vertical-through-via (VTV) connectors 467, may be exposed to form a bottom planar surface.

Next, referring to FIG. 11A, a backside interconnection scheme for a device (BISD) 79 may be formed on and under the bottom planar surface, including (1) one or more interconnection metal layers 27 coupling to the vertical through vias (VTVs) 358 of each of the second type of vertical-through-via (VTV) connectors 467, or the fifth or eleventh type of vertical-through-via (VTV) connectors 467 in case of replacing the second type of vertical-through-via (VTV) connectors 467, and (2) one or more polymer layers 42, i.e., insulating dielectric layers, each between neighboring two of its interconnection metal layers 27, between the bottom planar surface and a topmost one of its interconnection metal layers 27 or on and under a bottommost one of its interconnection metal layers 27, wherein the bottommost one of the interconnection metal layers 27 of the backside interconnection scheme for a device (BISD) 79 may be patterned with multiple metal pads at tops of multiple openings 42*a* in the bottommost one of the polymer layers 42 of the backside interconnection scheme for a device (BISD) 79. Each of the interconnection metal layers 27 of the backside interconnection scheme for a device (BISD) 79 may include (1) a copper layer 40 having upper portions in openings in one of the polymer layers 42 of the backside interconnection scheme for a device (BISD) 79, having a thickness of between 0.3 μm and 20 μm, and lower portions having a thickness 0.3 μm and 20 μm under and on said one of the polymer layers 42, (2) an adhesion layer 28*a*, such as titanium or titanium nitride having a thickness of between 1 nm and 50 nm, at a top and sidewall of each of the upper portions of the copper layer 40 thereof and at a top of each of the lower portions of the copper layer 40 thereof, and (3) a seed layer 28*b*, such as copper, between the copper layer 40 and adhesion layer 28*a* thereof, wherein said each of the lower portions of the copper layer 40 thereof may have a sidewall not covered by the adhesion layer 28*a*. Each of the interconnection metal layers 27 of the backside interconnection scheme for a device (BISD) 79 may have a metal line or trace with a thickness between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 1 μm, 2 μm, 3 μm, 5 μm, 7 μm or 10 μm and a width between, for example, 0.3 μm and 40 μm, 0.5 μm and 30 μm, 1 μm and 20 μm, 1 μm and 15 μm, 1 μm and 10 μm, or 0.5 μm to 5 μm, or greater than or equal to 0.3 μm, 0.7 μm, 2 μm, 3 μm, 5 μm, 7 μm or 10 μm. Each of the polymer layer 42 of the backside interconnection scheme for a device (BISD) 79 may be a layer of polyimide, BenzoCycloButene (BCB), parylene, polybenzoxazole (PBO), epoxy-based material or compound, photo epoxy SU-8, elastomer silicon organic glass (SOG) or silicone, having a thickness between, for example, 0.3 μm and 50 μm, 0.3 μm and 30 μm, 0.5 μm and 20 μm, 1 μm and 10 μm, or 0.5 μm and 5 μm, or thicker than or equal to 0.3 μm, 0.5 μm, 0.7 μm, 1 μm, 1.5 μm, 2 μm, 3 μm or 5 μm. One of the interconnection metal layers 27 of the backside interconnection scheme for a device (BISD) 79 may have two planes used respectively for power and ground planes of a power supply and/or used as a heat dissipater or spreader for the heat dissipation or spreading, wherein each of the two planes may have a thickness, for example, between 5 μm and 50 μm, 5 μm and 30 μm, 5 μm and 20 μm, or 5 μm and 15 μm, or greater than or equal to 5 μm, 10 μm, 20 μm, or 30 μm. The two planes may be layout as interlaced or interleaved shaped structures in a plane or may be layout in a fork shape. Each of the interconnection metal layers 27 of the backside interconnection scheme for a device (BISD) 79 may extend across under (1) an edge of each of the application specific integrated-circuit (ASIC) chips 398, or the sub-system modules 190 in case of replacing the application specific integrated-circuit (ASIC) chips 398, and (2) an edge of each of the second type of vertical-through-via (VTV) connectors 467, or an edge of each of the fifth or eleventh type of vertical-through-via (VTV) connectors 467 in case of replacing the second type of vertical-through-via (VTV) connectors 467.

Next, referring to FIG. 11A, multiple metal bumps or pads 581, i.e., metal contacts, in an array, which may be of one of the first through fourth types having the same specification as the first through fourth types of micro-bumps or micro-pillars 34 as illustrated in FIG. 1E respectively, may have the adhesion layer 26*a* formed on the metal pads of the bottommost one of the interconnection metal layers 27 of the backside interconnection scheme for a device (BISD) 79 at the tops of the respective openings 42*a* in the bottommost one of the polymer layers 42 of the backside interconnection scheme for a device (BISD) 79.

Next, referring to FIG. 11B, when the metal bumps or pads 580 is of the first type, multiple solder balls 582, such as a tin-silver alloy or tin-lead alloy, may be formed on the metal bumps or pads 580 by performing solder ball implant process including using a screen for dropping multiple solder balls on the metal bumps or pads 580 respectively and then performing a solder reflow process for bonding the solder balls to the metal bumps or pads 580 respectively.

Next, the polymer layers 42 of the frontside interconnection scheme for a device (FISD) 101, the polymer layer 92 and the polymer layers 42 of the backside interconnection scheme for a device (BISD) 79 may be cut or diced to separate multiple individual units (only one is shown) each for the second type of chip package 422 as shown in FIG. 11C by a laser cutting process or mechanical cutting process.

Structure and Process for Third Type of Chip Package

Figure 12A:
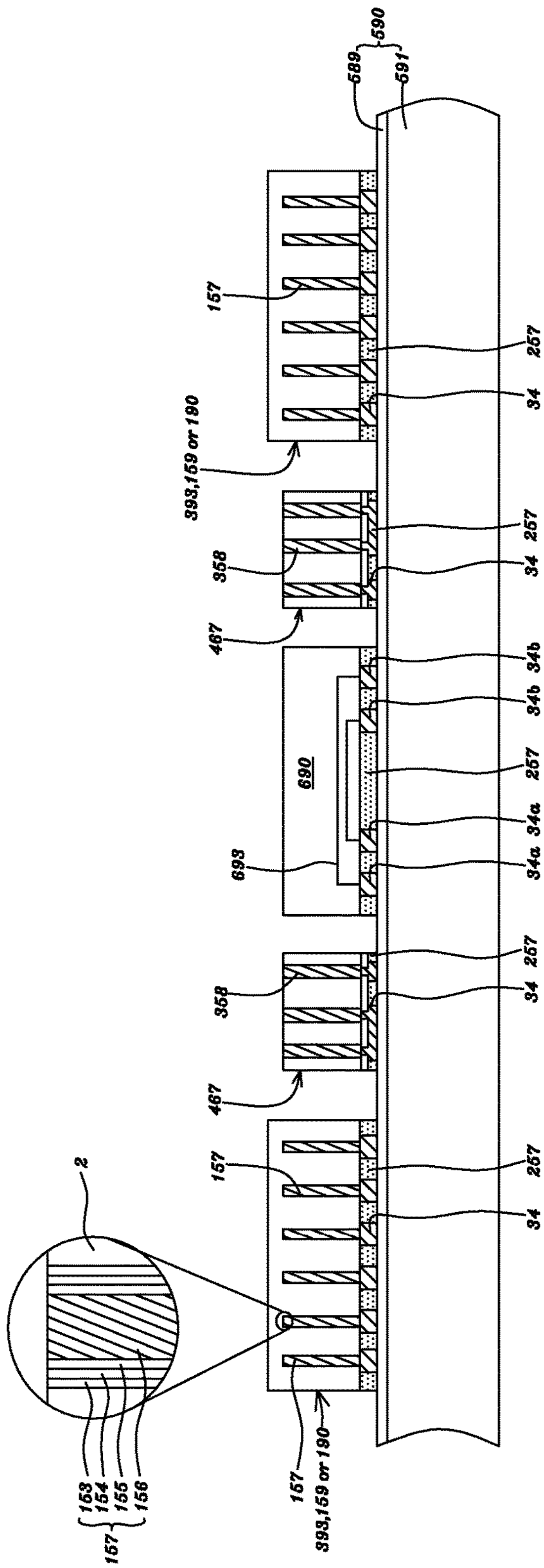
FIGS. 12A-12H are schematically cross-sectional views showing a process for forming a third type of chip package in accordance with an embodiment of the present application.

FIGS. 12A-12H are schematically cross-sectional views showing a process for forming a third type of chip package in accordance with an embodiment of the present application. Referring to FIG. 12A, the temporary substrate 590 as illustrated in FIG. 10A may be provided with the glass or silicon substrate 589 and the sacrificial bonding layer 591 on the glass or silicon substrate 589 thereof. The specification of the temporary substrate 590 may be referred to that as illustrated in FIG. 10A.

Next, referring to FIG. 12A, multiple semiconductor integrated-circuit (IC) chips 393 (only one is shown), each having the same specification as the second type of semiconductor integrated-circuit (IC) chip 100 illustrated in FIG. 6B, may be provided to be turned upside down with its insulating dielectric layer 257 attached to the sacrificial bonding layer 591 of the temporary substrate 590 and its first type of micro-bumps or micro-pads 34 attached to the sacrificial bonding layer 591 of the temporary substrate 590. Each of the semiconductor integrated-circuit (IC) chips 393 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example. Alternatively, each of the semiconductor integrated-circuit (IC) chips 393 may be a memory chip, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip. Alternatively, each of the semiconductor integrated-circuit (IC) chips 393 may be a logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip, cryptography or security integrated-circuit (IC) chip, innovated ASIC or customer-owned-tooling (COT) integrated-circuit (IC) chip or power-management integrated-circuit (IC) chip. Alternatively, each of the semiconductor integrated-circuit (IC) chips 393 may be replaced with a memory module 159 having the same specification as the second type of memory module 159 illustrated in FIG. 7B provided with the insulating dielectric layer 257 to be attached to the sacrificial bonding layer 591 of the temporary substrate 590 and the first type of micro-bumps or micro-pads 34 to be attached to the sacrificial bonding layer 591 of the temporary substrate 590. Alternatively, each of the semiconductor integrated-circuit (IC) chips 393 may be replaced with a sub-system module 190 having the same specification as the second type of sub-system module 190 illustrated in FIG. 9B provided to be turned upside down with its insulating dielectric layer 257 to be attached to the sacrificial bonding layer 591 of the temporary substrate 590 and its first type of micro-bumps or micro-pads 34 to be attached to the sacrificial bonding layer 591 of the temporary substrate 590.

Further, referring to FIG. 12A, multiple third type of vertical-through-via (VTV) connectors 467 may be provided, each having the same specification as that as illustrated in FIG. 1O but optionally having the first type of micro-bumps or micro-pads 34 each covering and aligning with two or more than two of its vertical through vias (VTVs) 358, that is, each of its first type of micro-bumps or micro-pads 34 may have the adhesion layer 26*a* on its passivation layer 14 and the top surface of the copper layer 156 of each of said two or more than two of its vertical through vias (VTVs) 358. Alternatively, each of the third type of vertical-through-via (VTV) connectors 467 may be replaced with the sixth or twelfth type of vertical-through-via (VTV) connector 467 as illustrated in FIG. 1R or 1X but optionally having the first type of micro-bumps or micro-pads 34 each covering and aligning with two or more than two of its vertical through vias (VTVs) 358, that is, each of its first type of micro-bumps or micro-pads 34 may have the adhesion layer 26*a* on its passivation layer 14 and the top surface of the copper layer 156 of each of said two or more than two of its vertical through vias (VTVs) 358. Each of the third type of vertical-through-via (VTV) connectors 467, or the sixth or twelfth type of vertical-through-via (VTV) connectors 467 in case of replacing the third type of vertical-through-via (VTV) connectors 467, may be turned upside down to have its insulating dielectric layer 257 attached to the sacrificial bonding layer 591 of the temporary substrate 590 and its first type of micro-bumps or micro-pads 34 attached to the sacrificial bonding layer 591 of the temporary substrate 590.

Further, referring to FIG. 12A, multiple first or second type of fine-line interconnection bridges (FIBs) 690 (only one is shown) as seen in FIG. 5B or 5D respectively either for the first case as illustrated in FIGS. 5E and 5F or the second case as illustrated in FIGS. 5G and 5H may be provided to be turned upside down. Besides, each of the first or second type of fine-line interconnection bridges (FIBs) 690 may be provided with (1) the left and right groups of micro-bumps or micro-pads 34*a* and 34*b*, each of which may be of the first type having the same specification as that of the first type of micro-bumps or micro-pads 34 as illustrated in FIG. 1E, and (2) an insulating dielectric layer 257 at a bottom thereof covering a sidewall of the copper layer 32 of each of its left and right groups of micro-bumps or micro-pads 34*a* and 34*b*, wherein its insulating dielectric layer 257 may have a bottom surface coplanar to a bottom surface of the copper layer 32 of each of its left and right groups of micro-bumps or micro-pads 34*a* and 34*b*, wherein its insulating dielectric layer 257 may have the same specification as that of the insulating dielectric layer 257 of the third type of vertical-through-via (VTV) connector 467 as illustrated in FIG. 1O. Each of the first or second type of fine-line interconnection bridges (FIBs) 690 may have (1) the insulating dielectric layer 257 attached to the sacrificial bonding layer 591 of the temporary substrate 590 and the left and right groups of micro-bumps or micro-pads 34*a* and 34*b* attached to the sacrificial bonding layer 591 of the temporary substrate 590. Each of the first or second type of fine-line interconnection bridges (FIBs) 690 may be arranged horizontally between two of the third type of vertical-through-via (VTV) connectors 467, or the sixth or twelfth type of vertical-through-via (VTV) connectors 467 in case of replacing the third type of vertical-through-via (VTV) connectors 467. Each of the third type of vertical-through-via (VTV) connectors 467, or the sixth or twelfth type of vertical-through-via (VTV) connectors 467 in case of replacing the third type of vertical-through-via (VTV) connectors 467, may be arranged horizontally between one of the semiconductor integrated-circuit (IC) chips 393 and one of the first or second type of fine-line interconnection bridges (FIBs) 690.

Figure 12B:
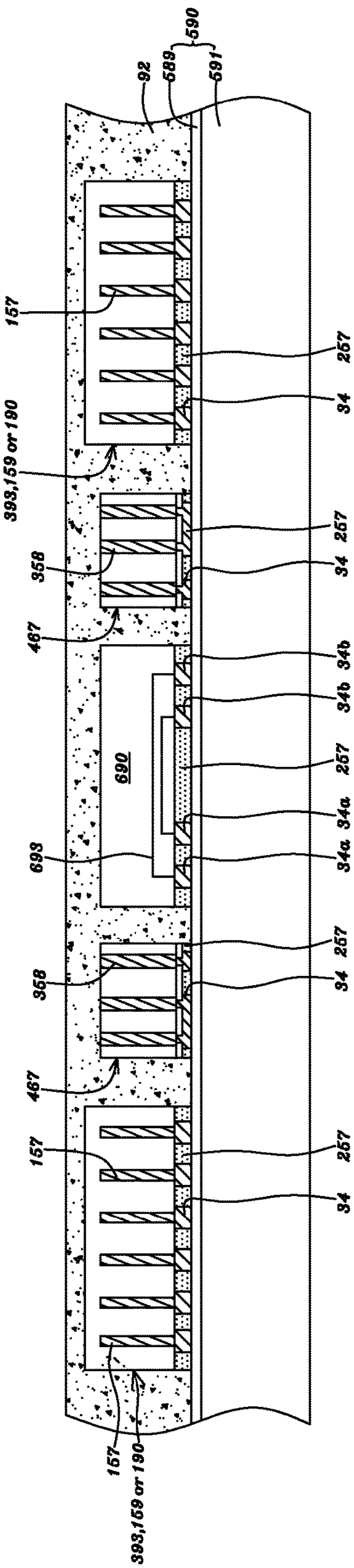

Next, referring to FIG. 12B, a polymer layer 92, or insulating dielectric layer, may be applied to fill a gap between each neighboring two of the semiconductor integrated-circuit (IC) chips 393, or the memory modules 159 or sub-system modules 190 in case of replacing the semiconductor integrated-circuit (IC) chips 393, the first or second type of fine-line interconnection bridges (FIBs) 690 and the third type of vertical-through-via (VTV) connectors 467, or the sixth or twelfth type of vertical-through-via (VTV) connectors 467 in case of replacing the third type of vertical-through-via (VTV) connectors 467, to cover a backside of each of the semiconductor integrated-circuit (IC) chips 393, or the memory modules 159 or sub-system modules 190 in case of replacing the semiconductor integrated-circuit (IC) chips 393 and each of the first or second type of fine-line interconnection bridges (FIBs) 690, and to cover (1) the backside of the semiconductor substrate 2 of each of the third type of vertical-through-via (VTV) connectors 467 and the backside of the copper layer 156 of each of the vertical through vias (VTVs) 358 of each of the third type of vertical-through-via (VTV) connectors 467 or (2) the or the topmost insulating bonding layer 252 of each of the sixth or twelfth type of vertical-through-via (VTV) connectors 467 in case of replacing the third type of vertical-through-via (VTV) connectors 467 and the backside of the copper layer 156 of each of the vertical through vias (VTVs) 358 of each of the sixth or twelfth type of vertical-through-via (VTV) connectors 467 in case of replacing the third type of vertical-through-via (VTV) connectors 467, by a method of spin-on coating, screen-printing, dispensing or molding. The polymer layer 92 may be, for example, polyimide, BenzoCycloButene (BCB), parylene, polybenzoxazole (PBO), epoxy-based resin or compound, photo epoxy SU-8, elastomer, silicon organic glass (SOG) or silicone. The polymer layer 92 may be, for example, photosensitive polyimide/PBO PIMEL™ supplied by Asahi Kasei Corporation, Japan, or epoxy-based molding compounds, resins or sealants provided by Nagase ChemteX Corporation, Japan.

Figure 12C:
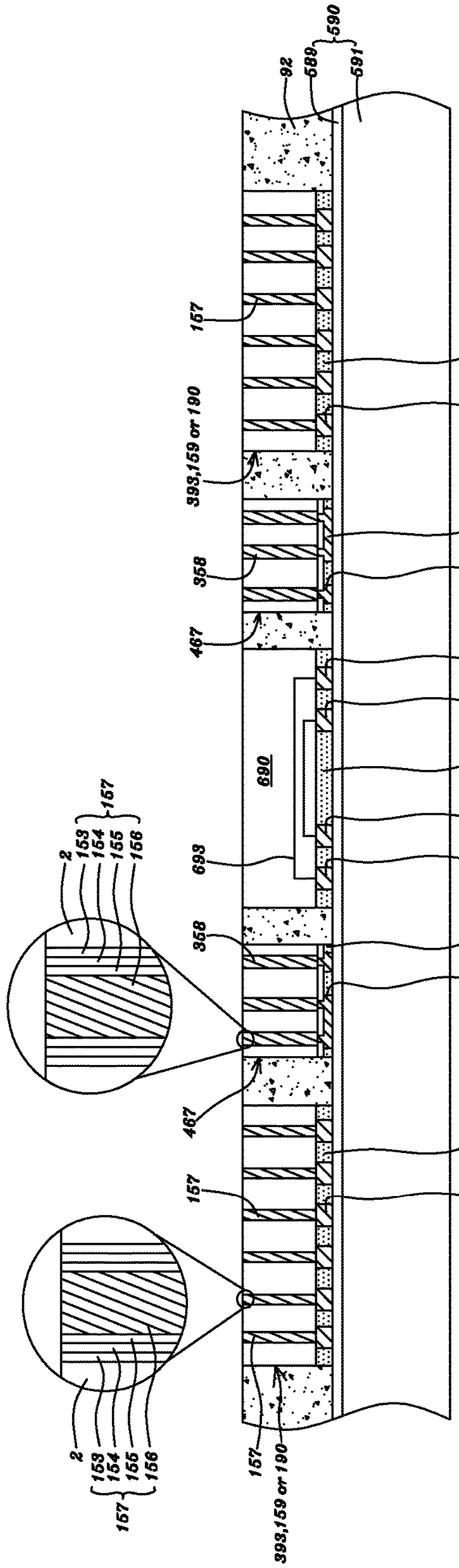

Next, referring to FIG. 12C, a chemical mechanical polishing (CMP), polishing or grinding process may be applied to remove a top portion of the polymer layer 92 and a top portion of the semiconductor integrated-circuit (IC) chips 393, or the memory modules 159 or sub-system modules 190 in case of replacing the semiconductor integrated-circuit (IC) chips 393, and to expose a top planar surface composed of (1) a top surface of the polymer layer 92; (2) the backside of the semiconductor substrate 2 of each of the first or second type of fine-line interconnection bridges (FIBs) 690; (3) the backside of the semiconductor substrate 2 of each of the third type of vertical-through-via (VTV) connectors 467; (4) the backside of the copper layer 156 of each of the vertical through vias (VTVs) 358 of each of the third type of vertical-through-via (VTV) connectors 467; (5) the or the topmost insulating bonding layer 252 of each of the sixth or twelfth type of vertical-through-via (VTV) connectors 467 in case of replacing the third type of vertical-through-via (VTV) connectors 467; (6) the backside of the copper layer 156 of each of the vertical through vias (VTVs) 358 of each of the sixth or twelfth type of vertical-through-via (VTV) connectors 467 in case of replacing the third type of vertical-through-via (VTV) connectors 467; (7) the backside of the semiconductor substrate 2 of each of the semiconductor integrated-circuit (IC) chips 393 and, optionally, the backside of the copper layer 156 of each of the through silicon vias (TSVs) 157 of each of the semiconductor integrated-circuit (IC) chips 393; (8) the backside of the semiconductor substrate 2 of the topmost one of the memory chips 251 of each of the memory modules 159 in case of replacing the semiconductor integrated-circuit (IC) chips 393 and, optionally, the backside of the copper layer 156 of each of the through silicon vias (TSVs) 157 of the topmost one of the memory chips 251 of each of the memory modules 159 in case of replacing the semiconductor integrated-circuit (IC) chips 393; and (9) the backside of the semiconductor substrate 2 of the application specific integrated-circuit (ASIC) chip 399 of each of the sub-system modules 190 in case of replacing the semiconductor integrated-circuit (IC) chips 393 and, optionally, the backside of the copper layer 156 of each of the through silicon vias (TSVs) 157 of the application specific integrated-circuit (ASIC) chip 399 of each of the sub-system modules 190 in case of replacing the semiconductor integrated-circuit (IC) chips 393.

Figure 12D:
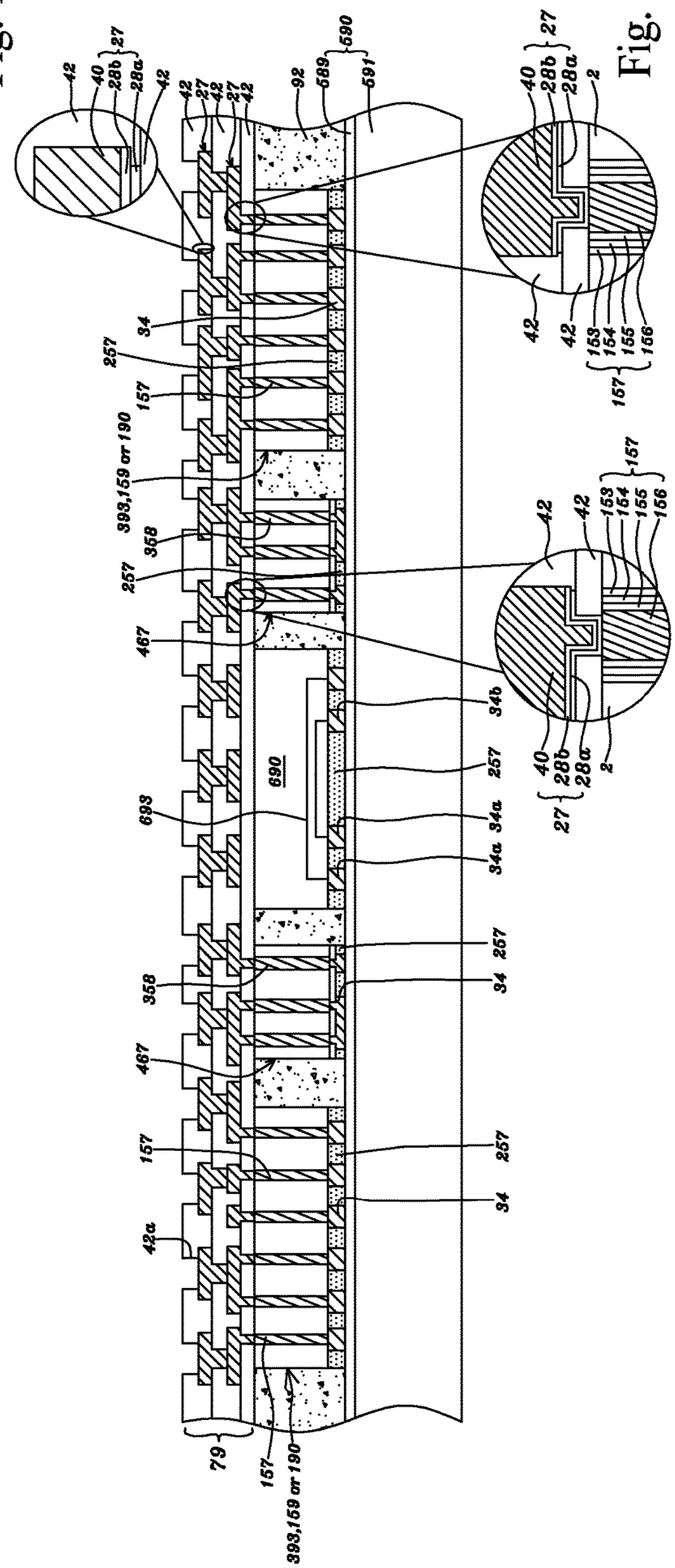

Next, referring to FIG. 12D, a backside interconnection scheme for a device (BISD) 79 may be formed on the top planar surface, including (1) one or more interconnection metal layers 27 coupling to the vertical through vias (VTVs) 358 of each of the third type of vertical-through-via (VTV) connectors 467, or the sixth or twelfth type of vertical-through-via (VTV) connectors 467 in case of replacing the third type of vertical-through-via (VTV) connectors 467, and, optionally, to the through silicon vias (TSVs) 157 of each of the semiconductor integrated-circuit (IC) chips 393, the through silicon vias (TSVs) 157 of the topmost one of the memory chips 251 of each of the memory modules 159 in case of replacing the semiconductor integrated-circuit (IC) chips 393, or the through silicon vias (TSVs) 157 of the application specific integrated-circuit (ASIC) chip 399 of each of the sub-system modules 190 in case of replacing the semiconductor integrated-circuit (IC) chips 393, and (2) one or more polymer layers 42, i.e., insulating dielectric layers, each between neighboring two of its interconnection metal layers 27, between the top planar surface and a bottommost one of its interconnection metal layers 27 or on and above a topmost one of its interconnection metal layers 27, wherein the topmost one of its interconnection metal layers 27 may be patterned with multiple metal pads at bottoms of multiple openings 42*a* in the topmost one of its polymer layers 42. Each of the interconnection metal layers 27 of the backside interconnection scheme for a device (BISD) 79 may have the same specification as that of the second interconnection scheme for an interconnection bridge (SISIB) 588 as illustrated in FIGS. 5C and 5D, and each of the polymer layers 42 of the backside interconnection scheme for a device (BISD) 79 may have the same specification as that of the second interconnection scheme for an interconnection bridge (SISIB) 588 as illustrated in FIGS. 5C and 5D. Each of the interconnection metal layers 27 of the backside interconnection scheme for a device (BISD) 79 may extend across over (1) an edge of each of the semiconductor integrated-circuit (IC) chips 393, or the memory modules 159 or sub-system modules 190 in case of replacing the semiconductor integrated-circuit (IC) chips 393, (2) an edge of each of the third type of vertical-through-via (VTV) connectors 467, or an edge of each of the sixth or twelfth type of vertical-through-via (VTV) connectors 467 in case of replacing the third type of vertical-through-via (VTV) connectors 467, and (3) an edge of each of the first or second type of fine-line interconnection bridges (FIBs) 690.

Next, the glass or silicon substrate 589 as seen in FIG. 12D may be released from the sacrificial bonding layer 591, the details of which may be referred to the description for FIG. 10D. Next, an adhesive peeling tape (not shown) may be attached to a bottom surface of the remainder of the sacrificial bonding layer 591. Next, the adhesive peeling tape may be peeled off to pull off the remainder of the sacrificial bonding layer 591 attached to the adhesive peeling tape to expose a planar bottom surface composed of: (1) a bottom surface of the polymer layer 92; (2) the bottom surface of the insulating dielectric layer 257 of each of the semiconductor integrated-circuit (IC) chips 393, or the memory modules 159 or sub-system modules 190 in case of replacing the semiconductor integrated-circuit (IC) chips 393, and the bottom surface of the copper layer 32 of each of the first type of micro-bumps or micro-pads 34 of each of the semiconductor integrated-circuit (IC) chips 393, or the memory modules 159 or sub-system modules 190 in case of replacing the semiconductor integrated-circuit (IC) chips 393; (3) the bottom surface of the insulating dielectric layer 257 of each of the third type of vertical-through-via (VTV) connectors 467, or the sixth or twelfth type of vertical-through-via (VTV) connectors 467 in case of replacing the third type of vertical-through-via (VTV) connectors 467, and the bottom surface of the copper layer 32 of each of the first type of micro-bumps or micro-pads 34 of each of the third type of vertical-through-via (VTV) connectors 467, or the sixth or twelfth type of vertical-through-via (VTV) connectors 467 in case of replacing the third type of vertical-through-via (VTV) connectors 467; and (4) the bottom surface of the insulating dielectric layer 257 of each of the first or second type of fine-line interconnection bridges (FIBs) 690 and the bottom surface of the copper layer 32 of each of the left and right groups of micro-bumps or micro-pads 34*a* and 24*b* of each of the first or second type of fine-line interconnection bridges (FIBs) 690.

Figure 12E:
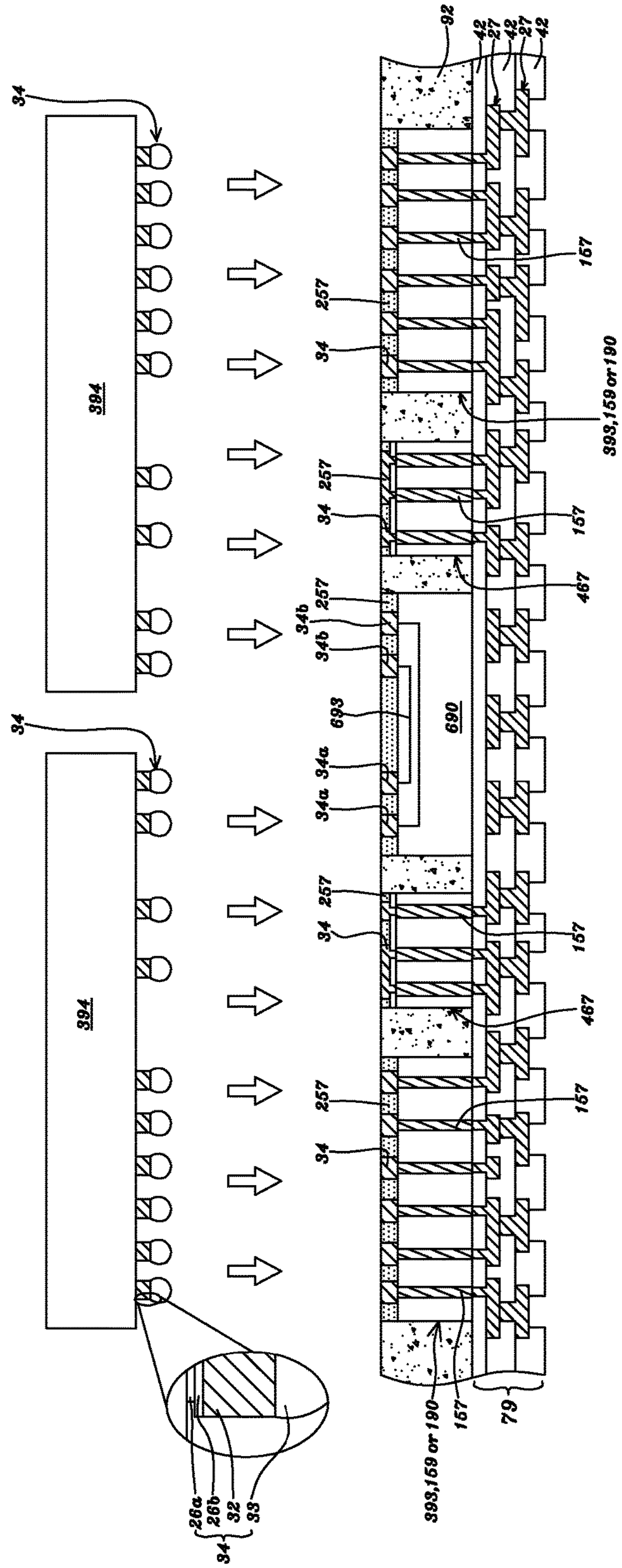

Next, the structure as above mentioned is turned upside down as seen in FIG. 12E. Multiple semiconductor integrated-circuit (IC) chips 394, each having the same specification as the first type of semiconductor integrated-circuit (IC) chip 100 illustrated in FIG. 6A, may be provided to be turned upside down with its first, second, third or third type of micro-bumps or micro-pads 34 to be bonded, as seen in FIG. 12F, to (1) the top surface of the copper layer 32 of one of the first type of micro-bumps or micro-pads 34 of one of the semiconductor integrated-circuit (IC) chips 393, or the memory modules 159 or sub-system modules 190 in case of replacing the semiconductor integrated-circuit (IC) chips 393, (2) the top surface of the copper layer 32 of one of the first type of micro-bumps or micro-pads 34 of one of the third type of vertical-through-via (VTV) connectors 467, or the sixth or twelfth type of vertical-through-via (VTV) connectors 467 in case of replacing the third type of vertical-through-via (VTV) connectors 467, or (3) the top surface of the copper layer 32 of one of the left and right groups of micro-bumps or micro-pads 34*a* and 34*b* of one of the first or second type of fine-line interconnection bridges (FIBs)

690. Each of the semiconductor integrated-circuit (IC) chips 394 may be a field-programmable-gate-array (FPGA) integrated-circuit (IC) chip, graphic-processing-unit (GPU) integrated-circuit (IC) chip, central-processing-unit (CPU) integrated-circuit (IC) chip, tensor-processing-unit (TPU) integrated-circuit (IC) chip, neural-network-processing-unit (NPU) integrated-circuit (IC) chip, application-processing-unit (APU) integrated-circuit (IC) chip, data-processing-unit (DPU) integrated-circuit (IC) chip or digital-signal-processing (DSP) integrated-circuit (IC) chip, for example. Alternatively, each of the semiconductor integrated-circuit (IC) chips 394 may be a memory chip, such as high-bit-width memory chip, volatile memory integrated-circuit (IC) chip, dynamic-random-access-memory (DRAM) integrated-circuit (IC) chip, static-random-access-memory (SRAM) integrated-circuit (IC) chip, non-volatile memory integrated-circuit (IC) chip, NAND or NOR flash memory integrated-circuit (IC) chip, magnetoresistive-random-access-memory (MRAM) integrated-circuit (IC) chip, resistive-random-access-memory (RRAM) integrated-circuit (IC) chip, phase-change-random-access-memory (PCM) integrated-circuit (IC) chip, ferroelectric random-access-memory (FRAM) integrated-circuit (IC) chip. Alternatively, each of the semiconductor integrated-circuit (IC) chips 394 may be a logic chip, auxiliary and cooperating (AC) integrated-circuit (IC) chip, dedicated I/O chip, dedicated control and I/O chip, intellectual-property (IP) chip, interface chip, networking chip, universal-serial-bus (USB) chip, Serdes chip, analog integrated-circuit (IC) chip, cryptography or security integrated-circuit (IC) chip, innovated ASIC or customer-owned-tooling (COT) integrated-circuit (IC) chip or power-management integrated-circuit (IC) chip.

Figure 12F:
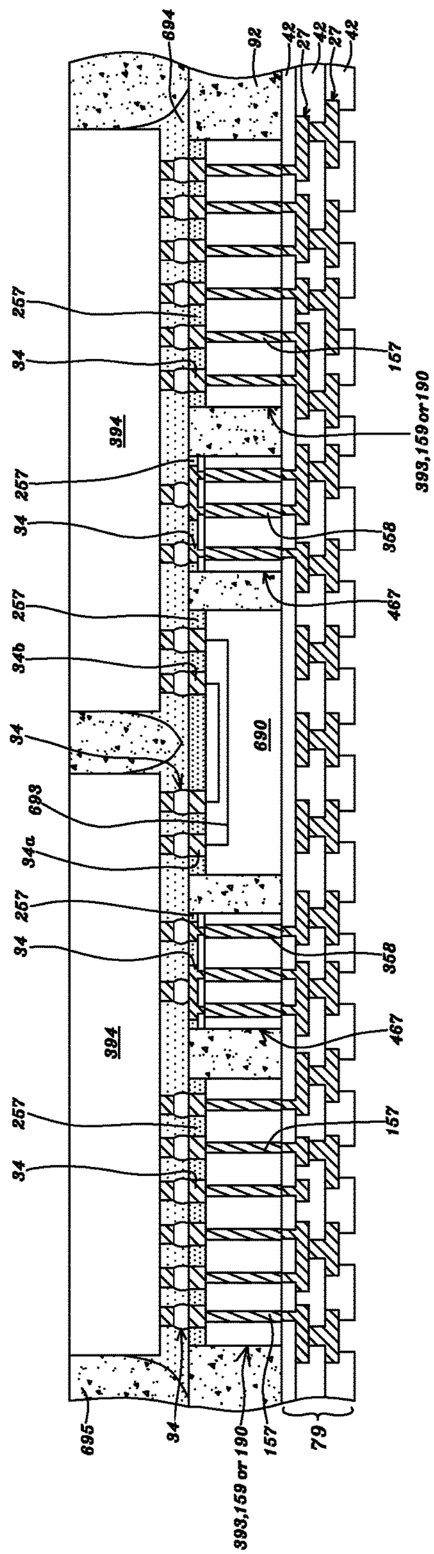

Next, referring to FIG. 12F, an underfill 694, e.g., a polymer, may be filled into a gap between each of the semiconductor integrated-circuit (IC) chips 394 and the planar top surface to enclose each of the first, second, third or third type of micro-bumps or micro-pads 34 of each of the semiconductor integrated-circuit (IC) chips 394. Next, a polymer layer 695 may be formed over the planar top surface and around each of the semiconductor integrated-circuit (IC) chips 394 by a method of spin-on coating, screen-printing, dispensing or molding. The polymer layer 695 may be, for example, polyimide, BenzoCycloButene (BCB), parylene, polybenzoxazole (PBO), epoxy-based resin or compound, photo epoxy SU-8, elastomer, silicon organic glass (SOG) or silicone. The polymer layer 695 may be, for example, photosensitive polyimide/PBO PIMEL™ supplied by Asahi Kasei Corporation, Japan, or epoxy-based molding compounds, resins or sealants provided by Nagase ChemteX Corporation, Japan. The polymer layer 695 may have a top surface coplanar to a backside surface of each of the semiconductor integrated-circuit (IC) chips 394.

Figure 12G:
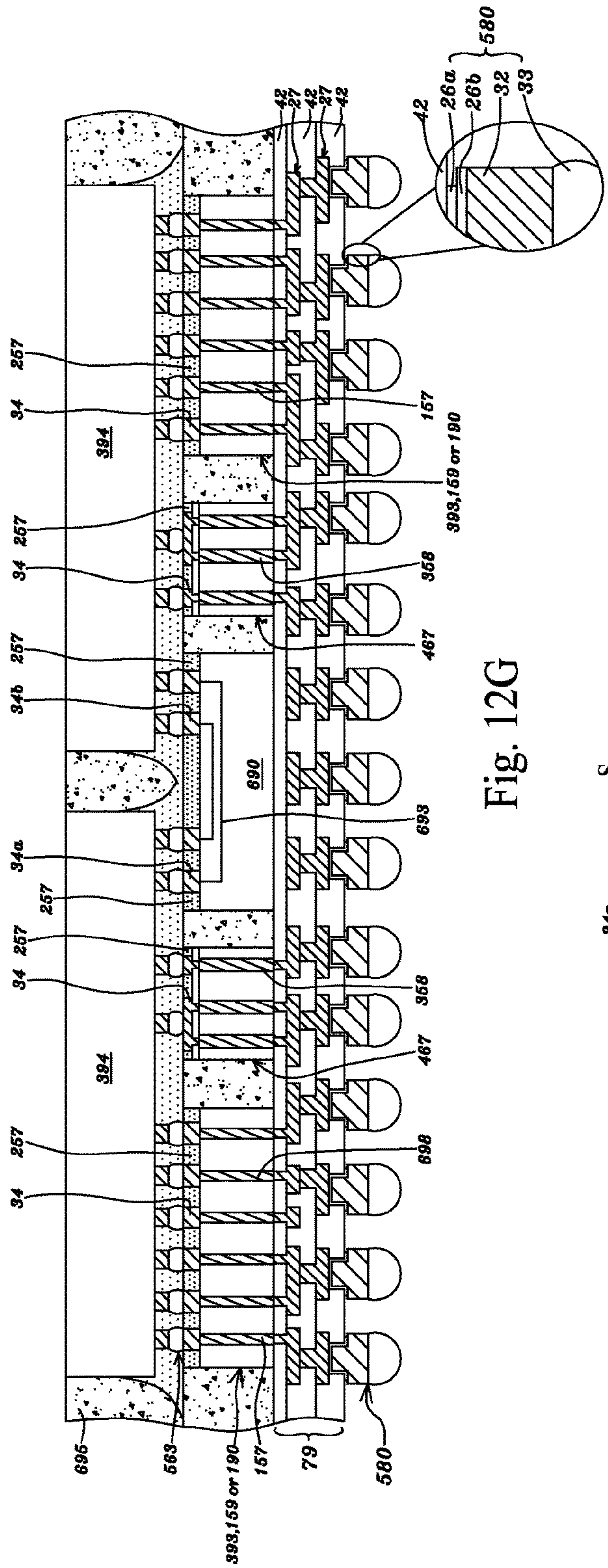

Next, referring to FIG. 12G, multiple metal bumps or pads 580, i.e., metal contacts, in an array, which may be of one of the first through fourth types having the same specification as the first through fourth types of micro-bumps or micro-pillars 34 as illustrated in FIG. 1E respectively, may have the adhesion layer 26*a* formed on the metal pads of the bottommost one of the interconnection metal layers 27 of the backside interconnection scheme for a device (BISD) 79 at the tops of the respective openings 42*a* in the bottommost one of the polymer layers 42 of the backside interconnection scheme for a device (BISD) 79. Next, the polymer layers 42 of the backside interconnection scheme for a device (BISD) 79 and the polymer layers 92 and 695 may be cut or diced to separate multiple individual units (only one is shown) each for a third type of chip package 424 as shown in FIG. 12H by a laser cutting process or mechanical cutting process.

Figure 12H:
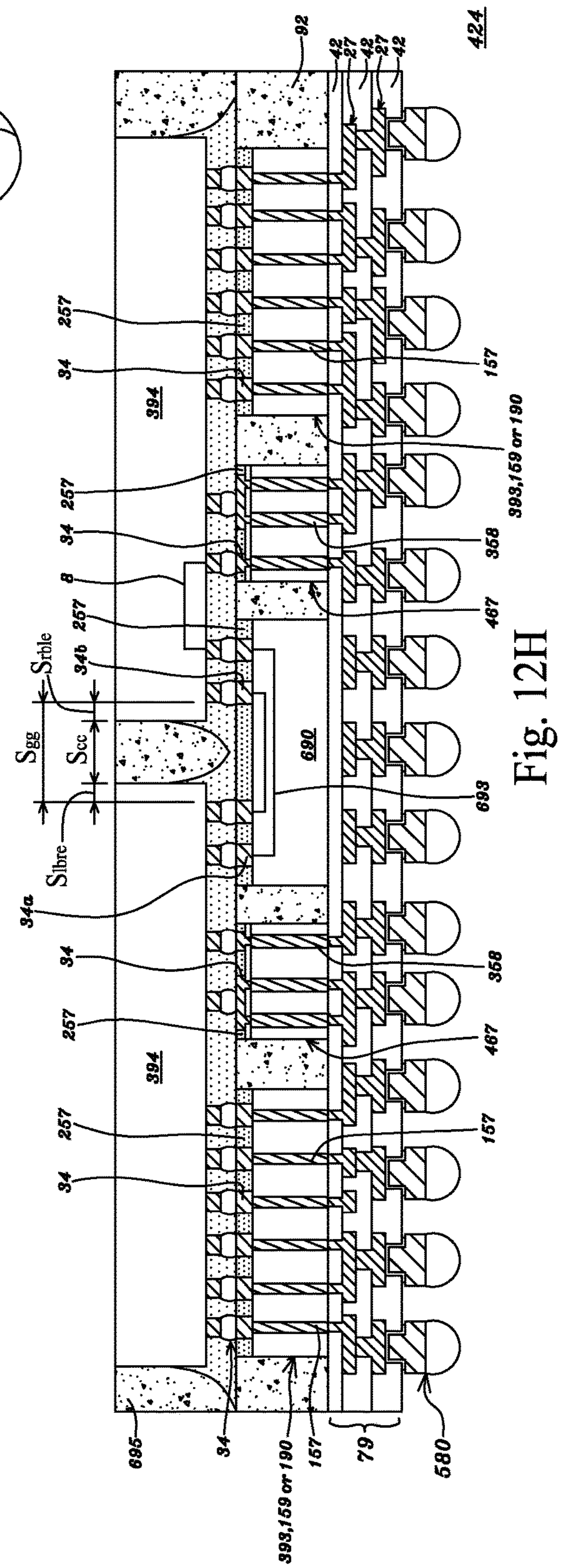

Referring to FIG. 12H, For the third type of chip package 424, a left one of its semiconductor integrated-circuit (IC) chips 394 may couple to a right one of its semiconductor integrated-circuit (IC) chips 394 through, in sequence, one of the left group of micro-bumps or micro-pads 34*a* of its first or second type of fine-line interconnection bridge (FIB) 690, one of the metal lines or traces 693 of its first or second type of fine-line interconnection bridge (FIB) 690 and one of the left group of micro-bumps or micro-pads 34*b* of its first or second type of fine-line interconnection bridge (FIB) 690. Alternatively, the left one of its semiconductor integrated-circuit (IC) chips 394 may couple to one of its metal bumps or pads 580 through, in sequence, one of the left group of micro-bumps or micro-pads 34*a* of its first or second type of fine-line interconnection bridge (FIB) 690, one of the metal lines or traces 693 of its first or second type of fine-line interconnection bridge (FIB) 690, one of the left group of micro-bumps or micro-pads 34*b* of its first or second type of fine-line interconnection bridge (FIB) 690, one or more of the metal traces 8 of the right one of its semiconductor integrated-circuit (IC) chips 394, one of the first type of micro-bumps or micro-pads 34*b* of its third type of vertical-through-via (VTV) connectors 467, or its sixth or twelfth type of vertical-through-via (VTV) connectors 467 in case of replacing its third type of vertical-through-via (VTV) connectors 467, under the right one of its semiconductor integrated-circuit (IC) chips 394 and each of the interconnection metal layers 27 of its backside interconnection scheme for a device (BISD) 79. It is noted that a space $S_{cc}$ between the left and right ones of its semiconductor integrated-circuit (IC) chips 394 may range from 20 micrometers to 300 micrometers, or from 20 micrometers to 100 micrometers; a space $S_{lbre}$ from the rightmost column of the left group of micro-bumps or micro-pads 34*a* of its first or second type of fine-line interconnection bridge (FIB) 690 to a right edge of the left one of its semiconductor integrated-circuit (IC) chips 394 may range from 20 micrometers to 100 micrometers or from 20 micrometers to 50 micrometers; a space $S_{rble}$ from the leftmost column of the right group of micro-bumps or micro-pads 34*b* of its first or second type of fine-line interconnection bridge (FIB) 690 to a left edge of the right one of its semiconductor integrated-circuit (IC) chips 394 may range from 20 micrometers to 100 micrometers or from 20 micrometers to 50 micrometers.

The components, steps, features, benefits and advantages that have been discussed are merely illustrative. None of them, nor the discussions relating to them, are intended to limit the scope of protection in any way. Numerous other embodiments are also contemplated. These include embodiments that have fewer, additional, and/or different components, steps, features, benefits and advantages. These also include embodiments in which the components and/or steps are arranged and/or ordered differently.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain. Furthermore, unless stated otherwise, the numerical ranges provided are intended to be inclusive of the stated lower and upper values. Moreover, unless stated otherwise, all material selections and numerical values are representative of preferred embodiments and other ranges and/or materials may be used.

The scope of protection is limited solely by the claims, and such scope is intended and should be interpreted to be as broad as is consistent with the ordinary meaning of the language that is used in the claims when interpreted in light of this specification and the prosecution history that follows, and to encompass all structural and functional equivalents thereof.

What is claimed is:

1. A method for fabricating a through-silicon-via (TSV) connector comprising:

providing a semiconductor wafer with a silicon substrate, wherein the semiconductor wafer has a frontside and a backside opposite to the frontside thereof;

forming, at the frontside of the semiconductor wafer, a plurality of holes in the silicon substrate of the semiconductor wafer;

forming a first insulating layer at a sidewall and bottom of each of the plurality of holes;

forming a first metal layer over the semiconductor wafer, on the first insulating layer and in each of the plurality of holes;

forming a second metal layer over the semiconductor wafer, on the first metal layer and in each of the plurality of holes;

removing, by a polishing process, the first and second metal layers outside each of the plurality of holes to leave the first and second metal layers in and vertically aligned with each of the plurality of holes and expose a frontside surface of the second metal layer in and vertically aligned with each of the plurality of holes;

forming a plurality of metal contacts each on the frontside surface of the second metal layer in and vertically aligned with at least one of the plurality of holes;

grinding a backside of the silicon substrate of the semiconductor wafer to expose a backside surface of the second metal layer in and through each of the plurality of holes; and after said grinding the backside of the silicon substrate of the semiconductor wafer and while the backside surface of the second metal layer in and through each of the plurality of holes is still exposed, cutting the semiconductor wafer to form the through-silicon-via (TSV) connector in a separated unit, wherein in the through-silicon-via (TSV) connector, a first metal contact of the plurality of metal contacts couples to the backside surface of the second metal layer in and through a first hole of the plurality of holes through the second metal layer in and through the first hole, and the backside surface of the second metal layer in and through the first hole is exposed.

2. The method of claim 1, after said removing, by the polishing process, the first and second metal layers outside each of the plurality of holes, further comprising:

depositing a polymer layer over the semiconductor wafer and the frontside surface of the second metal layer in and vertically aligned with each of the plurality of holes; and patterning the polymer layer to form a plurality of first trenches in the polymer layer a plurality of second trenches in the polymer layer and a plurality of openings in the polymer layer, wherein each of the plurality of first trenches extends in a first direction across the semiconductor wafer and is aligned with one of a plurality of first scribe lines extending in the first direction across the semiconductor wafer, and each of the plurality of second trenches extends in a second direction, perpendicular to the first direction, across the semiconductor wafer and is aligned with one of a plurality of second scribe lines extending in the second direction across the semiconductor wafer, wherein the polymer layer is divided into a plurality of polymer islands by the plurality of first and second trenches, wherein each of the plurality of openings is over the frontside surface of the second metal layer in and vertically aligned with one of the plurality of holes, wherein a portion of the plurality of openings are in each of the plurality of polymer islands, wherein said forming the plurality of metal contacts comprises forming the plurality of metal contacts each in one of the plurality of openings and on one of the plurality of polymer islands, wherein each of the plurality of metal contacts couples to the frontside surface of the second metal layer in and vertically aligned with one of the plurality of holes through one of the plurality of openings.

3. The method of claim 2, wherein said cutting the semiconductor wafer to form the through-silicon-via (TSV) connector comprises cutting the semiconductor wafer along a first portion of the plurality of first and second scribe lines while not cutting the semiconductor wafer along a second portion of the plurality of first and second scribe lines.

4. The method of claim 2, wherein said cutting the semiconductor wafer to form the through-silicon-via (TSV) connector is performed without cutting the semiconductor wafer along a scribe line of the plurality of first and second scribe lines, wherein the scribe line is reserved between neighboring two of the plurality of polymer islands within the through-silicon-via (TSV) connector.

5. The method of claim 2, wherein the semiconductor wafer has a first space between nearest neighboring two of the plurality of metal contacts and across one of the plurality of first and second scribe lines and a second space between nearest neighboring two of the plurality of metal contacts on one of the plurality of polymer islands, wherein the first space is greater than the second space.

6. The method of claim 5, wherein the first space is greater than 50 micrometers and the second space is smaller than 50 micrometers.

7. The method of claim 1, wherein said forming the plurality of metal contacts comprises forming a second metal contact on the frontside surface of the second metal layer in and vertically aligned with second and third holes of the plurality of holes and over the semiconductor wafer, wherein the second metal contact couples the second metal layer in and vertically aligned with the second hole to the second metal layer in and vertically aligned with the third hole.

8. The method of claim 1, wherein said cutting the semiconductor wafer to form the through-silicon-via (TSV) connector comprises cutting the semiconductor wafer along a line and through a portion of the plurality of metal contacts arranged in the line.

9. The method of claim 1, wherein the second metal layer comprises a copper layer.

10. The method of claim 1, wherein each of the plurality of first metal contacts is a tin-containing metal bump.

11. The method of claim 1, wherein each of the plurality of metal contacts comprises a copper layer having a thickness between 2 and 20 micrometers.

12. The method of claim 1, wherein said forming the plurality of metal contacts comprises forming the plurality of metal contacts each with an adhesion layer on the frontside surface of the second metal layer in and vertically aligned with one of the plurality of holes and a copper layer on the adhesion layer, wherein the adhesion layer is at a bottom of the copper layer but not at a sidewall of the copper layer.

13. The method of claim 1, after forming the plurality of metal contacts each on the frontside surface of the second metal layer in and vertically aligned with the at least one of the plurality of holes, further comprises forming a second insulating layer over the semiconductor wafer, wherein the second insulating layer covers a sidewall of each of the plurality of metal contacts and has a top surface coplanar with a top surface of each of the plurality of metal contacts.

14. The method of claim 1, wherein the through-silicon-via (TSV) connector has no transistor.

15. The method of claim 1, wherein after said cutting the semiconductor wafer to form the through-silicon-via (TSV) connector in the separated unit, the backside surface of the second metal layer in and through each of the plurality of holes and a backside surface of the silicon substrate of the semiconductor wafer are coplanar in the through-silicon-via (TSV) connector.

16. The method of claim 1, after said grinding the backside of the silicon substrate of the semiconductor wafer, further comprising performing an etching process to remove a portion of the silicon substrate of the semiconductor wafer and form a recess from the backside surface of the second metal layer in and through each of the plurality of holes, forming a second insulating layer in the recess, on the backside of the silicon substrate of the semiconductor wafer and on the backside surface of the second metal layer in and through each of the plurality of holes, and removing, by a polishing process, the second insulating layer on the backside surface of the second metal layer in and through each of the plurality of holes to expose the backside surface of the second metal layer in and through each of the plurality of holes, wherein after said cutting the semiconductor wafer to form the through-silicon-via (TSV) connector in the separated unit, the backside surface of the second metal layer in and through each of the plurality of holes and a backside surface of the second insulating layer are coplanar in the through-silicon-via (TSV) connector.

17. A method for fabricating a through-silicon-via (TSV) connector comprising:

providing a semiconductor wafer with a silicon substrate, wherein the semiconductor wafer has a frontside and a backside opposite to the frontside thereof;

forming, at the frontside of the semiconductor wafer, a plurality of holes in the silicon substrate of the semiconductor wafer;

forming a first insulating layer at a sidewall and bottom of each of the plurality of holes;

forming a first metal layer over the semiconductor wafer, on the first insulating layer and in each of the plurality of holes;

forming a second metal layer over the semiconductor wafer, on the first metal layer and in each of the plurality of holes;

removing, by a polishing process, the first and second metal layers outside each of the plurality of holes to leave the first and second metal layers in and vertically aligned with each of the plurality of holes and expose a frontside surface of the second metal layer in and vertically aligned with each of the plurality of holes;

grinding a backside of the silicon substrate of the semiconductor wafer to expose a backside surface of the second metal layer in and through each of the plurality of holes; and after said grinding the backside of the silicon substrate of the semiconductor wafer and while the backside surface of the second metal layer in and through each of the plurality of holes is still exposed, cutting the semiconductor wafer to form the through-silicon-via (TSV) connector in a separated unit, wherein in the through-silicon-via (TSV) connector, the frontside surface of the second metal layer in and through a hole of the plurality of holes couples to the backside surface of the second metal layer in and through the hole, and the frontside and backside surfaces of the second metal layer in and through the hole are exposed.

18. The method of claim 17, wherein the first insulating layer comprises a layer of silicon oxide.

19. The method of claim 17, wherein the second metal layer comprises a copper layer.

20. The method of claim 17, wherein the semiconductor wafer has a plurality of first scribe lines extending in a first direction across the semiconductor wafer and a plurality of second scribe lines extending in a second direction, perpendicular to the first direction, across the semiconductor wafer, wherein the semiconductor wafer is divided into a plurality of regions by the plurality of first and second scribe lines.

21. The method of claim 20, wherein said cutting the semiconductor wafer to form the plurality of through-silicon-via (TSV) connector comprises cutting the semiconductor wafer through along a first portion of the plurality of first and second scribe lines while not cutting the semiconductor wafer along a second portion of the plurality of first and second scribe lines.

22. The method of claim 20, wherein said cutting the semiconductor wafer to form the through-silicon-via (TSV) connector is performed without cutting the semiconductor wafer along a scribe line of the plurality of first and second scribe lines, wherein the scribe line is reserved between nearest neighboring two of the plurality of regions within the through-silicon-via (TSV) connector.

23. The method of claim 20, wherein the semiconductor wafer has a first space between nearest neighboring two of the plurality of holes and across one of the plurality of first and second scribe lines and a second space between nearest neighboring two of the plurality of holes within one of the plurality of regions, wherein the first space is greater than the second space.

24. The method of claim 23, wherein the first space is greater than 50 micrometers and the second space is smaller than 50 micrometers.

25. The method of claim 17, wherein said cutting the semiconductor wafer to form the through-silicon-via (TSV) connector comprises cutting the semiconductor wafer along a line and through a portion of the plurality of holes arranged in the line.

26. The method of claim 17, wherein the through-silicon-via (TSV) connector has no transistor.

27. The method of claim 17, wherein after said cutting the semiconductor wafer to form the through-silicon-via (TSV) connector in the separated unit, the backside surface of the second metal layer in and through each of the plurality of holes and a backside surface of the silicon substrate of the semiconductor wafer are coplanar in the through-silicon-via (TSV) connector.

28. The method of claim 17, after said grinding the backside of the silicon substrate of the semiconductor wafer, further comprising performing an etching process to remove a portion of the silicon substrate of the semiconductor wafer and form a recess from the backside surface of the second metal layer in and through each of the plurality of holes, forming a second insulating layer in the recess, on the backside of the silicon substrate of the semiconductor wafer and on the backside surface of the second metal layer in and through each of the plurality of holes, and removing, by a polishing process, the second insulating layer on the backside surface of the second metal layer in and through each of the plurality of holes to expose the backside surface of the second metal layer in and through each of the plurality of holes, wherein after said cutting the semiconductor wafer to form the through-silicon-via (TSV) connector in the separated unit, the backside surface of the second metal layer in and through each of the plurality of holes and a backside surface of the second insulating layer are coplanar in the through-silicon-via (TSV) connector.

* * * * *